US011292875B2

(12) United States Patent
Pan et al.

(10) Patent No.: US 11,292,875 B2
(45) Date of Patent: Apr. 5, 2022

(54) CROSS-LINKABLE POLYMER BASED ON DIELS-ALDER REACTION AND USE THEREOF IN ORGANIC ELECTRONIC DEVICE

(71) Applicant: GUANGZHOU CHINARAY OPTOELECTRONIC MATERIALS LTD., Guangdong (CN)

(72) Inventors: Junyou Pan, Guangdong (CN); Shengjian Liu, Guangdong (CN)

(73) Assignee: Guangzhou Chinaray Optoelectronic Materials LTD., Guangdong (CN)

( * ) Notice: Subject to any disclaimer, the term of this patent is extended or adjusted under 35 U.S.C. 154(b) by 304 days.

(21) Appl. No.: 16/472,664

(22) PCT Filed: Dec. 22, 2017

(86) PCT No.: PCT/CN2017/118068

§ 371 (c)(1),
(2) Date: Jun. 21, 2019

(87) PCT Pub. No.: WO2018/113786

PCT Pub. Date: Jun. 28, 2018

(65) Prior Publication Data

US 2019/0359764 A1 Nov. 28, 2019

(30) Foreign Application Priority Data

Dec. 22, 2016 (CN) ........................ 201611201706.X

(51) Int. Cl.
*C08G 61/12* (2006.01)
*H01L 51/00* (2006.01)

(52) U.S. Cl.
CPC .......... *C08G 61/12* (2013.01); *H01L 51/0036* (2013.01); *H01L 51/0059* (2013.01);
(Continued)

(58) Field of Classification Search
CPC ...... C08G 2261/124; C08G 2261/1424; C08G 2261/148; C08G 2261/312;
(Continued)

(56) References Cited

U.S. PATENT DOCUMENTS 3,567,450 A 3/1971 Brantly et al.
3,615,404 A 10/1971 Price et al.
(Continued)

FOREIGN PATENT DOCUMENTS

CN 1583691 2/2005
CN 101495433 A 7/2009
(Continued)

OTHER PUBLICATIONS

Patel et al. J. Mater. Chem., 2012, 22, 3004.*
(Continued)

*Primary Examiner* — Shane Fang
(74) *Attorney, Agent, or Firm* — Cozen O'Connor

(57) ABSTRACT

Provided is a mixture which can be subjected to a Diels-Alder reaction, comprising polymer (I) and polymer (II), wherein the structures of the polymer (I) and the polymer (II) are as shown in (I), Polymer (I)

(Continued)

P2

M1

M2

M3

-continued

Polymer (II)

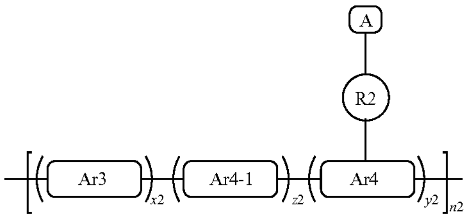

wherein x1, y1, x2, y2, z1 and z2 are percentage molar contents; said x1 is >0, x2 is >0, y1 is >0, y2 is >0, z1 is ≥0, and z2 is ≥0; x1+y1+z1=1, and x2+y2+z2=1; Ar1, Ar2, Ar2-1, Ar3, Ar4 and Ar4-1 are each independently selected from: an aryl, or heteroaryl group containing 5-40 ring atoms; R1 and R2 are each independently a linking group; D is a conjugated diene functional group, and A is a dienophilic functional group; and n1 is greater than 0, and n2 is greater than 0. The mixture for a Diels-Alder reaction has a very good optical performance.

16 Claims, 7 Drawing Sheets

(52) U.S. Cl.
CPC ...... *H01L 51/0065* (2013.01); *H01L 51/0067* (2013.01); *H01L 51/0068* (2013.01); *H01L 51/0073* (2013.01); *H01L 51/0074* (2013.01); *C08G 2261/334* (2013.01); *C08G 2261/3325* (2013.01); *C08G 2261/46* (2013.01)

(58) Field of Classification Search
CPC ........ C08G 2261/3142; C08G 2261/41; C08G 2261/512; C08G 2261/514; C08G 2261/76; C08G 2261/91; C08G 61/121; H01L 51/0039; H01L 51/5056; H01L 51/5072; H01L 51/0043
See application file for complete search history.

(56) References Cited

U.S. PATENT DOCUMENTS 4,720,432 A 1/1988 Vanslyke et al.
4,769,292 A 9/1988 Tang et al.
5,061,569 A 10/1991 Vanslyke et al.
5,121,029 A 6/1992 Hosokawa et al.
5,130,603 A 7/1992 Tokailin et al.
6,020,078 A 2/2000 Chen et al.
6,251,531 B1 6/2001 Enokida et al.
6,824,895 B1 11/2004 Sowinski et al.
6,830,828 B2 12/2004 Thompson et al.
6,835,469 B2 12/2004 Kwong et al.
7,029,766 B2 4/2006 Huo et al.
7,250,532 B2 7/2007 Iwakuma et al.
7,592,414 B2 9/2009 Meerholz et al.
2001/0053462 A1 12/2001 Mishima
2005/0096404 A1 5/2005 O'Neill et al.
2005/0258742 A1 11/2005 Tsai et al.
2006/0210830 A1 9/2006 Funahashi et al.
2006/0222886 A1 10/2006 Kwong et al.
2007/0087219 A1 4/2007 Ren et al.
2007/0092753 A1 4/2007 Begley et al.
2007/0252517 A1 11/2007 Owczarczyk et al.
2008/0027220 A1 1/2008 Stossel et al.
2008/0113101 A1 5/2008 Inoue et al.
2009/0061681 A1 3/2009 McMunigal et al.
2009/0076204 A1 3/2009 Inabe
2009/0134784 A1 5/2009 Lin et al.
2010/0216900 A1* 8/2010 Liu .......................... C08F 2/18
521/27
2012/0004407 A1 1/2012 Stoessel et al.
2012/0217869 A1 8/2012 Adachi et al.
2015/0307654 A1 10/2015 Hibbs

FOREIGN PATENT DOCUMENTS

CN 102282150 12/2011
CN 102668152 9/2012
CN 103483332 1/2014
CN 103848966 A 6/2014
CN 103896701 7/2014
CN 103985822 A 8/2014
CN 104185668 12/2014
CN 104497279 A 4/2015
CN 105694005 6/2016
CN 106220830 12/2016
CN 201510889328 6/2017
DE 102005058557 6/2007
EP 1191613 3/2006
EP 1957606 8/2008
EP 1191614 5/2009
EP 1191612 9/2009
JP 2913116 6/1999
JP 2008053397 3/2008
TW 201309696 3/2013
TW 201309778 3/2013
TW 201343874 11/2013
TW 201350558 12/2013
TW 201406810 2/2014
WO 200070655 11/2000
WO 2001021729 3/2001
WO 200141512 6/2001
WO 200202714 1/2002
WO 200215645 2/2002
WO 2005019373 3/2005
WO 2005033244 4/2005
WO 2006/000388 1/2006
WO 2006/000389 1/2006
WO 2006/058737 6/2006
WO 2006/122630 11/2006
WO 2007/065549 6/2007
WO 2007095118 8/2007
WO 2007/115610 10/2007
WO 2007/140847 12/2007
WO 2008/006449 1/2008
WO 2009118087 10/2009
WO 2009146770 12/2009
WO 2010015307 2/2010
WO 2010031485 3/2010
WO 2010034125 4/2010
WO 2010054728 5/2010
WO 2010054731 5/2010
WO 2010086089 8/2010
WO 2010099852 9/2010
WO 2010102709 9/2010
WO 2010135519 11/2010
WO 2011110277 9/2011
WO 2011157339 12/2011
WO 2012007086 1/2012
WO 2012007087 1/2012
WO 2012007088 1/2012
WO 2012/119020 A1 9/2012
WO 2013133359 9/2013
WO 2013154064 10/2013

OTHER PUBLICATIONS

PCT/CN2017/118068, "International Search Report", dated Mar. 22, 2018, 2 pages.
Jiang, X., Liu, S., Liu, M., Herguth, P., Jen, A.-Y., Fong, H. and Sarikaya, M. (2002), Perfluorocyclobutane-Based Arylamine Hole-Transporting Materials for Organic and Polymer Light-Emitting Diodes. Adv. Fund. Mater., 12: 745-751.

(56) References Cited

OTHER PUBLICATIONS

Yu-Hua Niu, Michelle S.Liu et al., Crosslinkable Hole-Transport Layer on Conducting Polymer for High- Efficiency White Polymer Light-Emitting Diodes., Adv. Mster., 2007, 19, 300.
C. David Muller, Aurellie Falcou et al., Multi-color organic light-emitting displays by solution processing., Nature, 2003, 421, 829.
Jonathan G.C. Veinot, Tobin J. Marks, Toward the ideal Organic Light-Emitting Diode. The Versatility and Utility of Interfacial Tailoring by Cross-Linked Iloxane Interlayers., Acc. Chern Res. 2005, 38, 632.
Benoit Demoercq, Richard D. Hreha, Ya-Dong Zhang et al., Photo-patternable Hole-Transport Polymers for Organic Light-Emittign Diodes., Chem. Mater., 2003, 15, 1491.
Biwu Ma, Frank Lauterwasser, Lan Deng et al., New Thermally Cross-Linkable Polymer and Its Application as a Hole-Transporting Layer for Solution Porcessed Multilayer Organic Light Emitting Diodes, Chern. Master., 2007, 19, 4827.
Ed. George R. Newkome, Charles N. Moorefield, Fritz Vogtle, Dendrimers and Dendrons, Wiley-VCH Verlag GmbH & Co. KGaA, 2002, pp. 1-21, 51-76, 76-102, 102-118, 191-234, 234-282, 282-309, 331-365, 366-393, 395-431, 431-455.
M. A. Baldo, M. E. Thompson, S. R. Forrest, High-efficiency fluorescent organic light-emitting devices using a phosphorescent sensitizer, Nature 403, (2000), 750-753.
Chihaya Adachi, Marc A. Baldo, Stephen R. Forrest, et al., High-efficiency red electrophosphorescence devices, Appl. Phys. Lett. 78 (2001), 1622-1624.
Junji Kido, Hiromichi Hayase, Kenichi Hongawa, et al., Bright red lightemitting organic electroluminescent devices having a europium complex as an emitter, Appl. Phys. Lett. 65 (1994), 2124.
Junji Kido, Katsutoshi Nagai, Yutaka Ohashi, Electroluminescence in a Terbium Complex,Chem. Lett. 657, 1990.
Curtis E. Johnson, Richard Eisenberg, Ted R. Evans, et al., Luminescent Iridium(I), Rhodium(I), and Platinum(II) Dithiolate Complexes, JACS 105, 1983, 1795.
Mark Wrighton, David L. Morse, The Nature of the Lowest Excited State in Tricarbonylchloro-1, 10-phenanthrolinerhenium(I) and Related Complexes, JACS 96, 1974, 99.
Yuguang Ma, Houyu Zhang, Jiacong Shen, et al., Electroluminescence from triplet metal-ligand charge-transfer exceited state of transition metal complexes, Synth. Metals 94, 1998, 245.
Ayataka Endo, Mai Ogasawara, Atsushi Takahashi, et al., Thermally Activated Delayed Fluorescence from Sn4*-Porphyrin Complexes and Their Application to Organic Light-Emitting Diodes—A Novel Mechanism for Electroluminescence, Adv. Mater., 21, 2009, 4802.
Ayataka Endo, Keigo Sato, Kazuaki Yoshimura, et al., Efficient up-conversion of triplet excitons into a singlet state and its application for organic light emitting diodes, Appl. Phys. Lett., 2011, 083302, 98.
Sae Youn Lee, Takuma Yasuda, Hiroko Nomura, High-efficiency organic light-emitting diodes utilizing thermally activated delayed fluorescence from triazine-based donor-acceptor hybrid molecules, Appl. Phys. Lett., 2012, 093306, 101.
Hiroyuki Tanaka, Katsuyuki Shizu, Hiroshi Miyazaki, Efficient green thermally activated delayed fluorescence (TADF) from a phenoxazine-triphenyltriazine (PXZ-TRZ) derivativew, Chem. Commun., 2012, 11392,48.
Kenichi Goushi, Kou Yoshida, Keigo Sato et.al., Organic light-emitting diodes employing efficient reverse intersystem crossing for triplet-to-singlet state conversion, Nature Photonics, 6, 2012, 253.
Hiroki Uoyama, Kenichi Goushi, Katsuyuki Shizu, Hiroko Nomura, et.al., Highly efficient organic light-emitting diodes from delayed fluorescence, Nature, 492, 2012, 234.
Qisheng Zhang, Jie Li, Katsuyuki Shizu, et.al., Design of Efficient Thermally Activated Delayed Fluorescence Materials for Pure Blue Organic Light Emitting Diodes, J. Am. Chern. Soc,, 2012, 14706, 134.
Gabor Mehes, Hiroko Nomura, Qisheng Zhang, et.al., Enhanced Electroluminescence Efficiency in a Spiro-Acridine Derivative through Thermally Activated Delayed Fluorescence, Angew. Chern. Int. Ed, 2012, 11311, 51.
Tetsuya Nakagawa,a Sung-Yu Ku,b Ken-Tsung Wong, et.al., Electroluminescence based on thermally activated delayed fluorescence generated by a spirobifluorene donor-acceptor structure, Chem. Commun., 2012, 9580, 48.
Keiro Nasu,a Tetsuya Nakagawa,a Hiroko Nomura, et.al., A highly luminescent spiro-anthracenone-based organic light-emitting diode exhibiting thermally activated delayed fluorescence, Chem. Commun., 2013, 10385, 49.
Jie Li, Tetsuya Nakagawa, Qisheng Zhang, et.al., Highly Effi cient Organic Light-Emitting Diode Based on a Hidden Thermally Activated Delayed Fluorescence Channel in a Heptazine Derivative, Adv. Mater., 2013, 3319, 25.
Fernando B. Dias, Konstantinos N. Bourdakos, Vygintas Jankus, et.al., Triplet Harvesting with 100% Effi ciency by Way of Thermally Activated Delayed Fluorescence in Charge Transfer OLED Emitters, Adv. Mater., 2013, 3707, 25.
Takeshi Komino, Hiroko Nomura, Takahiro Koyanagi, et.al., Suppression of Efficiency Roll-Off Characteristics in Thermally Activated Delayed Fluorescence Based Organic Light-EmittingDiodes Using Randomly Oriented Host Molecules, Chem. Mater., 2013, 3038, 25.
Hiroyuki Tanaka, Katsuyuki Shizu, Hajime Nakanotani, et.al., Twisted Intramolecular Charge Transfer State for Long-Wavelength Thermally Activated Delayed Fluorescence, Chem. Mater., 2013, 3766, 25.
Jiyoung Lee, Katsuyuki Shizu, Hiroyuki Tanaka, et.al., Oxadiazole- and triazole-based highly-efficient thermally activated delayed fluorescence emitters for organic light-emitting diodes, J. Mater. Chem. C., 2013, 4599, 1.
Ryoichi Ishimatsu, Shigeyuki Matsunami, Katsuyuki Shizu, et.al., Solvent Effect on Thermally Activated Delayed Fluorescence by 1,2,3,5-Tetrakis(carbazol-9-yl)-4,6-dicyanobenzene, J. Phys. Chem. A., 2013, 5607, 117.
Helmut Kipphan, Handbook of Print Media: Technologies and Production Methods, (2004), 40-67, 117-144, 711-730.
V. Bulovic, G. Gu, P. E. Burrows, et al., Transparent light-emitting devices, Nature, 1996, 380, p. 29.
G. Gu, V. Bulovic, P. E. Burrows, et al., Transparent organic light emitting devices, Appl. Phys. Lett., 1996, 68, p. 2606.

* cited by examiner

CROSS-LINKABLE POLYMER BASED ON DIELS-ALDER REACTION AND USE THEREOF IN ORGANIC ELECTRONIC DEVICE

CROSS-REFERENCE TO RELATED APPLICATIONS

The present application is the national phase of International Application PCT/CN2017/118068, filed on Dec. 22, 2017, which claims priority to Chinese Application No. 201611201706.X, filed on Dec. 22, 2016, both of which are incorporated herein by reference in their entireties.

TECHNICAL FIELD

The present disclosure relates to the field of organic polymer optoelectronic materials, and particularly to a mixture comprising the crosslinkable polymers constructed based on a Diels-Alder reaction, another mixture, a formulation, and an organic electronic device comprising the same, and use thereof.

BACKGROUND

Since the invention of organic/polymer light-emitting diodes (O/PLEDs), the organic/polymer light-emitting diodes (O/PLEDs) show great potential in application of optoelectronic devices such as flat-panel displays and lighting due to the diversities in synthesis, relatively low manufacturing cost, and excellent optical and electrical performance of polymer semiconductor materials.

In order to obtain the high-efficiency polymer electroluminescent devices, in addition to the development of high-performance light-emitting materials, efficient injection of electrons and holes from the cathode and anode, respectively, is also the key point. Therefore, many high-efficiency polymer electroluminescent devices tend to adopt a multilayer device structure, e.g., in addition to a light-emitting layer, one or more layers of hole transporting/injection layers or electron transporting/injection layers are included.

For small molecular vacuum evaporation OLEDs, it is easy to obtain multilayer, complicated and high-efficiency OLEDs by vacuum evaporation, but the vacuum evaporation method is expensive, time-consuming, material-wasting, and difficult to achieve large-area applications. Corresponding solution processed O/PLEDs have wide application prospects and commercial value due to the advantages of preparing large-area, flexible devices by solution processing methods such as a low-cost inkjet printing, and a Roll-to-Roll. Since common commercial polymer optoelectronic materials have a similar solubility, e.g., polymer light-emitting materials, hole injection/transporting materials, electron injection/transporting materials have a good solubility in toluene, chloroform, chlorobenzene, o-dichlorobenzene, o-xylene, tetrahydrofuran, there are problems such as interface miscibility and interface corrosion when a solution processing method is used to prepare a multilayer, complicated polymer light-emitting diode. For example, when the solution process is used to prepare a polymer light-emitting layer, the solvent used will dissolve the underlying hole transporting layer, causing problems such as interface miscibility and interface corrosion.

In order to solve the problems of interface miscibility and interface corrosion in solution processed O/PLEDs, it is very important to find a polymer optoelectronic material with excellent solvent resistance, which has attracted extensive attention in academia and industry. There are three main methods. Method 1: Orthogonal Solvent Processing Method, i.e., to use water/alcohol-soluble polymeric optoelectronic materials (such as poly 3,4-ethylenedioxythiophene/polystyrene sulfonate PEODT:SS) which is insoluble in weakly polar solvents (such as toluene, chlorobenzene, chloroform, tetrahydrofuran), and can be processed into a film by using an orthogonal solvent solution. This method can overcome the problems of interface miscibility, interface corrosion and the like, and this orthogonal solvent processing method has been successfully applied in high-efficiency and stable polymer optoelectronic devices. Method 2: Thermal Removal of Solubilizing Group (alkyl chain, alkoxy chain), i.e., soluble polymer precursor formed into a film by a solution processing method, and solubilizing groups of the polymer precursor removed by post-treatment such as heating, acid and illumination. The obtained polymer is insoluble in organic solvents and has excellent solvent resistance, and a typical example thereof is a light-emitting polymer poly(p-phenylenevinylene) (PPV). Method 3: Crosslinking Method, i.e., development of a crosslinkable polymer optoelectronic material which has excellent solubility before crosslinking and can be formed into a film by a solution processing method, and then the crosslinking groups of whose side chains are initiated under conditions such as illumination and heating to chemically react with each other to form an insoluble and infusible three-dimensional interpenetrating network polymer which has excellent solvent resistance and facilitates subsequent solution processing of a functional layer. The foregoing three methods have been widely used in solution processed O/PLEDs which have excellent light-emitting performance.

Currently, there are many reports on crosslinkable polymer optoelectronic materials, but they all focus on use of polymers modified with conventional crosslinking groups such as perfluorocyclobutane (Adv. Funct. Mater., 2002, 12, 745), styrene (Adv. Mater., 2007, 19, 300), oxetane (Nature, 2003, 421, 829.), siloxane (Acc. Chem. Res., 2005, 38, 632), acrylate (Chem. Mater., 2003, 15, 1491), benzocyclobutene (Chem. Mater., 2007, 19, 4827.). These crosslinking groups can undergo chemical crosslinking reaction by heating, illumination, etc., to form an insoluble and infusible interpenetrating network polymer film which has excellent solvent resistance and can avoid problems of interface miscibility, interface corrosion, etc (TW201406810A, U.S. Pat. No. 7,592,414B2).

However, the performance, especially the device lifetime, of solution processed OLEDs based on these crosslinking groups have yet to be improved. New high-performance crosslinkable polymer charge transporting materials are in urgent need of development.

SUMMARY

A mixture that can undergo a Diels-Alder reaction includes a polymer (I) and a polymer (II), wherein the polymer (I) and the polymer (II) have structures as follows:

Polymer (I)

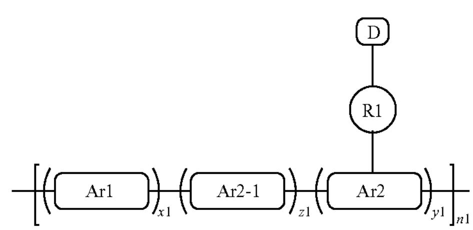

-continued

Polymer (II)

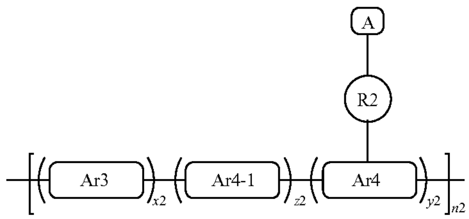

wherein x1, y1, x2, y2, z1, and z2 are molar percentages; $x1>0$, $x2>0$, $y1>0$, $y2>0$, $z1\geq 0$, $z2\geq 0$;

$$x1+y1+z1=1,\ x2+y2+z2=1;$$

Ar1, Ar2, Ar2-1, Ar3, Ar4 and Ar4-1 are each independently selected from an aryl group containing 5 to 40 ring atoms or a heteroaryl group containing 5 to 40 ring atoms;

R1 and R2 are each independently a linking group;

D is a conjugated diene functional group, A is a dienophile functional group;

n1 is greater than 0, and n2 is greater than 0.

A polymer film is formed by the foregoing mixture that can undergo a Diels-Alder reaction after undergoing the Diels-Alder reaction.

A mixture includes the foregoing mixture that can undergo a Diels-Alder reaction, and an organic functional material selected from the group consisting of a hole injection material, a hole transporting material, an electron transporting material, an electron injection material, an electron blocking material, a hole blocking material, a light-emitting material, and a host material.

A formulation includes the foregoing mixture that can undergo a Diels-Alder reaction, and an organic solvent.

An organic electronic device includes the foregoing mixture that can undergo a Diels-Alder reaction, or the foregoing mixture, or prepared from the foregoing formulation.

The foregoing mixture that can undergo a Diels-Alder reaction has the following advantages:

(1) The crosslinkable polymer in the mixture constructed based on a Diels-Alder reaction according to the present disclosure, the conjugated backbone structure gives rich optical (photoluminescence, electroluminescence, photovoltaic effect, etc.) properties, and electrical (semiconductor property, carrier transporting property, etc.) properties to the polymer, the conjugated diene functional groups D and the dienophile functional groups A on the side chain undergo a Diels-Alder reaction under heating or acid catalysis and form a three-dimensional insoluble and infusible interpenetrating network polymer film, it has excellent solvent resistance. In the preparation of complicated multilayer optoelectronic devices, the solution processing properties of the conjugated polymer can be utilized to prepare polymer optoelectronic devices by solution processing such as by inkjet printing, screen printing, spin coating, etc; the polymer can form an insoluble and infusible three-dimensional interpenetrating network polymer film by a way of crosslinking, and has excellent solvent resistance which facilitates the solution processing of multilayer polymer optoelectronic devices.

(2) Compared with conventional crosslinkable polymer optoelectronic materials, the conjugated diene functional groups D and the dienophile functional groups A on the side chain of the crosslinkable polymer in the mixture constructed based on a Diels-Alder reaction according to the present disclosure requires a low temperature and short time for undergoing the Diels-Alder reaction, and has a good crosslinking effect. At a cross-linking temperature between 80 to 160° C., preferably 100° C., an insoluble and infusible three-dimensional interpenetrating polymer film can be obtained in 1 minute.

(3) Compared with conventional crosslinkable polymer optoelectronic materials, the crosslinkable polymer in the mixture constructed based on a Diels-Alder reaction according to the present disclosure doesn't need additive in crosslinking reaction. The Diels-Alder reaction of the conjugated diene functional groups D and the dienophile functional groups A can be initiated to crosslink the polymer by heating.

(4) Compared with conventional crosslinkable polymer optoelectronic materials, since the conjugated diene functional groups D and the dienophilic functional groups A on the side chain of the crosslinkable polymer in the mixture constructed based on a Diels-Alder reaction according to the present disclosure can undergo the Diels-Alder reaction at certain temperature, and because of the reversity of the Diels-Alder reaction, it is easier for the reverse reaction to take place at another temperature, particularly at high temperature, the reaction of addition without dissociation into a diene component and a dienophile component can take place. Therefore, the polymer containing the conjugated diene functional groups D and the dienophile functional groups A is a kind of self-repairing material with commercial application prospects. Currently, the most researched self-repairing material is obtained by the reaction between furan and maleimide. This self-repairing material is expected to be used in flexible OLED devices.

BRIEF DESCRIPTION OF THE DRAWINGS

In order to better illustrate the technical solutions in the embodiments of the present disclosure or the prior art, the accompanying drawings used in the embodiments or the prior art description are briefly described below. Obviously, the drawings in the following description are only several embodiments of the present disclosure, while it will be understood that other drawings may be obtained according to these drawings without any inventive step for those skilled in the art.

DETAILED DESCRIPTION OF THE INVENTION

Figure 1:
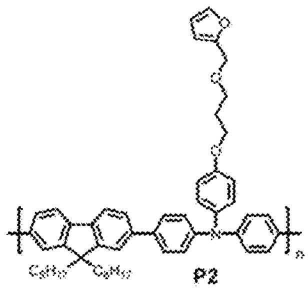
FIG. 1 shows the chemical structure of the polymer P2 containing a conjugated diene functional group and small molecular crosslinking agent containing a dienophile M1, M2, M3 used in the solvent resistance test.
Figure 2:
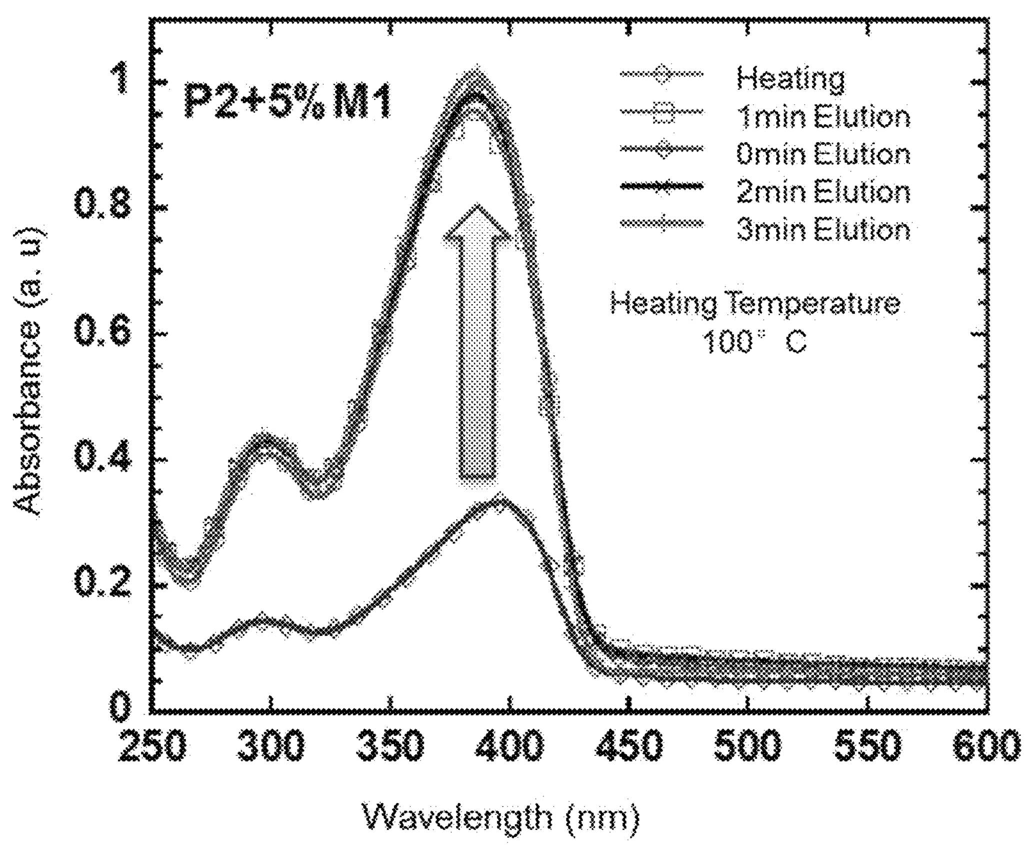
FIG. 2 is a graph showing changes in absorbance curve before and after elution with the toluene solution of the film made from the polymer P2 prepared in Example 2 doped with 5% (molar ratio of functional groups) of the small molecular crosslinking agent M1 containing a dienophile before and after heating (100° C.) crosslinking treatment for 0 to 3 minutes; results shows that when the polymer P2 was not heat-treated, the absorbance of the polymer film eluted with toluene was only maintained at about 20%, and most of the polymer P2 was washed away by the toluene solution and had no solvent resistance. After heated for 1 minute, the absorbance of the polymer P2 was slowly decreased after elution with the toluene solution, and was maintained at 80% of the original absorbance, the solvent resistance property gradually increased. When heated for 3 minutes, the absorbance of the polymer P2 eluted with toluene was basically maintained unchanged, indicating that the polymer P2 has excellent solvent resistance after crosslinking.
Figure 3:
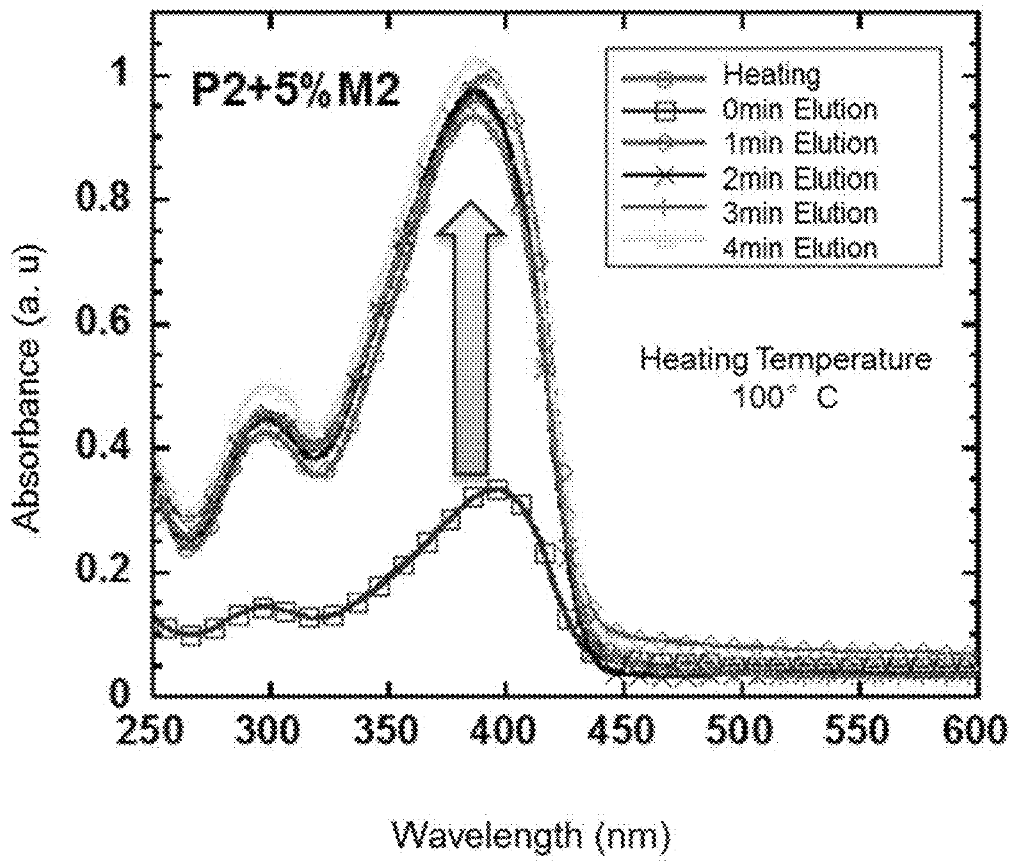
FIG. 3 is a graph showing changes in absorbance curve before and after elution with the toluene solution of the film made from the polymer P2 prepared in Example 2 doped with 5% (molar ratio of functional groups) of the small molecular crosslinking agent M2 containing a dienophile before and after heating (100° C.) crosslinking treatment for 0 to 3 minutes ; results shows that when heated for 3 minutes, the absorbance of the polymer P2 eluted with toluene was basically maintained unchanged, indicating that the polymer P2 has excellent solvent resistance after cross-linking.
Figure 4:
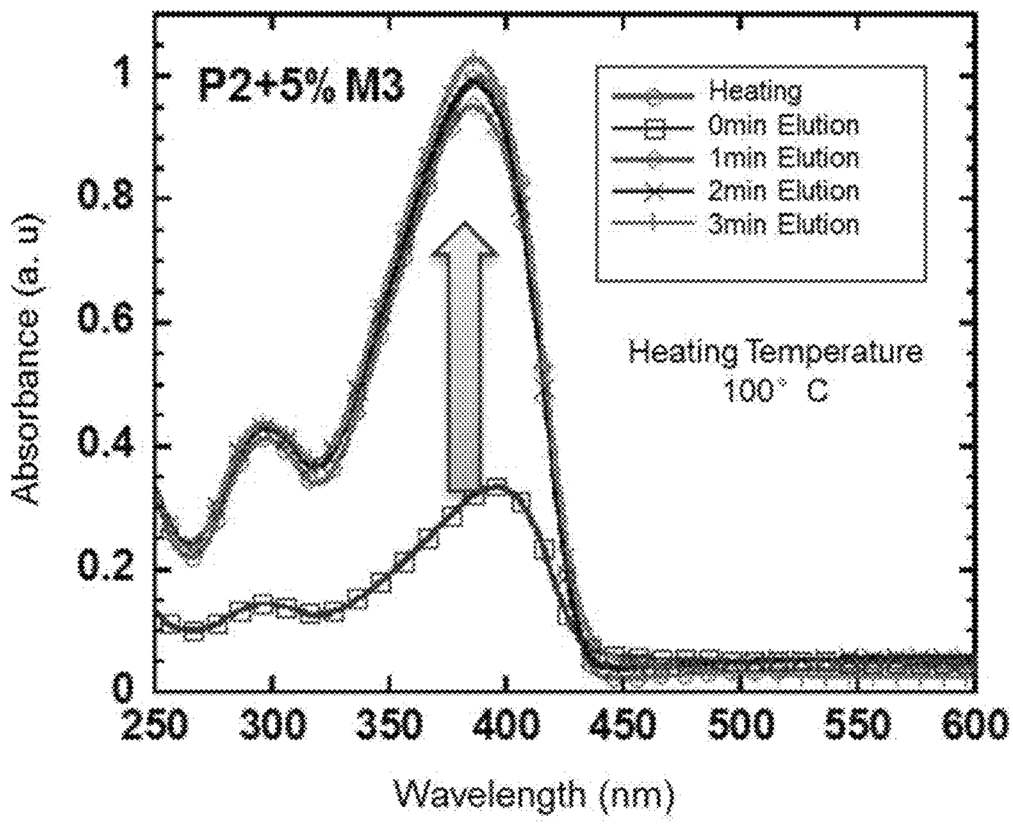
FIG. 4 is a graph showing changes in absorbance curve before and after elution with the toluene solution of the film made from the polymer P2 prepared in Example 2 doped with 5% (molar ratio of functional groups) of the small molecular crosslinking agent M3 containing a dienophile before and after heating (100° C.) crosslinking treatment for 0 to 3 minutes; results shows that when heated for 3 minutes, the absorbance of the polymer P2 eluted with toluene was basically maintained unchanged, indicating that the polymer P2 has excellent solvent resistance after crosslinking.
Figure 5:
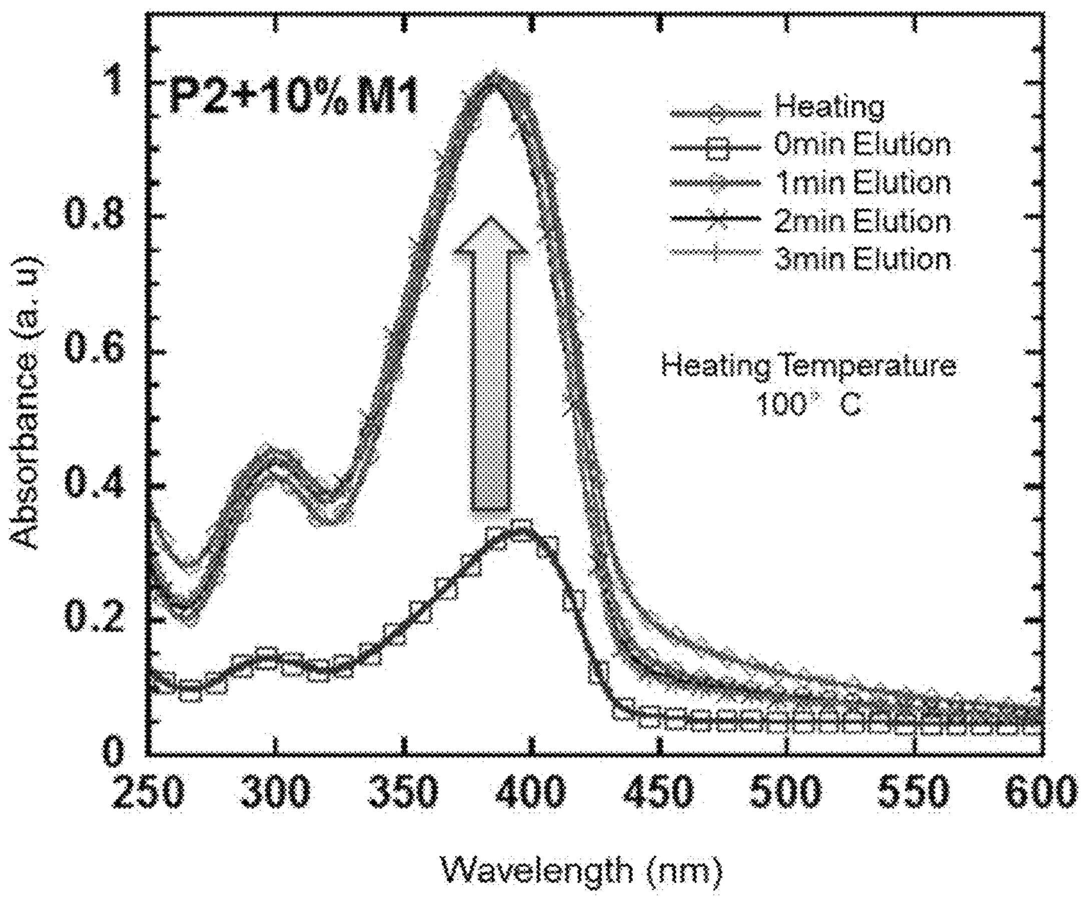
FIG. 5 is a graph showing changes in absorbance curve before and after elution with the toluene solution of the film made from the polymer P2 prepared in Example 2 doped with 10% (molar ratio of functional groups) of the small molecular crosslinking agent M1 containing a dienophile before and after heating (100° C.) crosslinking treatment for 0 to 3 minutes; results shows that when heated for 1 minute, the absorbance of the polymer P2 eluted with toluene was basically maintained unchanged, indicating that the polymer P2 has excellent solvent resistance after crosslinking.
Figure 6:
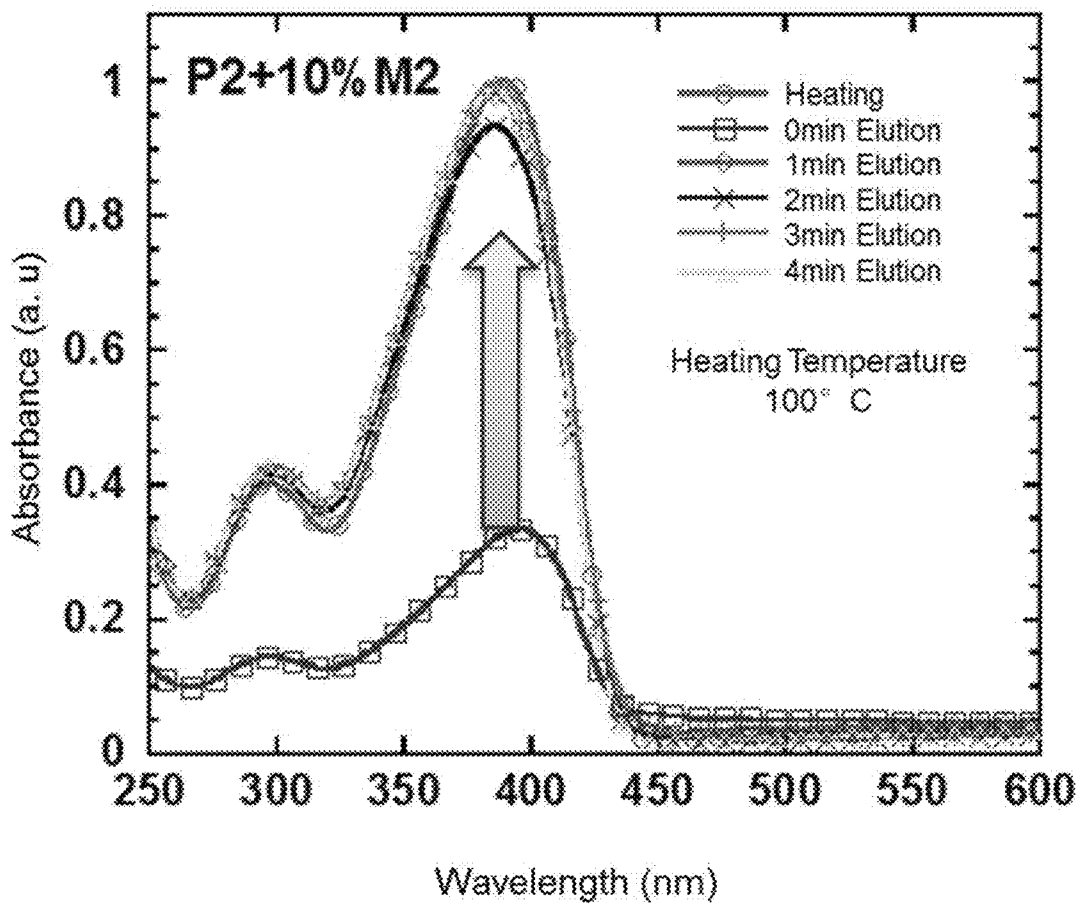
FIG. 6 is a graph showing changes in absorbance curve before and after elution with the toluene solution of the film made from the polymer P2 prepared in Example 2 doped with 10% (molar ratio of functional groups) of the small molecular crosslinking agent M2 containing a dienophile before and after heating (100° C.) crosslinking treatment for 0 to 3 minutes; results shows that when heated for 1 minute, the absorbance of the polymer P2 eluted with toluene was basically maintained unchanged, indicating that the polymer P2 has excellent solvent resistance after crosslinking.
Figure 7:
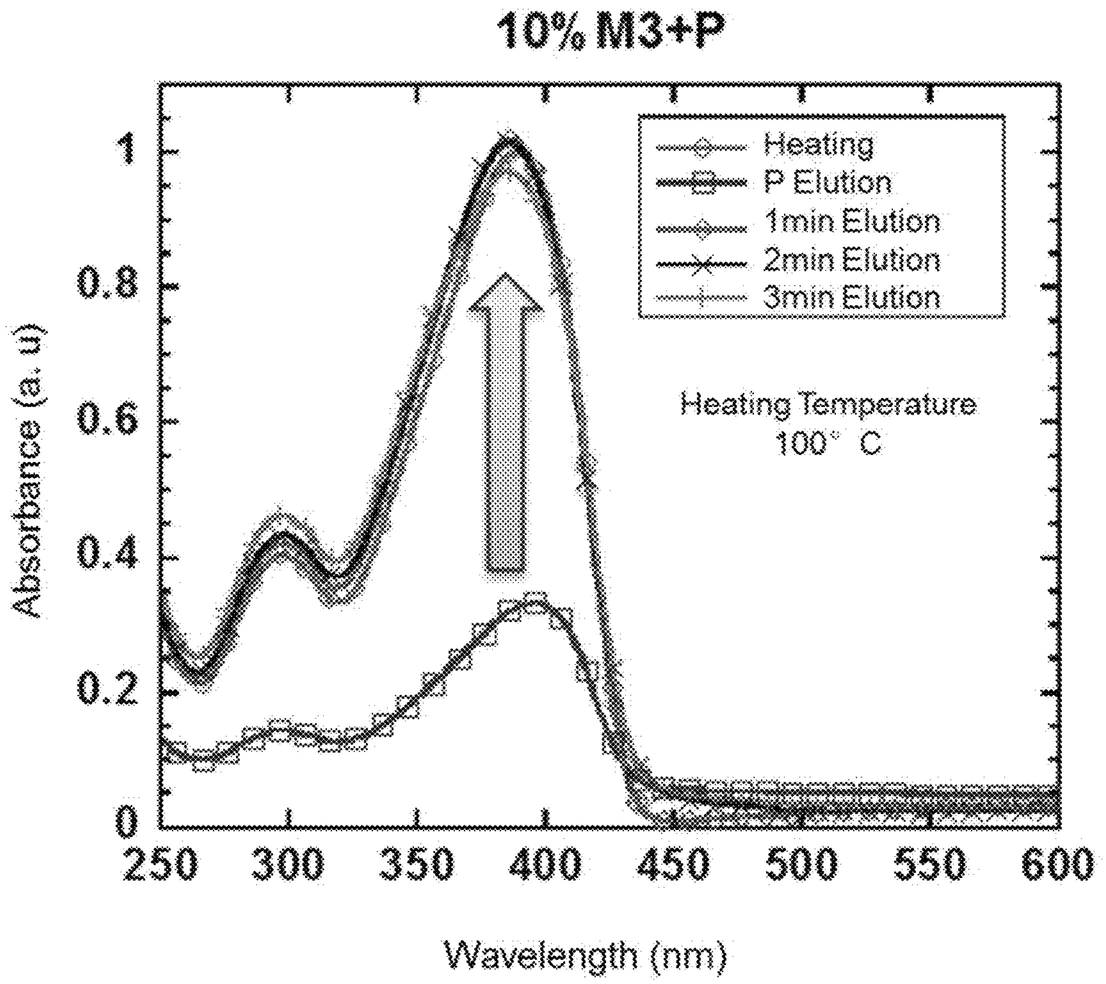
FIG. 7 is a graph showing changes in absorbance curve before and after elution with the toluene solution of the film made from the polymer P2 prepared in Example 2 doped with 10% (molar ratio of functional groups) of the small molecular crosslinking agent M1 containing a dienophile before and after heating (100° C.) crosslinking treatment for 0 to 3 minutes; results shows that when heated for 1 minute, the absorbance of the polymer P2 eluted with toluene was basically maintained unchanged, indicating that the polymer P2 has excellent solvent resistance after crosslinking.
Figure 8:
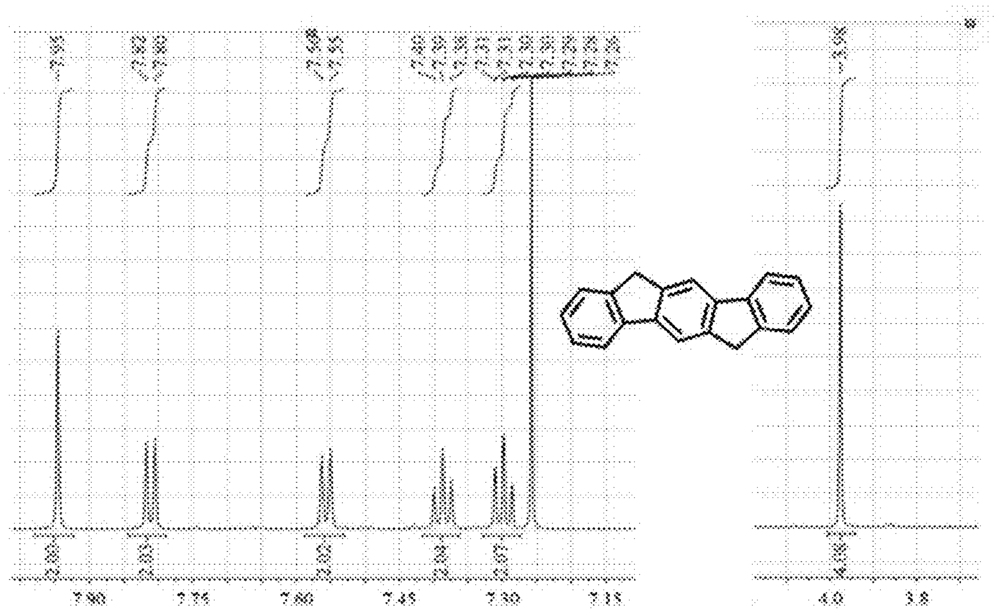
FIG. 8 is a $^1$H NMR of the key intermediate indenofluorene.
Figure 9:
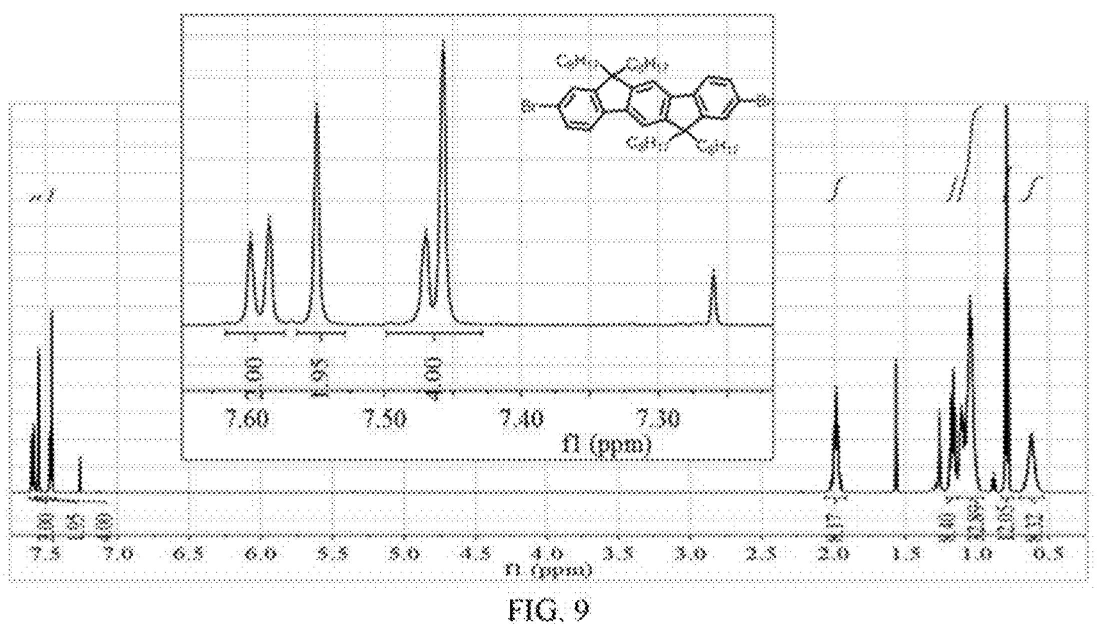
FIG. 9 is a $^1$H NMR of 2,7-dibromo-6,6,12,12-tetraoctyl-indenofluorene.

The present disclosure provides a crosslinkable mixture constructed based on a Diels-Alder reaction and use thereof. The conjugated polymer material in the mixture has a conjugated backbone structure and a functional side chain of the conjugated diene functional group and a dienophile functional group. In order to make the purpose, technical solution and effects of the present disclosure clearer and more specific, the present disclosure will be further described in detail below. It should be understood that the specific embodiments described herein are only to explain the disclosure and not to limit the disclosure.

In the present disclosure, the host material and the matrix material, Host and Matrix have the same meaning and are interchangeable.

In the present disclosure, the metal organic clathrate, the metal organic complex, the organometallic complex, and the metal complex have the same meaning and are interchangeable.

In the present disclosure, the formulation, the printing ink, the ink, and the inks have the same meaning and are interchangeably.

In the present disclosure, “optionally further substituted” means that it may be substituted or may not be substituted. For example, “D is optionally substituted by an alkyl group” means D may be substituted by an alkyl group or may not be substituted by an alkyl group.

Technical solution of the disclosure is described below.

A mixture that can undergo a Diels-Alder reaction includes a polymer (I) and a polymer (II), wherein the polymer (I) and the polymer (II) have structures as follows:

Polymer (I)

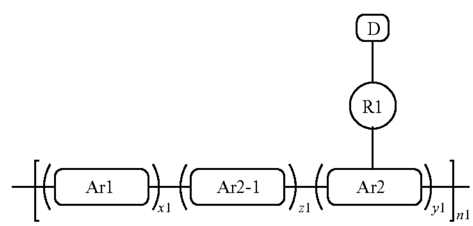

Polymer (II)

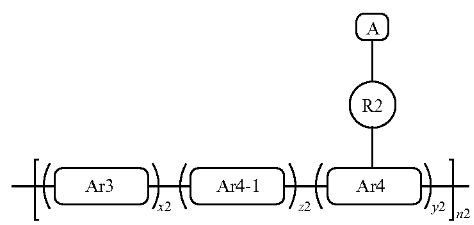

wherein x1, y1, x2, y2, z1, and z2 are molar percentages; $x1>0$, $x2>0$, $y1>0$, $y2>0$, $z1\geq 0$, $z2\geq 0$;

$$x1+y1+z1=1,\ x2+y2+z2=1;$$

Ar1, Ar2, Ar2-1, Ar3, Ar4, and Ar4-1 are each independently selected from an aryl group containing 5 to 40 ring atoms or a heteroaryl group containing 5 to 40 ring atoms;

R1 and R2 are each independently a linking group;

D is a conjugated diene functional group, A is a dienophile functional group.

In an embodiment, the foregoing mixture includes a polymer (III) and a polymer (IV), wherein the polymer (III) and the polymer (IV) have structures as follows:

Polymer (III)

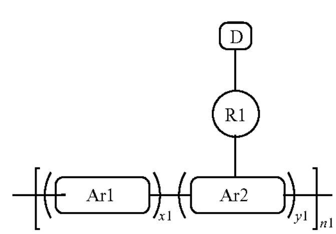

-continued

Polymer (IV)

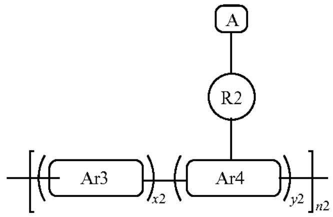

wherein x1, y1, x2, y2 are molar percentages, x1+y1=1, x2+y2=1,

Ar1, Ar2, Ar3, and Ar4, are same or different in multiple occurrences and selected from aryl groups containing 5 to 40 ring atoms or heteroaryl groups containing 5 to 40 ring atoms;

R1 and R2 are linking groups and same or different in multiple occurrences;

D is a conjugated diene functional group, A is a dienophile functional group.

The present disclosure relates to small molecular materials or polymer materials.

The term "small molecule" as defined herein refers to a molecule that is not a polymer, oligomer, dendrimer, or blend. In particular, there is no repeat unit in small molecules. The small molecule has a molecular weight less than or equal to 3000 g/mol, preferably further less than or equal to 2000 g/mol, and still further less than or equal to 1500 g/mol.

Polymer includes homopolymer, copolymer, and block copolymer. In addition, in the present disclosure, polymer also includes dendrimer. The synthesis and application of dendrimers are described in Dendrimers and Dendrons, Wiley-VCH Verlag GmbH & Co. KGaA, 2002, Ed. George R. Newkome, Charles N. Moorefield, Fritz Vogtle.

Conjugated polymer is a polymer whose backbone is primarily composed of the sp2 hybrid orbital of C atoms. Taking polyacetylene and poly (phenylene vinylene) as examples, the C atoms in the backbones of which may also be substituted by other non-C atoms, and which are still considered to be conjugated polymers when the sp2 hybridization in the backbones is interrupted by some natural defects. In addition, the conjugated polymer in the present disclosure may also include aryl amine, aryl phosphine and other heteroaromatics, organometallic complexes, and the like in the backbone.

In the present disclosure, the high polymer, and the polymer have the same meaning and are interchangeable.

In some embodiments, the polymer according to the present disclosure has a molecular weight Mw≥10000 g/mol, further Mw≥50000 g/mol, still further Mw≥100,000 g/mol, and even further Mw≥200,000 g/mol.

In an embodiment, Ar1, Ar2, Ar3, and Ar4 are each independently selected from the group consisting of an aromatic ring system containing 5 to 35 ring atoms or a heteroaromatic ring system containing 5 to 35 ring atoms; in an embodiment, Ar1, Ar2, Ar3, and Ar4 are each independently selected from an aromatic ring system containing 5 to 30 ring atoms or a heteroaromatic ring system containing 5 to 30 ring atoms; in an embodiment, Ar1, Ar2, Ar3, and Ar4 are each independently selected from an aromatic ring system containing 5 to 20 ring atoms or a heteroaromatic ring system containing 5 to 20 ring atoms; in an embodiment, Ar1, Ar2, Ar3, and Ar4 are each independently selected from an aromatic ring system containing 6 to 10 ring atoms or a heteroaromatic ring system containing 6 to 10 ring atoms.

In an embodiment, the aromatic ring system contains 5 to 15 ring atoms in the ring system, and in an embodiment, the aromatic ring system contains 5 to 10 ring atoms in the ring system. In an embodiment, the heteroaromatic ring system contains 2 to 15 carbon atoms, and at least one heteroatom in the ring system, provided that the total number of carbon atoms and heteroatoms is at least 4; in an embodiment, the heteroaromatic ring system contains 2 to 10 carbon atoms, and at least one heteroatom in the ring system, provided that the total number of carbon atoms and heteroatoms is at least 4. The heteroatom is particularly selected from Si, N, P, O, S and/or Ge, especially selected from Si, N, P, O and/or S, and even more particularly selected from N, O or S.

The foregoing aromatic ring system or aryl group refers to a hydrocarbonyl group containing at least one aromatic ring, including a monocyclic group and a polycyclic ring system. The foregoing heteroaromatic ring system or heteroaryl group refers to a hydrocarbonyl group containing at least one heteroaromatic ring (containing a heteroatom), including a monocyclic group and a polycyclic ring system. These polycyclic rings may have two or more rings where two carbon atoms are shared by two adjacent rings, i.e., a fused ring. At least one of ring system in polycyclic ring systems is aromatic or heteroaromatic. For the purpose of the present disclosure, the aromatic or heteroaromatic ring system not only includes a system of an aryl or heteroaryl group, but also has a plurality of aryl or heteroaryl groups spaced by short nonaromatic units (<10% of non-H atoms and preferably <5% of non-H atoms, such as C, N or O atoms). Thus, systems such as 9,9'-spirobifluorene, 9,9-diarylfluorene, triarylamine and diaryl ether are considered to be aromatic ring systems for the purpose of this disclosure.

Specifically, examples of the aromatic group are benzene, naphthalene, anthracene, phenanthrene, perylene, tetracene, pyrene, benzopyrene, triphenylene, acenaphthene, fluorene, spirofluorene, and derivatives thereof.

Specifically, examples of the heteroaryl group are furan, benzofuran, dibenzofuran, thiophene, benzothiophene, dibenzothiophene, pyrrole, pyrazole, triazole, imidazole, oxazole, oxadiazole, thiazole, tetrazole, indole, carbazole, pyrroloimidazole, pyrrolopyrrole, thienopyrrole, thienothiophene, furopyrrole, furofuran, thienofuran, benzisoxazole, benzisothiazole, benzimidazole, pyridine, pyrazine, pyridazine, pyrimidine, triazine, quinoline, isoquinoline, cinnoline, quinoxaline, phenanthridine, primidine, quinazoline, quinazolinone, and derivatives thereof.

In an embodiment, Ar1 and Ar2 are selected from aromatic ring systems containing 6 to 20 ring atoms, in one embodiment, Ar1 and Ar2 are selected from aromatic ring systems containing 6 to 15 ring atoms, in one embodiment, Ar1 and Ar2 are selected from aromatic ring systems containing 6 to 10 ring atoms.

In some embodiments, Ar1, Ar2, Ar3, and Ar4 may be further selected from the following structural groups:

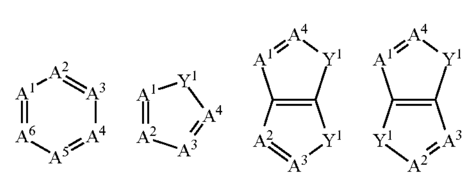

-continued

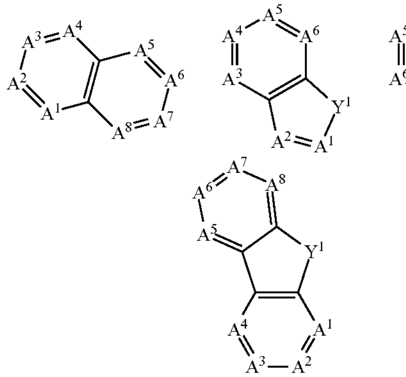

wherein $A^1$, $A^2$, $A^3$, $A^4$, $A^5$, $A^6$, $A^7$, $A^8$ independently represent $CR^5$ or N;

$Y^1$ is selected from $CR^6R^7$, $SiR^8R^9$, $NR^{10}$, C(═O), S or O;

$R^5$ to $R^{10}$ are each selected from the group consisting of H, D, or a linear alkyl group containing 1 to 20 C atoms, or an alkoxy group containing 1 to 20 C atoms, or a thioalkoxy group containing 1 to 20 C atoms, or a branched alkyl group containing 3 to 20 C atoms, or a cyclic alkyl group containing 3 to 20 C atoms, or an alkoxy containing 3 to 20 C atoms, or a thioalkoxy group containing 3 to 20 C atoms, or a silyl group, or a substituted keto group containing 1 to 20 C atoms, or an alkoxycarbonyl group containing 2 to 20 C atoms, or an aryloxycarbonyl group containing 7 to 20 C atom, a cyano group (—CN), a carbamoyl group (—C(═O)$NH_2$), a haloformyl group (—C(═O)—X, wherein X represents a halogen atom), a formyl group (—C(═O)—H), an isocyano group, an isocyanate, a thiocyanate group or an isothiocyanate group, a hydroxyl group, a nitro group, $CF_3$, Cl, Br, F, a crosslinkable group, or a substituted or unsubstituted aromatic ring system containing 5 to 40 ring atoms or substituted or unsubstituted heteroaromatic ring system containing 5 to 40 ring atoms, or an aryloxy group containing 5 to 40 ring atoms or heteroaryloxy group containing 5 to 40 ring atoms, wherein one or more of groups $R^5$ to $R^{10}$ may form a monocyclic or polycyclic aliphatic or aromatic ring with each other and/or with the ring bonded to the groups.

In an embodiment, Ar1, Ar2, Ar3, and Ar4 may be further selected from the following structural groups, wherein H in the rings may be optionally substituted:

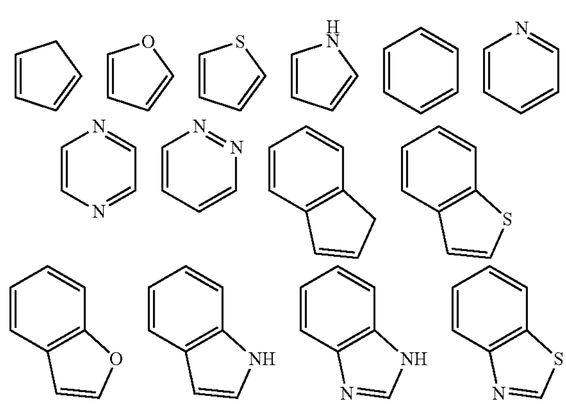

-continued

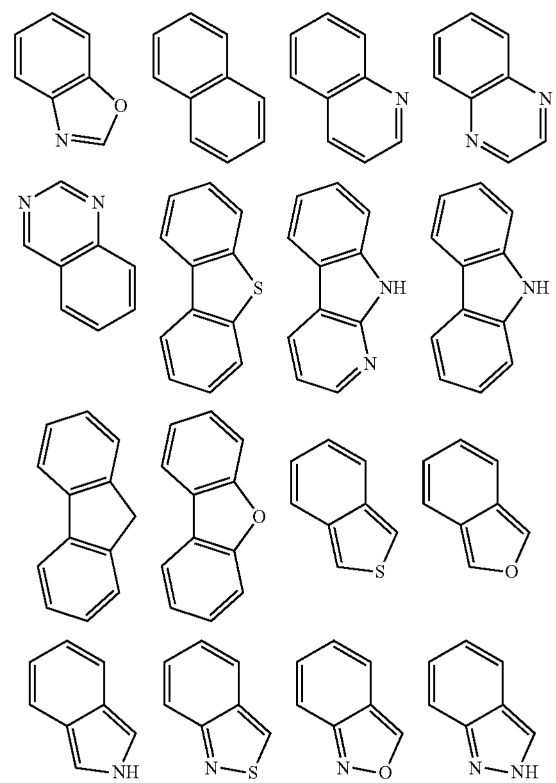

In an embodiment, Ar1, Ar2, Ar3, and Ar4 in the foregoing mixture may be same or different in multiple occurrences, and selected from aromatic ring groups or heteroaromatic ring groups. The aromatic ring group includes benzene, biphenyl, triphenyl, benzo, fluorene, indenofluorene, and derivatives thereof; the heteroaromatic ring group inlcudes triphenylamine, dibenzothiophene, dibenzofuran, dibenzoselenophen, furan, thiophene, benzofuran, benzothiophene, benzoselenophene, carbazole, indolocarbazole, indolopyridine, pyrrolopyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazin, oxadiazine, indole, benzimidazole, indazole, benzoxazole, bisbenzoxazole, isoxazole, benzothiazole, quinoline, isoquinoline, cinnoline, quinazoline, quinoxaline, naphthalene, phthalein, pteridine, xanthene, acridine, phenazine, phenothiazine, phenoxazine, benzofuropyridine, furodipyridine, benzothienopyridine, thienodipyridine, benzoselenophenopyridine, and selenophenodipyridine.

In an embodiment, Ar1, Ar2, Ar2-1, Ar3, Ar4, and Ar4-1 are same or different in multiple occurrences, and include the following structural groups:

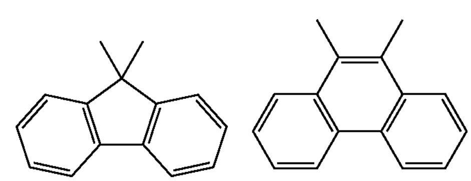

-continued
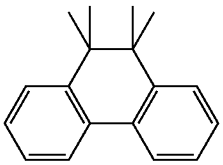
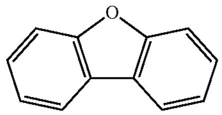
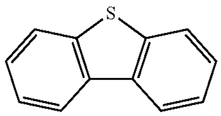
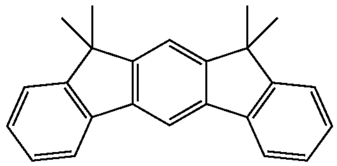
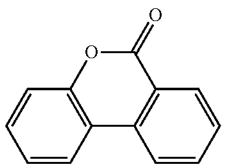
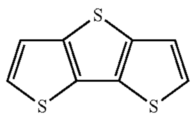
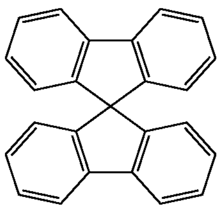
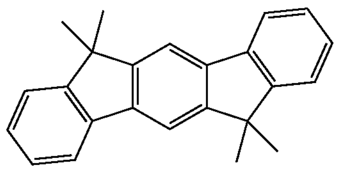
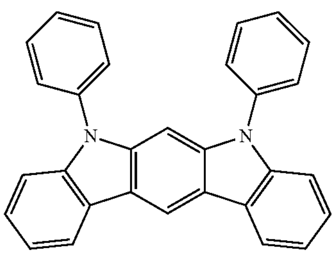
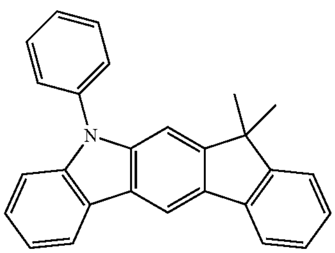
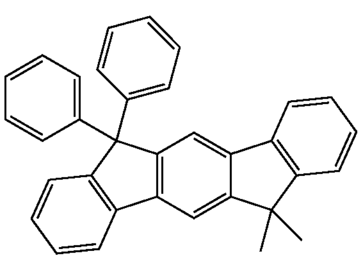
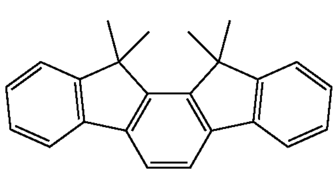
-continued
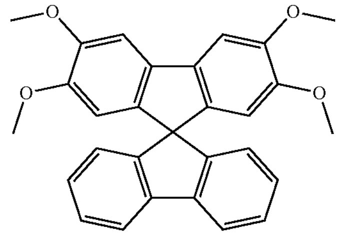
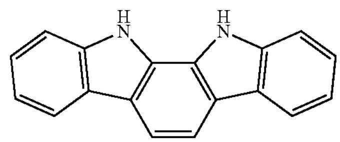
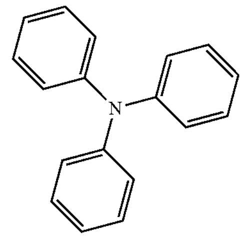
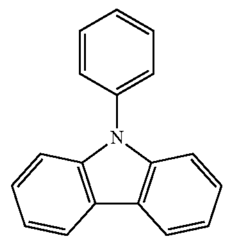
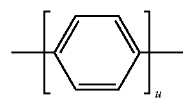
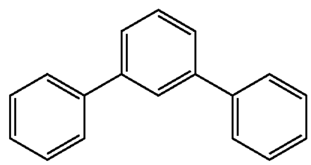
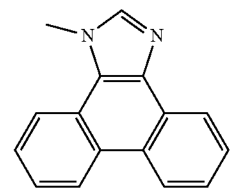
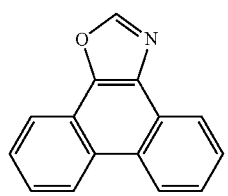
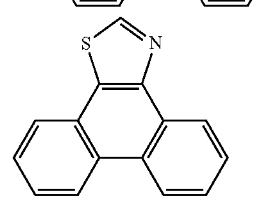
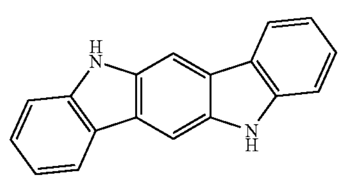
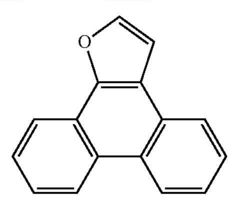
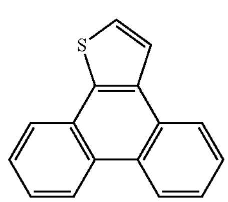
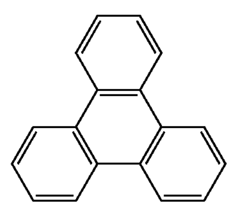
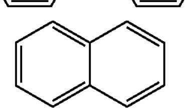
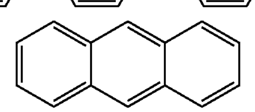
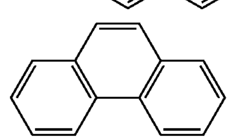
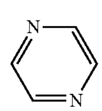
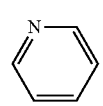
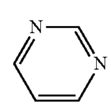

-continued

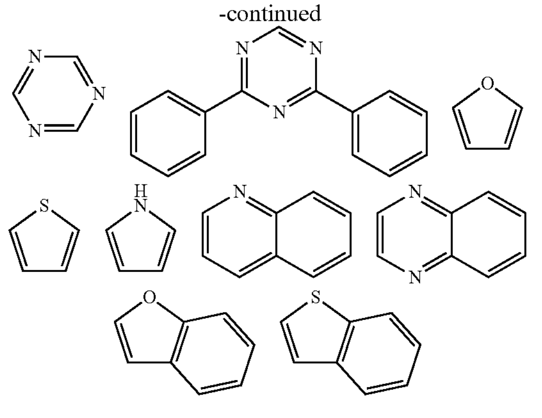

wherein u is 1 or 2 or 3 or 4.

In an embodiment, the cyclic aromatic hydrocarbonyl groups and the heteroaromatic ring groups in Ar1, Ar2, Ar2-1, Ar3, Ar4, and Ar4-1 may be further substituted, and the substituent may be selected from the group consisting of hydrogen, deuterium, alkyl, alkoxy, amino, alkenyl, alkynyl, aralkyl, heteroalkyl, aryl and heteroaryl.

Generally, the conjugated polymer includes at least one backbone structural unit. The backbone structural unit generally has a π-conjugated structural unit with larger energy gap, and it is also called a backbone unit which may be selected from monocyclic or polycyclic aryl or heteroaryl. In the present disclosure, the conjugated polymer may include two or more backbone structural units. In an embodiment, the backbone structural unit has a content greater than or equal to 40 mol %; in an embodiment, the backbone structural unit has a content greater than or equal to 50 mol %; in an embodiment, the backbone structural unit has a content greater than or equal to 55 mol %; in an embodiment, the backbone structural unit has a content greater than or equal to 60 mol %.

In an embodiment, Ar1 and Ar3 in the foregoing mixture are polymer backbone structural units selected from benzene, biphenyl, triphenyl, benzo, fluorene, indenofluorene, carbazole, indolecarbazole, dibenzosilole, dithienocyclopentadiene, dithienosilole, thiophene, anthracene, naphthalene, benzodithiophene, benzofuran, benzothiophene, benzoselenophene, and derivatives thereof.

In a high molecule chain having a branched (side chain) structure, a chain having the largest number of links or a chain having the largest number of repeating units is called a polymer backbone.

In an embodiment, the polymer I or polymer II in the foregoing mixture has a hole transporting property, in an embodiment, the polymer III or polymer IV in the foregoing mixture has a hole transporting property, in an embodiment, both the polymer I and polymer II in the foregoing mixture have a hole transporting property, in an embodiment, both the polymer III and polymer IV in the foregoing mixture have hole transporting property.

In an embodiment, Ar2 or Ar4 in the foregoing mixture is selected from units having a hole transporting property, and in one embodiment, both Ar2 and Ar4 in the foregoing mixture are selected from units having a hole transporting property.

The hole transporting unit is particularly selected from the group consisting of aryl amine, triphenylamine, naphthylamine, thiophene, carbazole, dibenzothiophene, dithienocyclopentadiene, dithienothiol, dibenzoselenophene, furan, thiophene, benzofuran, benzothiophene, benzoselenophene, carbazole, indolocarbazole, and derivatives thereof.

In an embodiment, Ar2 or Ar4 has a structure represented by Chemical Formula 1:

Chemical Formula 1

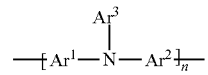

wherein $Ar^1$, $Ar^2$, $Ar^3$ can be same or different in multiple occurrences.

$Ar^1$ is selected from a single bond or a mononuclear or polynuclear aryl or heteroaryl group, the aryl or heteroaryl group can be substituted by other side chain.

$Ar^2$ is selected from a single bond or a polynuclear aryl or heteroaryl group, the aryl or heteroaryl group can be substituted by other side chain.

$Ar^3$ is selected from a single bond or a polynuclear aryl or heteroaryl group, the aryl or heteroaryl group can be substituted by other side chain. $Ar^3$ may also be linked to other parts in Chemical Formula 1 via a bridging group.

n is selected from 1, 2, 3, 4, or 5.

In an embodiment, Ar2 or Ar4 has a structure represented by Chemical Formula 2:

Chemical Formula 2

(a)

(b)

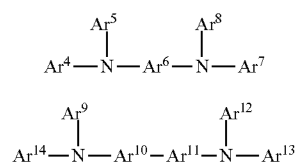

wherein $Ar^4$, $Ar^6$, $Ar^7$, $Ar^{10}$, $Ar^{11}$, $Ar^{13}$, $Ar^{14}$: are defined as $Ar^2$ in Chemical Formula 1, $Ar^5$, $Ar^8$, $Ar^9$, $Ar^{12}$ are defined as $Ar^3$ in Chemical Formula 1.

$Ar^1$ to $Ar^{14}$ in Chemical Formula 1 and Chemical Formula 2 are particularly selected from the following groups: phenylene, naphthalene, anthracen fluorene, spirobifluorene, indenofuorene, phenanthrene, thiophene, pyrrole, carbazole, binaphthalene, and dehydrophenanthrene.

The structural units represented by Chemical Formula 1 and Chemical Formula 2 are selected from the following structures, each compound may be substituted by one or more substituents, and R is a substituent.

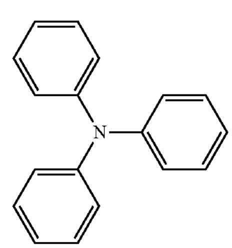

-continued
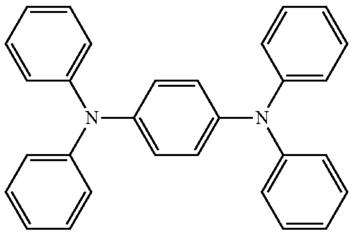
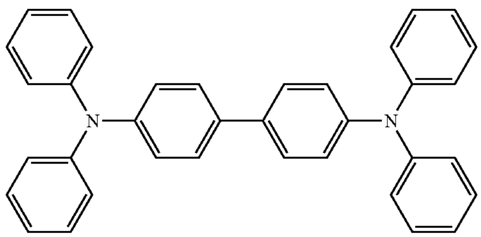
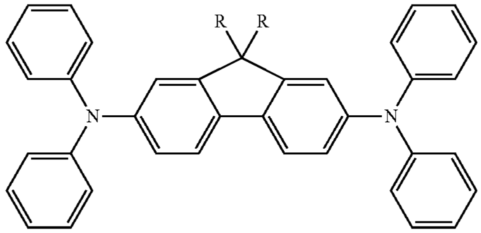
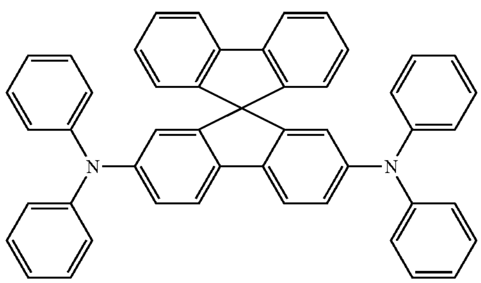
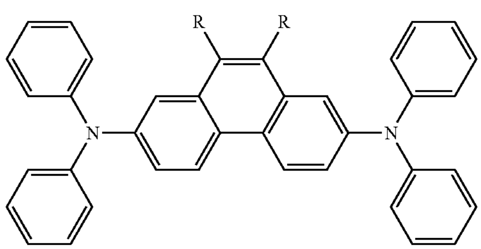
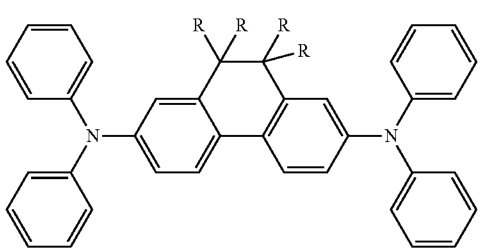
-continued
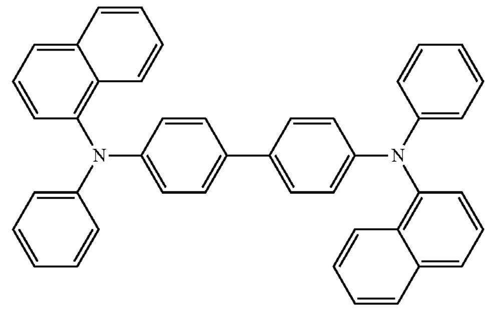
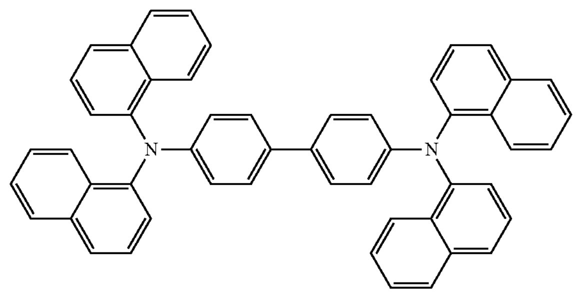
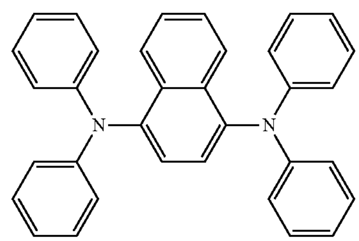
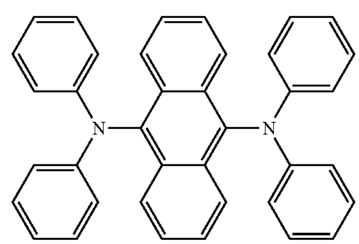
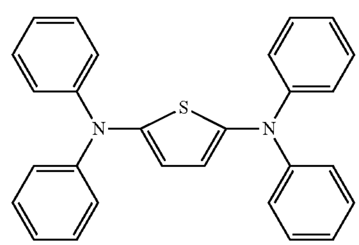

-continued

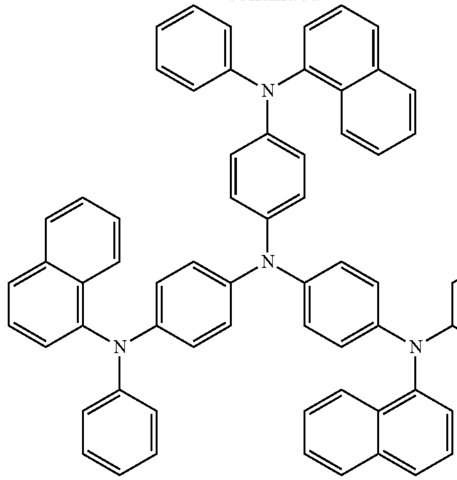

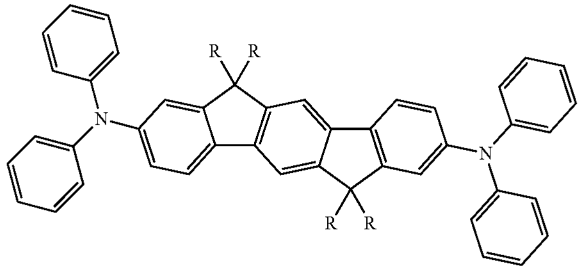

In an embodiment, Ar2 has a structure represented by Chemical Formula 3:

Chemical Formula 3

$$(D^1)_{n1}—(Ar^{15})_{n2}—(D^2)_{n3}—(Ar^{16})_{n4}$$

wherein $D^1$ and $D^2$ can be same or different in multiple occurrences, and they are independently selected from the following functional groups: thiophene, selenophene, thieno[2,3b]thiophene, thieno[3,2b]thiophene, dithienothiophene, pyrrole, and aniline, all of these functional groups may be optionally substituted by the following groups: halogen, —CN, —NC, —NCO, —NCS, —OCN, SCN, C(=O)$NR^0R^{00}$, —C(=O)X, —C(=O)$R^0$, —$NH_2$, —$NR^0R^{00}$, SH, $SR^0$, —$SO_3H$, —$SO_2R^0$, —OH, —$NO_2$, —$CF_3$, —$SF_5$, a silyl or divalent carbyl or hydrocarbyl group containing 1 to 40 C atoms; wherein $R^0$, $R^{00}$ are substituents.

$Ar^{15}$ and $Ar^{16}$ may be same or different in multiple occurrences, and they may be selected from mononuclear or polynuclear aryl or heteroaryl, which may be each optionally fused to the respective adjacent $D^1$ and $D^2$.

n1 to n4 may be independently selected from integers from 0 to 4.

In the material represented by Chemical Formula 3, $Ar^{15}$ and $Ar^{16}$ are selected from phenylene, naphthalene, anthracene, fluorene, spirobifluorene, indenofluorene, phenanthrene, thiophene, pyrrole, carbazole, binaphthalene, and dehydrophenanthrene.

Further suitable units having a hole transporting property correspond to hole transporting materials HTMs. Suitable organic HTM materials may be selected from compounds containing the following structural units: phthlocyanine, porphyrine, amine, aryl amine, triarylamine, thiophene, fused thiophene (such dithienothiophene and dibenzothiphene)), (pyrrole), aniline, carbazole, indolocarbazole, and derivatives thereof.

Examples of cyclic aryl amine-derived compounds that can be used as HIMs include but are not limited to the following general structures:

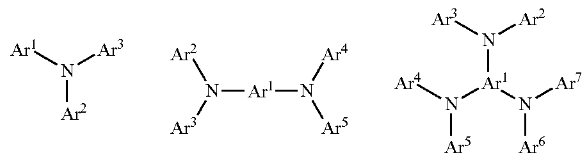

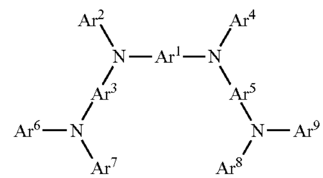

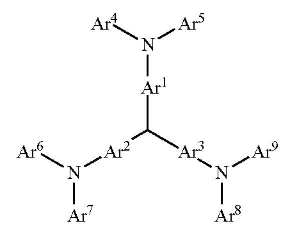

wherein each of $Ar^1$ to $Ar^9$ may be independently a cyclic aromatic hydrocarbonyl group or a heteroaromatic ring group, wherein the cyclic aromatic hydrocarbonyl group is selected from the group consisting of benzene, biphenyl, triphenyl, benzo, naphthalene, anthracene, phenalene, phenanthrene, fluorene, pyrene, chrysene, perylene, and azulene; the heteroaromatic ring group is selected from the group consisting of dibenzothiophene, dibenzofuran, furan, thiophene, benzofuran, benzothiophene, carbazole, pyrazole, imidazole, triazole, isoxazole, thiazole, oxadiazole, oxadiazine, dioxazole, thiadiazole, pyridine, pyridazine, pyrimidine, pyrazine, triazine, oxazine, oxathiazine, oxadiazine, indole, benzimidazole, indazole, benzoxazole, benzoxazole, benzisoxazole, benzothiazole, quinoline, isoquinoline, cinnoline, quinazoline, quinoxaline, naphthalene, phthalein, pteridine, xanthene, acridine, phenazine, phenothiazine, phenoxazine, dibenzoselenophene, benzoselenophene, benzofuropyridine, indolocarbazole, pyridylindole, pyrrolodipyridine, furodipyridine, benzothieopyridine, thienopyridine, benzoselenophenepyridine and selenophenodipyridine; or a group containing 2 to 10 ring structures that may be same or different types of cyclic aromatic hydrocarbonyl groups or heteroaromatic ring groups, and linked each other directly or through at least one of the following groups: an oxygen atom, a nitrogen atom, a sulfur atom, a silicon atom, a phosphorus atom, a boron atom, a chain structure unit, and an aliphatic ring group. Each Ar may be further substituted, and the substituent may be selected from the group consisting of hydrogen, alkyl, alkoxy, amino, alkenyl, alkynyl, aralkyl, heteroalkyl, aryl and heteroaryl.

In one aspect, $Ar^1$ to $Ar^9$ can be independently selected from the groups including the following groups:

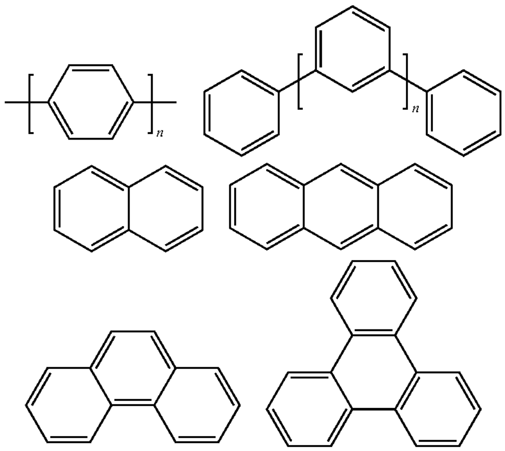

-continued

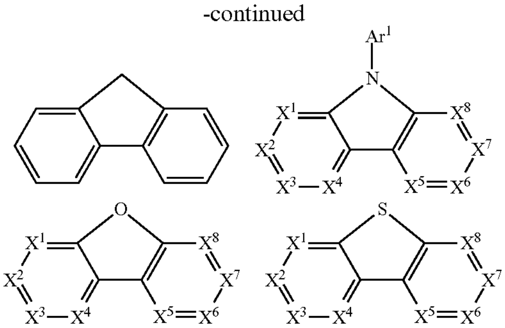

wherein n is an integer from 1 to 20; $X^1$ to $X^8$ are CH or N; $Ar^1$ is as defined above. Additional examples of cyclic aromatic amine-derived compounds can be referred to U.S. Pat. Nos. 3,567,450, 4,720,432, 5,061,569, 3,615,404, and 5,061,569.

Suitable examples that can be used as HTM compounds are listed in the table below:

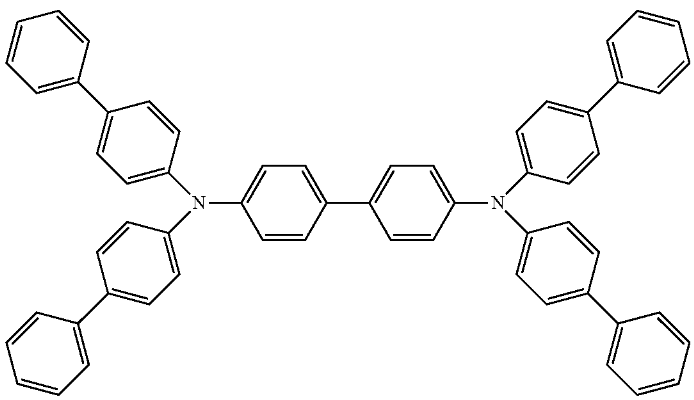

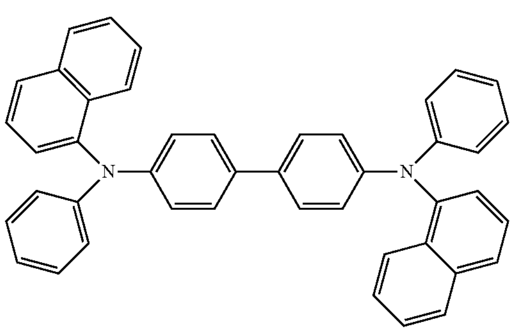

-continued
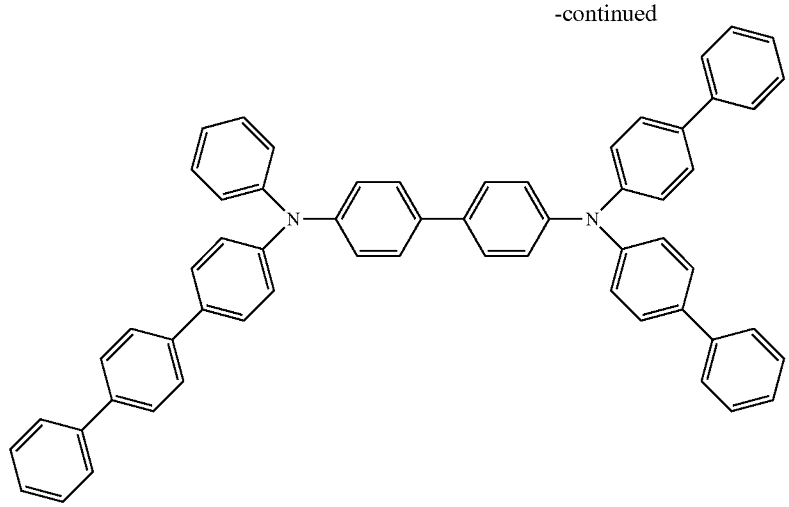
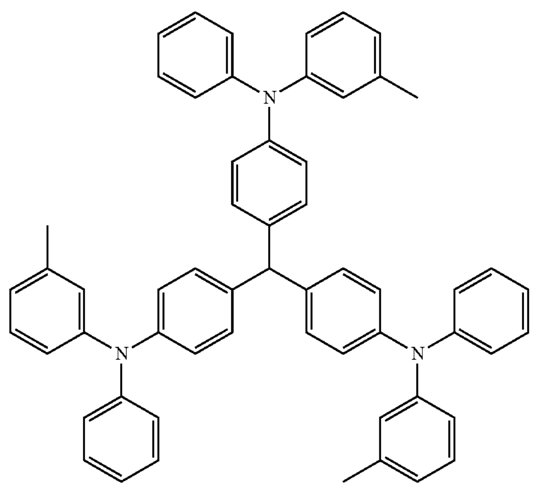
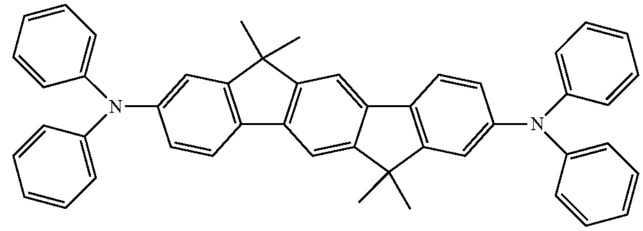
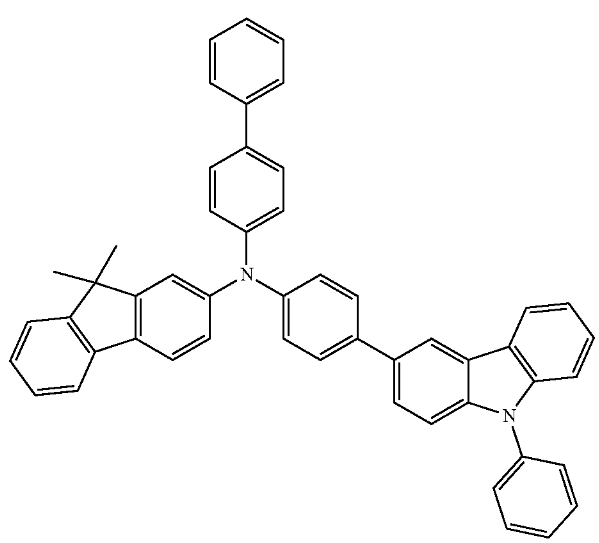
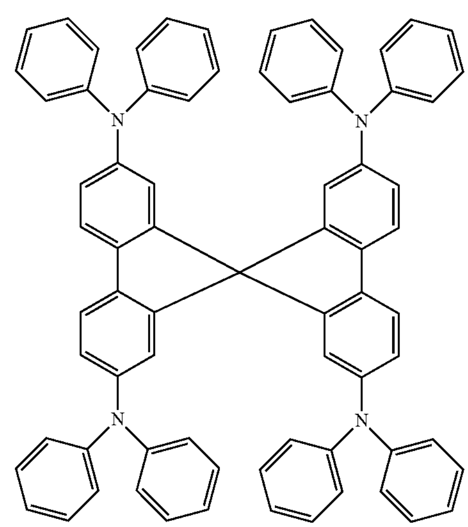

-continued

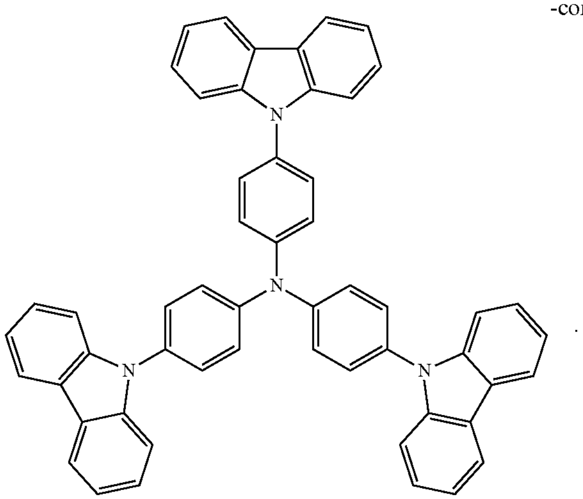

The foregoing HTMs can be incorporated into the polymers I to IV according to the present disclosure as hole transporting structural units.

In an embodiment, the polymer I or II in the foregoing mixture has an electron transporting property; in an embodiment, both of the polymers I and II in the foregoing mixture have an electron transporting property. In an embodiment, the polymer III or IV in the foregoing mixture has an electron transporting property; in an embodiment, both of the polymers III and IV in the foregoing mixture have an electron transporting property.

In an embodiment, Ar2 or Ar4 in the foregoing mixture is selected from units having an electron transporting property; in an embodiment, both of Ar2 and Ar4 are selected from units having an electron transporting property; the electron transporting unit is selected from pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, benzoxazole, bisbenzoxazole, isoxazole, benzothiazole, quinoline, isoquinoline, cinnoline, quinazoline, quinoxaline, naphthalene, phthalein, pteridine, xanthene, acridine, phenazine, phenothiazine, phenoxazine, benzofuropyridine, furodipyridine, benzothienopyridine, thienodipyridine, benzoselenophenopyridine, selenophenodipyridine, and derivatives thereof.

Further suitable units having an electron transporting property correspond to electron transporting materials ETMs. ETM is sometimes called an n-type organic semiconductor material. In principle, suitable examples of ETM materials are not particularly limited, and any metal clathrate or organic compound may be used as an ETM as long as it can transport electrons. Preferred organic ETM material may be selected from tris(8-hydroxyquinoline)aluminum (AlQ3), phenazine, phenanthroline, anthracene, phenanthrene, fluorene, bifluorene, spiro-bifluorene, phenylene-vinylene, triazine, triazole, imidazole, pyrene, perylene, trans-indenofluorene, cis-indenonfluorene, dibenzol-indenofluorene, indenonaphthalene, benzanthracene, and derivatives thereof.

In another aspect, a compound that can be used as an ETM is a molecule including at least one of the following groups:

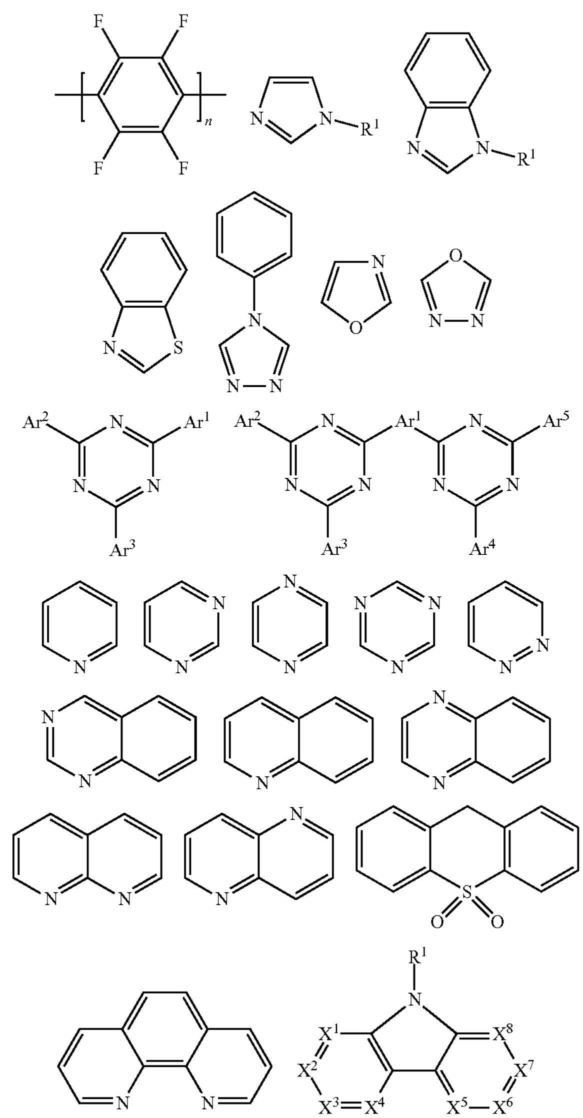

-continued

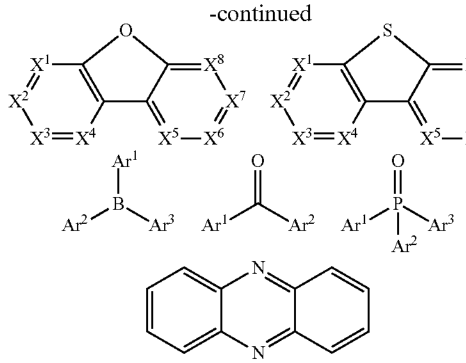

wherein $R^1$ may be selected from the following groups: hydrogen, alkyl, alkoxy, amino, alkene, alkynyl, aralkyl, heteroalkyl, aryl, and heteroaryl, when they are aryl or heteroaryl, they have the same meaning as $Ar^1$ in the foregoing HTM, $Ar^1$ to $Ar^5$ have the same meaning as $Ar^1$ described in HTM, n is an integer from 0 to 20, and $X^1$ to $X^8$ are selected from $CR^1$ or N.

Suitable examples that can be used as ETM compounds are listed in the table below:

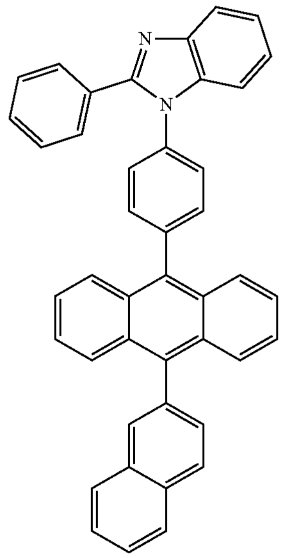

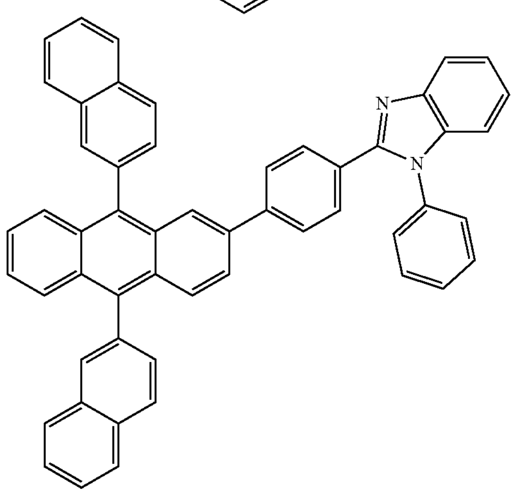

-continued

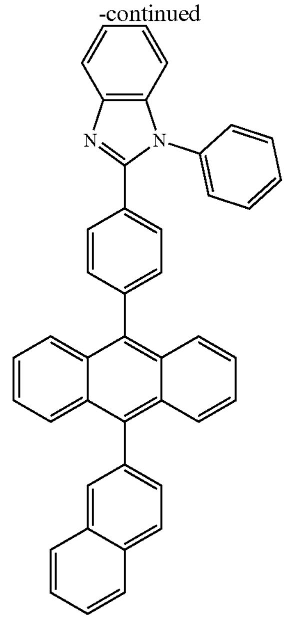

The foregoing ETM can be incorporated into the polymer I or II or III or IV of the foregoing mixture as an electron transporting structural unit.

In an embodiment, the foregoing conjugated polymer I and II in the foregoing mixture have the following general formulas:

Polymer I

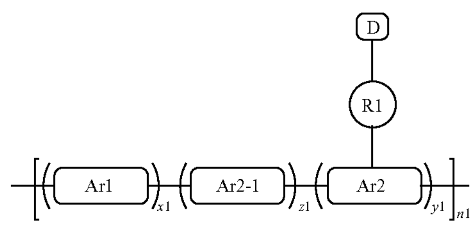

Polymer II

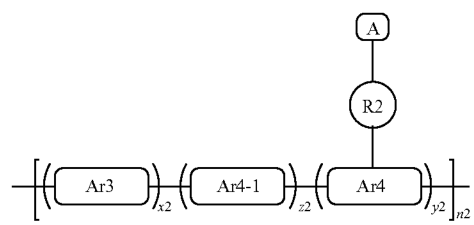

wherein x1, y1, z1, x2, y2, z2 are molar percentages, and x1>0, x2>0, y1>0, y2>0, z1≥0, z2≥0, x1+y1+z1=1, x2+y2+z2=1, Ar2-1 and Ar2 have the same meaning, and Ar4-1 and Ar4 have the same meaning. In an embodiment, the cross-linking group (the conjugated diene functional group) has a content y1 less than or equal to 50 mol %; in an embodiment, the crosslinking group (the conjugated diene functional group) has a content y1 less than or equal to 40 mol %; in an embodiment, the crosslinking group (the conjugated diene functional group) has a content y1 less than or equal to 30 mol %; in an embodiment, the crosslinking group (the conjugated diene functional group) has a content y1 less than or equal to 20 mol %; in an embodiment, the crosslinking group (the dienophile functional group) has a content y2 less than or equal to 50 mol %; in an embodiment, the crosslinking group (the dienophile functional group) has a content y2 less than or equal to 40 mol %; in an embodiment, the crosslinking group (the dienophile functional group) has a content y2 less than or equal to 30 mol %; in an embodiment, the crosslinking group (the dienophile functional group) has a content y2 less than or equal to 20 mol %.

In an embodiment, Ar2-1 is selected from optoelectronic functional groups different from Ar1 and Ar2.

In another embodiment, Ar4-1 is selected from optoelectronic functional groups different from Ar3 and Ar4.

The optoelectronic functional groups may be selected from the groups having the following functions: a hole (also called electron hole) injection or transporting function, a hole blocking function, an electron injection or transporting function, an electron blocking function, an organic host function, a singlet light-emitting function, a triplet light-emitting function, and a thermally activated delayed fluorescent function. Suitable organic optoelectronic functions can be referred to corresponding organic functional materials, including a hole (also known as electron hole) injection or transporting material (HIM/HTM), a hole blocking material (HBM), an electron injection or transporting material (EIM/ETM), an electron blocking material (EBM), an organic host material (Host), a singlet emitter (a fluorescent emitter), a triplet emitter (a phosphorescent emitter), particularly a light-emitting organometallic clathrate. Various organic functional materials are described in detail, for example, in WO2010135519A1, US20090134784A1, and WO2011110277A1, the entire contents of which three patent documents are hereby incorporated herein by reference.

In an embodiment, Ar2-1 or Ar4-1 is selected from the group consisting of groups having a singlet light-emitting function, a triplet light-emitting function, and a thermally activated delayed fluorescent function.

In an embodiment, z1 is from 1% to 30%, further from 2% to 20%, and still further from 3% to 15%.

In an embodiment, z2 is from 1% to 30%, further from 2% to 20%, and still further from 3% to 15%.

In an embodiment, the polymer (I) has a structure represented by the polymer (III-1), and the polymer (II) has a structure represented by the polymer (IV-1):

Polymer (III-1)

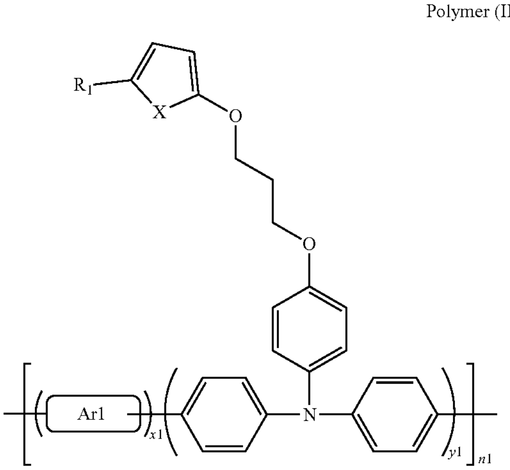

-continued

Polymer (IV-1)

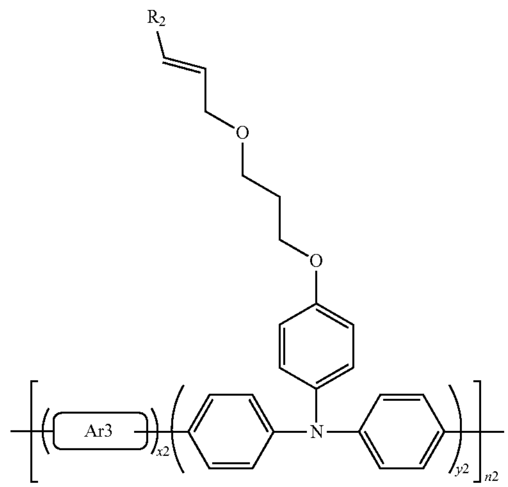

X is $CH_2$, S, O or N—$CH_3$;

$R_1$ is hydrogen, deuterium, methyl or phenyl;

R2 is —COOH, —CHO, —CN, —$NO_2$ or

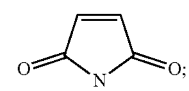

x1, y1, x2, y2 are as defined above;

Ar1, Ar2, n1, and n2 are as defined above.

The polymers (I) and (II) in the foregoing mixture can undergo a Diels-Alder reaction to crosslink. The possible principle of the disclosure is as follows.

The Diels-Alder reaction (or abbreviated as D-A reaction) is also called diene addition reaction. In 1928, a German chemist Otto Diels and his student Kurt Alder first discovered and documented this new reaction, and thereby they won the 1950-year Nobel Prize in Chemistry. The Diels-Alder reaction is an organic reaction (specifically, a cycloaddition reaction). It can be known from the reaction formula that the reaction is divided into two parts, i.e., one part is a compound provides a conjugated diene i.e. diene, the other part is a compound which provides an unsaturated bond—i.e. a dienophile. The conjugated diene reacts with a substituted olefin (generally referred to as a dienophile) to form a substituted cyclohexene. Even if some of the atoms in the newly-formed ring are not carbon atoms, this reaction can continue. The Diels-Alder reaction is one of the most important means of carbon-carbon bond formation in organic chemical synthesis reactions, and one of the commonly used reactions in modern organic synthesis. The reaction mechanism is shown in the figure below:

Schematic Diagram of Diels-Alder Reaction Mechanism

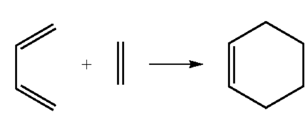

-continued

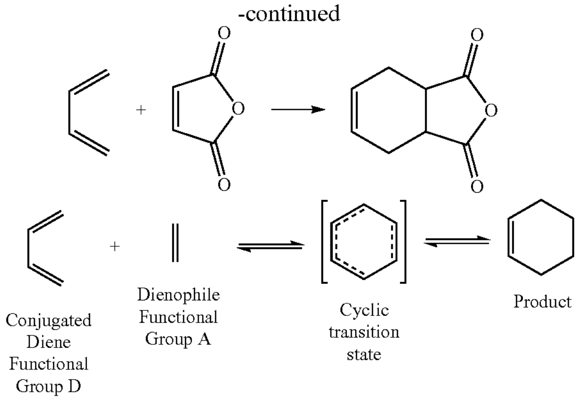

This is a synergistic reaction that is completed in one step. No intermediate but the transition state exists. Under normal conditions, the highest occupied molecular orbital (HOMO) of the diene interacts with the lowest unoccupied molecular orbital (LUMO) of the dienophile to form a bond. Since it is a synergistic reaction that does not involve ions, ordinary acids and bases have no effect on the reaction. However, Lewis acid can affect the energy level of the lowest unoccupied molecular orbital by complexation, so it can catalyze the reaction. The Diels-Alder reaction is a reversible reaction, especially when the temperature is high, the reverse reaction is more likely to occur. According to the definition of its forward reaction, the reverse reaction is defined as a reaction with addition and without disassociation into a diene component and a dienophile component. Some Diels-Alder reactions are reversible, and such ring dissociation reactions are called reverse Diels-Alder reactions.

The conjugated diene (abbreviated as D) unit and the dienophile (abbreviated as A) unit are linked to the backbone, the side chain, the end of the backbone of the polymer, etc. through chemical bonds to obtain the polymer I (indicating that the polymer I is modified by the conjugated diene functional group D) or the polymer II (indicating that the polymer II is modified by the dienophile functional group A), respectively. The polymer I and II are solution processed into a film by blending at a certain ratio, and then the conjugated diene functional group D and the dienophile functional group A can undergo the Diels-Alder reaction by heating, i.e., the polymer 1 and II interact to form a cross-linked three-dimensional network conjugated polymer film, so it has excellent solvent resistance, which is beneficial to construct a multilayer polymeric optoelectronic devices by solution processing techniques, such as printing, inkjet printing, and "roll-to-roll".

In addition, this type of reaction mainly utilizes the reaction between an olefin and a planar diene. At a certain temperature, the conjugated diene D and the dienophile A undergo a Diels-Alder reaction to form a new compound. At another temperature, the newly-formed compound undergoes a reverse diassociation reaction. This is a self-repairing material with commercial application prospects. This self-repairing material is expected to be used in flexible OLED devices.

Conjugated Diene Functional Group D: A conjugated diene in a Diels-Alder reaction (also referred to as a diene synthesis reaction) is generally referred to as a conjugated diene functional group. The conjugated diene functional group has an electron-donating group attached, which facilitates the Diels-Alder reaction.

Dienophile functional group A: a unsaturated compound in the Diels-Alder reaction (also referred to as the diene synthesis reaction) is usually referred to as a dienophile functional group. The dienophile functional group has an electron-accepting group attached, which facilitates the Diels-Alder reaction.

In an embodiment, Ds in the polymer I and in the polymer III in the foregoing mixture are selected from conjugated diene functional groups, and the conjugated diene functional group is selected from the group consisting of a chain-open cis-conjugated diene, an intra-annular diene, a transcyclic conjugated diene, and the like.

In an embodiment, the conjugated diene functional group D is selected from the following chemical structures:

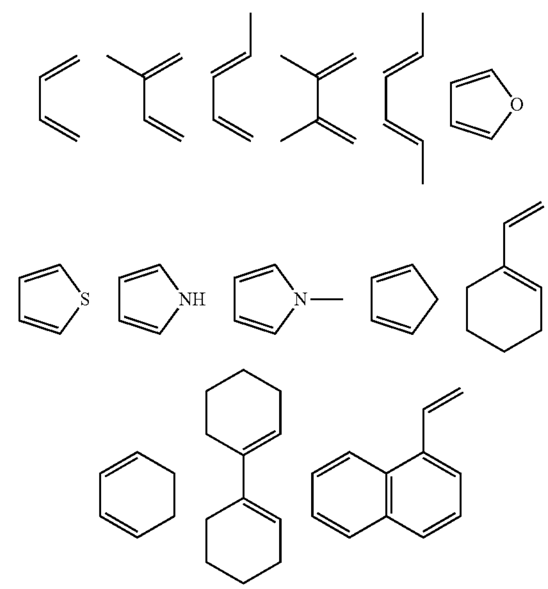

In some embodiments, the conjugated diene funcational group D may be further substituted, and the substituent may be selected from the group consisting of deuterium, alkyl, alkoxy, amino, alkenyl, alkynyl, aralkyl, heteroalkyl, aryl and heteroaryl.

In an embodiment, A in the polymer II and in the polymer IV in the foregoing mixture is selected from dienophile functional groups, and the dienophile functional group is selected from the group consisting of an olefin, an alkyne, an olefin having an electron-withdrawing group unit, an alkyne having an electron-withdrawing group unit, and the like.

In an embodiment, the dienophile functional group A is selected from the following chemical structures:

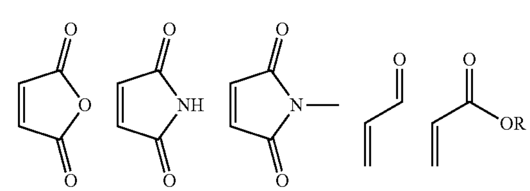

-continued

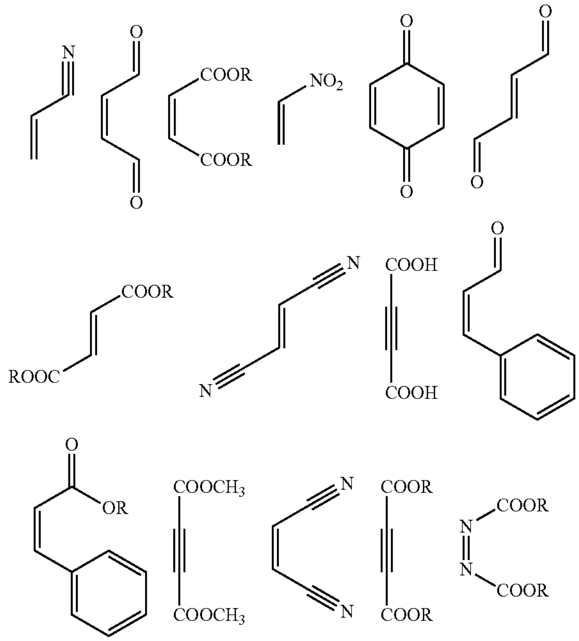

In some embodiments, the dienophile functional group A may be further substituted, and the substituent may be selected from the group consisting of hydrogen, deuterium, alkyl, alkoxy, amino, alkenyl, alkynyl, aralkyl, heteroalkyl, aryl and heteroaryl.

In the polymer of the foregoing Chemical Formula (I) in the crosslinkable mixture constructed based on a Diels-Alder reaction, R1 and R2 are linking groups. In an embodiment, R1 and R2 are selected from alkyl groups containing 2 to 30 carbon atoms, alkoxy groups containing 2 to 30 carbon atoms, amino, alkene, alkyne, aralkyl, heteroalkyl, aryl, and heteroaryl.

In some embodiments, R1 and R2 are mutually independently selected from the group consisting of alkyl, alkoxy, amino, alkenyl, alkynyl, aralkyl, and heteroalkyl.

In an embodiment, R1 and R2 are mutually independently selected from the group consisting of an alkyl group containing 1 to 30 C atoms, an alkoxy group containing 1 to 30 C atoms, benzene, biphenyl, triphenyl, benzo, thiophene, anthracene, naphthalene, benzodithiophene, aryl amine, triphenylamine, naphthylamine, thiophene, carbazole, dibenzothiophene, dithienocyclopentadiene, dithienothiol, dibenzoselenophene, furan, thiophene, benzofuran, benzothiophene, benzoselenophene, carbazole, furan, and the like.

Examples of suitable structural formulas that can be used as the linking groups R1-D and R2-A are listed in the following table:

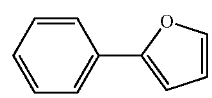 [SMILES: c1ccc(-c2ccco2)cc1]

1

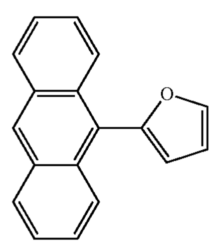 [SMILES: c1coc(-c2c3ccccc3cc3ccccc23)c1]

2

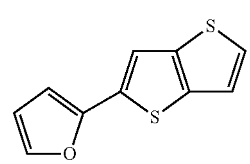 [SMILES: c1coc(-c2cc3sccc3s2)c1]

3

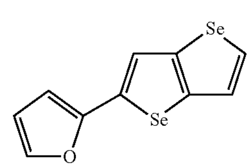 [SMILES: c1coc(-c2cc3[se]ccc3[se]2)c1]

4

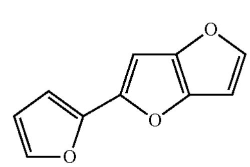 [SMILES: c1coc(-c2cc3occc3o2)c1]

5

-continued
6
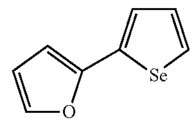
7
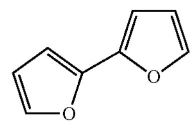
8
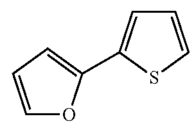
9
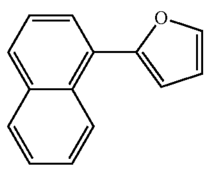 [SMILES: c1coc(-c2cccc3ccccc23)c1]
10
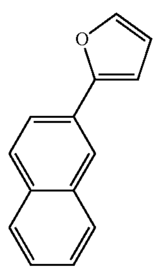 [SMILES: c1coc(-c2ccc3ccccc3c2)c1]
11
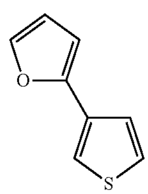
12
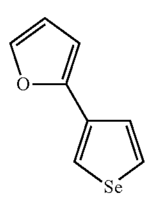
13
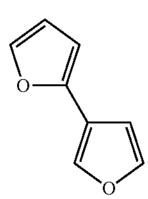

-continued
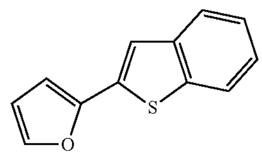
14
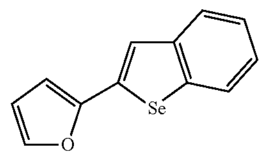 [SMILES: c1coc(-c2cc3ccccc3[se]2)c1]
15
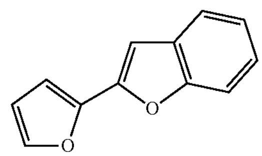 [SMILES: c1coc(-c2cc3ccccc3o2)c1]
16
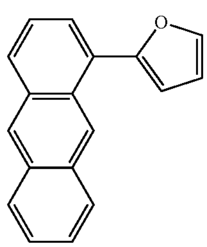 [SMILES: c1coc(-c2cccc3cc4ccccc4cc23)c1]
17
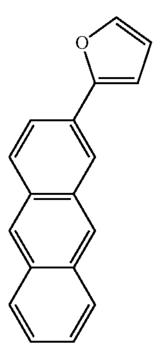 [SMILES: c1coc(-c2ccc3cc4ccccc4cc3c2)c1]
18
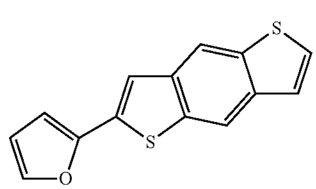
19
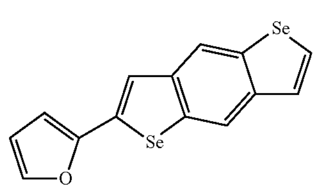
20

-continued
21
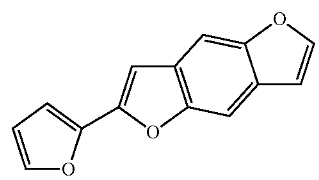 [SMILES: c1coc(-c2cc3cc4occc4cc3o2)c1]
22
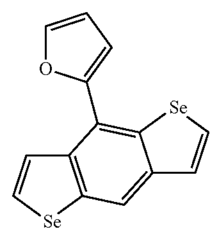 [SMILES: c1coc(-c2c3cc[se]c3cc3cc[se]c23)c1]
23
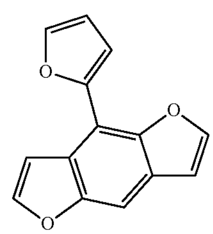 [SMILES: c1coc(-c2c3ccoc3cc3ccoc23)c1]
24
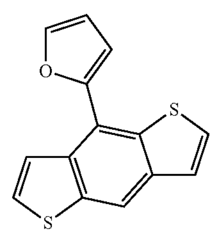 [SMILES: c1coc(-c2c3ccsc3cc3ccsc23)c1]
25
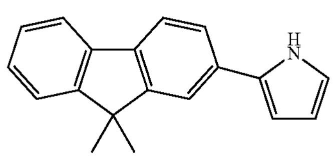
26
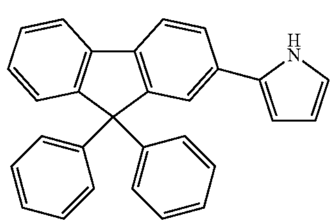 [SMILES: c1ccc(C2(c3ccccc3)c3ccccc3-c3ccc(-c4ccc[nH]4)cc32)cc1]
27
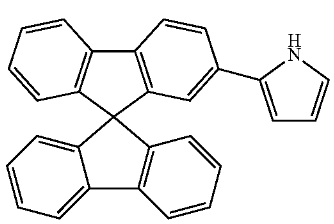 [SMILES: c1c[nH]c(-c2ccc3c(c2)C2(c4ccccc4-c4ccccc42)c2ccccc2-3)c1]

-continued
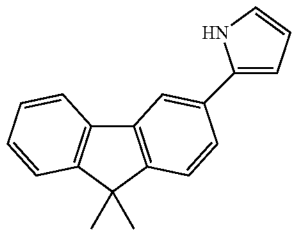 [SMILES: CC1(C)c2ccccc2-c2cc(-c3ccc[nH]3)ccc21]
28
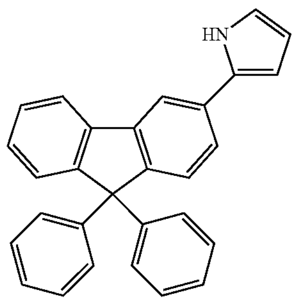 [SMILES: c1ccc(C2(c3ccccc3)c3ccccc3-c3cc(-c4ccc[nH]4)ccc32)cc1]
29
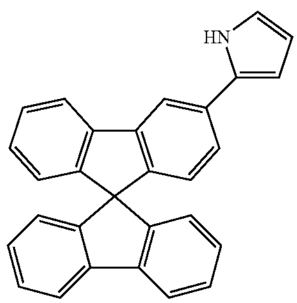 [SMILES: c1c[nH]c(-c2ccc3c(c2)-c2ccccc2C32c3ccccc3-c3ccccc32)c1]
30
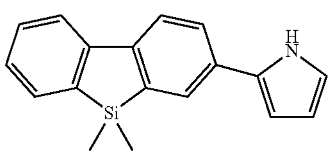
31
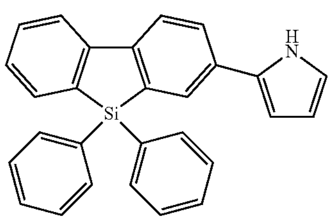
32
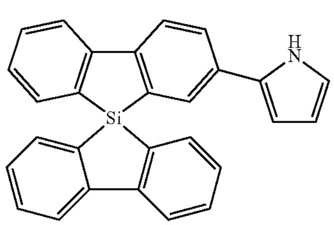
33

-continued
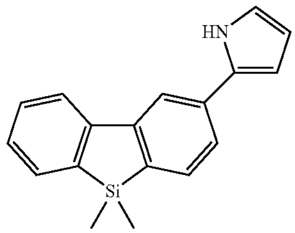 [SMILES: C[Si]1(C)c2ccccc2-c2cc(-c3ccc[nH]3)ccc21]
34
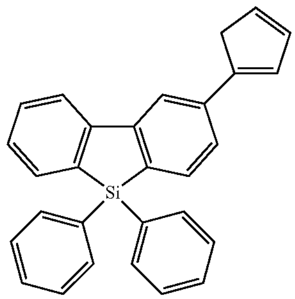 [SMILES: C1=CCC(c2ccc3c(c2)-c2ccccc2[Si]3(c2ccccc2)c2ccccc2)=C1]
35
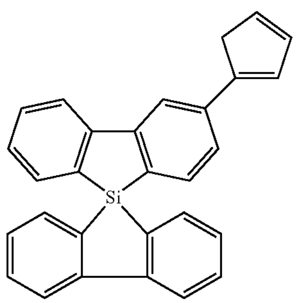 [SMILES: C1=CCC(c2ccc3c(c2)-c2ccccc2[Si]32c3ccccc3-c3ccccc32)=C1]
36
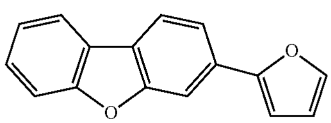
37
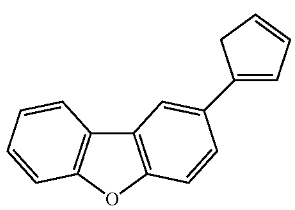
38
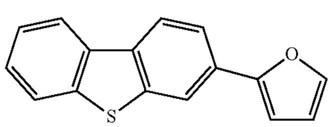 [SMILES: c1coc(-c2ccc3c(c2)oc2ccccc23)c1]
39
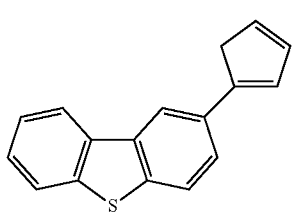 [SMILES: C1=CCC(c2ccc3sc4ccccc4c3c2)=C1]
40

-continued
41
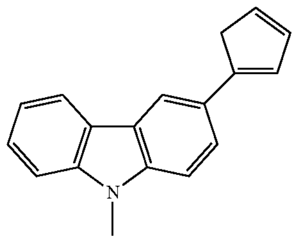 [SMILES: Cn1c2ccccc2c2cc(C3=CC=CC3)ccc21]
42
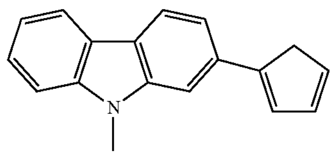 [SMILES: Cn1c2ccccc2c2ccc(C3=CC=CC3)cc21]
43
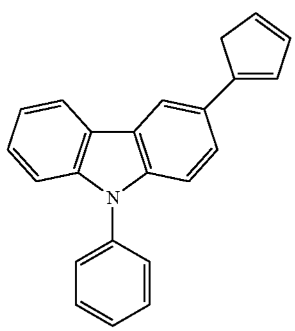 [SMILES: C1=CCC(c2ccc3c(c2)c2ccccc2n3-c2ccccc2)=C1]
44
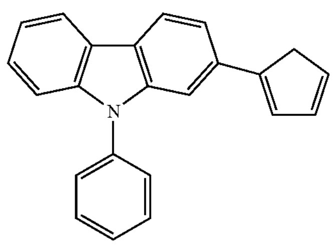 [SMILES: C1=CCC(c2ccc3c4ccccc4n(-c4ccccc4)c3c2)=C1]
45
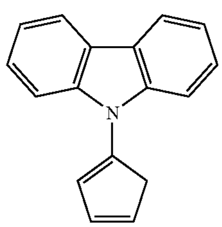 [SMILES: C1=CCC(n2c3ccccc3c3ccccc32)=C1]
46
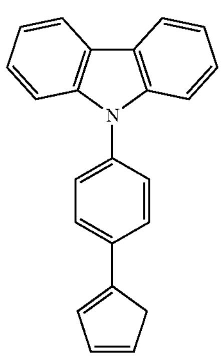 [SMILES: C1=CCC(c2ccc(-n3c4ccccc4c4ccccc43)cc2)=C1]

-continued
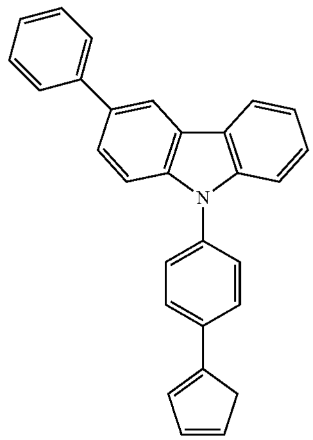 [SMILES: C1=CCC(c2ccc(-n3c4ccccc4c4cc(-c5ccccc5)ccc43)cc2)=C1]
47
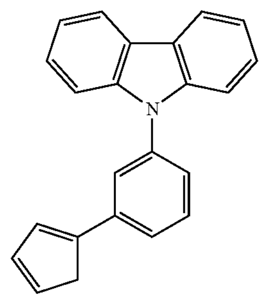 [SMILES: C1=CCC(c2cccc(-n3c4ccccc4c4ccccc43)c2)=C1]
48
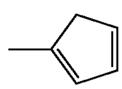
49
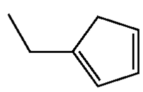
50
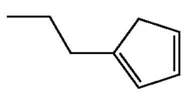
51
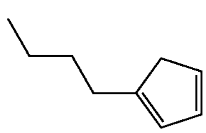
52
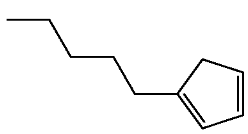
53
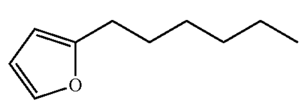
54
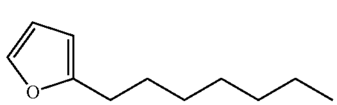
55

-continued
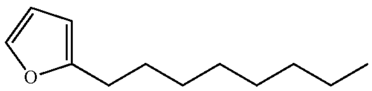
56
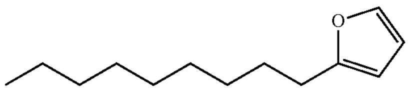
57
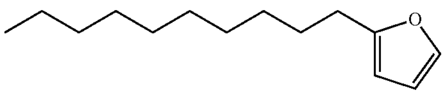
57
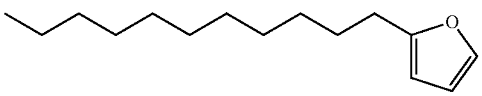 [SMILES: CCCCCCCCCCCc1ccco1]
58
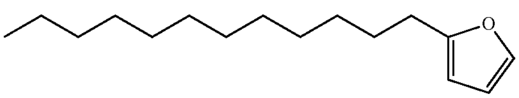 [SMILES: CCCCCCCCCCCCc1ccco1]
59
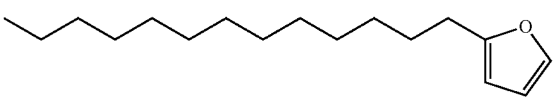 [SMILES: CCCCCCCCCCCCCc1ccco1]
60
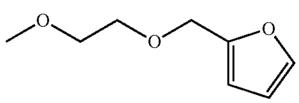
61
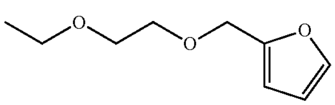
62
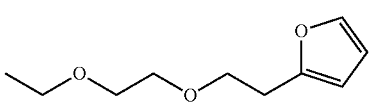
63
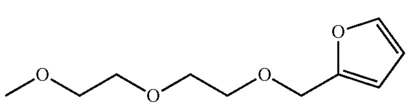
64
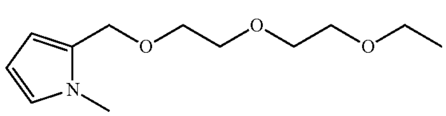 [SMILES: CCOCCOCCOCc1cccn1C]
65
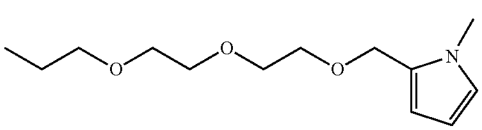 [SMILES: CCCOCCOCCOCc1cccn1C]
66
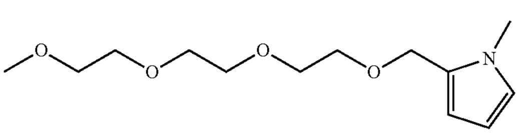 [SMILES: COCCOCCOCCOCc1cccn1C]
67

-continued
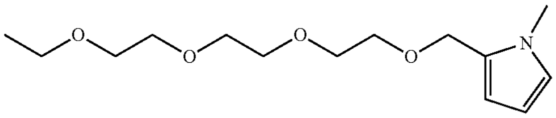 [SMILES: CCOCCOCCOCCOCc1cccn1C]
68
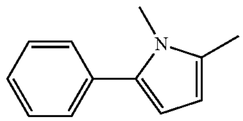
69
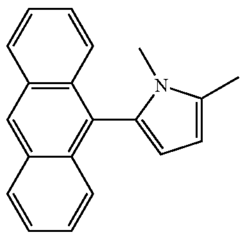 [SMILES: Cc1ccc(-c2c3ccccc3cc3ccccc23)n1C]
70
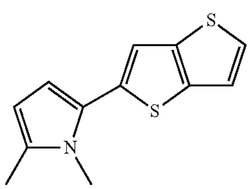
71
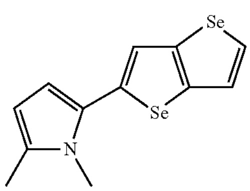
72
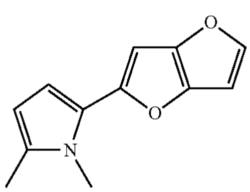
73
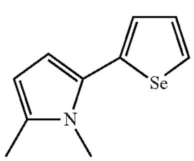
74
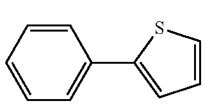
75

-continued
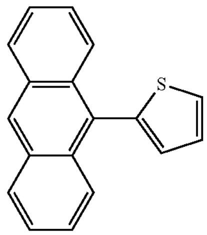 [SMILES: c1csc(-c2c3ccccc3cc3ccccc23)c1]
76
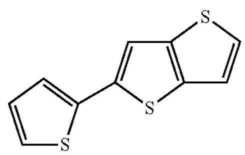 [SMILES: c1csc(-c2cc3sccc3s2)c1]
77
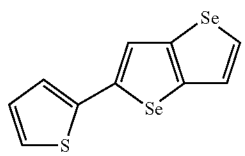
78
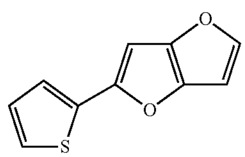 [SMILES: c1csc(-c2cc3occc3o2)c1]
79
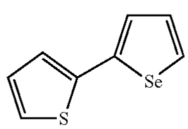
80
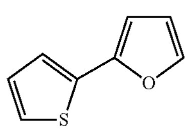
81
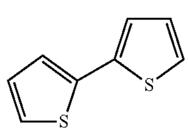
82
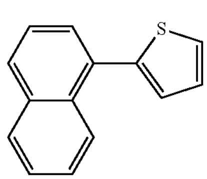
83

-continued
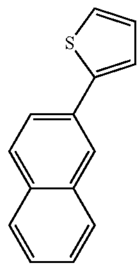 [SMILES: c1csc(-c2ccc3ccccc3c2)c1]
84
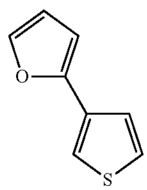
85
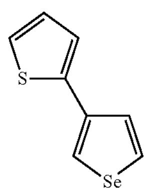
86
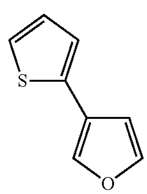
87
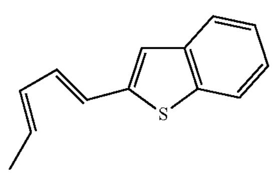
88
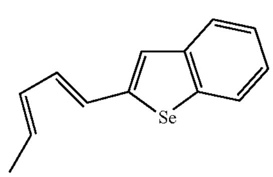
89
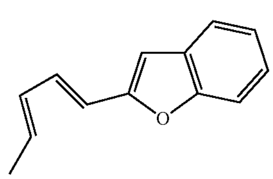
90

-continued
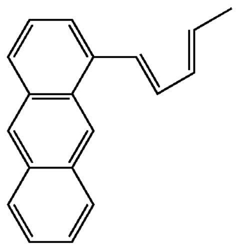 [SMILES: C/C=C/C=C/c1cccc2cc3ccccc3cc12]
91
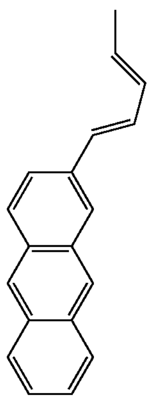 [SMILES: C/C=C/C=C/c1ccc2cc3ccccc3cc2c1]
92
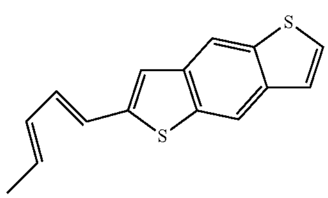 [SMILES: C/C=C/C=C/c1cc2cc3sccc3cc2s1]
93
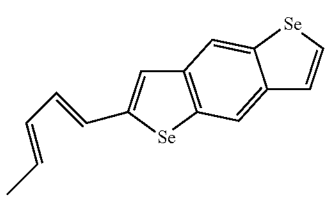 [SMILES: C/C=C/C=C/c1cc2cc3[se]ccc3cc2[se]1]
94
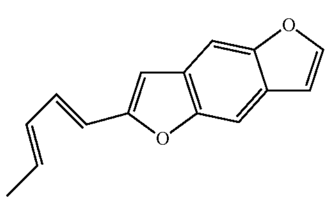 [SMILES: C/C=C/C=C/c1cc2cc3occc3cc2o1]
95
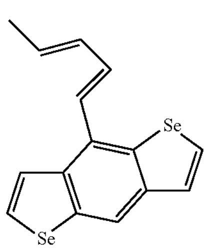 [SMILES: C/C=C/C=C/c1c2cc[se]c2cc2cc[se]c12]
96

-continued
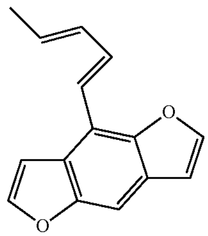 [SMILES: C/C=C/C=C/c1c2ccoc2cc2ccoc12]
97
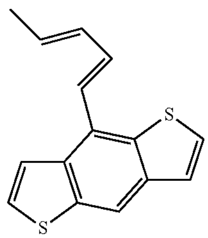 [SMILES: C/C=C/C=C/c1c2ccsc2cc2ccsc12]
98
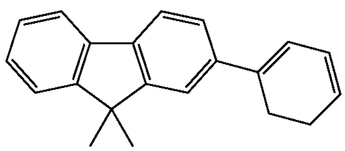 [SMILES: CC1(C)c2ccccc2-c2ccc(C3=CC=CCC3)cc21]
99
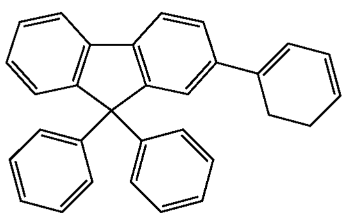 [SMILES: C1=CCCC(c2ccc3c(c2)C(c2ccccc2)(c2ccccc2)c2ccccc2-3)=C1]
100
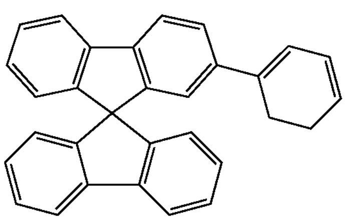 [SMILES: C1=CCCC(c2ccc3c(c2)C2(c4ccccc4-c4ccccc42)c2ccccc2-3)=C1]
101
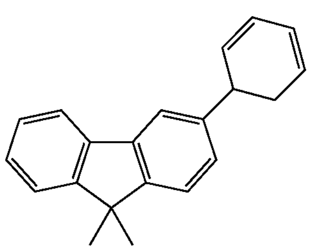 [SMILES: CC1(C)c2ccccc2-c2cc(C3C=CC=CC3)ccc21]
102

-continued
103
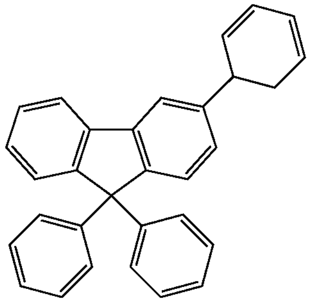 [SMILES: C1=CCC(c2ccc3c(c2)-c2ccccc2C3(c2ccccc2)c2ccccc2)C=C1]
104
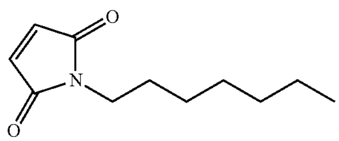
105
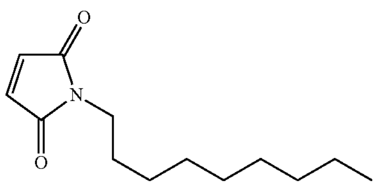 [SMILES: CCCCCCCCCN1C(=O)C=CC1=O]
106
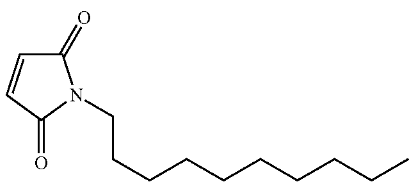 [SMILES: CCCCCCCCCCN1C(=O)C=CC1=O]
107
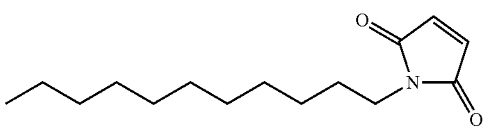 [SMILES: CCCCCCCCCCCN1C(=O)C=CC1=O]
108
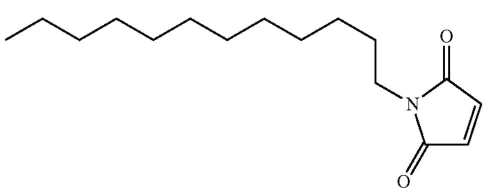 [SMILES: CCCCCCCCCCCCN1C(=O)C=CC1=O]
109
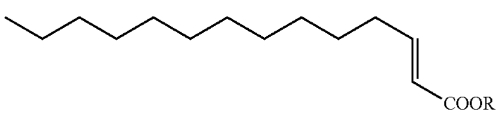
110
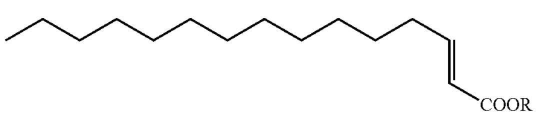
111
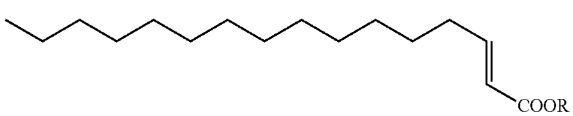

-continued
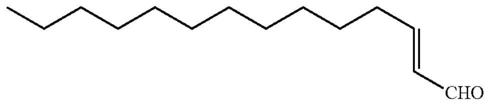
112
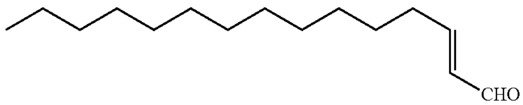 [SMILES: CCCCCCCCCCCC/C=C/C=O]
113
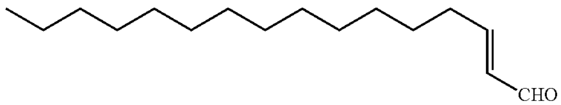 [SMILES: CCCCCCCCCCCCC/C=C/C=O]
114
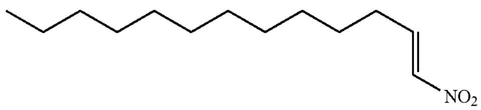 [SMILES: CCCCCCCCCCC/C=C/[N+](=O)[O-]]
115
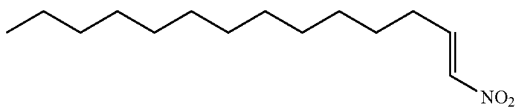 [SMILES: CCCCCCCCCCCC/C=C/[N+](=O)[O-]]
116
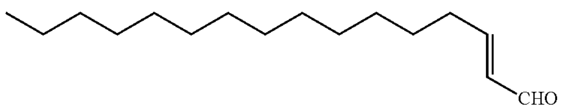
117
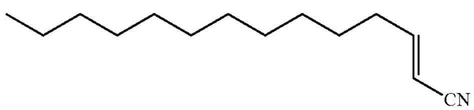
118
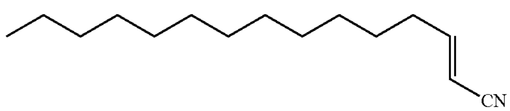 [SMILES: CCCCCCCCCCCC/C=C/C#N]
118
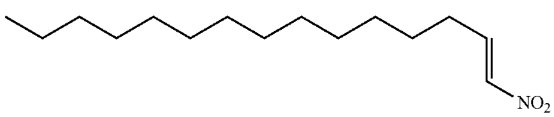 [SMILES: CCCCCCCCCCCCC/C=C/[N+](=O)[O-]]
119
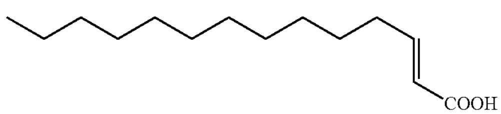 [SMILES: CCCCCCCCCCC/C=C/C(=O)O]
120
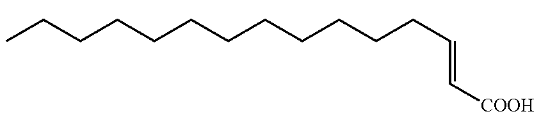 [SMILES: CCCCCCCCCCCC/C=C/C(=O)O]
121
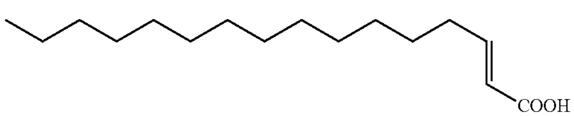
122
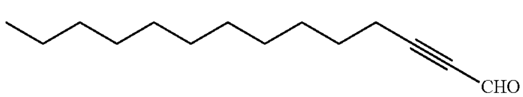
123

-continued

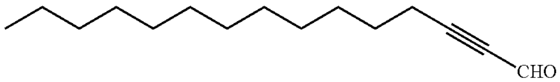 [SMILES: CCCCCCCCCCCCC#CC=O]
124

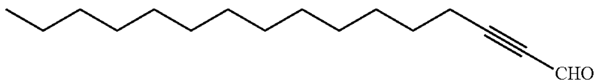 [SMILES: CCCCCCCCCCCCCC#CC=O]
125

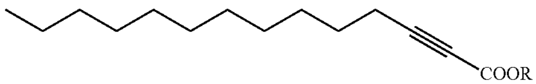
126

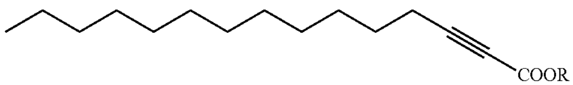
127

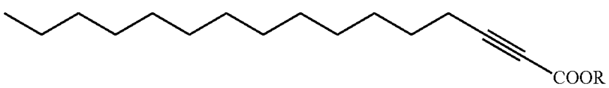
128

The present disclosure further relates to synthesis methods of polymers I and II.

The crosslinkable polymer constructed based on the Diels-Alder reaction is a mixture of polymers I and II, wherein the general synthesis method of polymers I and II is to synthesize a monomer having the functionalized conjugated diene functional group D and the dienophile functional group A firstly, and then to obtain a conjugated polymer by a polymerization method, such as transition metal catalyzed coupling (Suzuki Polymerization, Heck Polymerization, Sonogashira Polymerization, Still Polymerization), and Witting reaction, and the molecular weight and the dispersion coefficient of the polymer can be controlled by controlling the reaction time, the reaction temperature, the monomer ratio, the reaction pressure, the solubility, the amount of the catalyst, the ligand ratio, and the phase transfer catalyst. The synthetic route is as shown below:

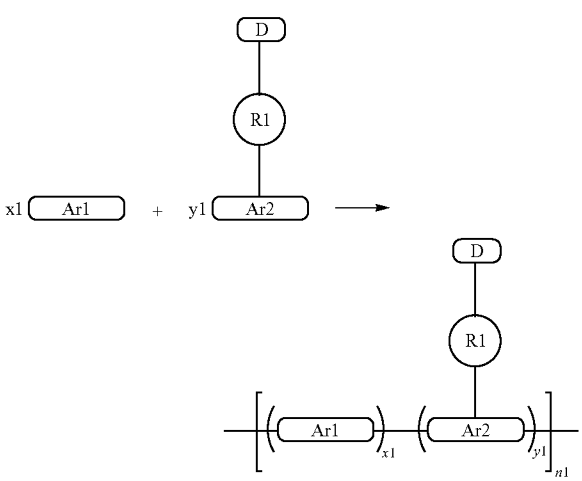

Polymer III

-continued

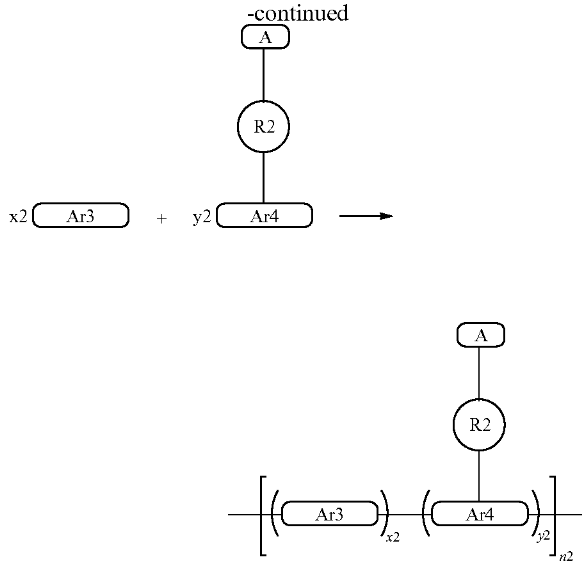

Polymer IV

The general synthesis method of a multi-component (ternary or more) conjugated polymer containing a conjugated diene functional group D and the dienophile functional group A is to synthesize a monomer having the functionalized conjugated diene functional group D and the dienophile functional group A firstly, and then to obtain a conjugated polymer by a polymerization method, such as transition metal catalyzed coupling (Suzuki Polymerization, Heck Polymerization, Sonogashira Polymerization, Still Polymerization), and Witting reaction of multiple (three or more) monomers, and the molecular weight and the dispersion coefficient of the polymer can be controlled by controlling the reaction time, the reaction temperature, the monomer ratio, the reaction pressure, the solubility, the amount of the catalyst, the ligand ratio, and the phase transfer catalyst. The synthetic route is as shown below:

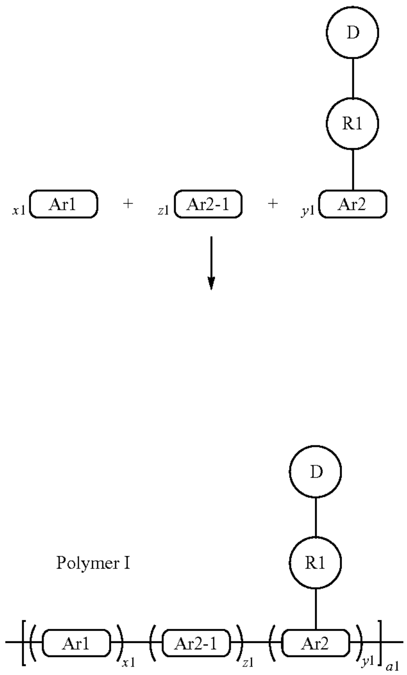

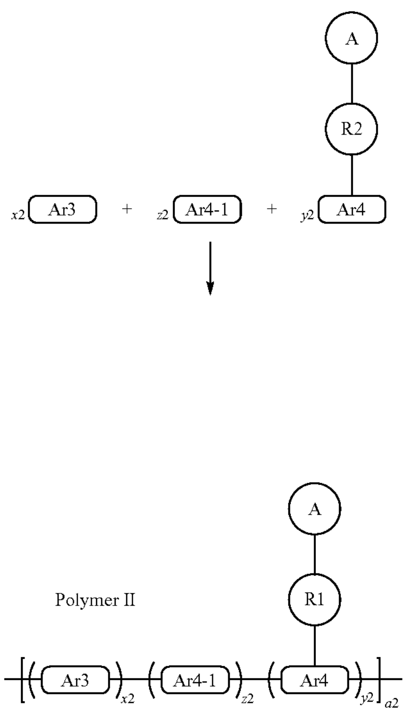

When R1, R2 are aromatic rings or heteroaromatic rings, the synthetic route of the conjugated organic monomer containing the conjugated diene functional group D or the dienophile functional group A is as shown in the following figure, but not limited to the following route for synthesis of a target compound. Raw material A (commercial chemical reagent or synthesized by chemical methods) is subjected to an electrophilic substitution reaction (a halogenating reaction such as chlorination, bromination, iodination) to obtain a compound B, which is subjected to a cross-coupling reaction such as Suzuki, Stile, Grignard reaction, Heck, Sonogashira with a derivative of the conjugated diene or the dienophile to obtain a target compound C.

Synthesis of Conjugated Organic Monomer Containing Conjugated Diene Functional Group D

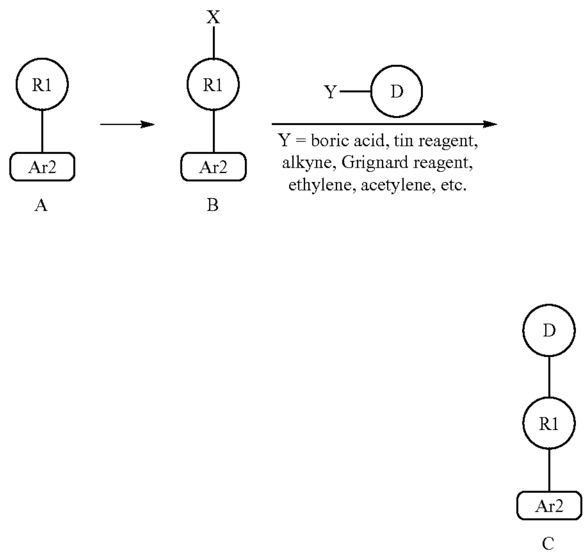

X = Cl, Br, 1

Synthesis of Conjugated Organic Monomer Containing Dienophile Functional Group A

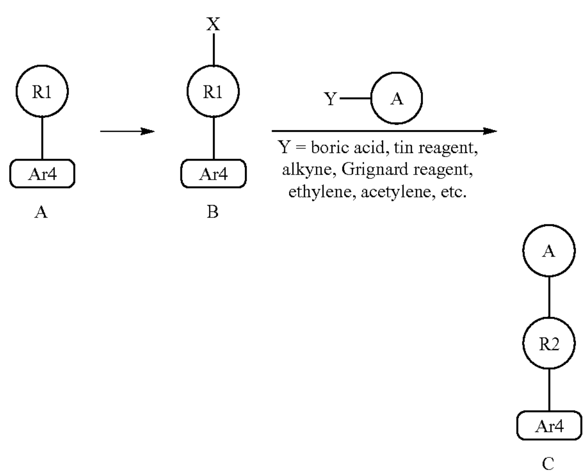

X = Cl, Br, 1

When R1, R2 are alkyl chains or alkoxy chains, the synthetic route of the conjugated organic monomer having the conjugated diene functional group D or the dienophile functional group A is as shown in the following figure, but not limited to the following route synthesis of a target compound. Raw material D (commercial chemical reagent or synthesized by chemical methods) is subjected to a nucleophilic substitution reaction (Williamson ether forming reaction) to obtain a compound B which is subjected to a Williamson ether forming reaction or Grignard reaction with a derivative of conjugated diene or a dienophile to obtain a target compound F.

Synthesis of Conjugated Organic Monomer Containing Conjugated Diene Functional Group D

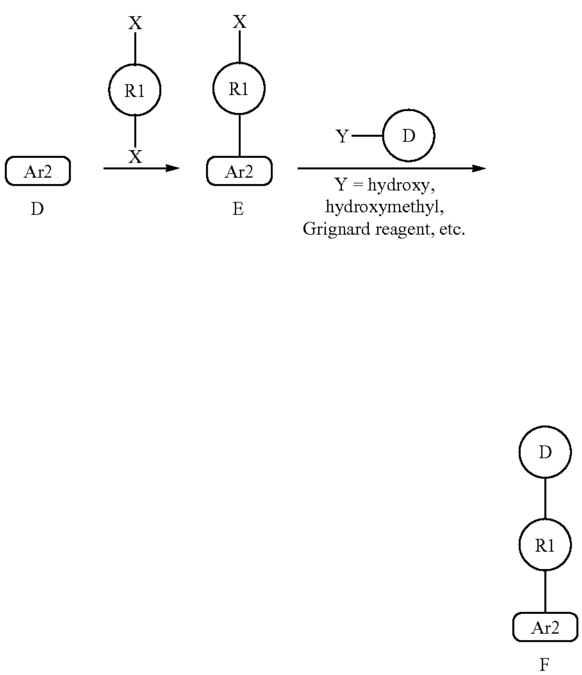

X = Cl, Br, 1

-continued

Synthesis of Conjugated Organic Monomer Containing Dienophile Functional Group A

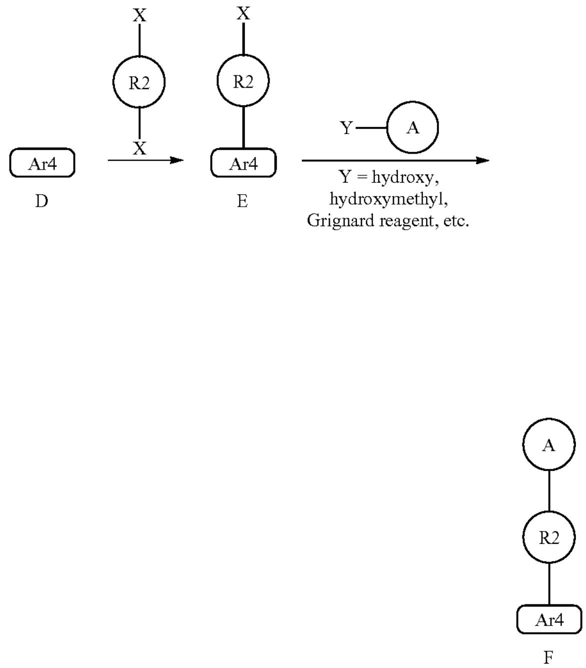

X = Cl, Br, 1

In order to facilitate the understanding of the crosslinkable mixture constructed based on the Diels-Alder reaction of the present disclosure, examples of the polymer containing the conjugated diene functional group D and the dienophile functional group A are listed below.

Examples of the polymer I having a conjugated diene functional group D are as follows, but not limited to the polymers shown:

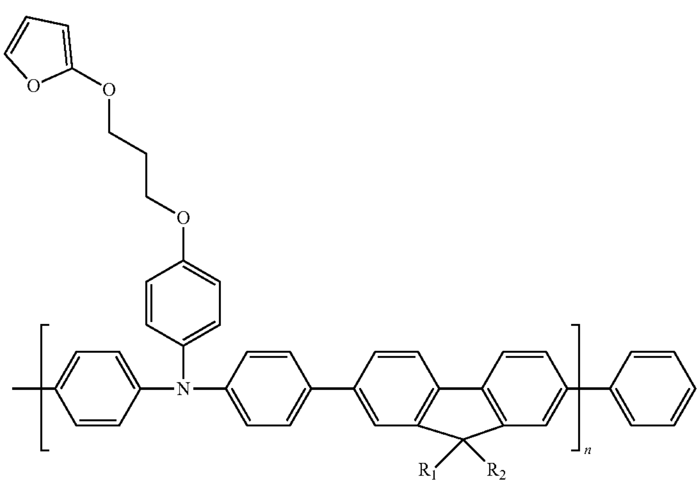

-continued
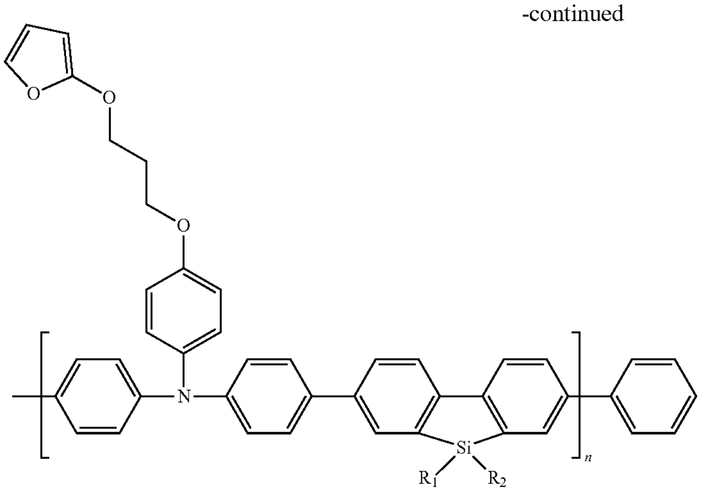
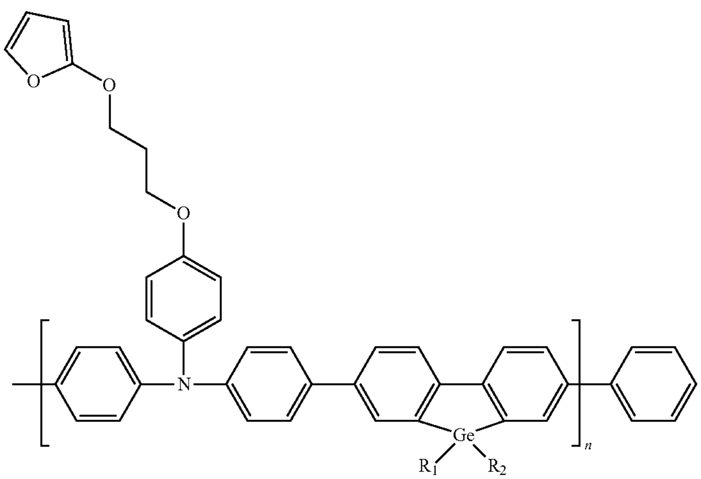
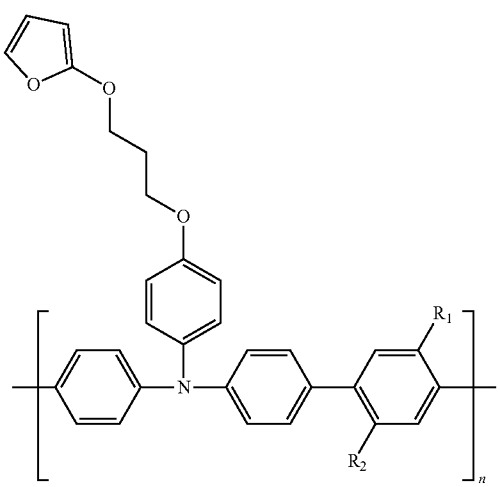
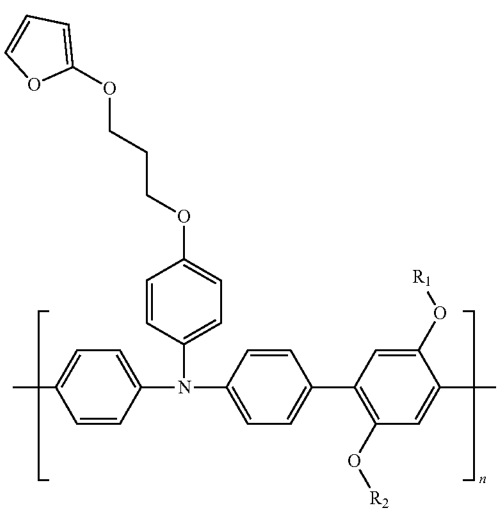

-continued
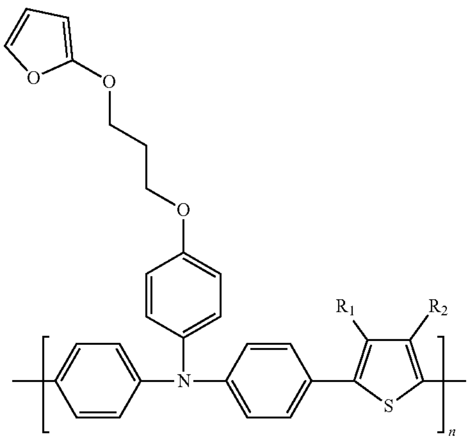
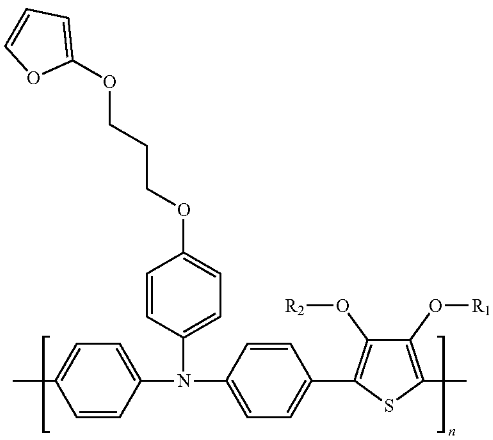
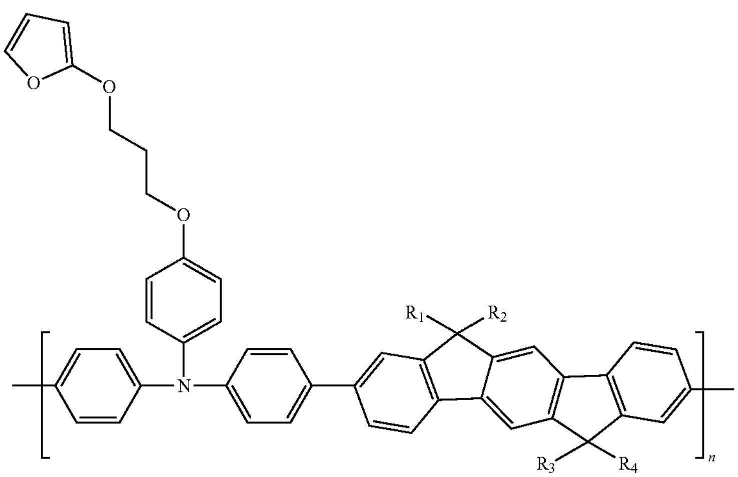
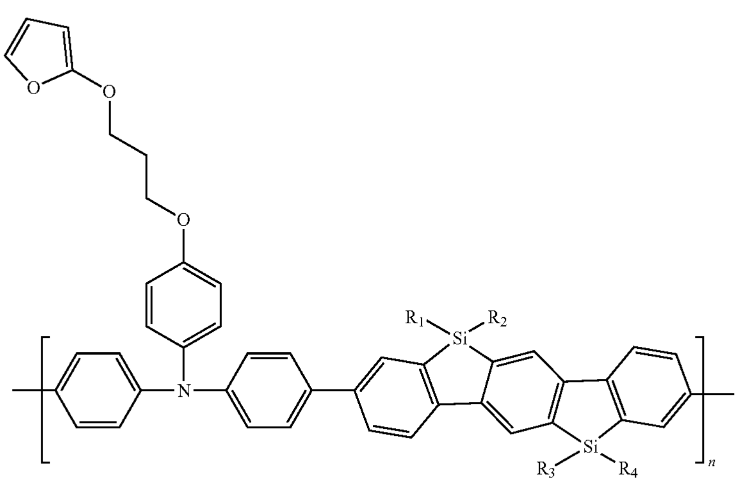

-continued
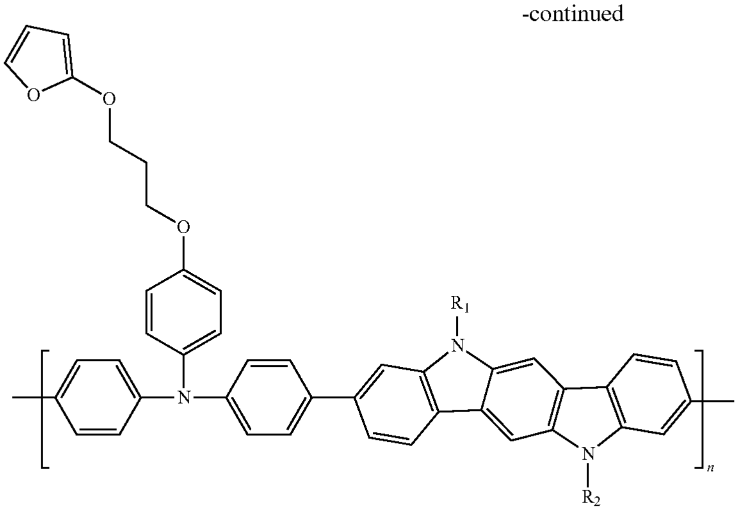
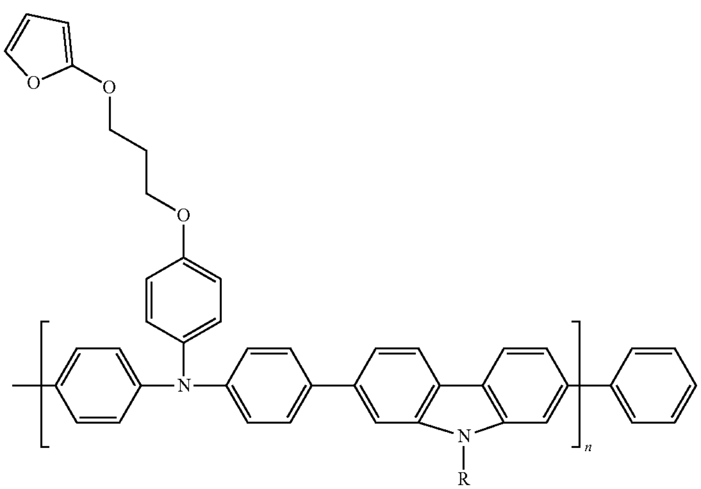
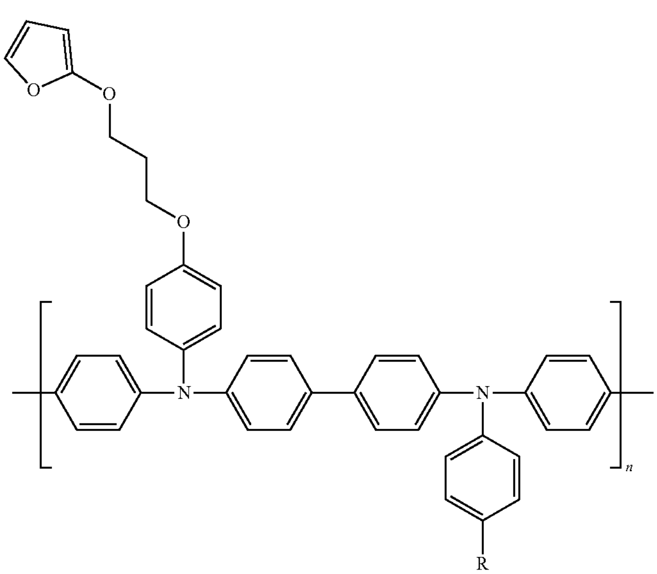

-continued
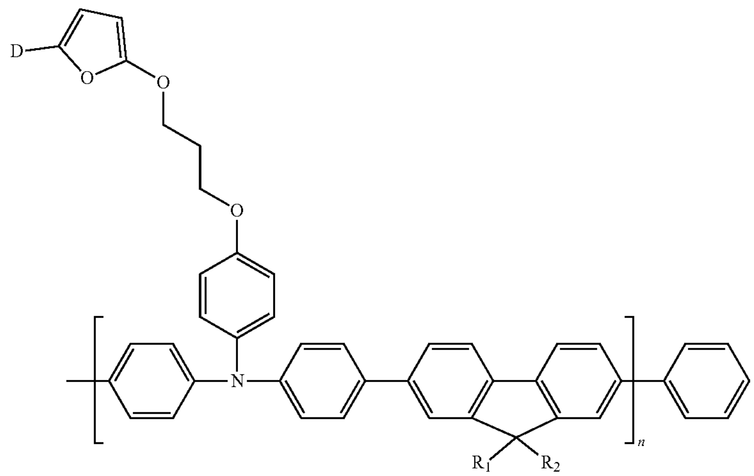
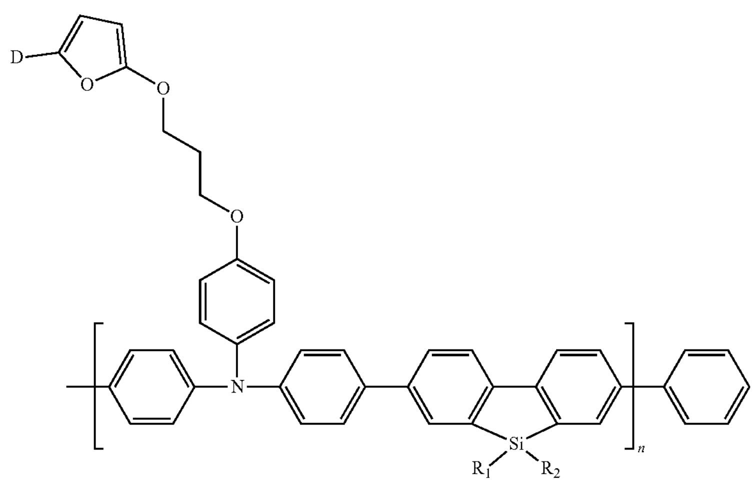
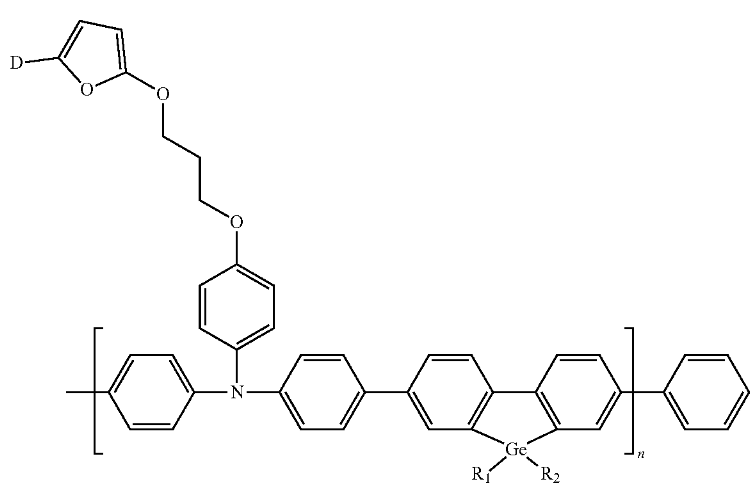

-continued
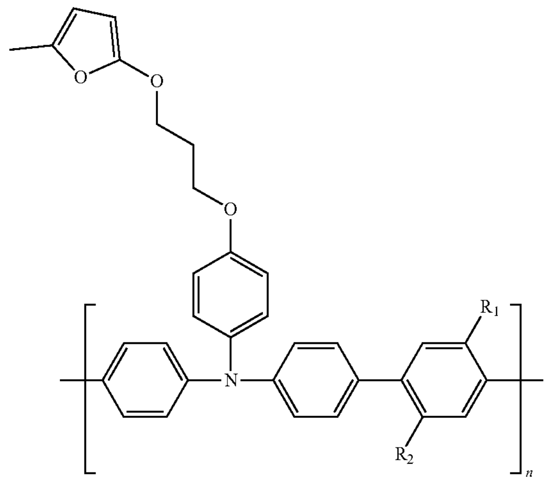
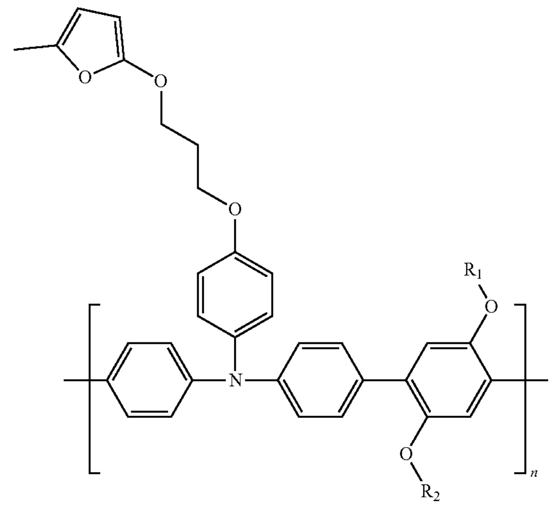
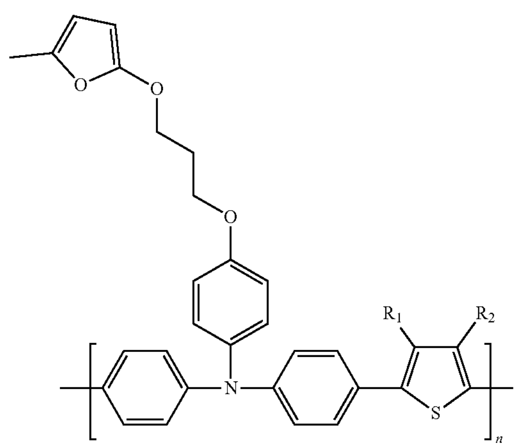
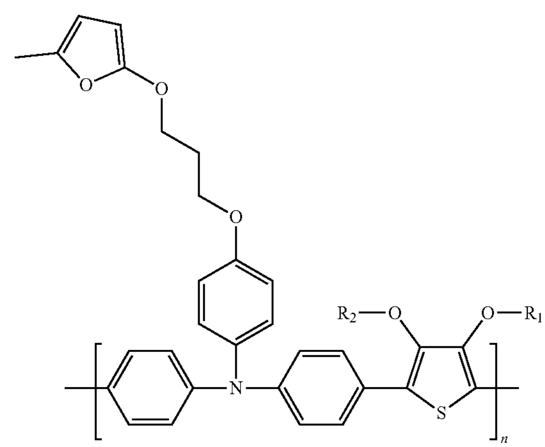
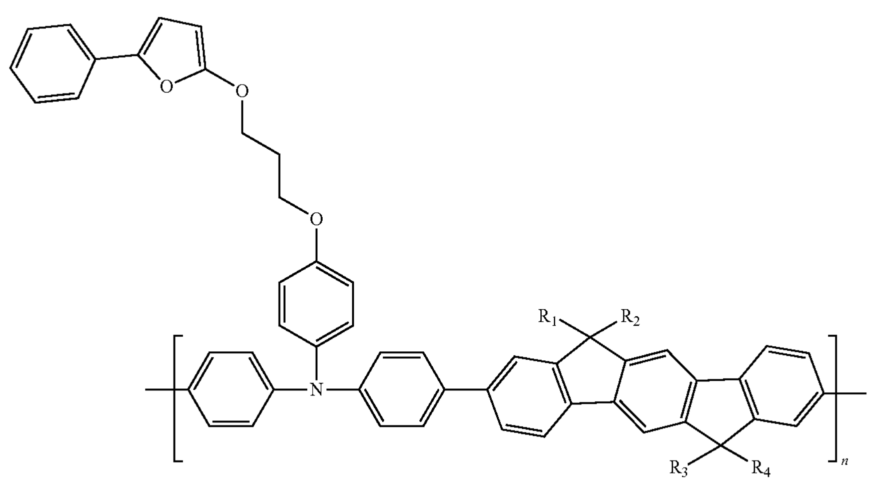

-continued
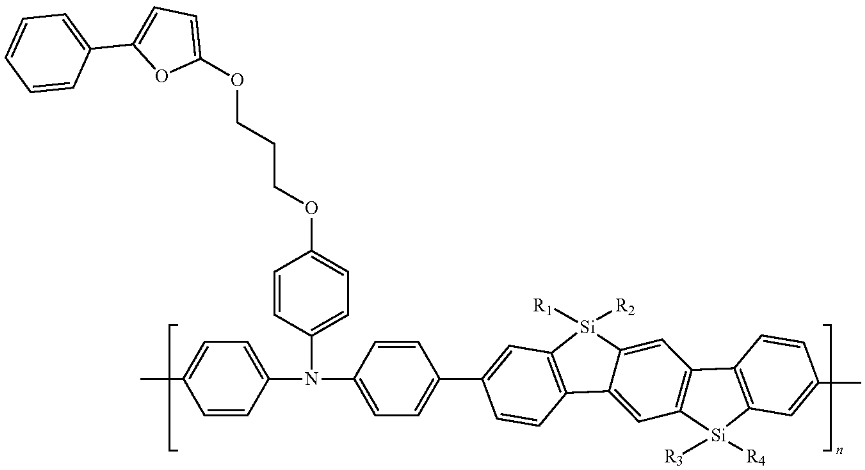
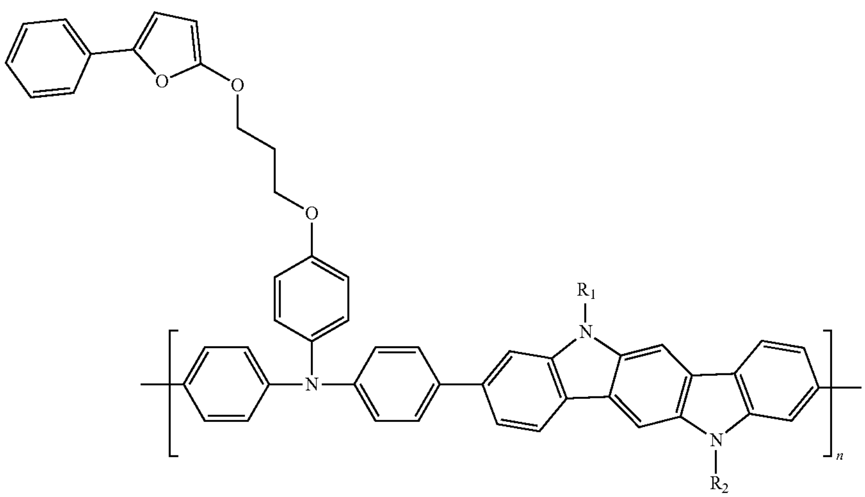
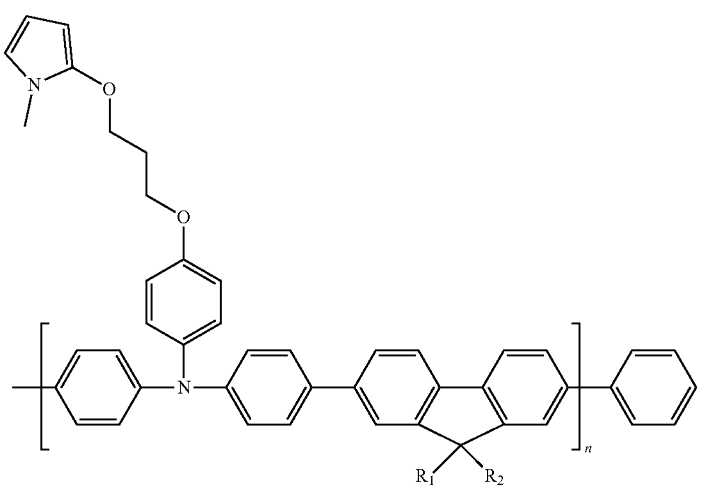

-continued
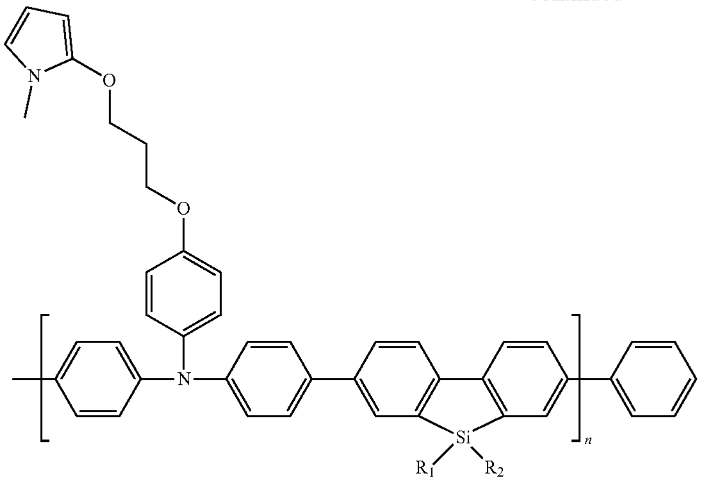
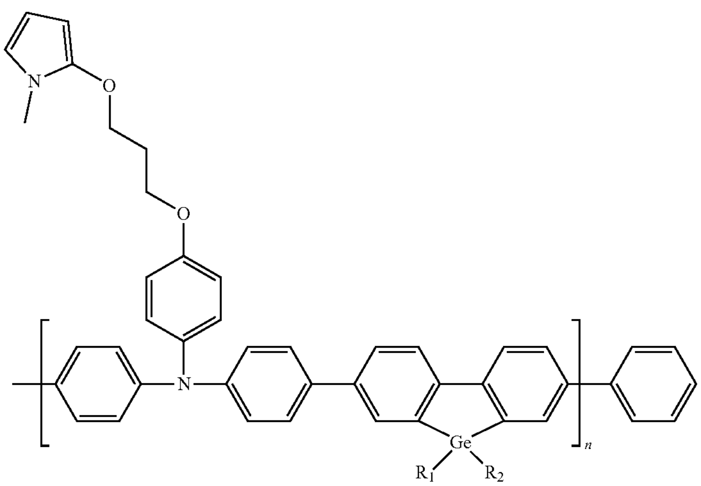
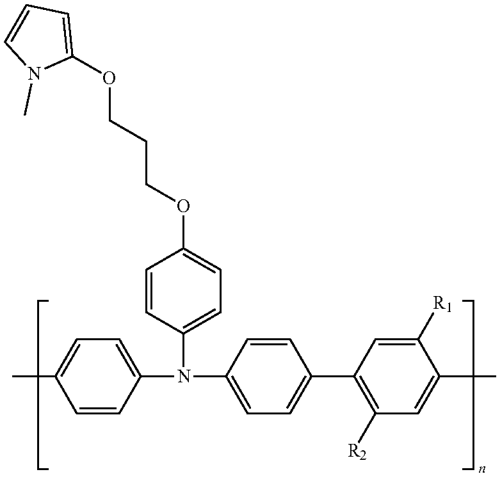
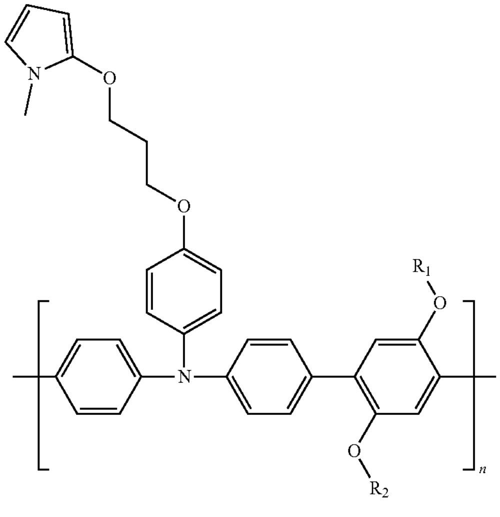

-continued
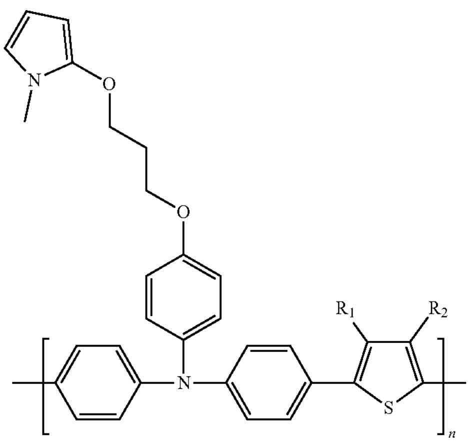
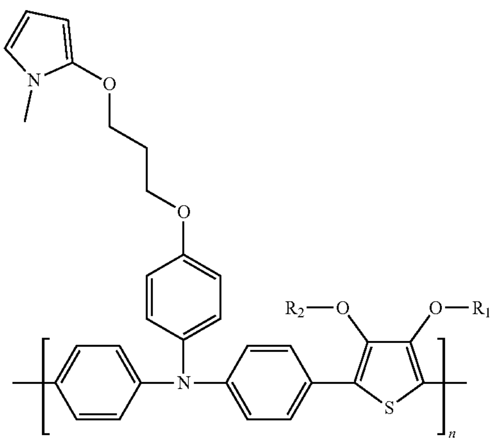
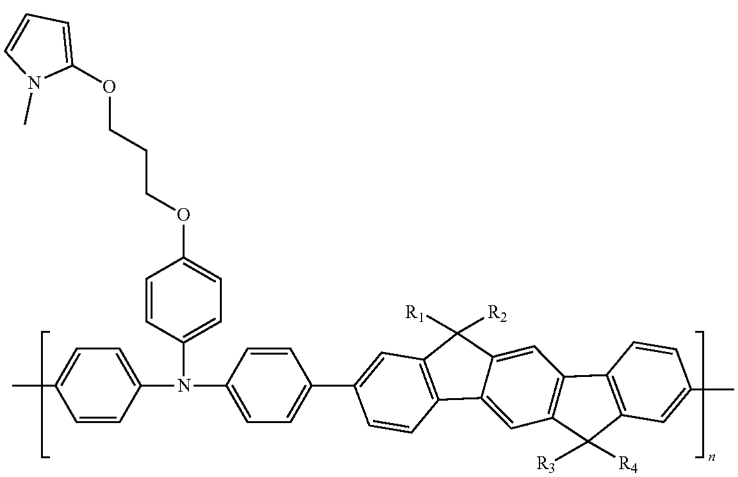
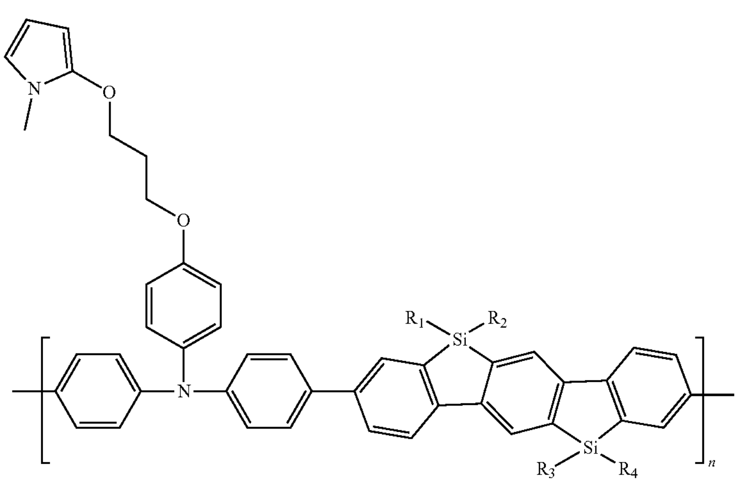

-continued
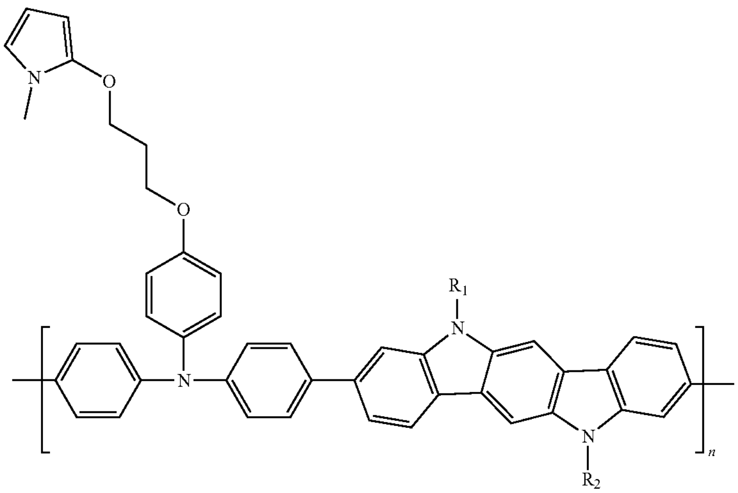
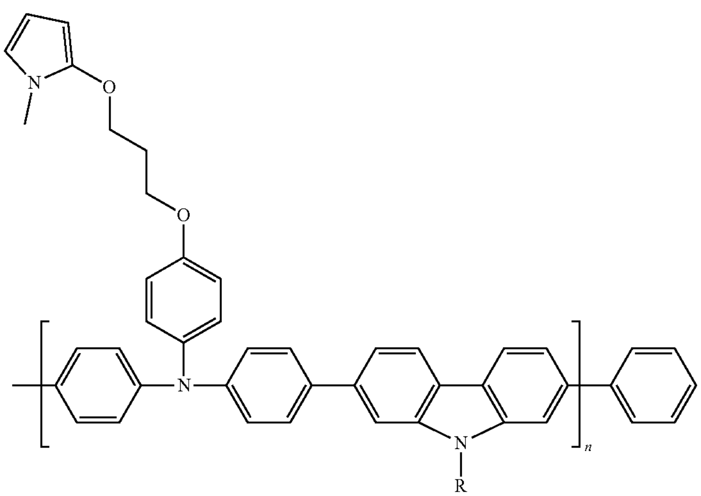
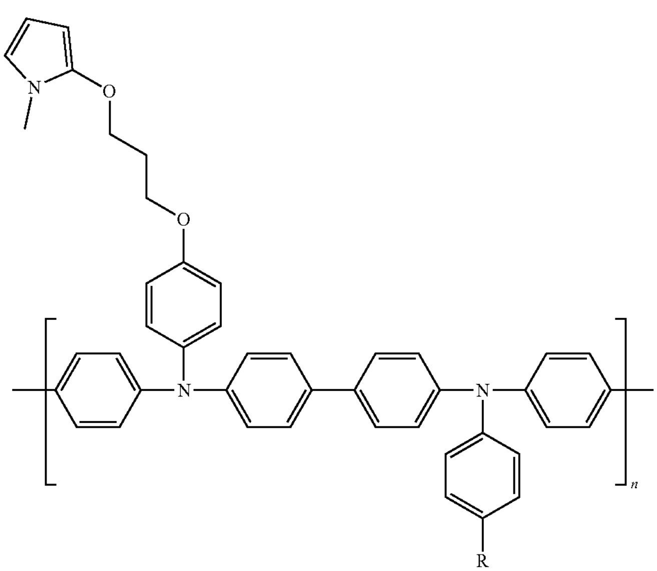

-continued
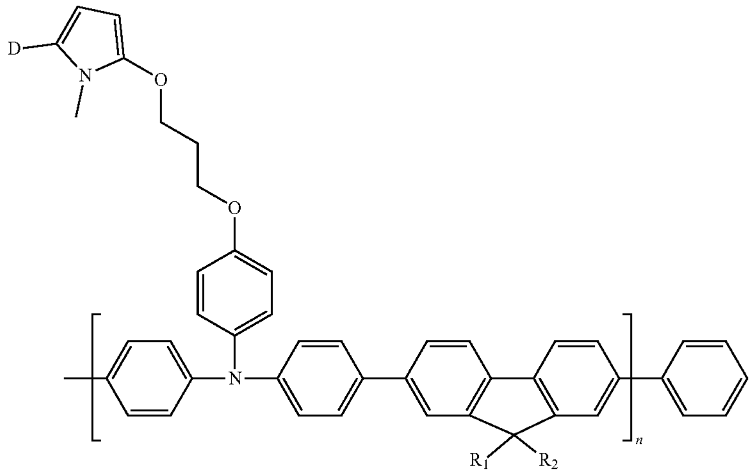
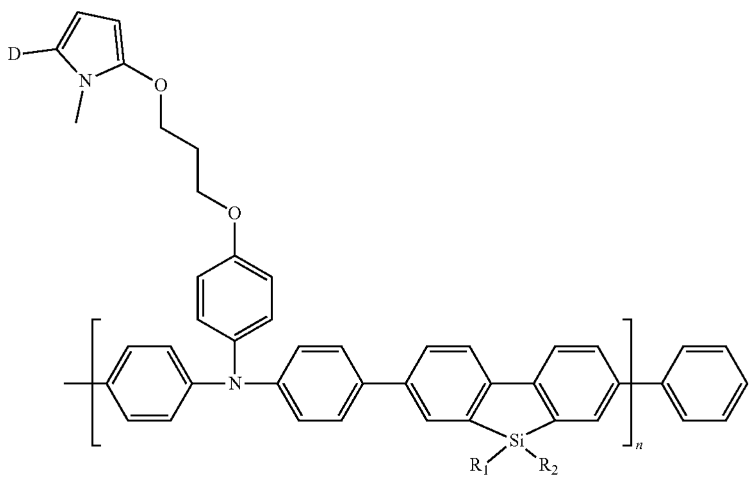
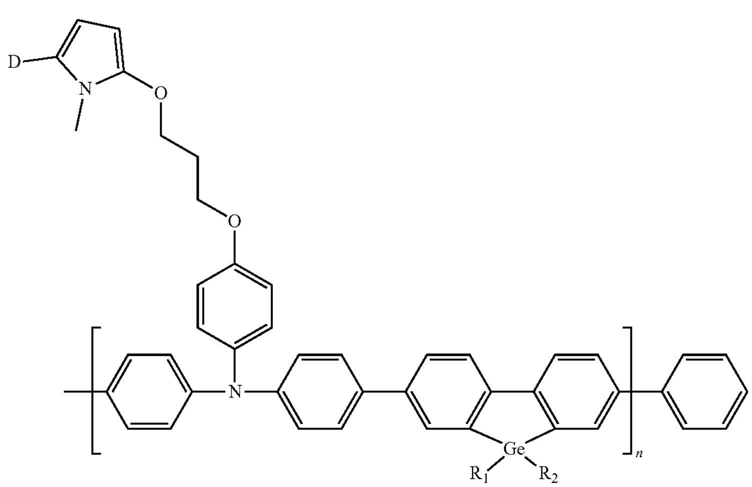

-continued
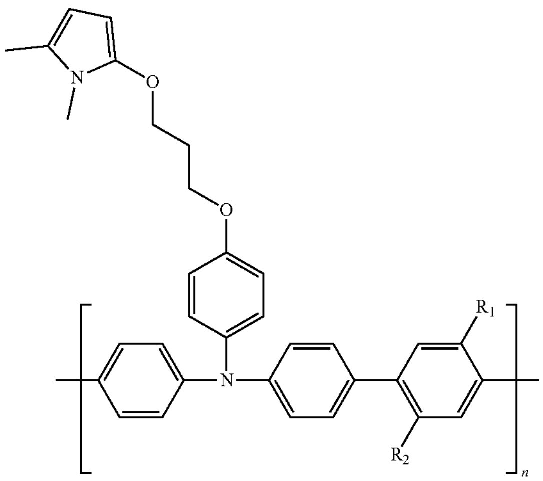
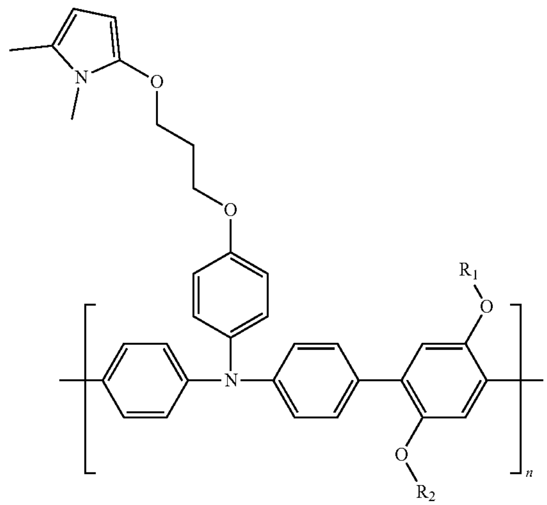
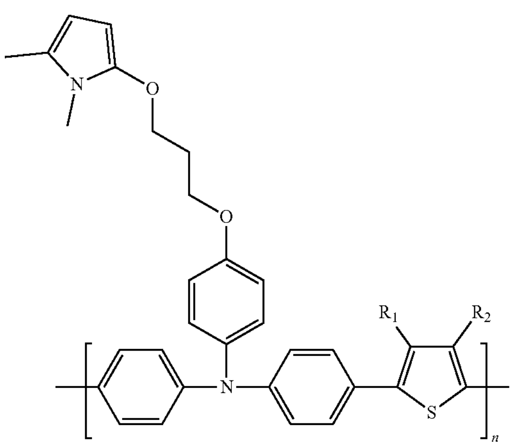
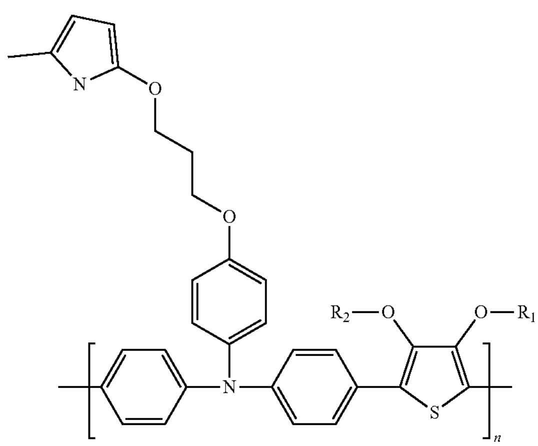
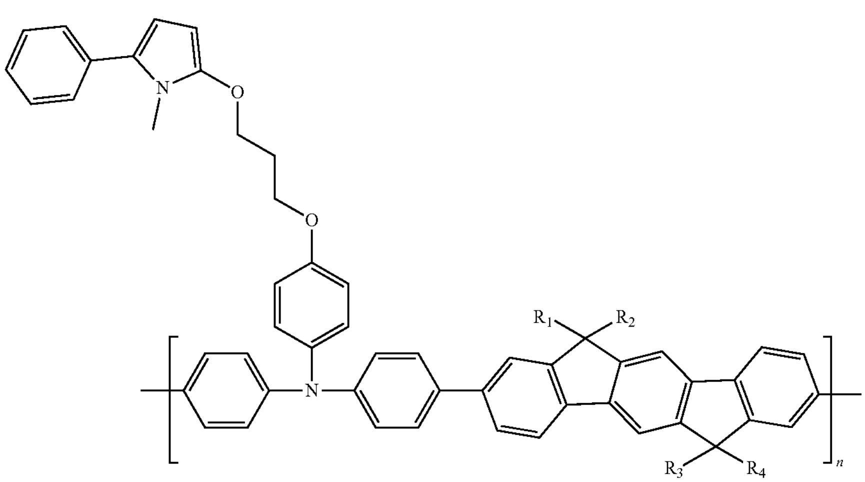

-continued
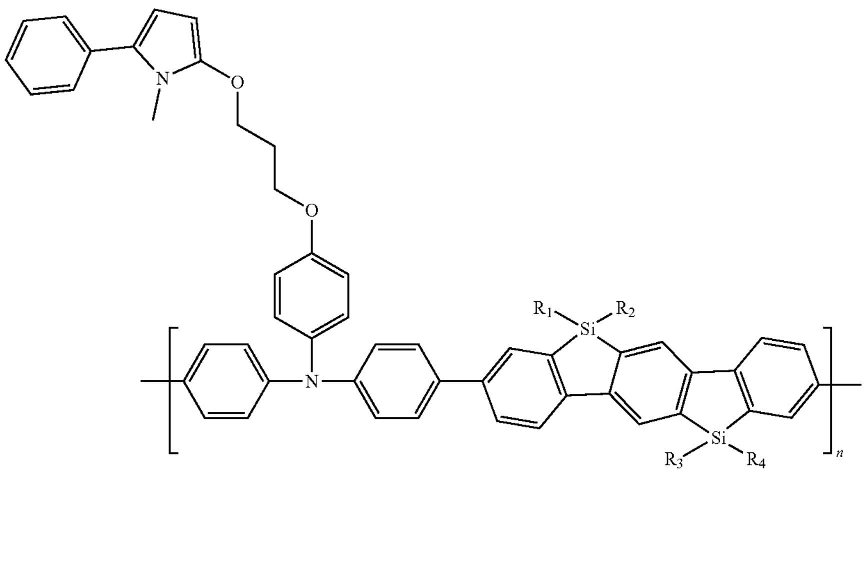
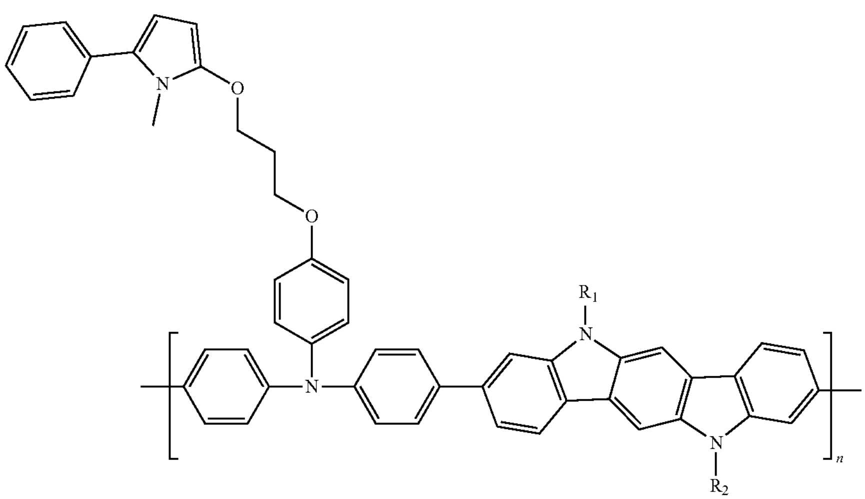
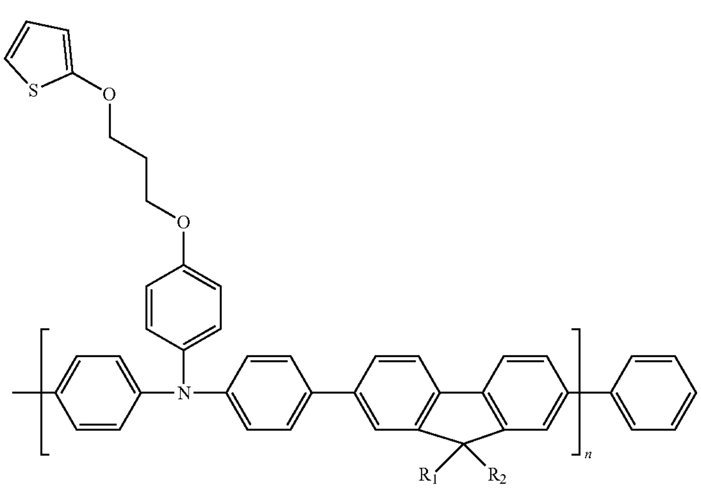

-continued
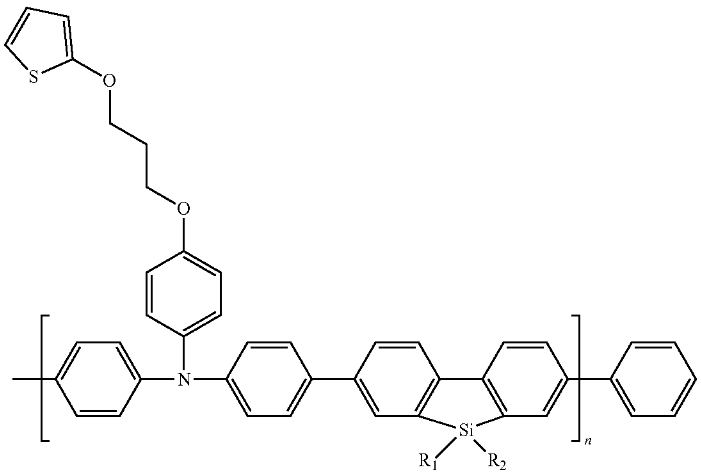
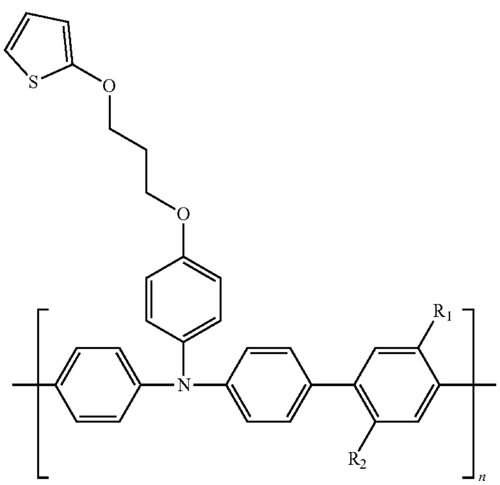
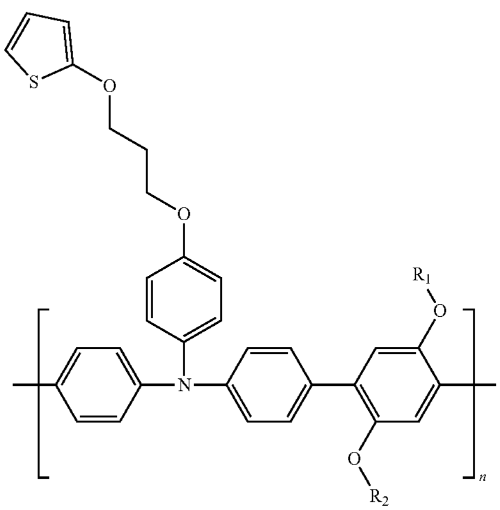
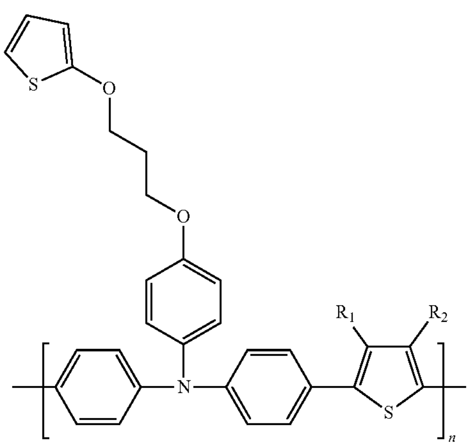
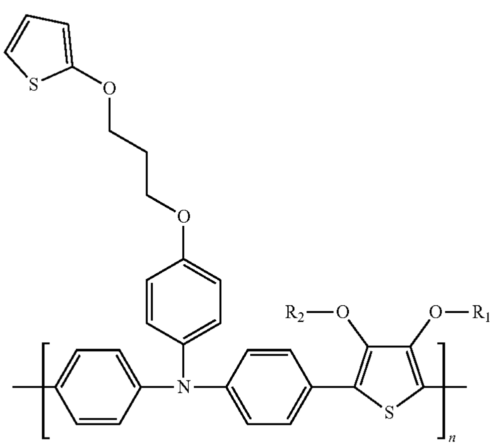

-continued
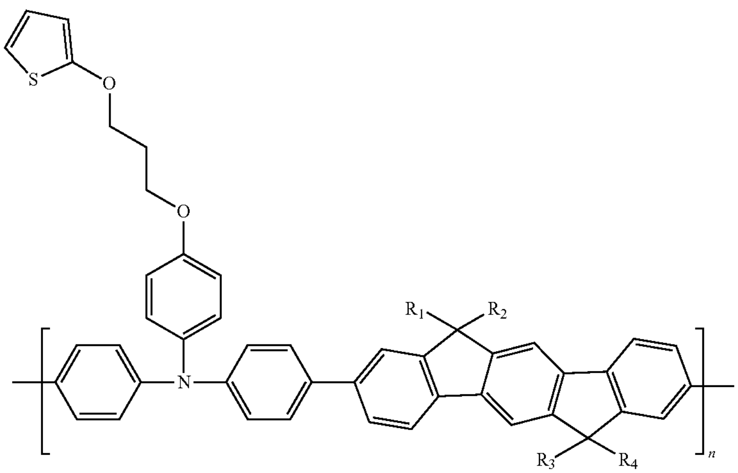
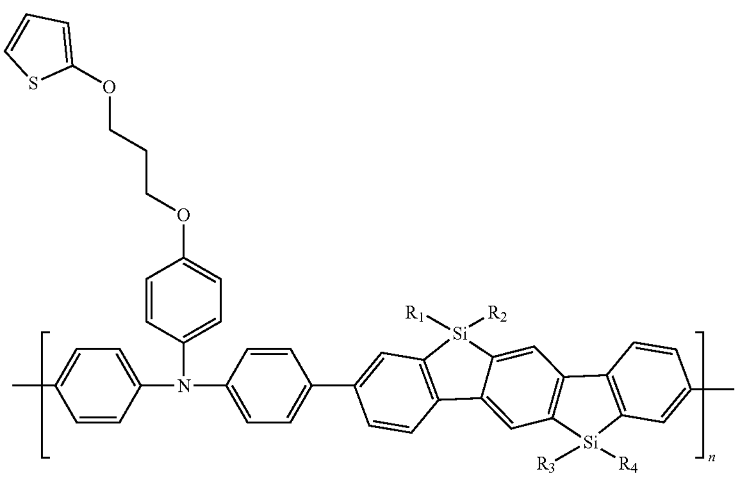
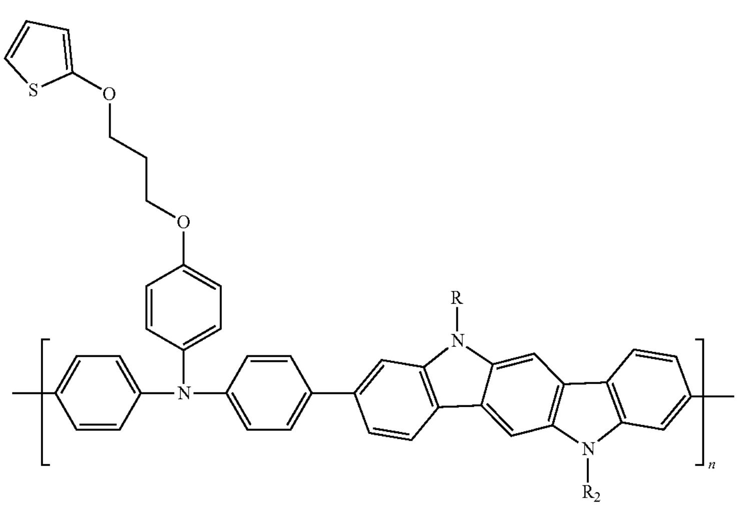

-continued
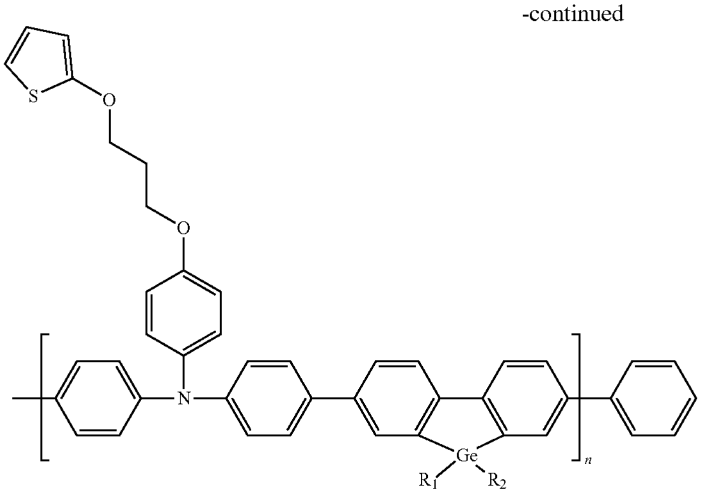
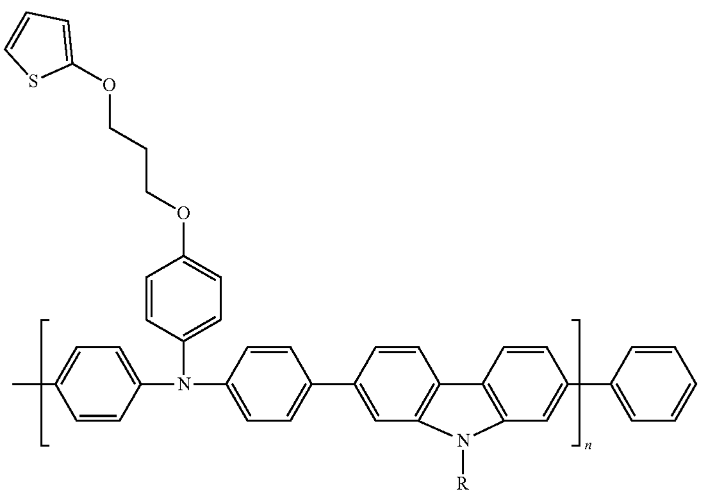
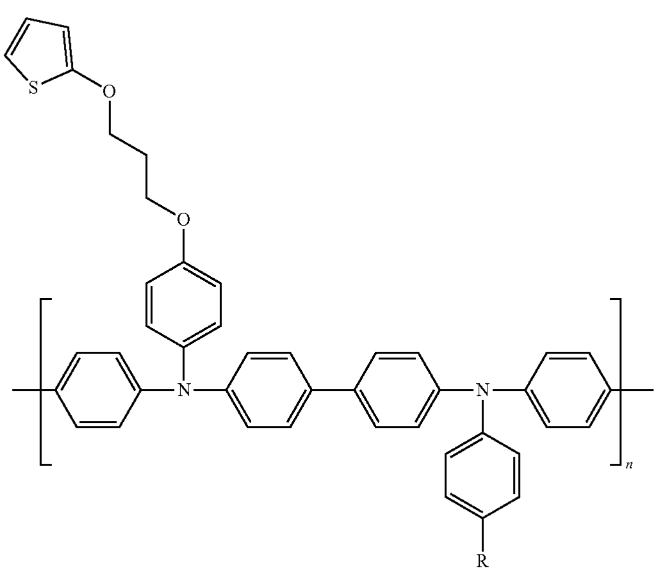

-continued
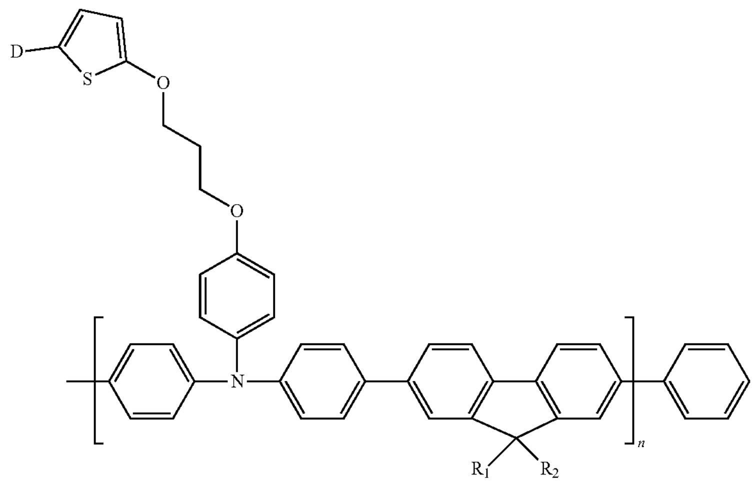
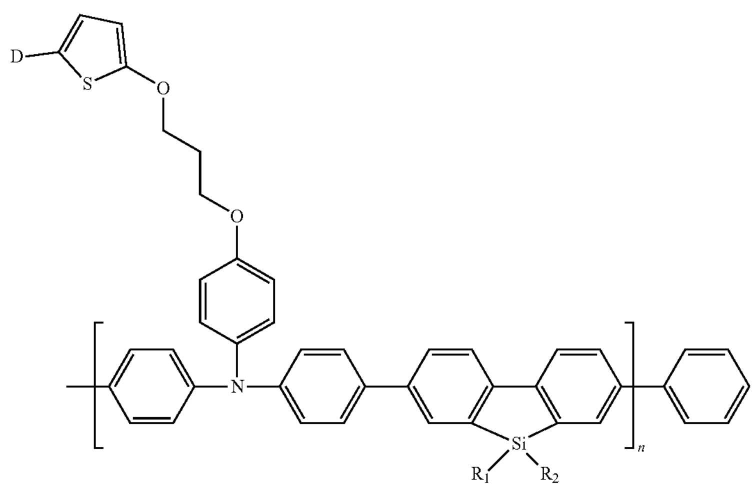
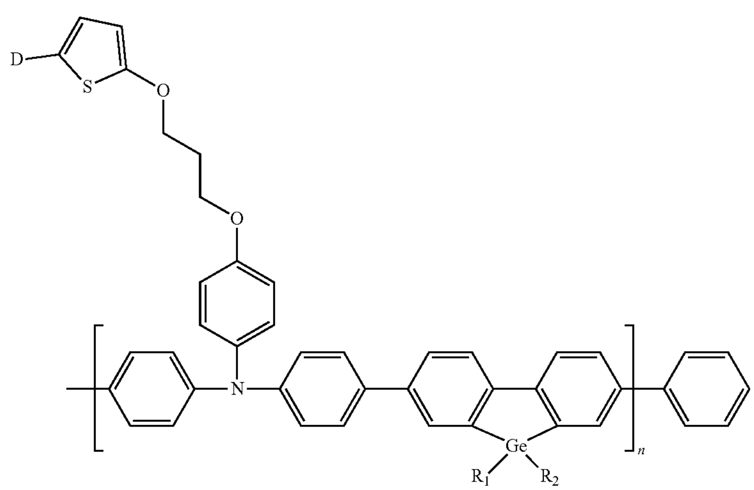

-continued
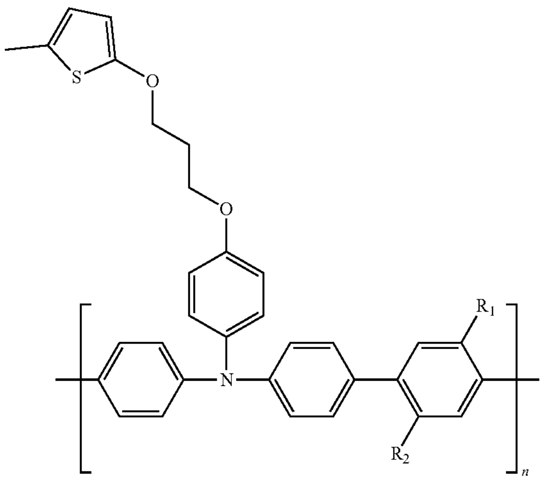
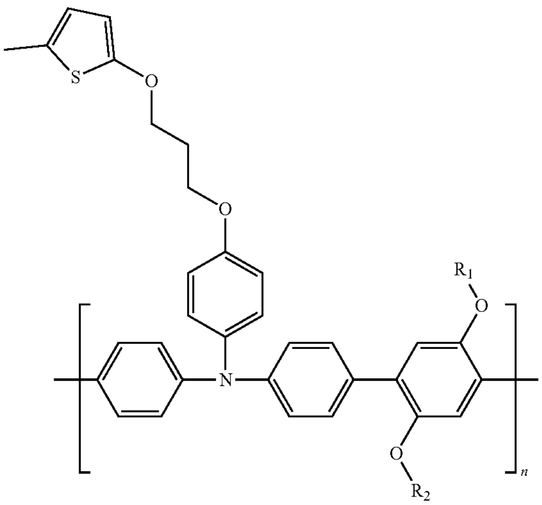
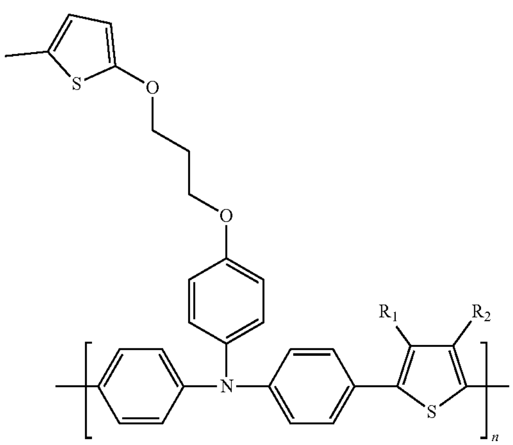
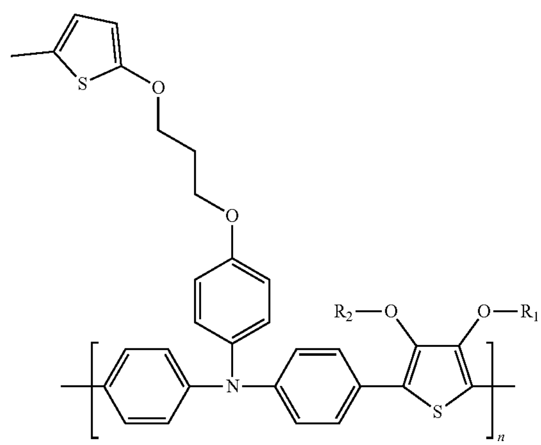
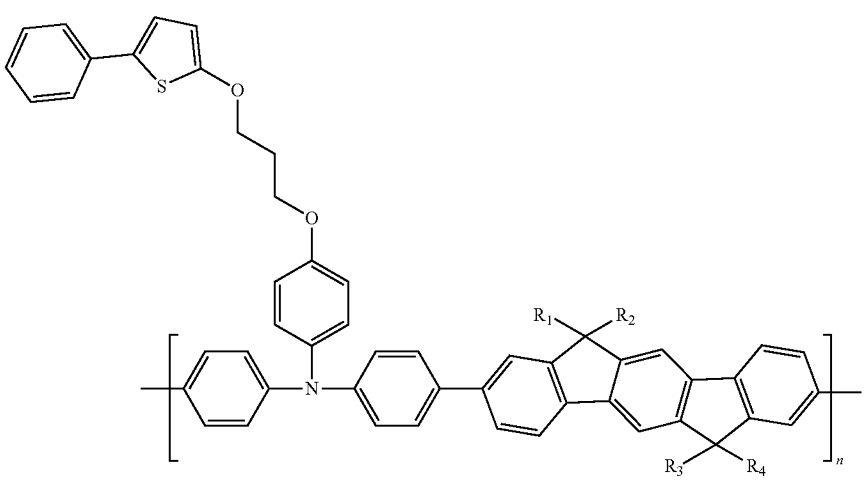

-continued
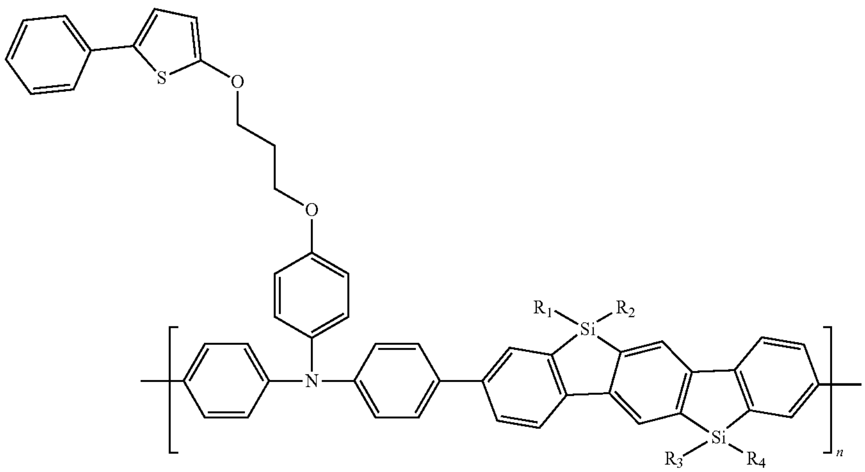
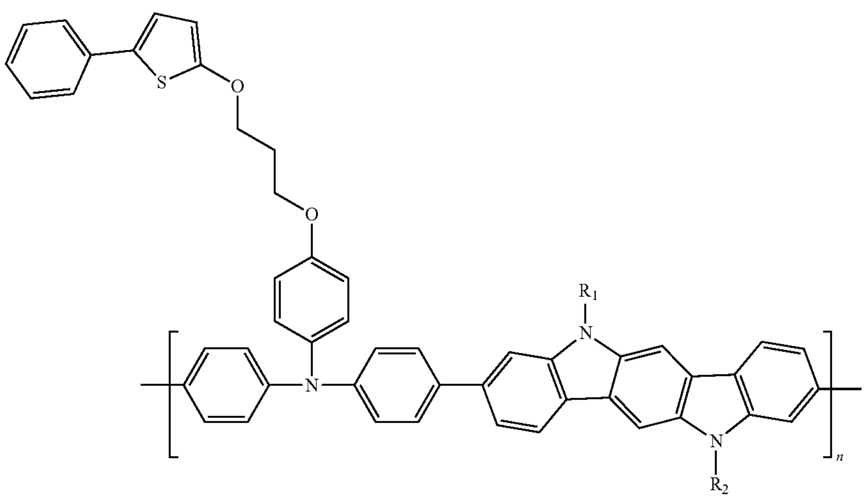
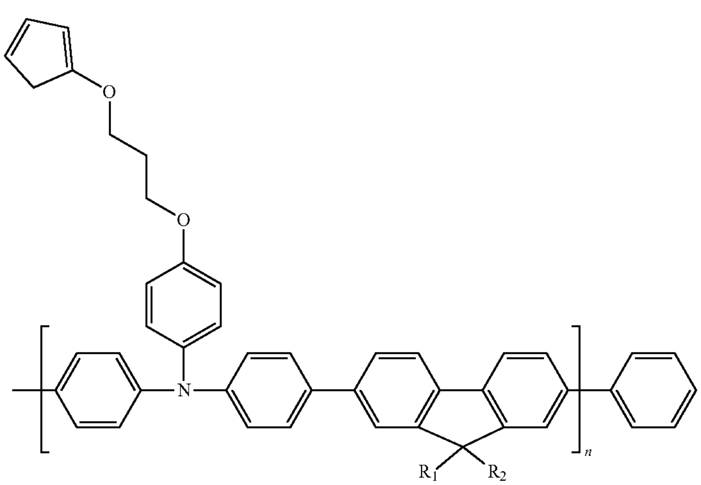

-continued
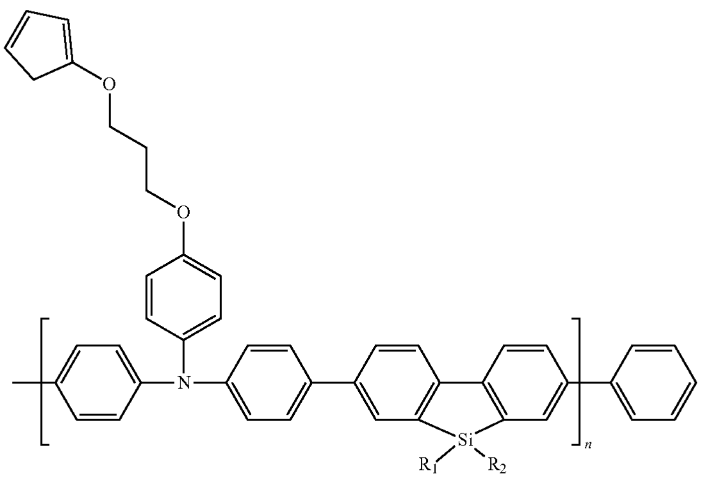
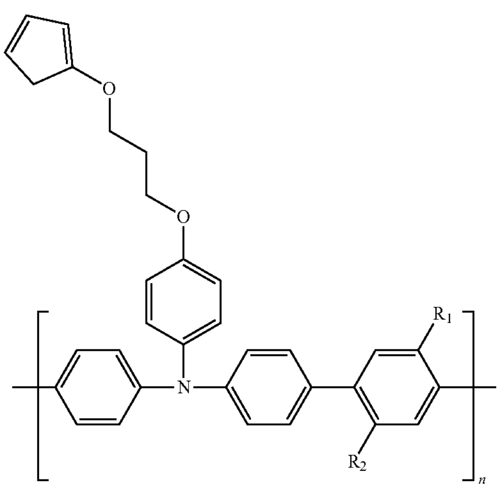
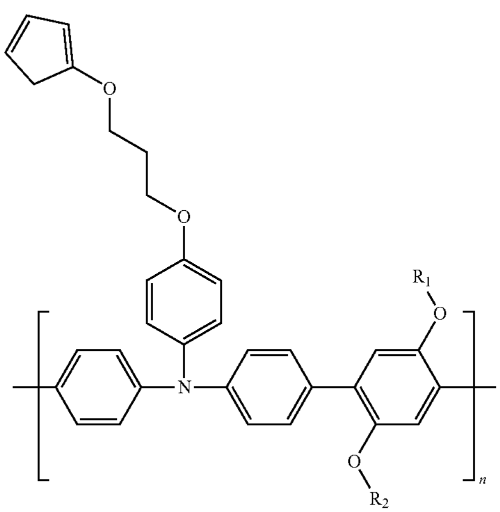
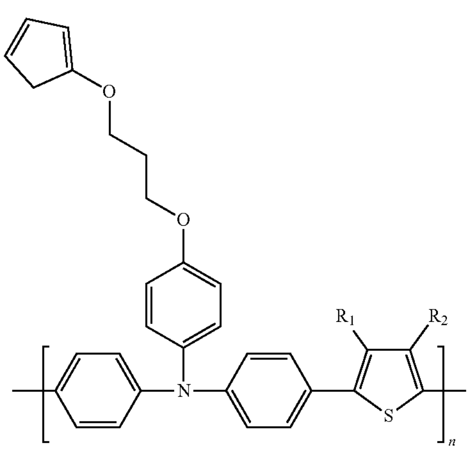
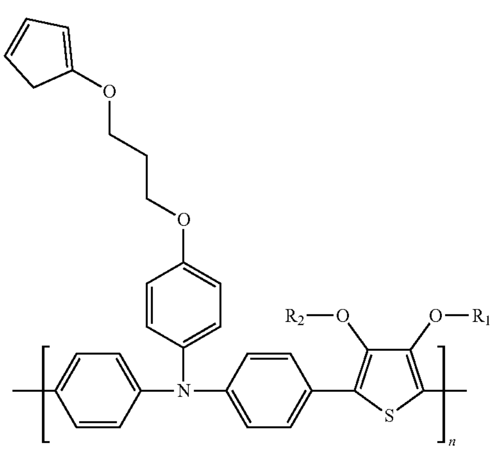

-continued
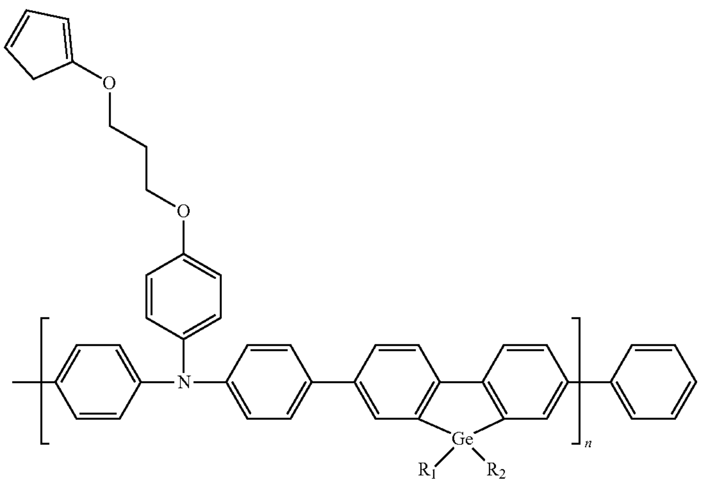
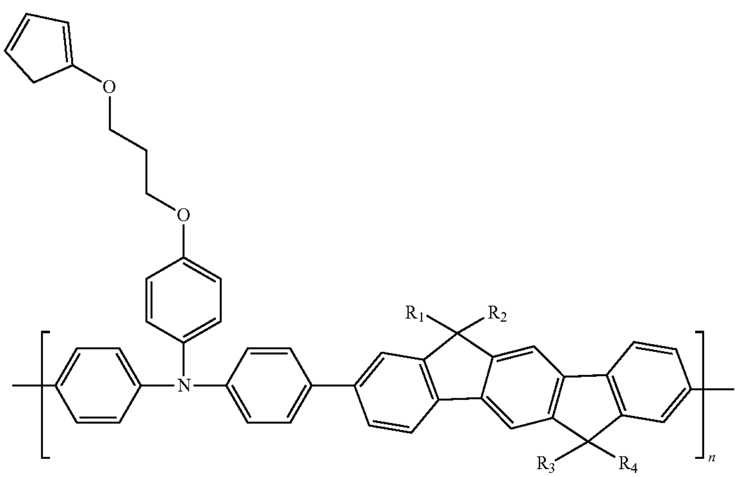
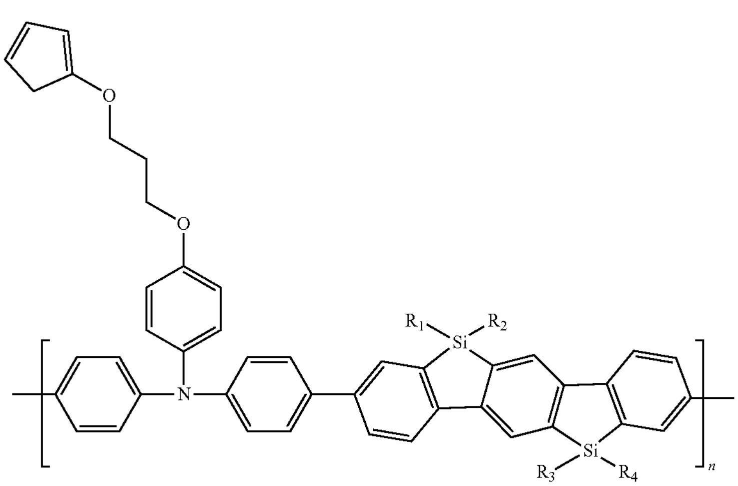

-continued
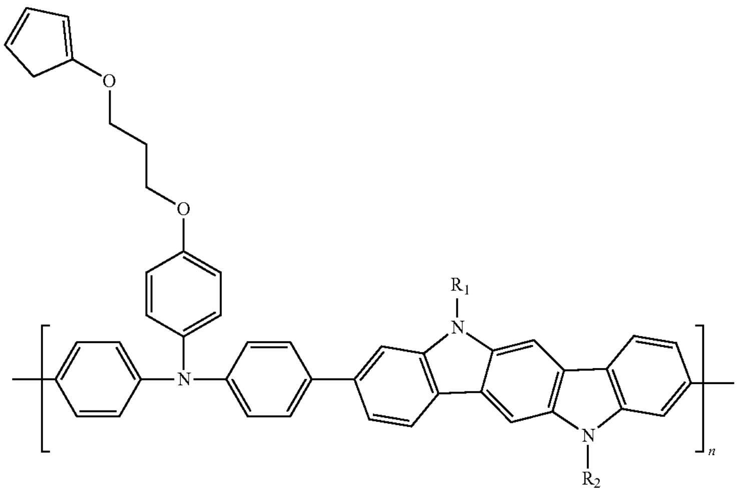
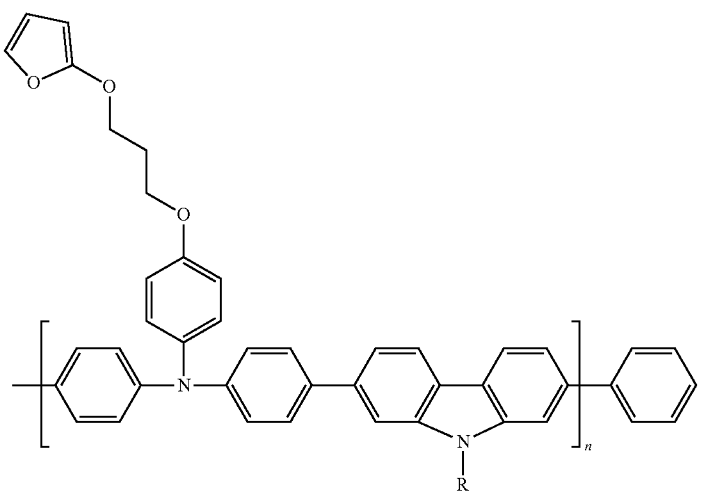
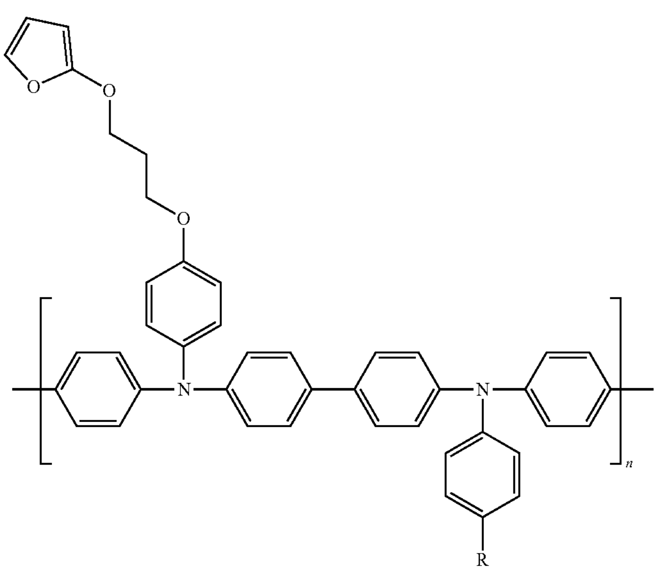

-continued
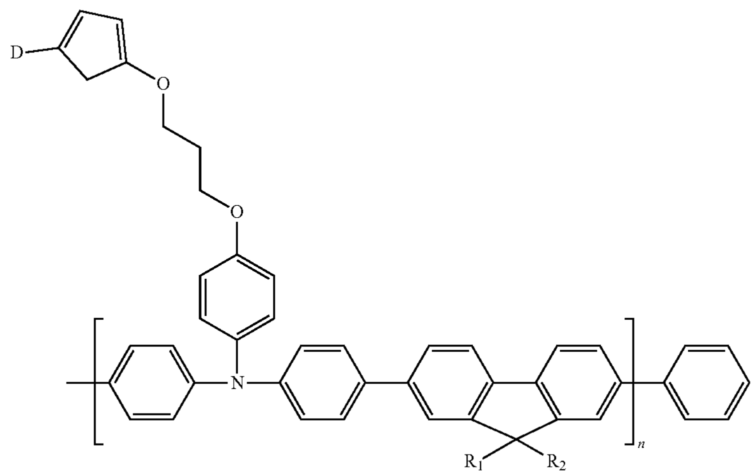
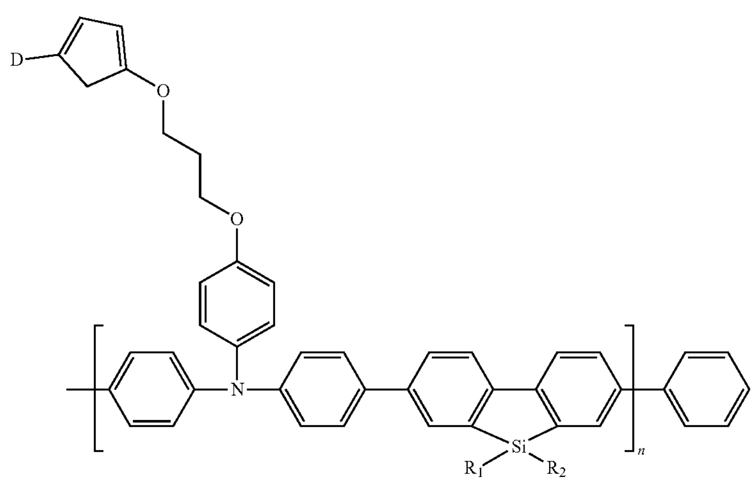
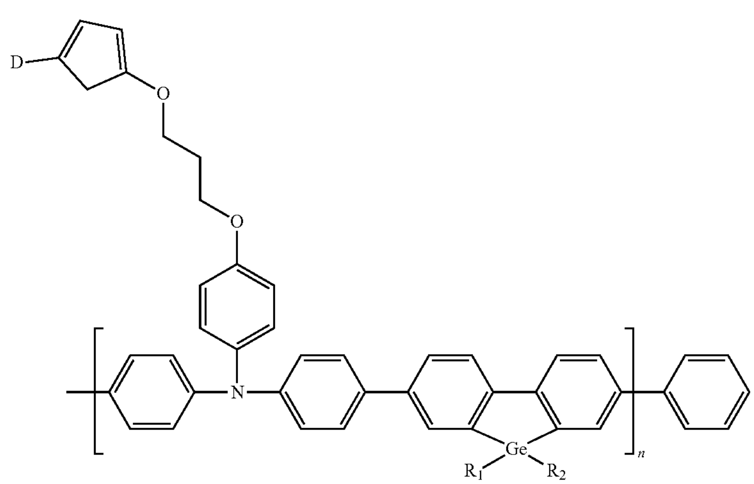

-continued
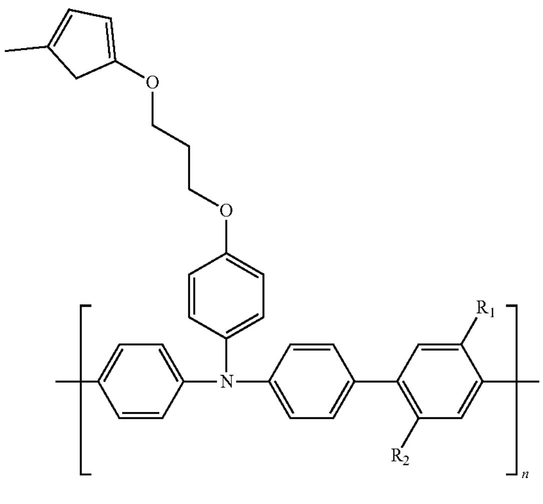
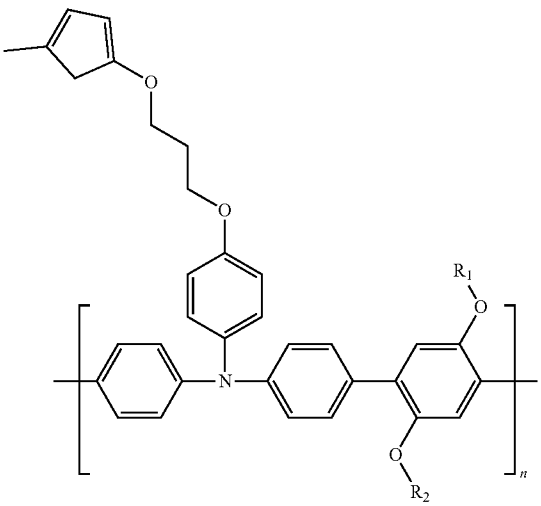
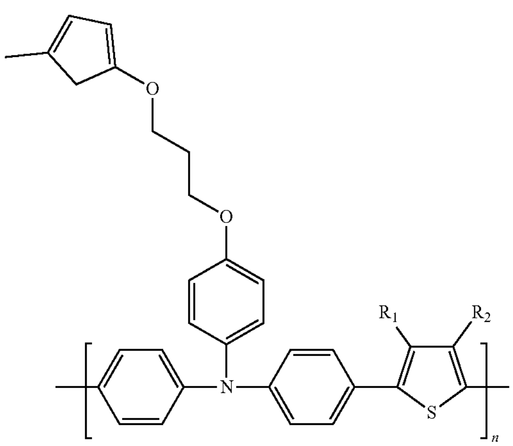
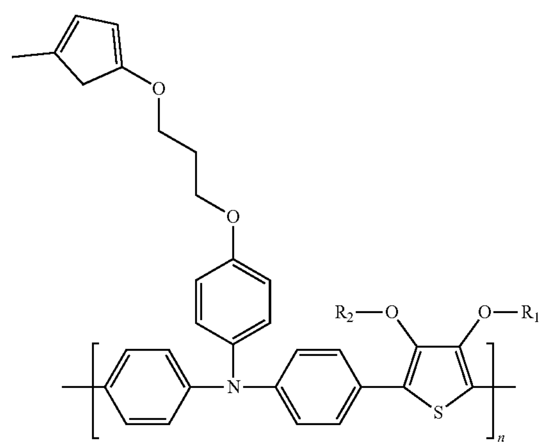
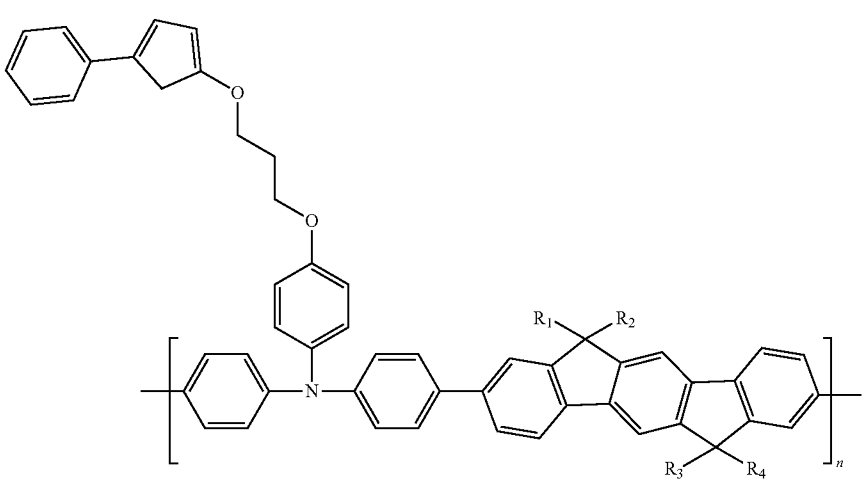

-continued
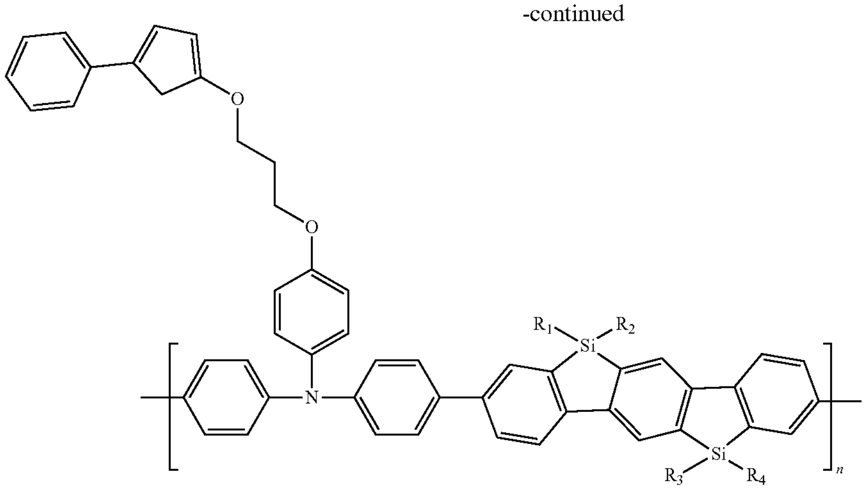
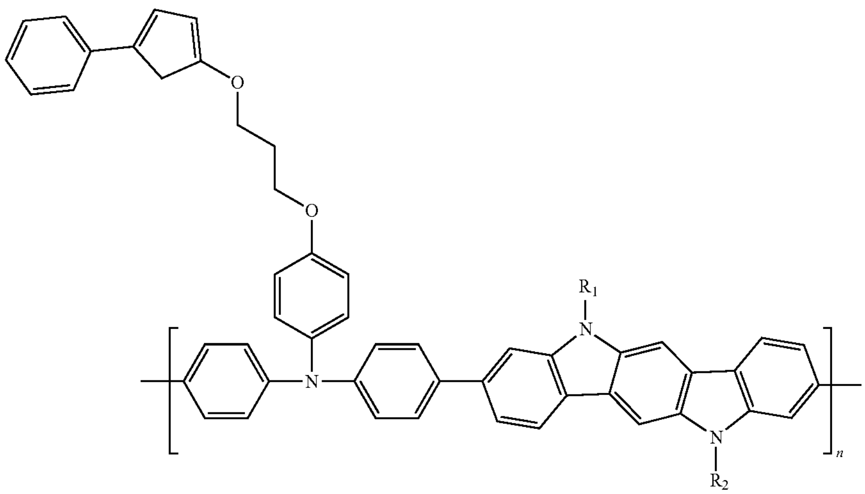
Examples of the polymer II containing the dienophile functional group A are as follows, but not limited to the polymers shown:
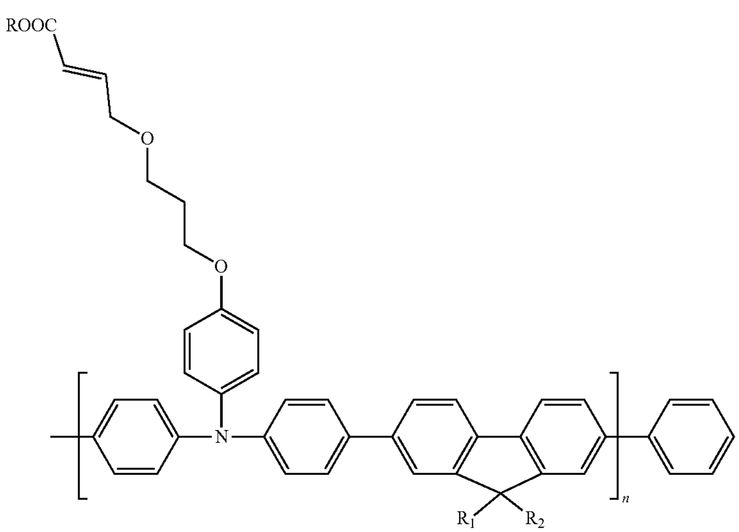

-continued
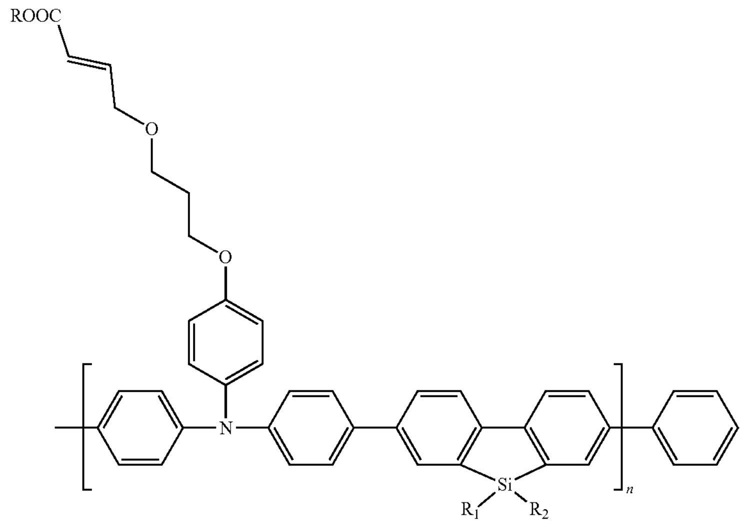
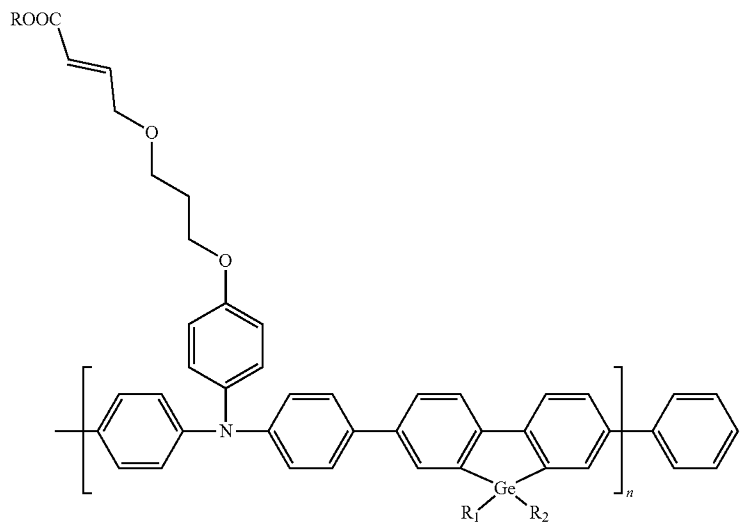
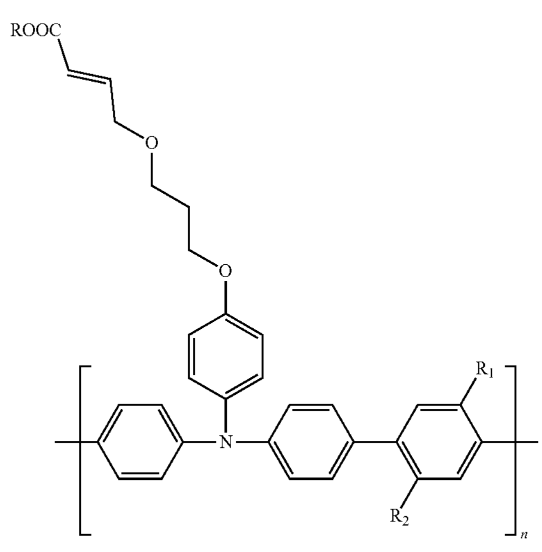
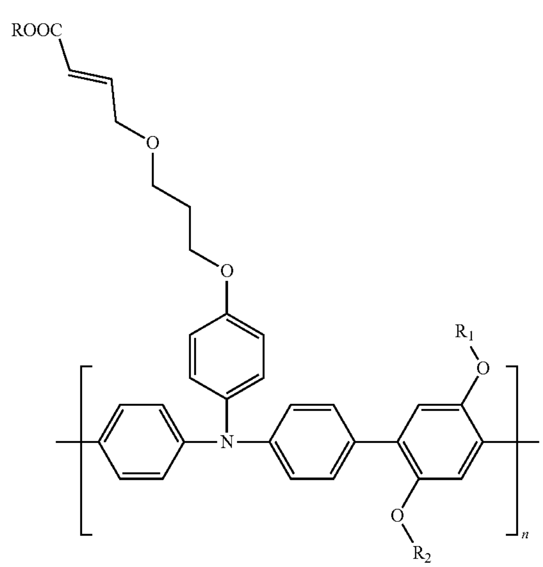

-continued
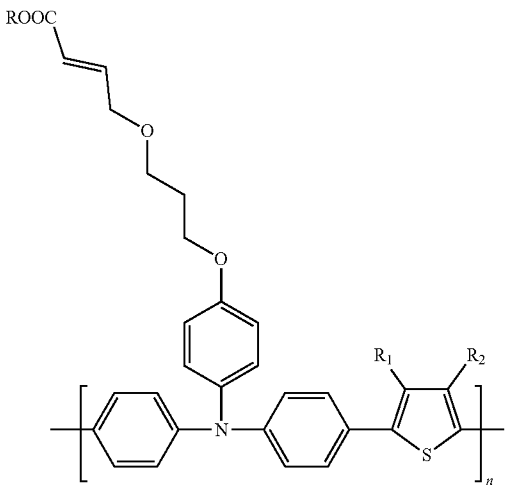
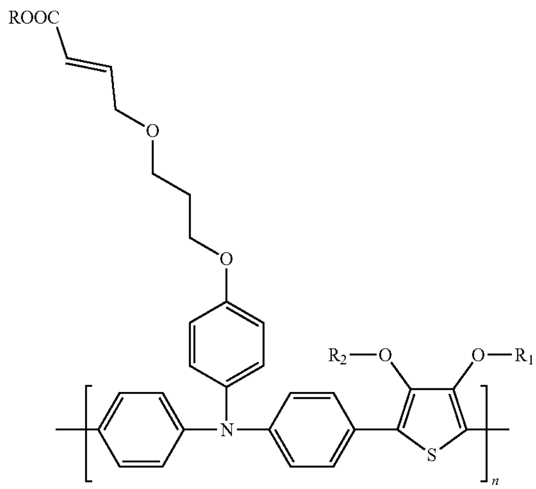
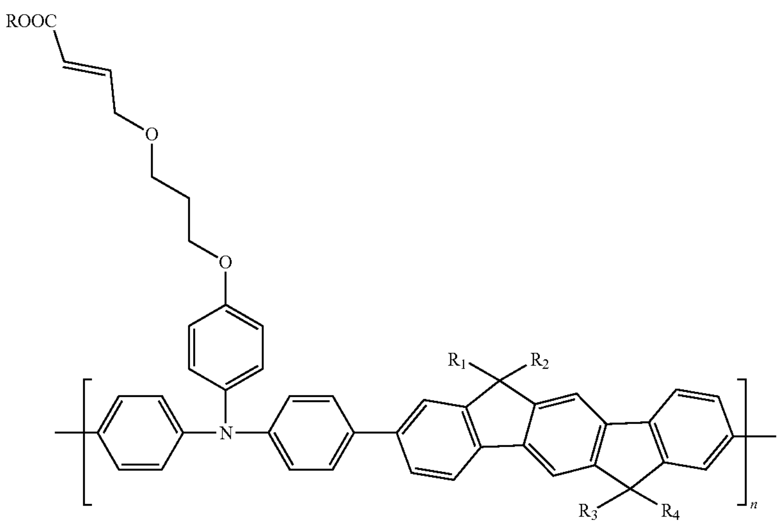
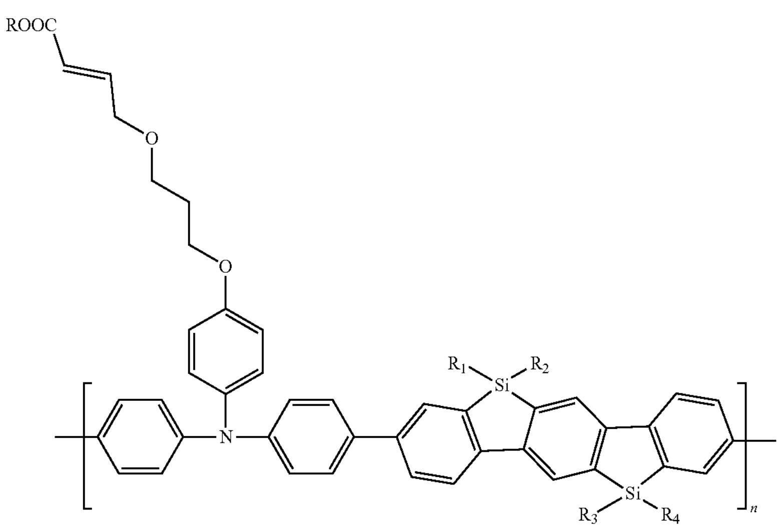

-continued
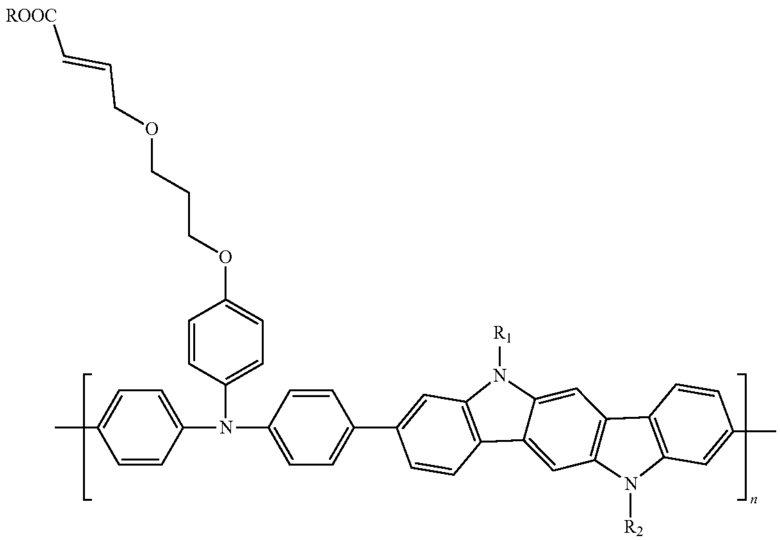
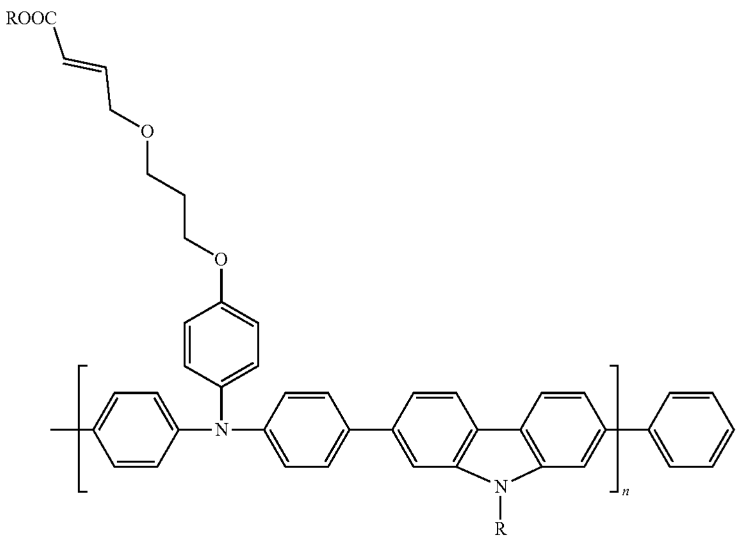
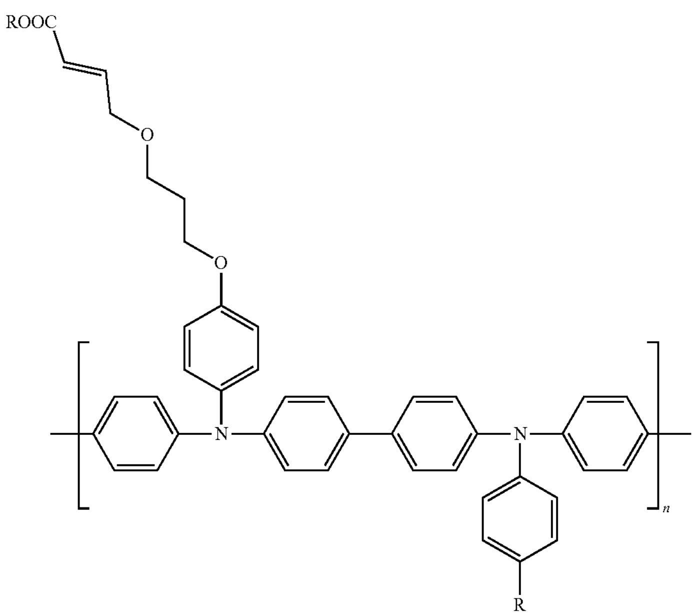

-continued
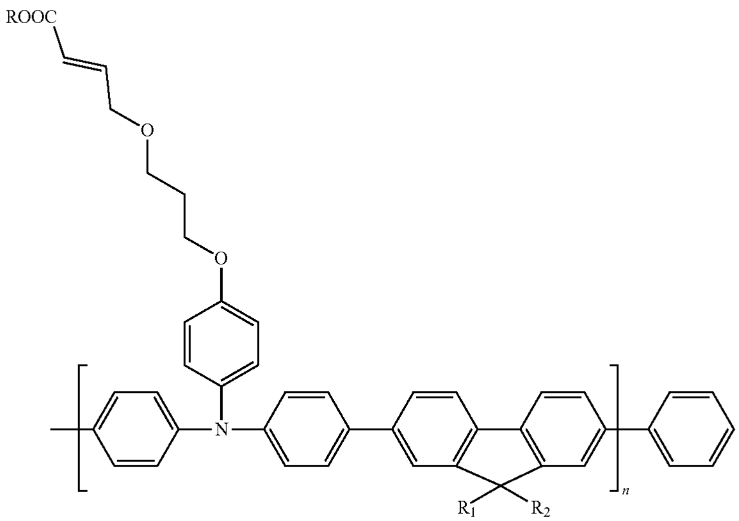
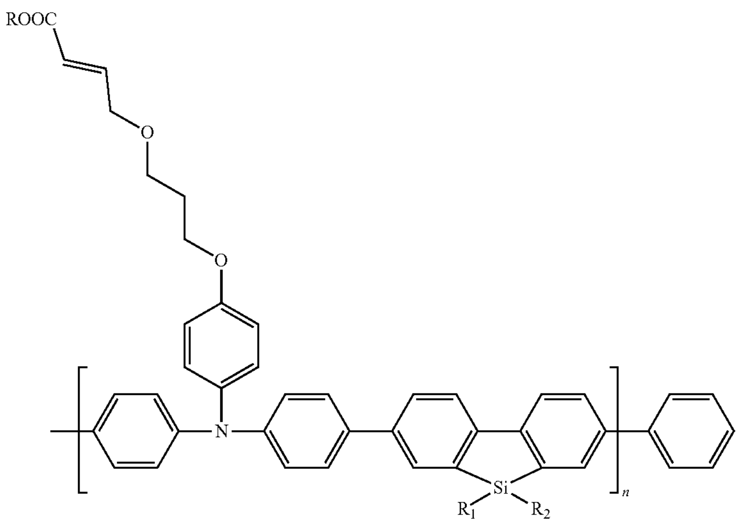
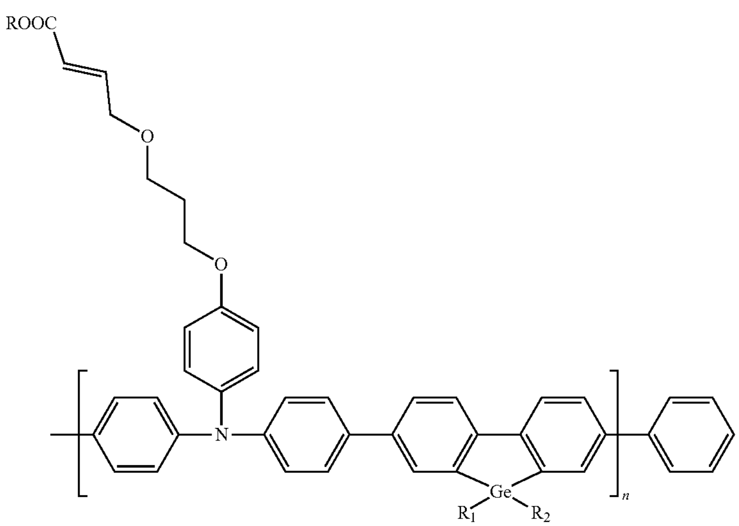

-continued
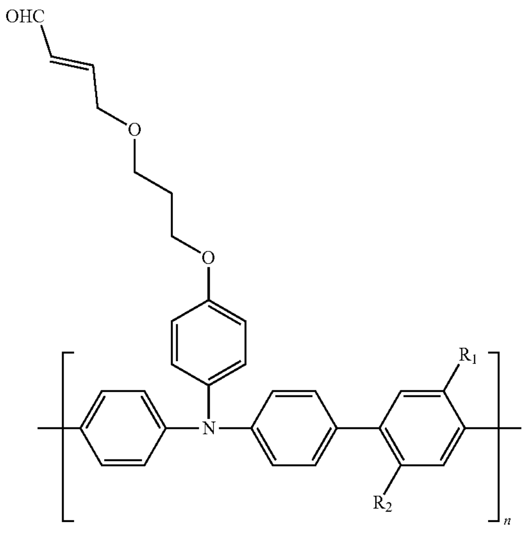
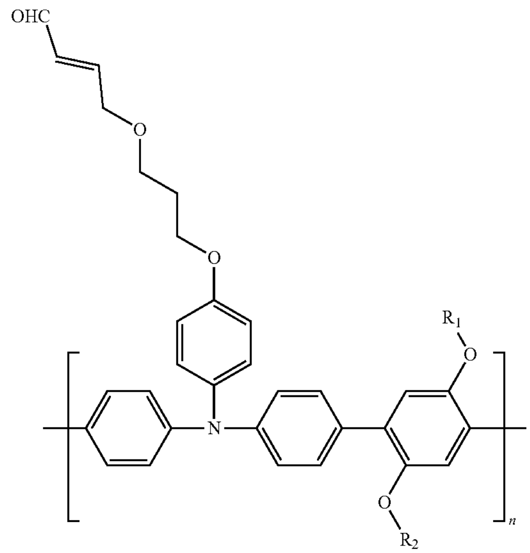
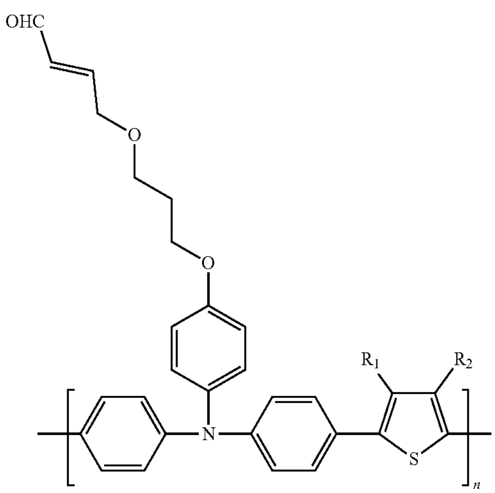
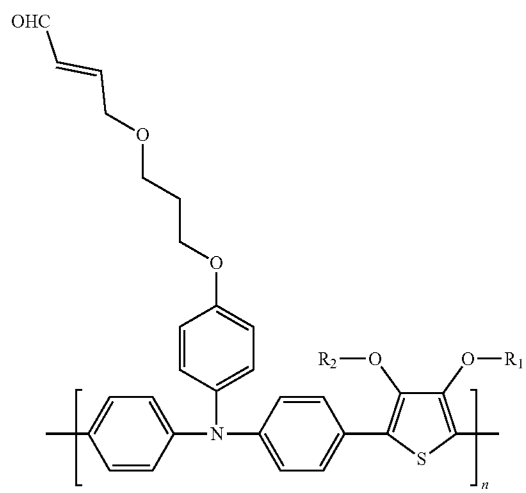
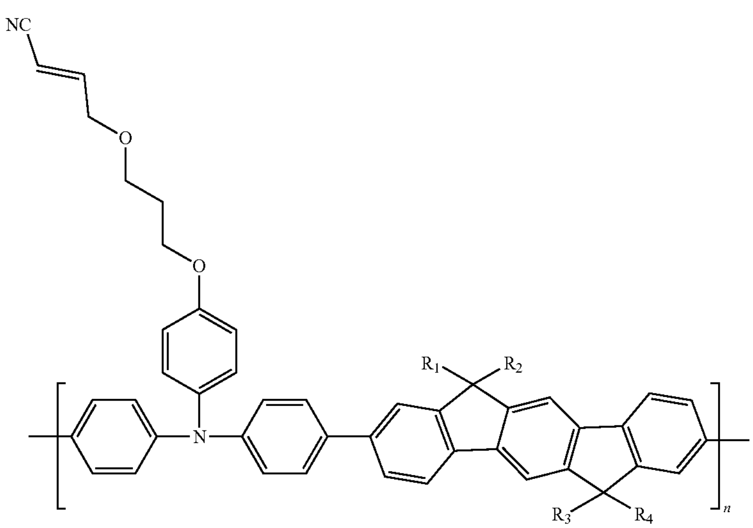

-continued
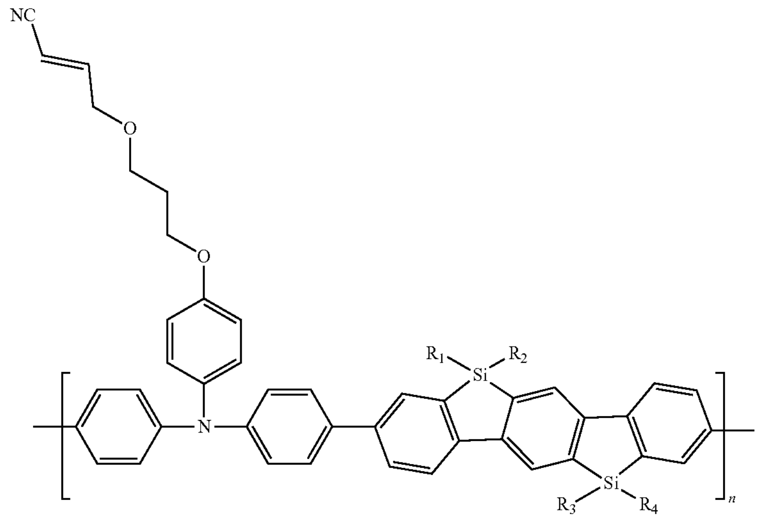
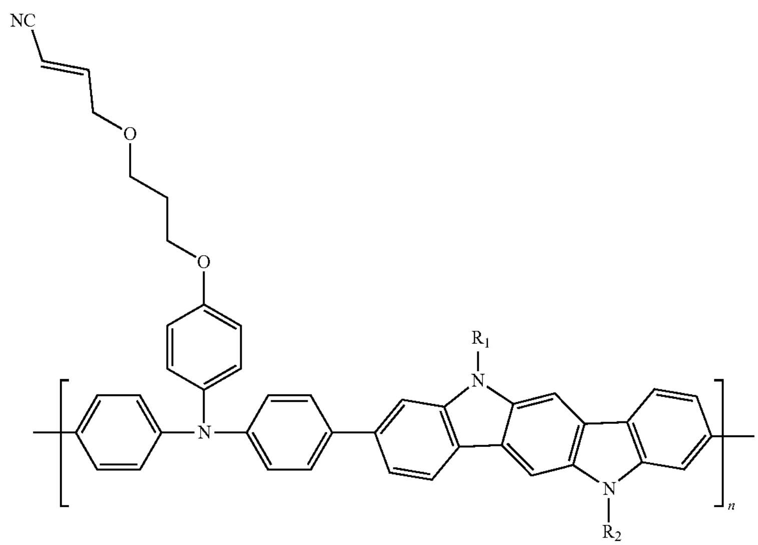
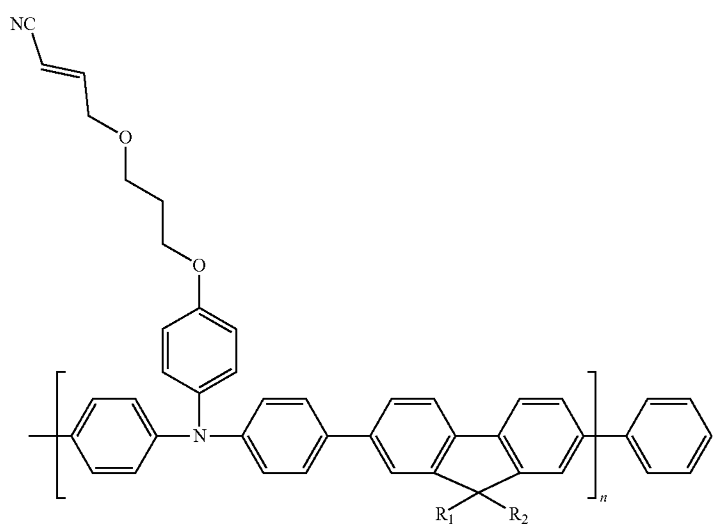

-continued
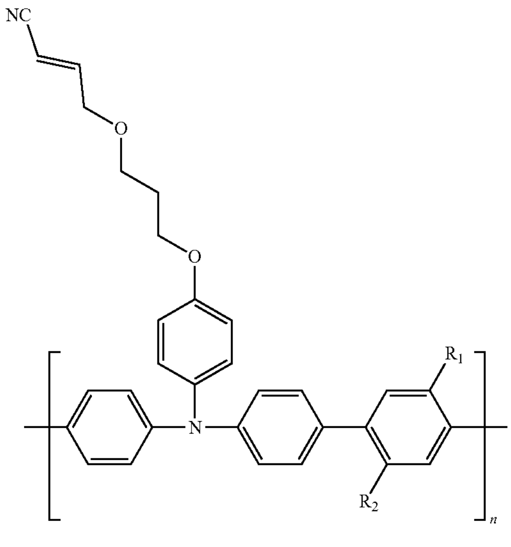
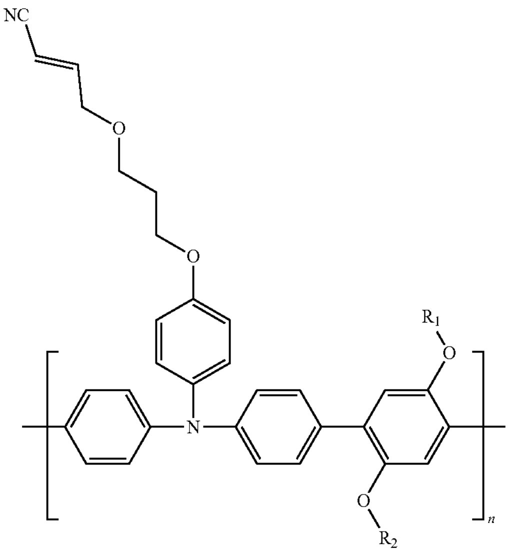
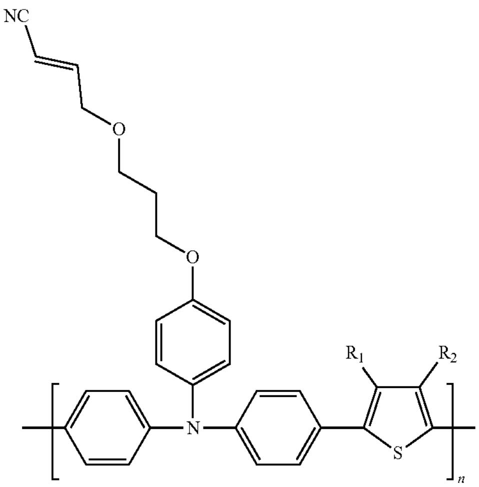
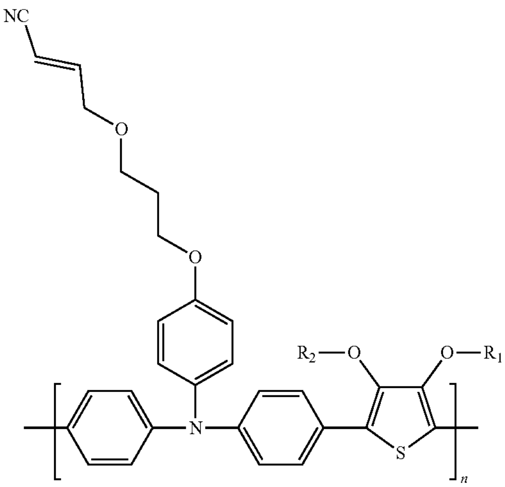
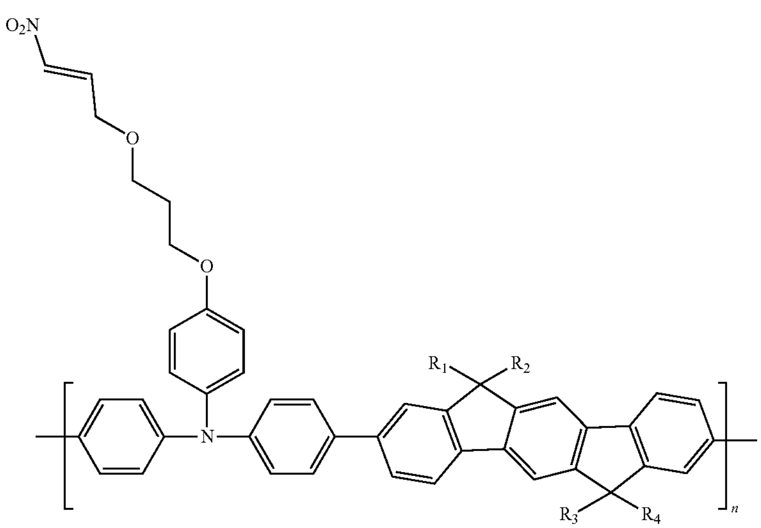

-continued
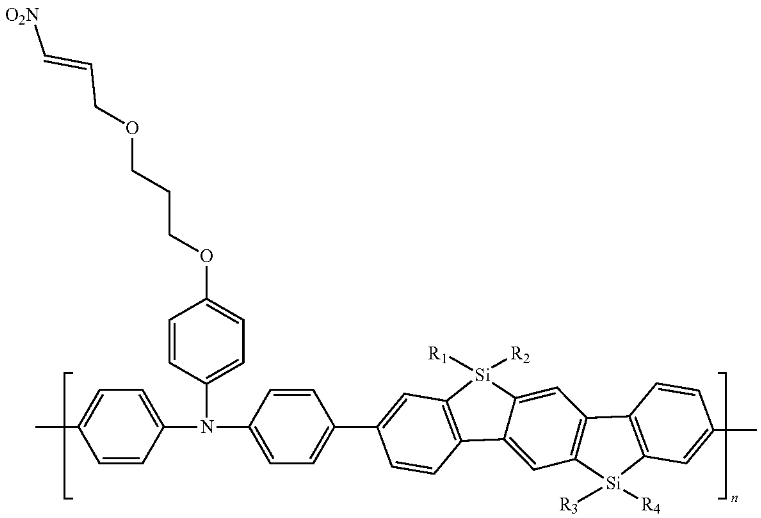
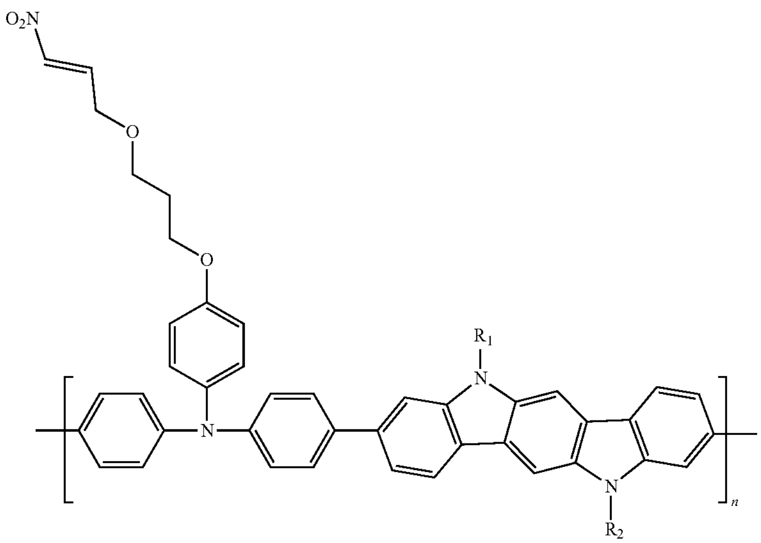
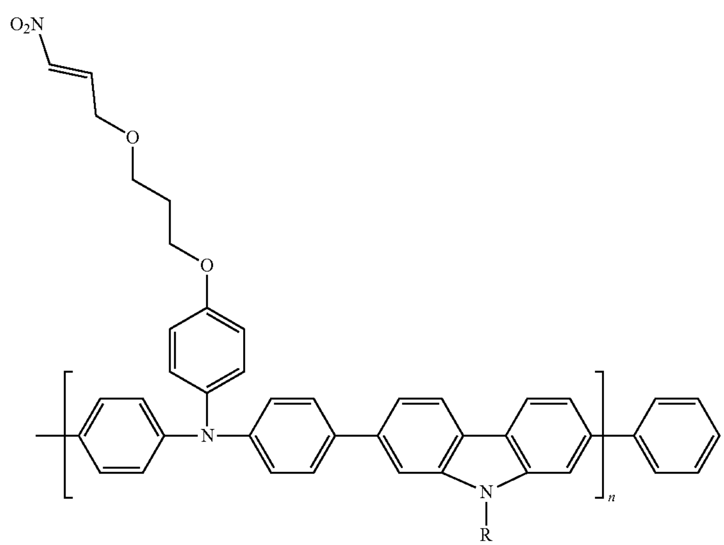

-continued
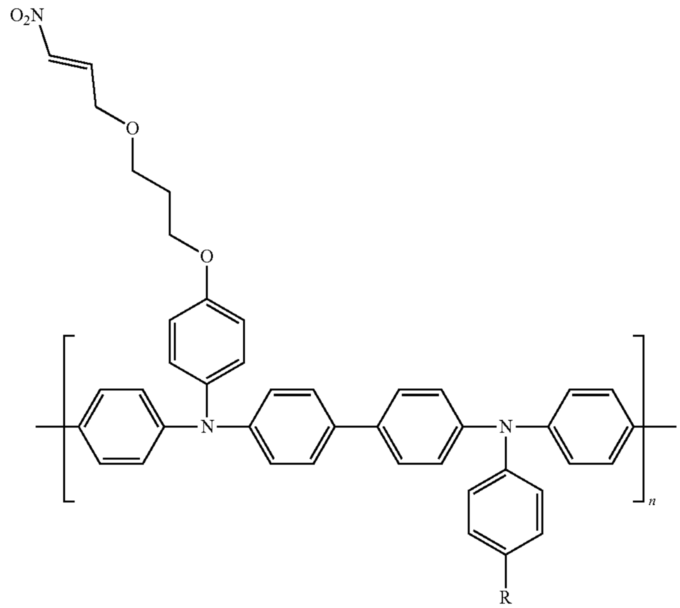
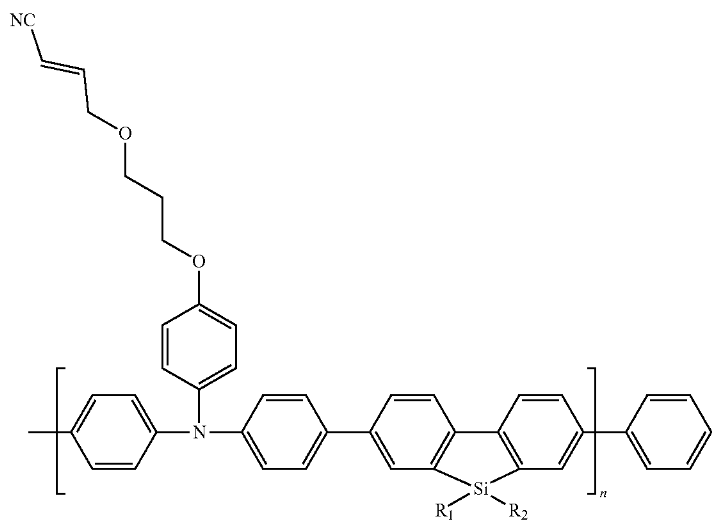
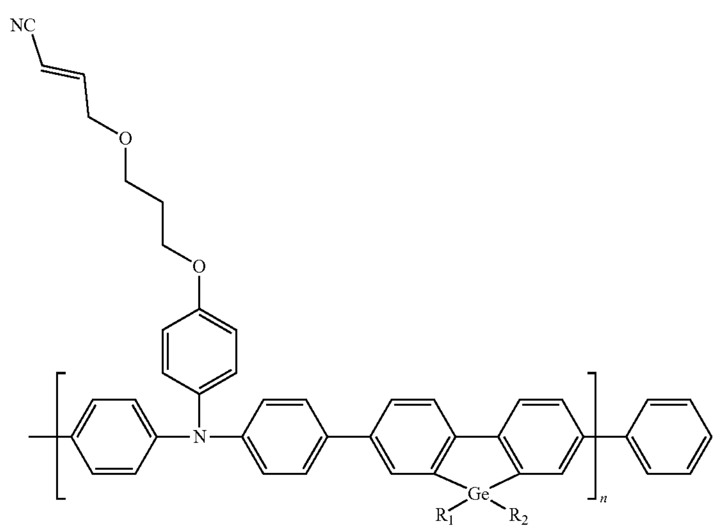

-continued
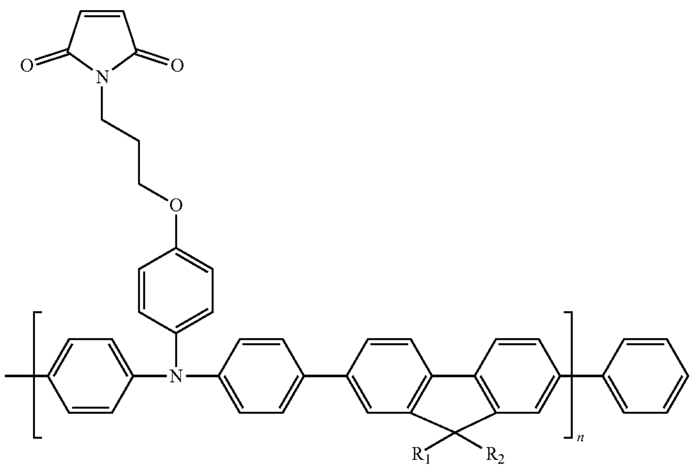
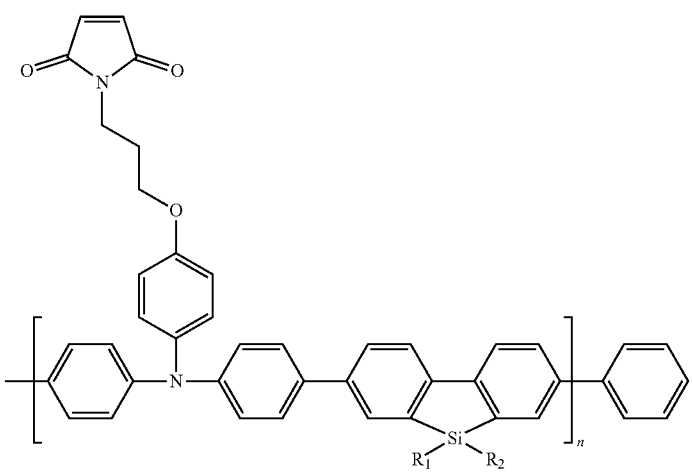
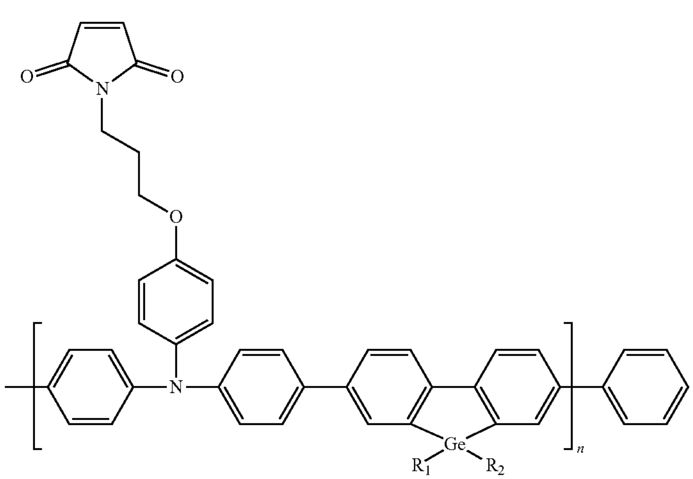

-continued
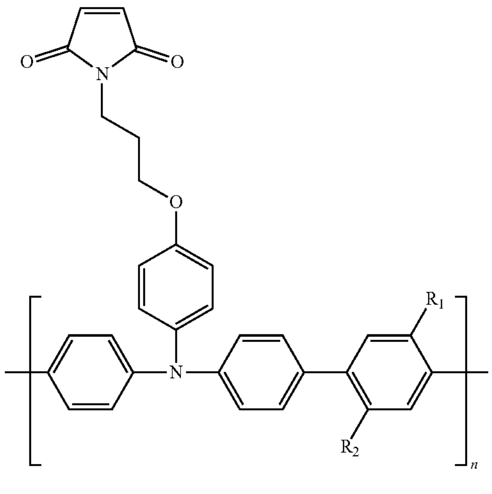
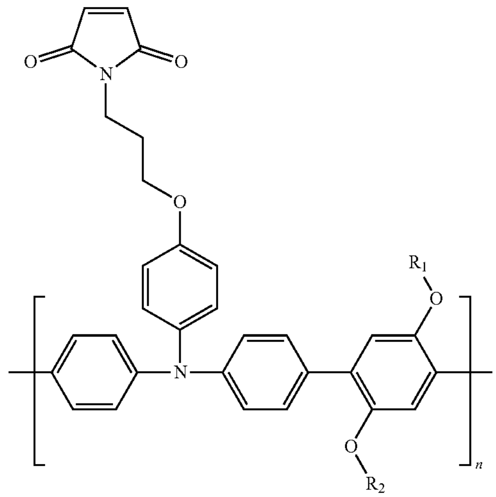
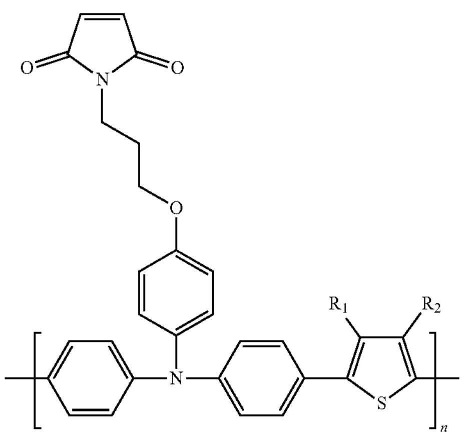
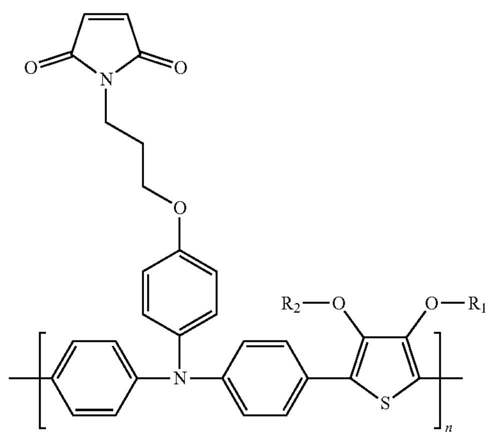
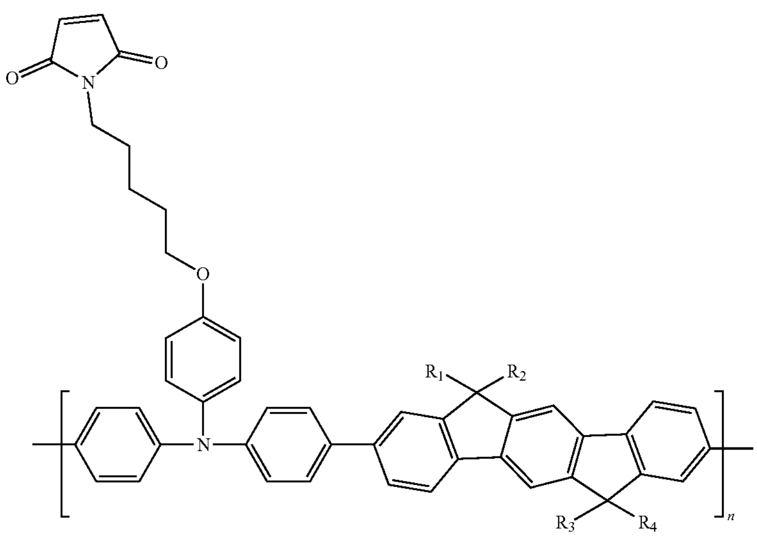

-continued

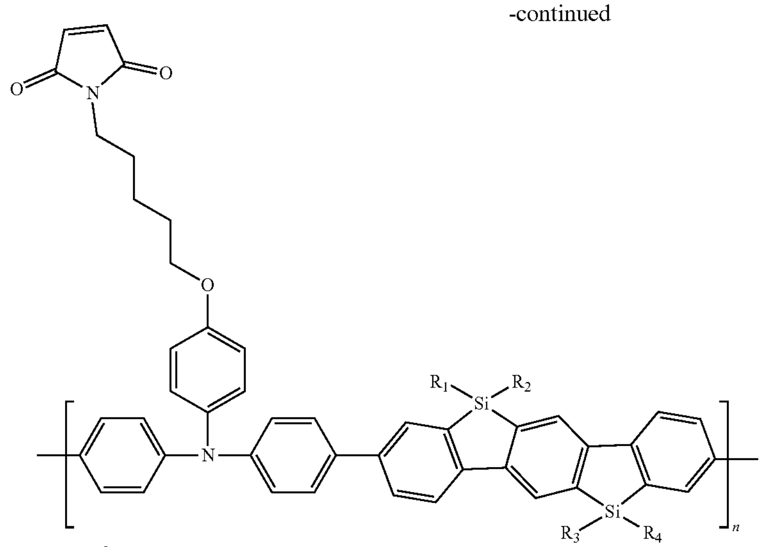

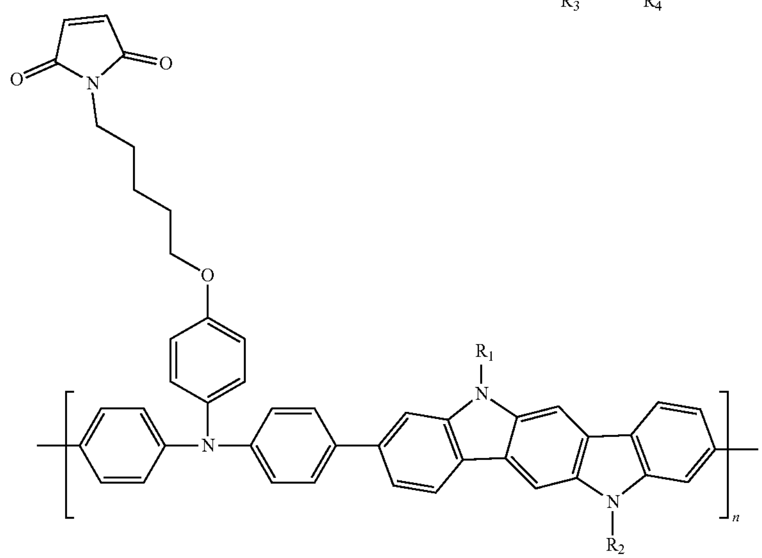

A mixture including the mixture according to the present disclosure, and at least one organic functional material. The organic functional material includes a hole (also known as electron hole) injection or transporting material (HIM/HTM), a hole blocking material (HBM), an electron injection or transporting material (EIM/ETM), an electron blocking material (EBM), an organic matrix material (Host), a singlet emitter (a fluorescent emitter), a triplet emitter (a phosphorescent emitter), particularly a light-emitting organometallic clathrate. Various organic functional materials are described in detail, for example, in WO2010135519A1, US20090134784A1, and WO2011110277A1, the entire contents of which three patent documents are incorporated herein by reference. The organic functional material may be a small molecular or a polymeric material. Organic functional materials are described in further detail hereinafter (but are not limited thereto).

In an embodiment, the mixture includes the foregoing mixture that can undergo a Diels-Alder reaction, and a fluorescent emitter (or a singlet emitter). The mixture that can undergo a Diels-Alder reaction can be used as a host, wherein the fluorescent emitter has a weight percentage less than or equal to 15 wt %, further less than or equal to 12 wt %, still further less than or equal to 9 wt %, still further less than or equal to 8 wt %, and even further less than or equal to 7 wt %.

In some embodiments, the mixture includes the foregoing mixture that can undergo a Diels-Alder reaction, and a TADF material.

In an embodiment, the mixture includes the foregoing mixture that can undergo a Diels-Alder reaction, and a phosphorescent emitter (or a triplet emitter). The foregoing mixture that can undergo a Diels-Alder reaction can be used as a host, wherein the phosphorescent emitter has a weight percentage less than or equal to 30 wt %, further less than or equal to 25 wt %, still further less than or equal to 20 wt %, and even further less than or equal to 18 wt %.

In another embodiment, the mixture includes the foregoing mixture that can undergo a Diels-Alder reaction, and an HTM material.

The singlet emitter, the triplet emitter and TADF material are described in more detail below (but not limited thereto).

1. Singlet Emitter

A singlet emitter tends to have a longer conjugated π-electron system. There have been many examples so far, such as the styrylamine and derivatives thereof disclosed in JP2913116B and WO2001021729A1, and the indenofluorene and derivatives thereof disclosed in WO2008/006449 and WO2007/140847.

In an embodiment, the singlet emitter may be selected from the group consisting of a monostyrylamine, a distyrylamine, a tristyrylamine, a tetrastyrylamine, a styryl phosphine, a styryl ether, and an aryl amine.

A monostyrylamine refers to a compound including an unsubstituted or substituted styryl group and at least one amine, particularly one aryl amine. A distyrylamine refers to a compound including two unsubstituted or substituted styryl groups and at least one amine, particularly one aryl amine. A tristyrylamine refers to a compound including three unsubstituted or substituted styryl groups and at least one amine, particularly one aryl amine. A tetrastyrylamine refers to a compound including four unsubstituted or substituted styryl groups and at least one amine, particularly one aryl amine. A suitable styrene is stilbene, which may be further substituted. The corresponding phosphines and ethers are defined similarly as amines. An aryl amine or aromatic amine refers to a compound including three unsubstituted or substituted aromatic ring or heteroaromatic ring systems directly attached to nitrogen. In one embodiment, at least one of these aromatic ring or heteroring systems is selected from fused ring systems and particularly has at least 14 aromatic ring atoms. Suitable examples are an aromatic anthramine, an aromatic anthradiamine, an aromatic pyrene amine, an aromatic pyrene diamine, an aromatic chrysene amine and an aromatic chrysene diamine. An aromatic anthramine refers to a compound in which one diaryl amino group is directly attached to anthracene, particularly at position 9. An aromatic anthradiamine refers to a compound in which two diarylamino groups are directly attached to anthracene, particularly at positions 9, 10. Aromatic pyrene amines, aromatic pyrene diamines, aromatic chrysene amines and aromatic chrysene diamine are similarly defined, wherein the diarylarylamine group is particularly attached to position 1, or 1 and 6 of pyrene.

Examples of singlet emitters based on vinylamine and aryl amine are also found in the following patent documents: WO2006/000388, WO2006/058737, WO2006/000389, WO2007/065549, WO2007/115610, U.S. Pat. No. 7,250,532 B2, DE102005058557 A1, CN1583691 A, JP08053397 A, U.S. Pat. No. 6,251,531 B1, US2006/210830 A, EP1957606 A1, and US2008/0113101 A1, and the entire contents of the above-listed patent documents are incorporated herein by reference.

Examples of singlet emitters based on distyrylbenzene and derivatives thereof may be found in U.S. Pat. No. 5,121,029.

Singlet emitters may be selected from the group consisting of: indenofluorene-amine and indenofluorene-diamine such as disclosed in WO2006/122630, benzoindenofluorene-amine and benzoindenofluorene-diamine such as disclosed in WO2008/006449, dibenzoindenofluorene-amine and dibenzoindenofluorene-diamine such as disclosed in WO2007/140847.

Other materials that may be used as singlet emitters include polycyclic aromatic hydrocarbon compounds, especially derivatives of the following compounds: anthracene such as 9,10-di(2-naphthylanthracene), naphthalene, tetraphenyl, xanthene, phenanthrene, pyrene (such as 2,5,8,11-tetra-t-butylperylene), indenopyrene, phenylene (such as 4,4'-(bis (9-ethyl-3-carbazovinylene)-1,1'-biphenyl), periflanthene, decacyclene, coronene, fluorene, spirobifluorene, arylpyrene (e.g., US20060222886), arylenevinylene (e.g., U.S. Pat. Nos. 5,121,029, 5,130,603), cyclopentadiene such as tetraphenylcyclopentadiene, rubrene, coumarine, rhodamine, quinacridone, pyrane such as 4(dicyanomethylene)-6-(4-p-dimethylaminostyryl-2-methyl)-4H-pyrane (DCM), thiapyran, bis(azinyl)imine-boron compounds (US 2007/0092753 A1), bis(azinyl)methene compound, carbostyryl compound, oxazone, benzoxazole, benzothiazole, benzimidazole, and diketopyrrolopyrrole. Examples of some singlet emitter materials may be found in the following patent documents: US 20070252517 A1, U.S. Pat. Nos. 4,769,292, 6,020,078, US 2007/0252517 A1, US 2007/0252517 A1. The entire contents of the above-listed patent documents are incorporated herein by reference.

The singlet emitter is selected from the group consisting of following structures:

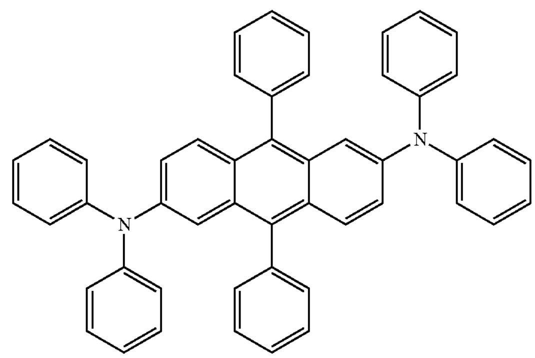

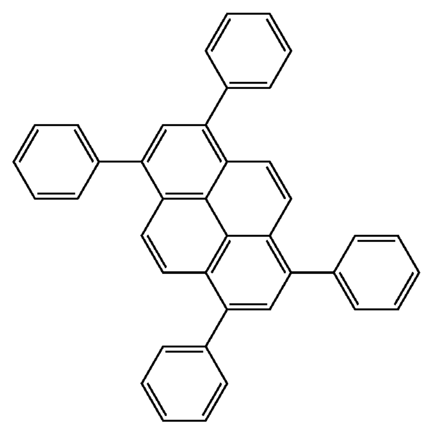

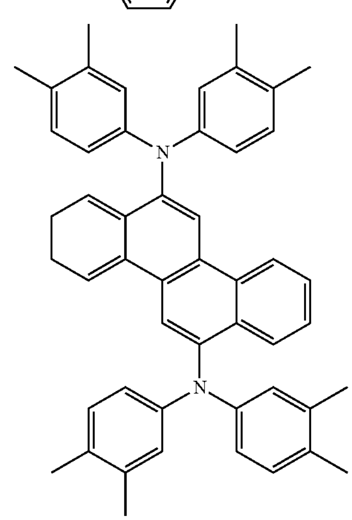

-continued

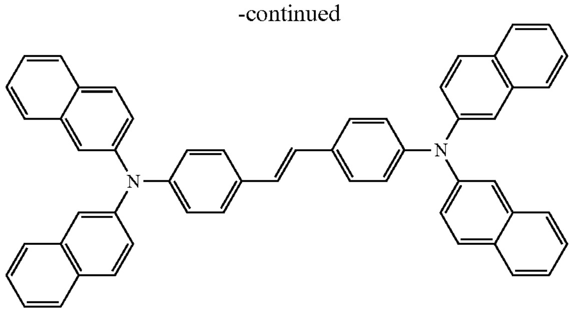

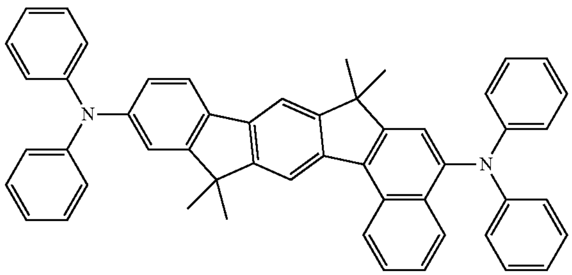

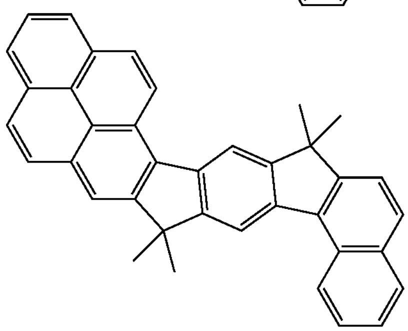

2. Triplet Emitter (Phosphorescent Emitter)

A triplet emitter is also called a phosphorescent emitter. In an embodiment, the triplet emitter is a metal clathrate having a general formula M(L)n; wherein M is a metal atom, L may be identical or different each time it is present and is an organic ligand, bonded or coordinated to the metal atom M through one or more positions; n is an integer greater than 1, further 1, 2, 3, 4, 5 or 6. Selectively, such metal clathrate is coupled to a polymer through one or more positions, particularly through an organic ligand.

In an embodiment, the metal atom M is selected from the group consisting of a transition metal element or a lanthanide element or an actinide element, especially selected from the group consisting of Ir, Pt, Pd, Au, Rh, Ru, Os, Sm, Eu, Gd, Tb, Dy, Re, Cu or Ag, and particularly selected from the group consisting of Os, Ir, Ru, Rh, Re, Pd or Pt.

In one embodiment, the triplet emitter includes a chelating ligand, i.e., a ligand, coordinated to a metal by at least two bonding sites, and it is particularly for consideration that the triplet emitter includes two or three identical or different bidentate or multidentate ligands. A chelating ligand is beneficial for improving the stability of a metal clathrate.

Examples of organic ligands may be selected from the group consisting of a phenylpyridine derivative, a 7,8-benzoquinoline derivative, a 2(2-thienyl)pyridine derivative, a 2(1-naphthyl)pyridine derivative, or a 2-phenylquinoline derivative. All of these organic ligands may be substituted, for example, by fluorine containing groups or trifluoromethyl. The auxiliary ligand may be preferably selected from acetylacetonate or picric acid.

In an embodiment, the metal clathrate which may be used as a triplet emitter has the following form:

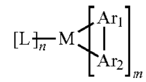

wherein M is a metal and selected from a transition metal element or a lanthanide element or an actinide element;

$Ar_1$ may be identical or different each time it is present and is a cyclic group, which includes at least one donor atom, i.e., an atom with a lone pair of electrons, such as nitrogen or phosphorus, through which the cyclic group is coordinated to the metal; $Ar_2$ may be identical or different each time it is present and is a cyclic group, which includes at least one C atom through which the cyclic group is coordinated to the metal; $Ar_1$ and $Ar_2$ are covalently bonded together and each of them may carry one or more substituents, and they may further be linked together by substituents; L may be identical or different each time it is present and is an auxiliary ligand, particularly a bidentate chelating ligand, and further a monoanionic bidentate chelating ligand; m is 1, 2 or 3, further 2 or 3, and particularly 3; n is 0, 1, or 2, further 0 or 1, and particularly 0.

Examples of triplet emitter materials and applications thereof may be found in the following patent documents and literature: WO 200070655, WO 200141512, WO 200202714, WO 200215645, EP 1191613, EP 1191612, EP 1191614, WO 2005033244, WO 2005019373, US 2005/0258742, WO 2009146770, WO 2010015307, WO 2010031485, WO 2010054731, WO 2010054728, WO 2010086089, WO 2010099852, WO 2010102709, US 20070087219 A1, US 20090061681 A1, US 20010053462 A1, Baldo, Thompson et al. Nature 403, (2000), 750-753, US 20090061681 A1, US 20090061681 A1, Adachi et al. Appl. Phys. Lett. 78 (2001), 1622-1624, J. Kido et al. Appl. Phys. Lett. 65 (1994), 2124, Kido et al. Chem. Lett. 657, 1990, US 2007/0252517 A1, Johnson et al., JACS 105, 1983, 1795, Wrighton, JACS 96, 1974, 998, Ma et al., Synth. Metals 94, 1998, 245, U.S. Pat. Nos. 6,824,895, 7,029,766, 6,835,469, 6,830,828, US 20010053462 A1, WO 2007095118 A1, US 2012004407A1, WO 2012007088A1, WO2012007087A1, WO 2012007086A1, US 2008027220A1, WO 2011157339A1, CN 102282150A, WO 2009118087A1. The entire contents of the above-listed patent documents and literature are hereby incorporated by reference.

Examples of suitable triplet emitters are provided in the following table:

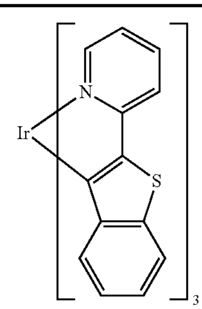

-continued
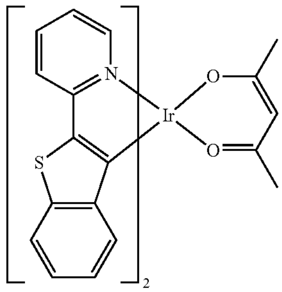
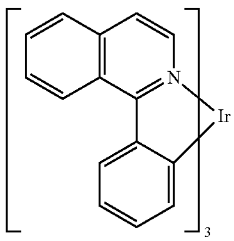
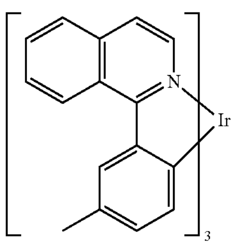
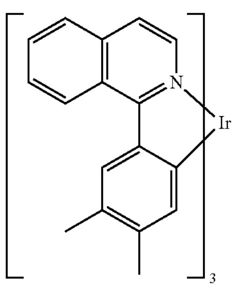
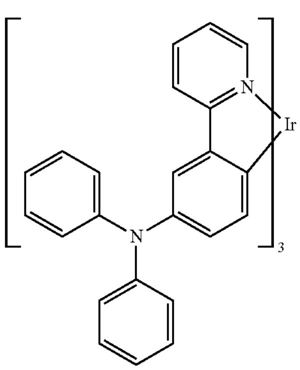
-continued
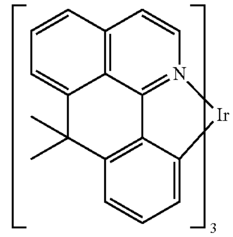
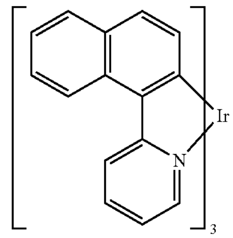
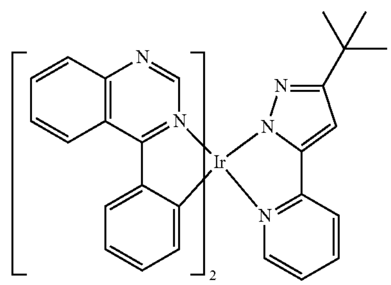
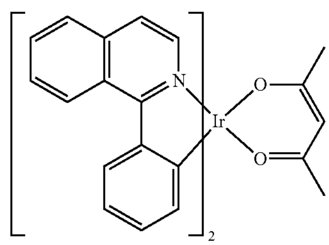
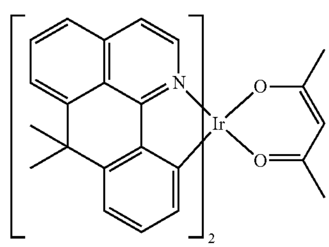
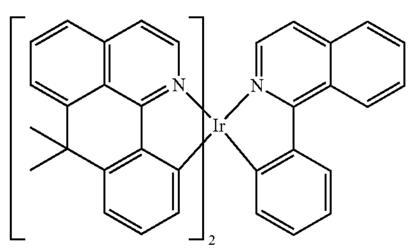

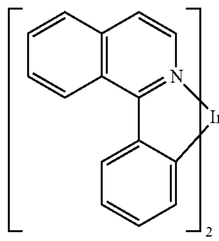
N
Ir
N
2
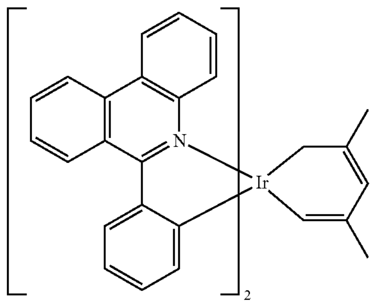
N
Ir
2
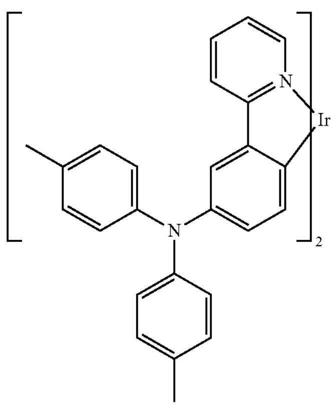
N
Ir
N
2
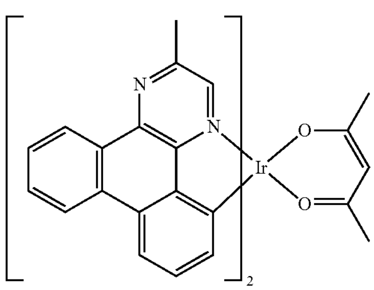
N
N
Ir
O
O
2
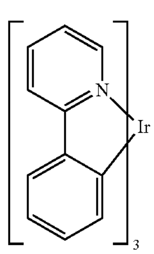
N
Ir
3
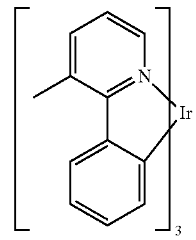
N
Ir
3
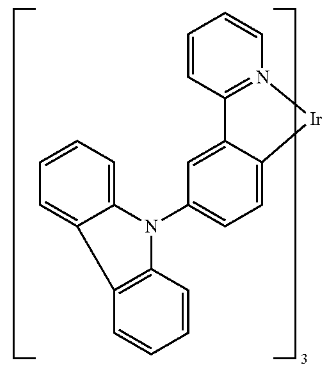
N
Ir
N
3
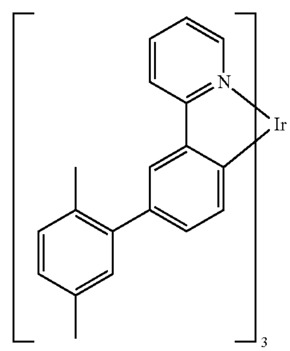
N
Ir
3
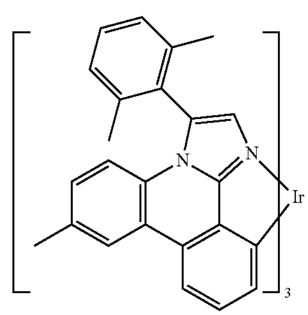
N
N
Ir
3
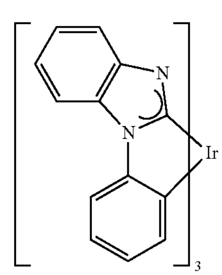
N
N
Ir
3

-continued
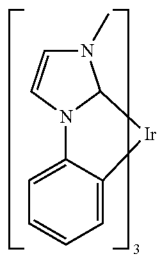
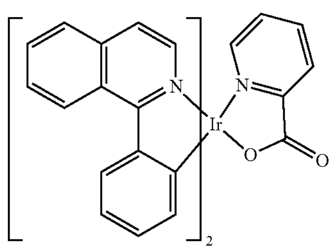
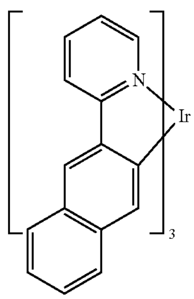
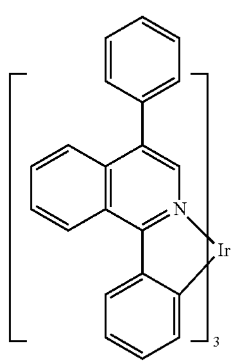
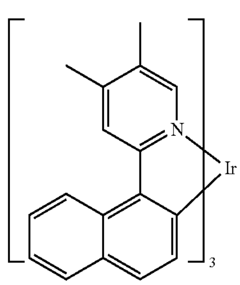
-continued
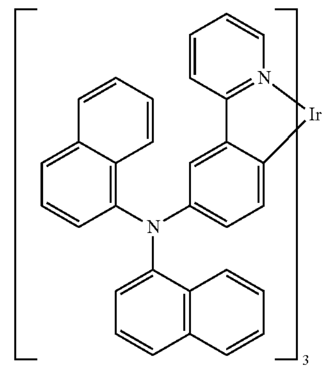
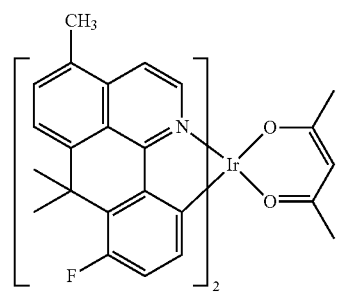
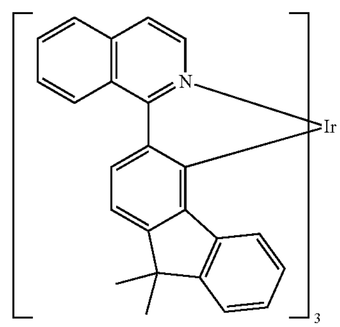
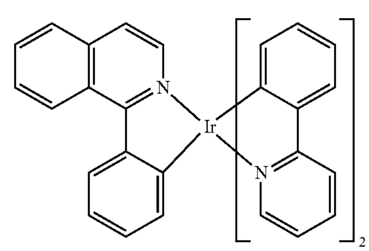
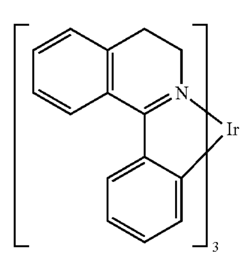

-continued
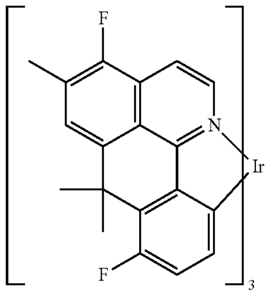
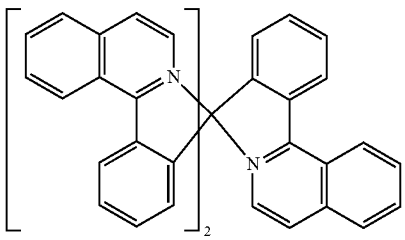
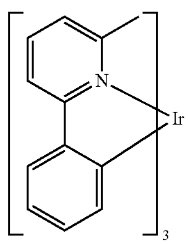
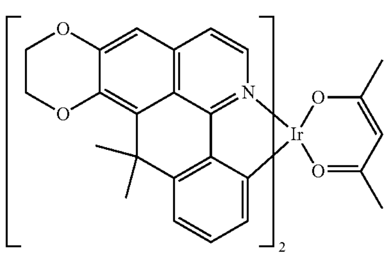
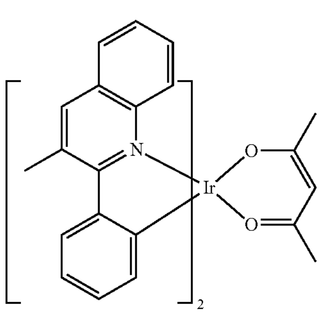
-continued
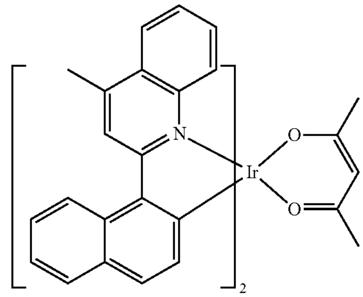
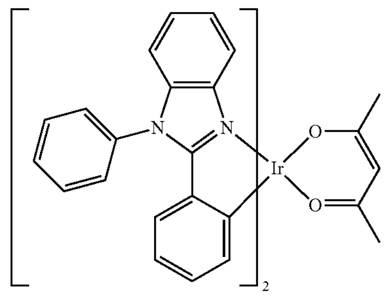
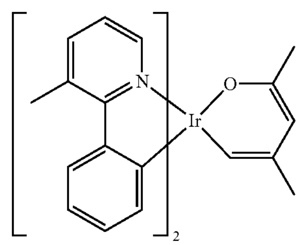
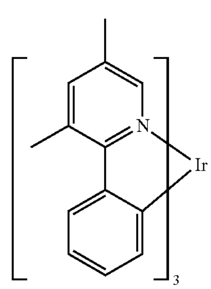
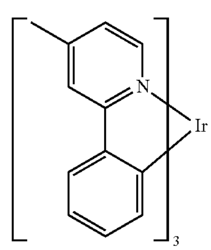

-continued

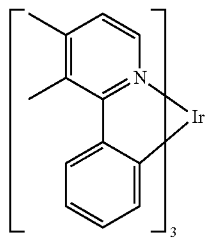

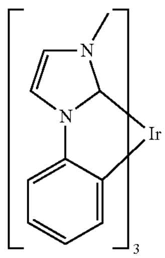

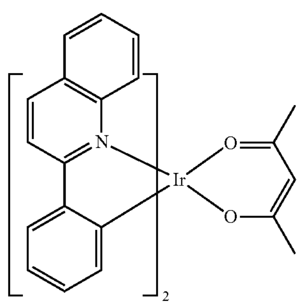

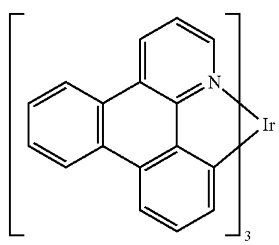

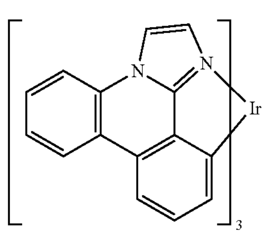

-continued

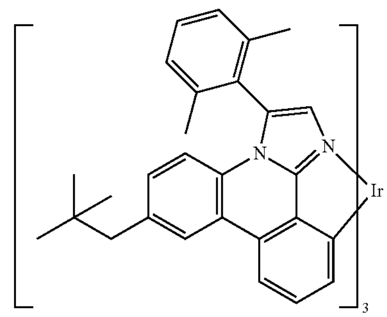

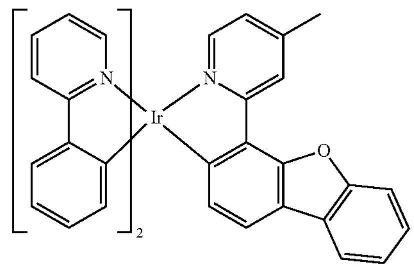

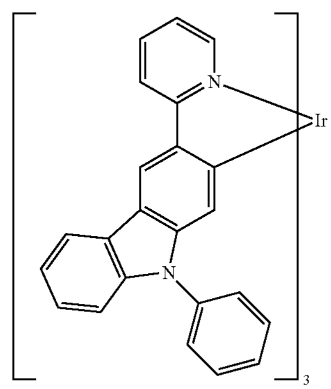

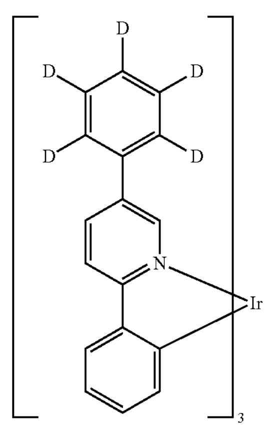

3. Thermally Activated Delayed Fluorescent Material (TADF)

Conventional organic fluorescent materials can only emit light using 25% singlet excitonic luminescence formed by electrical excitation, and the devices have relatively low internal quantum efficiency (up to 25%). A phosphorescent material enhances the intersystem crossing due to the strong spin-orbit coupling of the heavy atom center, the singlet exciton and the triplet exciton luminescence formed by the electric excitation can be effectively utilized, so that the internal quantum efficiency of the device can reach 100%. However, the phosphorescent materials are expensive, the material stability is poor, and the device efficiency roll-off is a serious problem, which limits its application in OLED. Thermally activated delayed fluorescent materials are the third generation of organic light-emitting materials developed after organic fluorescent materials and organic phosphorescent materials. This type of material generally has a small singlet-triplet excited state energy level difference (ΔEst), and triplet excitons can be converted to singlet excitons by anti-intersystem crossing. This can make full use of the singlet excitons and triplet excitons formed under electric excitation. The device can achieve 100% quantum efficiency. At the same time, the material structure is controllable, the property is stable, the price is cheap, no noble metal is needed, and the application prospect in the OLED field is broad.

The TADF material needs to have a small singlet-triplet excited state energy level difference, generally ΔEst<0.3 eV, further ΔEst<0.2 eV, and still further ΔEst<0.1 eV. In an embodiment, the TADF material has a small ΔEst, and in another embodiment, the TADF has a good fluorescence quantum efficiency. Some TADF light-emitting materials can be found in the following patent documents: CN103483332(A), TW201309696(A), TW201309778(A), TW201343874(A), TW201350558(A), US20120217869 (A1), WO2013133359(A1), WO2013154064(A1), Adachi, et.al. Adv. Mater., 21, 2009, 4802, Adachi, et.al. Appl. Phys. Lett., 98, 2011, 083302, Adachi, et.al. Appl. Phys. Lett., 101, 2012, 093306, Adachi, et.al. Chem. Commun., 48, 2012, 11392, Adachi, et.al. Nature Photonics, 6, 2012, 253, Adachi, et.al. Nature, 492, 2012, 234, Adachi, et.al. J. Am. Chem. Soc, 134, 2012, 14706, Adachi, et.al. Angew. Chem. Int. Ed, 51, 2012, 11311, Adachi, et.al. Chem. Commun., 48, 2012, 9580, Adachi, et.al. Chem. Commun., 48, 2013, 10385, Adachi, et.al. Adv. Mater., 25, 2013, 3319, Adachi, et.al. Adv. Mater., 25, 2013, 3707, Adachi, et.al. Chem. Mater., 25, 2013, 3038, Adachi, et.al. Chem. Mater., 25, 2013, 3766, Adachi, et. al. J. Mater. Chem. C., 1, 2013, 4599, Adachi, et.al. J. Phys. Chem. A., 117, 2013, 5607, and the entire contents of the above-listed patent or literature documents are hereby incorporated by reference.

Some examples of suitable TADF light-emitting materials are listed in the following table:

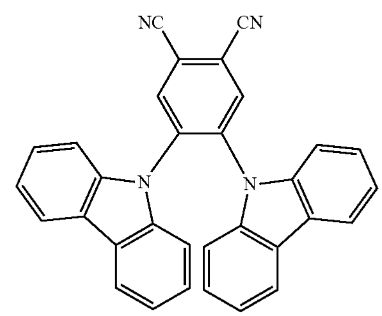 [SMILES: N#Cc1cc(-n2c3ccccc3c3ccccc32)c(-n2c3ccccc3c3ccccc32)cc1C#N]

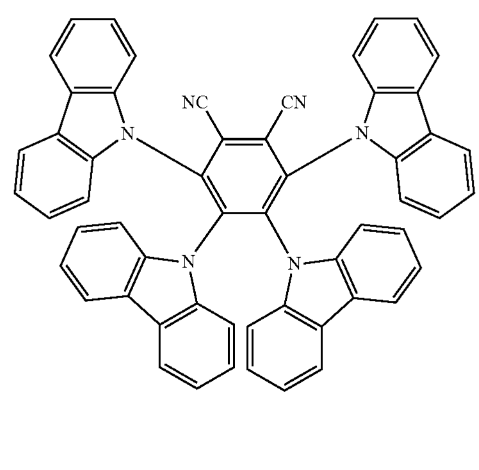 [SMILES: N#Cc1c(C#N)c(-n2c3ccccc3c3ccccc32)c(-n2c3ccccc3c3ccccc32)c(-n2c3ccccc3c3ccccc32)c1-n1c2ccccc2c2ccccc21]

-continued
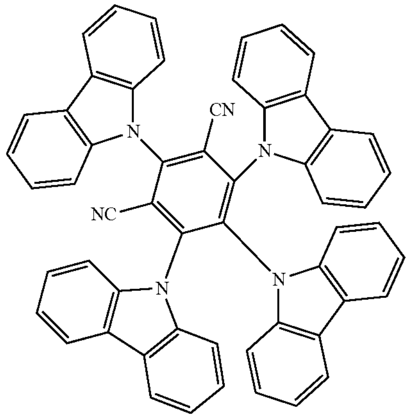 [SMILES: N#Cc1c(-n2c3ccccc3c3ccccc32)c(C#N)c(-n2c3ccccc3c3ccccc32)c(-n2c3ccccc3c3ccccc32)c1-n1c2ccccc2c2ccccc21]
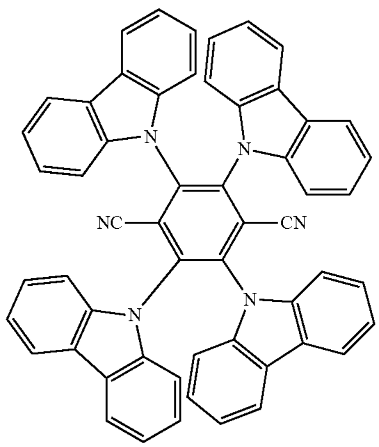 [SMILES: N#Cc1c(-n2c3ccccc3c3ccccc32)c(-n2c3ccccc3c3ccccc32)c(C#N)c(-n2c3ccccc3c3ccccc32)c1-n1c2ccccc2c2ccccc21]
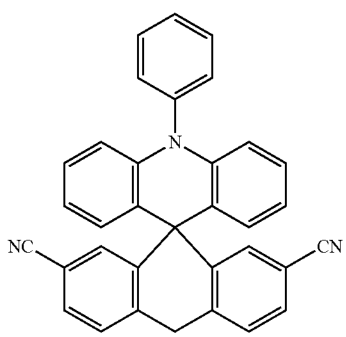 [SMILES: N#Cc1ccc2c(c1)C1(c3cc(C#N)ccc3C2)c2ccccc2N(c2ccccc2)c2ccccc21]
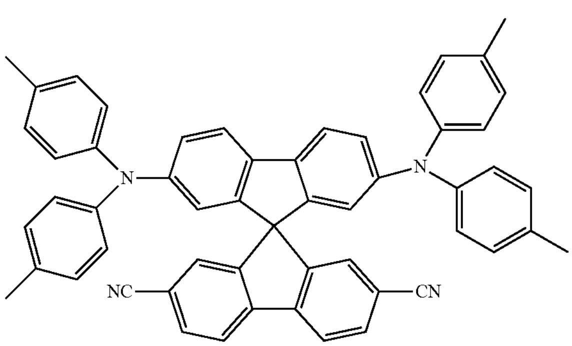

-continued
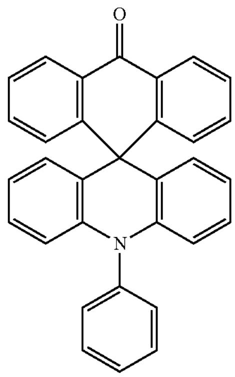 [SMILES: O=C1c2ccccc2C2(c3ccccc31)c1ccccc1N(c1ccccc1)c1ccccc12]
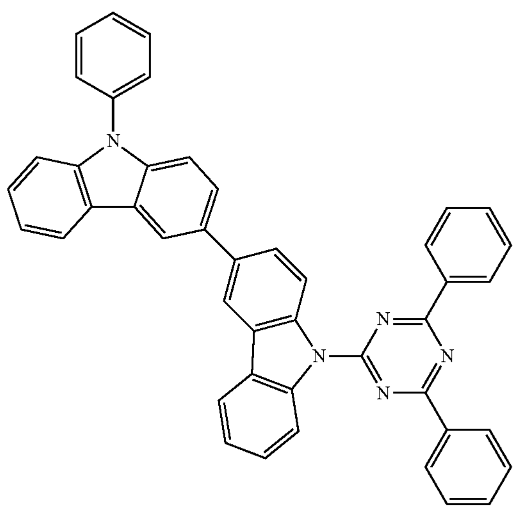 [SMILES: c1ccc(-c2nc(-c3ccccc3)nc(-n3c4ccccc4c4cc(-c5ccc6c(c5)c5ccccc5n6-c5ccccc5)ccc43)n2)cc1]
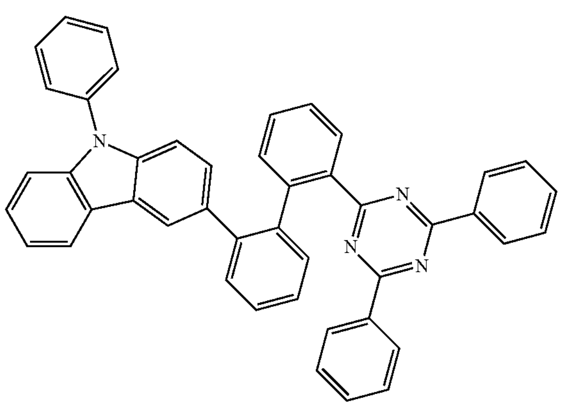 [SMILES: c1ccc(-c2nc(-c3ccccc3)nc(-c3ccccc3-c3ccccc3-c3ccc4c(c3)c3ccccc3n4-c3ccccc3)n2)cc1]

-continued
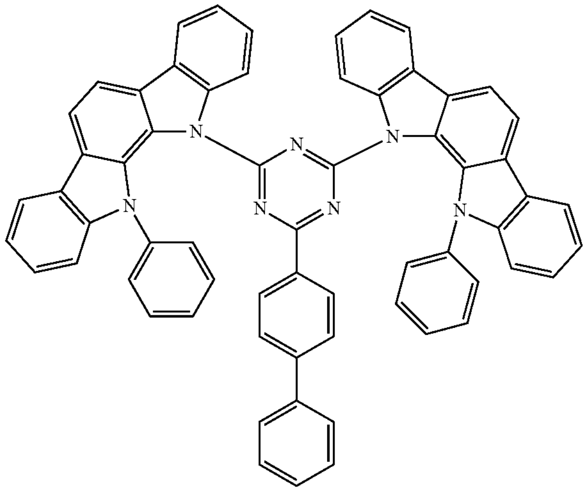 [SMILES: c1ccc(-c2ccc(-c3nc(-n4c5ccccc5c5ccc6c7ccccc7n(-c7ccccc7)c6c54)nc(-n4c5ccccc5c5ccc6c7ccccc7n(-c7ccccc7)c6c54)n3)cc2)cc1]
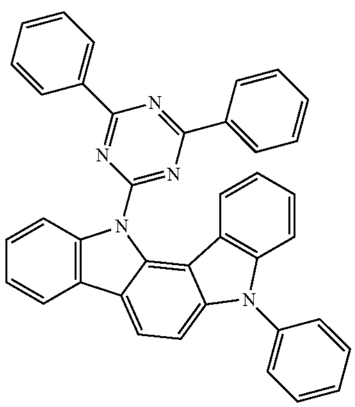 [SMILES: c1ccc(-c2nc(-c3ccccc3)nc(-n3c4ccccc4c4ccc5c(c6ccccc6n5-c5ccccc5)c43)n2)cc1]
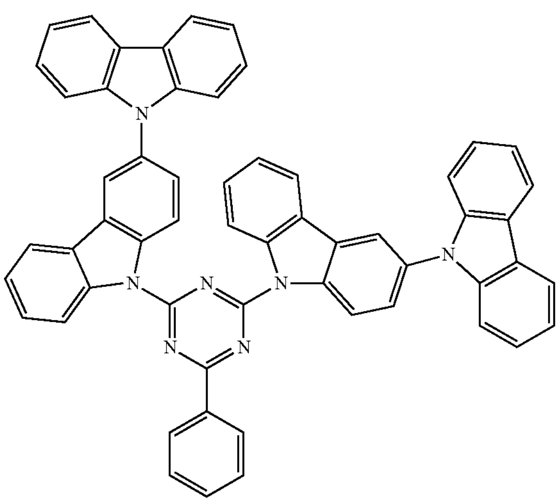 [SMILES: c1ccc(-c2nc(-n3c4ccccc4c4cc(-n5c6ccccc6c6ccccc65)ccc43)nc(-n3c4ccccc4c4cc(-n5c6ccccc6c6ccccc65)ccc43)n2)cc1]

-continued
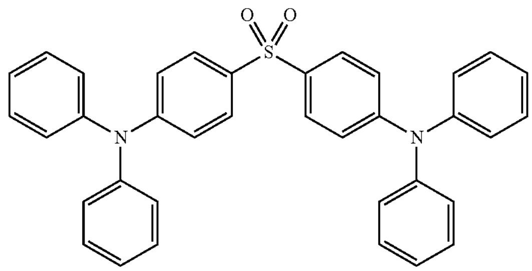 [SMILES: O=S(=O)(c1ccc(N(c2ccccc2)c2ccccc2)cc1)c1ccc(N(c2ccccc2)c2ccccc2)cc1]
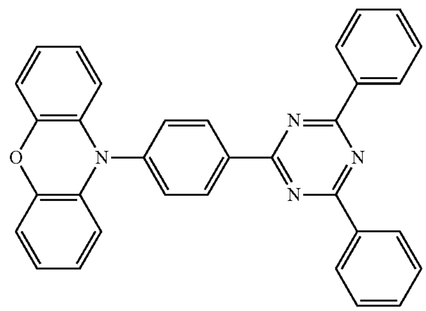 [SMILES: c1ccc(-c2nc(-c3ccccc3)nc(-c3ccc(N4c5ccccc5Oc5ccccc54)cc3)n2)cc1]
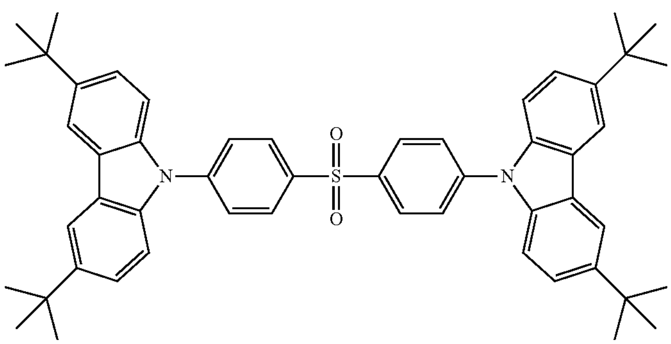 [SMILES: CC(C)(C)c1ccc2c(c1)c1cc(C(C)(C)C)ccc1n2-c1ccc(S(=O)(=O)c2ccc(-n3c4ccc(C(C)(C)C)cc4c4cc(C(C)(C)C)ccc43)cc2)cc1]
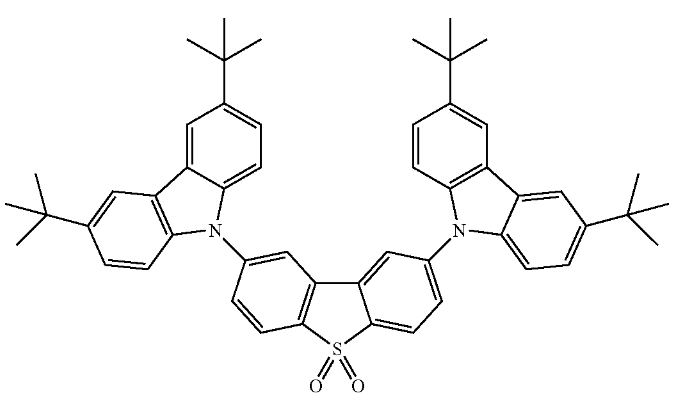 [SMILES: CC(C)(C)c1ccc2c(c1)c1cc(C(C)(C)C)ccc1n2-c1ccc2c(c1)-c1cc(-n3c4ccc(C(C)(C)C)cc4c4cc(C(C)(C)C)ccc43)ccc1S2(=O)=O]

-continued
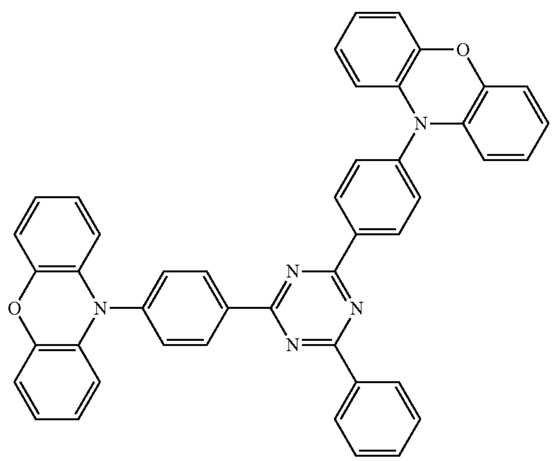 [SMILES: c1ccc(-c2nc(-c3ccc(N4c5ccccc5Oc5ccccc54)cc3)nc(-c3ccc(N4c5ccccc5Oc5ccccc54)cc3)n2)cc1]
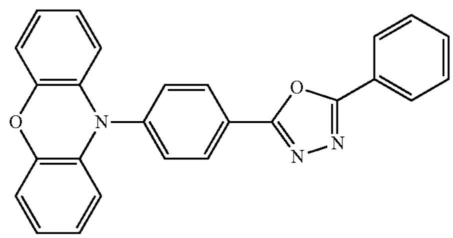 [SMILES: c1ccc(-c2nnc(-c3ccc(N4c5ccccc5Oc5ccccc54)cc3)o2)cc1]
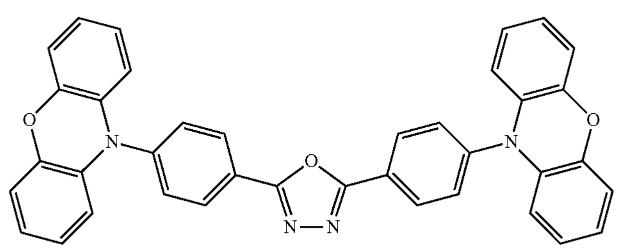 [SMILES: c1ccc2c(c1)Oc1ccccc1N2c1ccc(-c2nnc(-c3ccc(N4c5ccccc5Oc5ccccc54)cc3)o2)cc1]
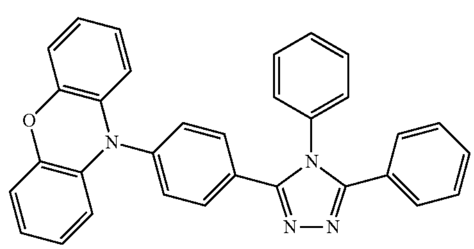 [SMILES: c1ccc(-c2nnc(-c3ccc(N4c5ccccc5Oc5ccccc54)cc3)n2-c2ccccc2)cc1]
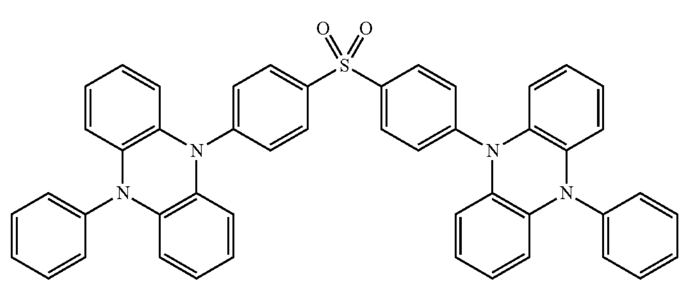 [SMILES: O=S(=O)(c1ccc(N2c3ccccc3N(c3ccccc3)c3ccccc32)cc1)c1ccc(N2c3ccccc3N(c3ccccc3)c3ccccc32)cc1]

-continued
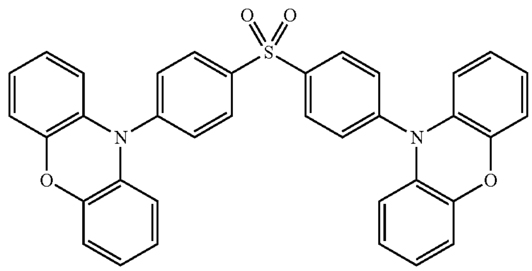 [SMILES: O=S(=O)(c1ccc(N2c3ccccc3Oc3ccccc32)cc1)c1ccc(N2c3ccccc3Oc3ccccc32)cc1]
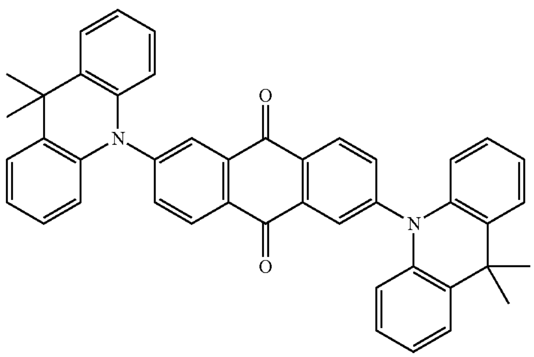 [SMILES: CC1(C)c2ccccc2N(c2ccc3c(c2)C(=O)c2ccc(N4c5ccccc5C(C)(C)c5ccccc54)cc2C3=O)c2ccccc21]
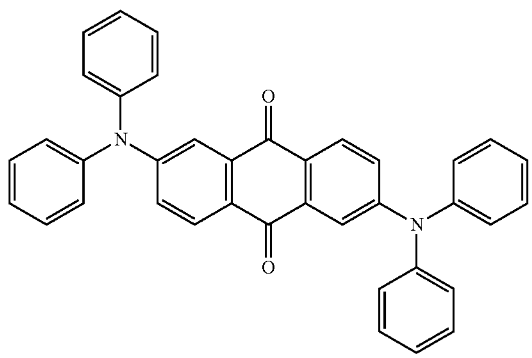 [SMILES: O=C1c2ccc(N(c3ccccc3)c3ccccc3)cc2C(=O)c2ccc(N(c3ccccc3)c3ccccc3)cc21]
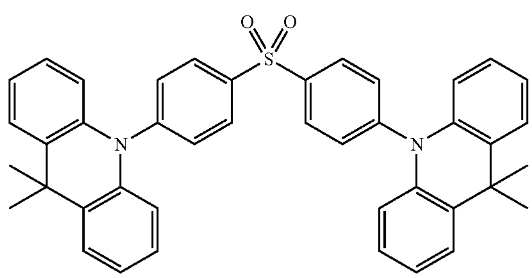 [SMILES: CC1(C)c2ccccc2N(c2ccc(S(=O)(=O)c3ccc(N4c5ccccc5C(C)(C)c5ccccc54)cc3)cc2)c2ccccc21]
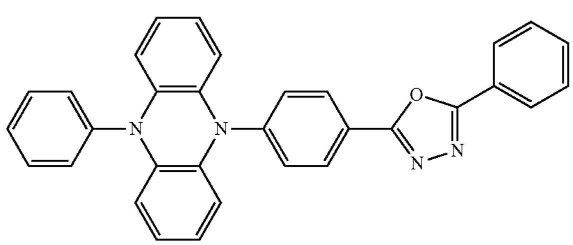 [SMILES: c1ccc(-c2nnc(-c3ccc(N4c5ccccc5N(c5ccccc5)c5ccccc54)cc3)o2)cc1]

-continued
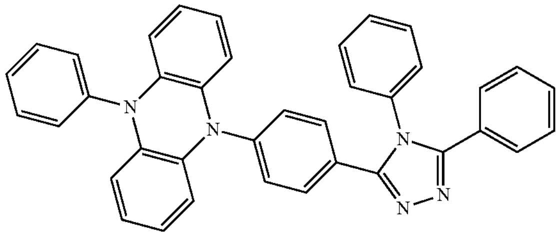 [SMILES: c1ccc(-c2nnc(-c3ccc(N4c5ccccc5N(c5ccccc5)c5ccccc54)cc3)n2-c2ccccc2)cc1]
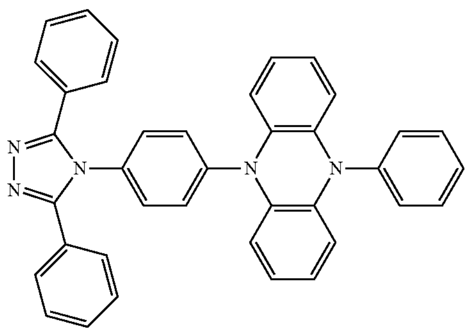 [SMILES: c1ccc(-c2nnc(-c3ccccc3)n2-c2ccc(N3c4ccccc4N(c4ccccc4)c4ccccc43)cc2)cc1]
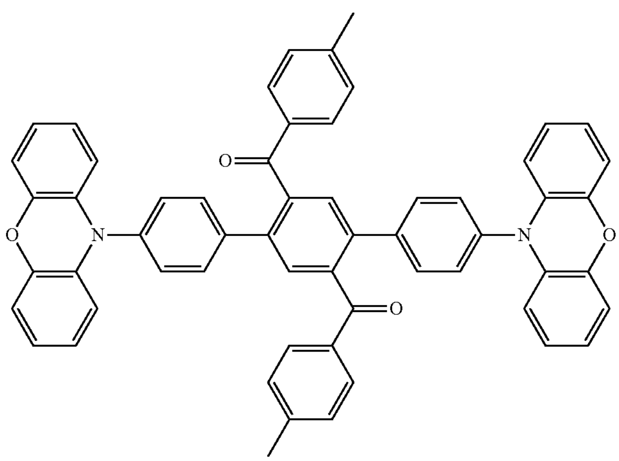 [SMILES: Cc1ccc(C(=O)c2cc(-c3ccc(N4c5ccccc5Oc5ccccc54)cc3)c(C(=O)c3ccc(C)cc3)cc2-c2ccc(N3c4ccccc4Oc4ccccc43)cc2)cc1]
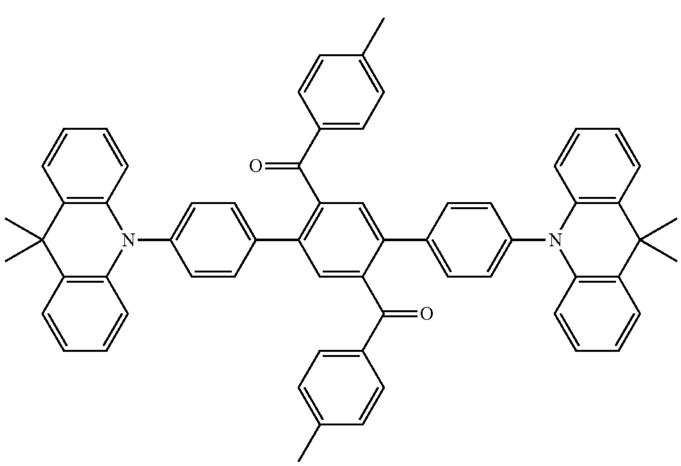

-continued
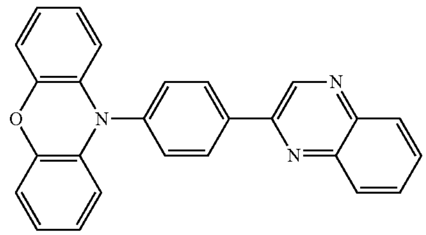 [SMILES: c1ccc2c(c1)Oc1ccccc1N2c1ccc(-c2cnc3ccccc3n2)cc1]
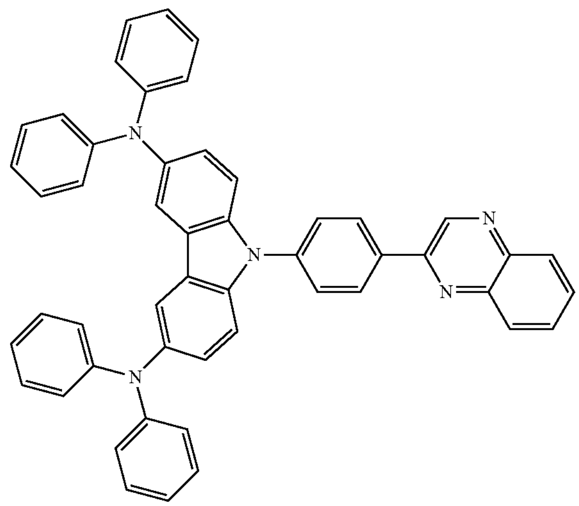 [SMILES: c1ccc(N(c2ccccc2)c2ccc3c(c2)c2cc(N(c4ccccc4)c4ccccc4)ccc2n3-c2ccc(-c3cnc4ccccc4n3)cc2)cc1]
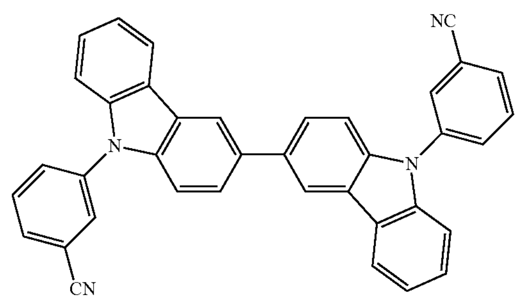 [SMILES: N#Cc1cccc(-n2c3ccccc3c3cc(-c4ccc5c(c4)c4ccccc4n5-c4cccc(C#N)c4)ccc32)c1]
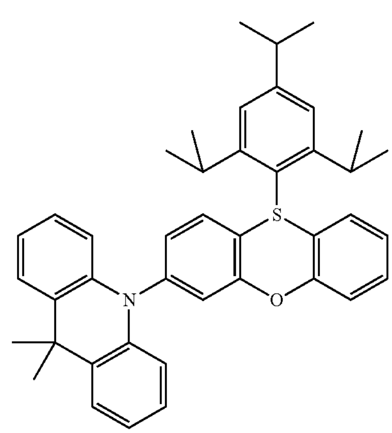

-continued
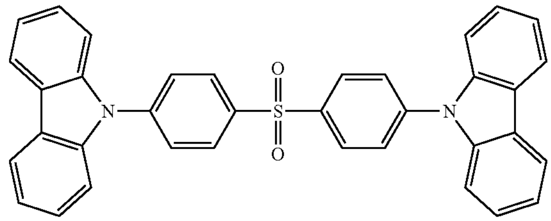 [SMILES: O=S(=O)(c1ccc(-n2c3ccccc3c3ccccc32)cc1)c1ccc(-n2c3ccccc3c3ccccc32)cc1]
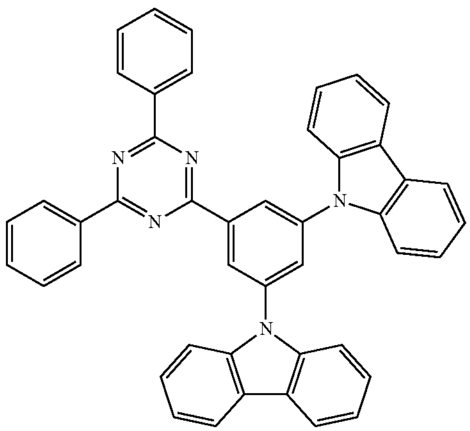 [SMILES: c1ccc(-c2nc(-c3ccccc3)nc(-c3cc(-n4c5ccccc5c5ccccc54)cc(-n4c5ccccc5c5ccccc54)c3)n2)cc1]
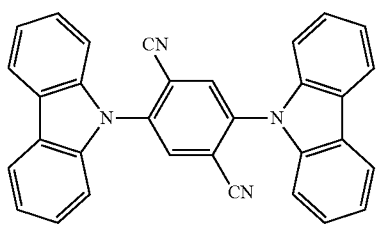 [SMILES: N#Cc1cc(-n2c3ccccc3c3ccccc32)c(C#N)cc1-n1c2ccccc2c2ccccc21]
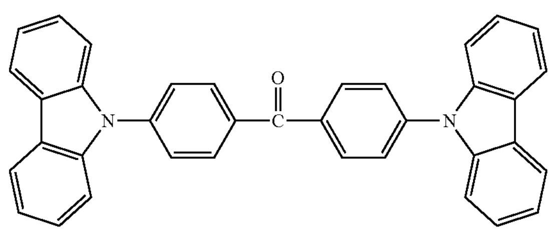 [SMILES: O=C(c1ccc(-n2c3ccccc3c3ccccc32)cc1)c1ccc(-n2c3ccccc3c3ccccc32)cc1]
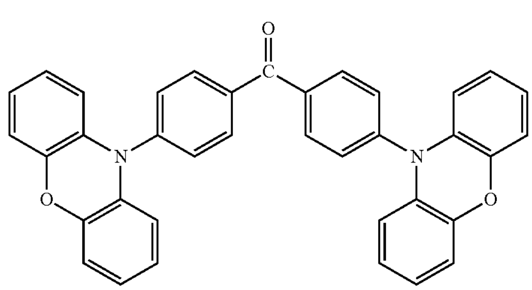 [SMILES: O=C(c1ccc(N2c3ccccc3Oc3ccccc32)cc1)c1ccc(N2c3ccccc3Oc3ccccc32)cc1]

-continued

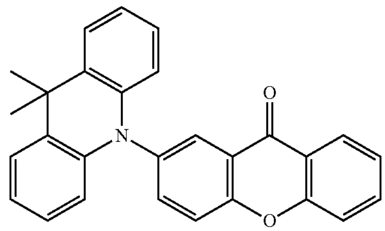 [SMILES: CC1(C)c2ccccc2N(c2ccc3oc4ccccc4c(=O)c3c2)c2ccccc21]

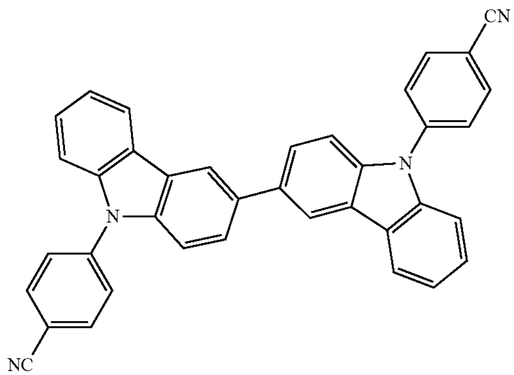 [SMILES: N#Cc1ccc(-n2c3ccccc3c3cc(-c4ccc5c(c4)c4ccccc4n5-c4ccc(C#N)cc4)ccc32)cc1]

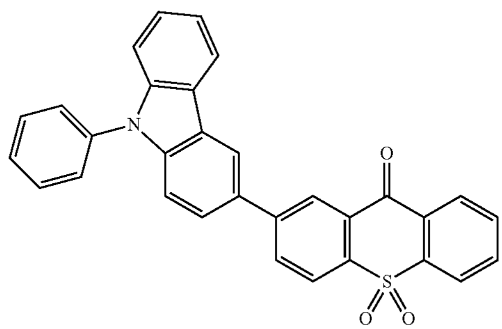 [SMILES: O=C1c2ccccc2S(=O)(=O)c2ccc(-c3ccc4c(c3)c3ccccc3n4-c3ccccc3)cc21]

The publications of organic functional material for the organic functional structural units described above are hereby incorporated by reference for the purpose of disclosure.

Another object of the present disclosure is to provide a material solution for printed OLEDs.

In some embodiments, in the mixture according to the present disclosure, the polymer I or the polymer II has a molecular weight greater than or equal to 100 kg/mol, further greater than or equal to 150 kg/mol, still further greater than or equal to 180 kg/mol, and even further greater than or equal to 200 kg/mol.

In other embodiments, in the mixture according to the present disclosure, the polymer I or the polymer II has a solubility in toluene greater than or equal to 5 mg/ml, further greater than or equal to 7 mg/ml, and still further greater than or equal to 10 mg/ml at 25° C.

The present disclosure further relates to a formulation or an ink including the mixture according to the present disclosure, and at least one organic solvent. The present disclosure further provides a film prepared from a formulation including the mixture according to the present disclosure.

In a printing process, the viscosity and surface tension of an ink is important parameters. Suitable surface tension parameters of an ink are suitable for a particular substrate and a particular printing method.

In an embodiment, the ink according to the present disclosure has a surface tension at an operating temperature or at 25° C. in the range of about 19 dyne/cm to 50 dyne/cm; further in the range of 22 dyne/cm to 35 dyne/cm; and still further in the range of 25 dyne/cm to 33 dyne/cm.

In an embodiment, the ink according to the present disclosure has a viscosity at the working temperature or at 25° C. in the range of about 1 cps to 100 cps, further in the range of 1 cps to 50 cps, still further in the range of 1.5 cps to 20 cps, and even further in the range of 4.0 cps to 20 cps. The formulation thus formulated will be suitable for inkjet printing.

The viscosity can be adjusted by different methods, such as by selecting a suitable solvent and the concentration of the functional material in the ink. The ink including the foregoing mixture according to the present disclosure can facilitate the adjustment of the printing ink in an appropriate range according to the printing method used. Generally, the functional material in the formulation according the present disclosure has a weight ratio in the range of 0.3 wt % to 30 wt %, further in the range of 0.5 wt % to 20 wt %, still further in the range of 0.5 wt % to 15 wt %, still further in the range of 0.5 wt % to 10 wt %, and even further in the range of 1 wt % to 5 wt %.

In some embodiments, in the ink according to the present disclosure, the at least one organic solvent is selected from the solvents based on aromatics or heteroaromatics, especially aliphatic chain/ring substituted aromatic solvents, or aromatic ketone solvents, or aromatic ether solvents.

Examples of the solvents suitable for the present disclosure are, but are not limited to, solvents based on aromatics or heteroaromatics: p-diisopropylbenzene, pentylbenzene, tetrahydronaphthalene, cyclohexyl benzene, chloronaphthalene, 1,4-dimethylnaphthalene, 3-isopropylbiphenyl, p-cymene, dipentylbenzene, tripentylbenzene, pentyltoluene, o-xylene, m-xylene, p-xylene, o-diethylbenzene, m-diethylbenzene, p-diethylbenzene, 1,2,3,4-tetramethylbenzene, 1,2,3,5-tetramethylbenzene, 1,2,4,5-tetramethylbenzene, butylbenzene, dodecylbenzene, dihexylbenzene, dibutylbenzene, p-diisopropylbenzene, 1-methoxynaphthalene, cyclohexylbenzene, dimethylnaphthalene, 3-isopropylbiphenyl, p-cymene, 1-methylnaphthalene, 1,2,4-trichlorobenzene, 1,3-dipropoxybenzene, 4,4-difluorodiphenylmethane, 1,2-dimethoxy-4-(1-propenyl)benzene, diphenylmethane, 2-phenylpyridine, 3-phenylpyridine, N-methyldiphenylamine, 4-isopropylbiphenyl, α,α-dichlorodiphenylmethane, 4-(3-phenylpropyl)pyridine, benzylbenzoate, 1,1-di(3,4-dimethylphenyl)ethane, 2-isopropylnaphthalene, dibenzylether, and the like; solvents based on ketones: 1-tetralone, 2-tetralone, 2-(phenylepoxy)tetralone, 6-(methoxyl)tetralone, acetophenone, phenylacetone, benzophenone, and derivatives thereof, such as 4-methylacetophenone, 3-methylacetophenone, 2-methylacetophenone, 4-methylphenylacetone, 3-methylphenylacetone, 2-methylphenylacetone, isophorone, 2,6,8-trimethyl-4-nonanone, fenchone, 2-nonanone, 3-nonanone, 5-nonanone, 2-decanone, 2,5-hexanedione, phorone, di-n-amyl ketone; aromatic ether solvents: 3-phenoxytoluene, butoxybenzene, benzylbutylbenzene, p-anisaldehyde dimethyl acetal, tetrahydro-2-phenoxy-2H-pyran, 1,2-dimethoxy-4-(1-propenyl) benzene, 1,4-benzodioxane, 1,3 -dipropylbenzene, 2,5-dimethoxytoluene, 4-ethylphenetole, 1,2,4-trimethoxybenzene, 4-(1-propenyl)-1,2-dimethoxybenzene, 1,3-dimethoxybenzene, glycidyl phenyl ether, dibenzyl ether, 4-tert-butylanisole, trans-p-propenylanisole, 1,2-dimethoxybenzene, 1-methoxynaphthalene, diphenyl ether, 2-phenoxymethyl ether, 2-phenoxytetrahydrofuran, ethyl-2-naphthyl ether, pentyl ether, hexyl ether, dioctyl ether, ethylene glycol dibutyl ether, diethylene glycol diethyl ether, diethylene glycol butyl methyl ether, diethylene glycol dibutyl ether, triethylene glycol dimethyl ether, triethylene glycol ethyl methyl ether, triethylene glycol butyl methyl ether, tripropylene glycol dimethyl ether, tetraethylene glycol dimethyl ether; and ester solvents: alkyl octoate, alkyl sebacate, alkyl stearate, alkyl benzoate, alkyl phenylacetate, alkyl cinnamate, alkyl oxalate, alkyl maleate, alkyl lactone, alkyl oleate, and the like.

Further, in the ink according to the present disclosure, the at least one organic solvent can be selected from aliphatic ketones, such as 2-nonanone, 3-nonanone, 5-nonanone, 2-decanone, 2,5-hexanedione, 2,6,8-trimethyl-4-nonanone, phorone, di-n-pentyl ketone, and the like; or aliphatic ethers, such as amyl ether, hexyl ether, dioctyl ether, ethylene glycol dibutyl ether, diethylene glycol diethyl ether, diethylene glycol butyl methyl ether, diethylene glycol dibutyl ether, triethylene glycol dimethyl ether, triethylene glycol ethyl methyl ether, triethylene glycol butyl methyl ether, tripropylene glycol dimethyl ether, tetraethylene glycol dimethyl ether.

In other embodiments, the foregoing printing ink further includes another organic solvent. Examples of the other organic solvents include, but are not limited to, methanol, ethanol, 2-methoxyethanol, dichloromethane, trichloromethane, chlorobenzene, o-dichlorobenzene, tetrahydrofuran, anisole, morpholine, toluene, o-xylene, m-xylene, p-xylene, 1,4-dioxahexane, acetone, methyl ethyl ketone, 1,2-dichloroethane, 3-phenoxytoluene, 1,1,1-trichloroethane, 1,1,2,2-tetrachloroethane, ethyl acetate, butyl acetate, dimethylformamide, dimethylacetamide, dimethyl sulfoxide, tetrahydronaphthalene, naphthane, indene and/or their mixtures.

In an embodiment, the foregoing formulation is a solution.

In another embodiment, the foregoing formulation is a suspension.

The present disclosure further relates to use of the foregoing formulation as a printing ink in the preparation of an organic electronic device, and particularly by a preparation method of printing or coating.

Suitable printing or coating techniques include, but are not limited to, inkjet printing, nozzle printing, typography, screen printing, dip coating, spin coating, blade coating, roller printing, twist roller printing, lithography, flexography, rotary printing, spray coating, brush coating or transfer printing, nozzle printing, slot die coating, and the like. The first preference is inkjet printing, slot die coating, nozzle printing, and gravure printing.

The solution or suspension may additionally include one or more components such as a surface active compound, a lubricant, a wetting agent, a dispersing agent, a hydrophobic agent, a binder, and the like, for adjusting viscosity, film-forming properties and improving adhesion. The detailed information relevant to the printing technology and requirements of the printing technology to the solution, such as solvent, concentration, and viscosity, may be referred to Handbook of Print Media: Technologies and Production Methods, Helmut Kipphan, ISBN 3-540-67326-1.

Based on the foregoing mixture, the present disclosure further provides use of the foregoing mixture in an organic electronic device. The organic electronic device may be selected from, but not limited to, an organic light-emitting diode (OLED), an organic photovoltaic cell (OPV), an organic light-emitting electrochemical cell (OLEEC), an organic field effect transistor (OFET), an organic light-emitting field effect transistor, an organic laser, an organic spintronic device, a quantum dot light-emitting diode, a perovskite cell, an organic sensor, and an organic plasmon emitting diode, especially an OLED. In the embodiments of the present disclosure, the foregoing mixture is particularly used in a hole transporting layer or a hole injection layer or a light-emitting layer in an OLED.

The present disclosure further relates to an organic electronic device including at least a functional layer prepared from the foregoing mixture that can undergo a Diels-Alder reaction. Generally, this type of organic electronic device includes a cathode, an anode, and a functional layer located between the cathode and the anode, wherein the functional layer includes at least one of the foregoing mixtures.

In one embodiment, the organic electronic device is an organic light-emitting diode (OLED), an organic photovoltaic cell (OPV), an organic light-emitting electrochemical cell (OLEEC), an organic field effect transistor (OFET), an organic light-emitting field effect transistor, an organic laser, an organic spintronic device, a quantum dot light-emitting diode, a perovskite cell, an organic sensor, or an organic plasmon emitting diode.

In an embodiment, the foregoing organic electronic device is an electroluminescent device, especially an OLED (as shown FIG. 1), wherein a substrate 101, an anode 102, a light-emitting layer 104, and a cathode 106 are included.

The substrate 101 can be opaque or transparent. A transparent substrate may be used to make a transparent light-emitting device. For example, please refer to Bulovic et al., Nature, 1996, 380, page 29 and Gu et al., Appl. Phys. Lett., 1996, 68, p2606. The substrate may be rigid or elastic. The substrate may be plastic, metal, semiconductor wafer or glass. Particularly, the substrate has a smooth surface. The substrate without any surface defects is a particular ideal selection. In an embodiment, the substrate is flexible and may be selected from a polymer film or a plastic which has a glass transition temperature Tg greater than 150° C., further greater than 200° C., still further greater than 250° C., and even further greater than 300° C. Suitable examples of the flexible substrate are polyethylene terephthalate (PET) and polyethylene 2,6-naphthalate (PEN).

The anode 102 may include a conductive metal, metallic oxide, or conductive polymer. The anode can inject holes easily into a hole injection layer (HIL), a hole transporting layer (HTL), or a light-emitting layer. In an embodiment, the absolute value of the difference between the work function of the anode and the HOMO energy level or the valence band energy level of the emitter in the light-emitting layer or of the p-type semiconductor material of the HIL or HTL or the electron blocking layer (EBL) is smaller than 0.5 eV, further smaller than 0.3 eV, and even further smaller than 0.2 eV. Examples of the anode material include, but are not limited to Al, Cu, Au, Ag, Mg, Fe, Co, Ni, Mn, Pd, Pt, ITO, aluminum-doped zinc oxide (AZO), and the like. Other suitable anode materials are known and may be easily selected by those skilled in the art. The anode material may be deposited by any suitable technologies, such as a suitable physical vapor deposition method which includes a radio frequency magnetron sputtering, a vacuum thermal evaporation, an electron beam (e-beam), and the like. In some embodiments, the anode is patterned and structured. A patterned ITO conductive substrate may be purchased from market to prepare the device according to the present disclosure.

The cathode 106 may include a conductive metal or metal oxide. The cathode can inject electrons easily into the EIL or the ETL, or directly injected into the light-emitting layer. In an embodiment, the absolute value of the difference between the work function of the cathode and the LUMO energy level or the valence band energy level of the emitter in the light-emitting layer or of the n-type semiconductor material as the electron injection layer (EIL) or the electron transporting layer (ETL) or the hole blocking layer (HBL) is smaller than 0.5 eV, further smaller than 0.3 eV, and still further smaller than 0.2 eV. In principle, all materials that can be used as a cathode for an OLED can be used as a cathode material for the devices of the disclosure. Examples of the cathode materials include, but not limited to Al, Au, Ag, Ca, Ba, Mg, LiF/Al, MgAg alloy, BaF2/Al, Cu, Fe, Co, Ni, Mn, Pd, Pt, and ITO. The cathode material may be deposited by any suitable technologies, such as a suitable physical vapor deposition method which includes a radio frequency magnetron sputtering, a vacuum thermal evaporation, an electron beam (e-beam), and the like.

The OLED may further include other functional layers such as a hole injection layer (HIL) or a hole transporting layer (HTL) 103, an electron blocking layer (EBL), an electron injection layer (EIL) or an electron transporting layer (ETL) (105), a hole blocking layer (HBL). Materials suitable for use in these functional layers are described in detail in WO2010135519A1, US20090134784A1 and WO2011110277A1, the entire contents of which three patent documents are incorporated herein by reference.

In an embodiment, in the foregoing light-emitting device according to the present disclosure, the hole injection layer (HIL) or the hole transporting layer (HTL) 103 is prepared from the foregoing formulation by printing.

In an embodiment, in the foregoing light-emitting device according to the present disclosure, the light-emitting layer 104 is prepared from the formulation according to the present disclosure by printing.

In an embodiment, in the foregoing light-emitting device according to the present disclosure, the hole transporting layer (HTL) 103 includes the mixture according to the present disclosure, and the light-emitting layer 104 includes a small molecular host material and a small molecular light-emitting material. The small molecular light-emitting material may be selected from a fluorescent light-emitting material and a phosphorescent light-emitting material.

In another embodiment, in the light-emitting device according to the present disclosure, the hole transporting layer (HTL) 103 includes the mixture according to the present disclosure, and the light-emitting layer 104 includes a high molecular light-emitting material.

The electroluminescence device according to the present disclosure has a light emission wavelength between 300 and 1000 nm, further between 350 and 900 nm, and still further between 400 and 800 nm.

The present disclosure further provides use of the organic electronic device according to the present disclosure in a variety of electronic equipment including, but not limited to, display equipment, lighting equipment, light sources, sensors, and the like.

The present disclosure further relates to organic electronic equipment including the organic electronic device according to the present disclosure, including, but not limited to, display equipment, lighting equipment, a light source, a sensor, and the like.

The disclosure will now be described with reference to the preferred embodiments, but the disclosure is not to be construed as being limited to the following examples. It should be understood that the appended claims are intended to cover the scope of the disclosure. Those skilled in the art will understand that modifications can be made to various embodiments of the disclosure with the teaching of the present disclosure, which will be covered by the spirit and scope of the claims of the disclosure.

SPECIFIC EXAMPLES

Example 1: Synthesis of Polymer P1 Containing the Conjugated Diene Functional Group D

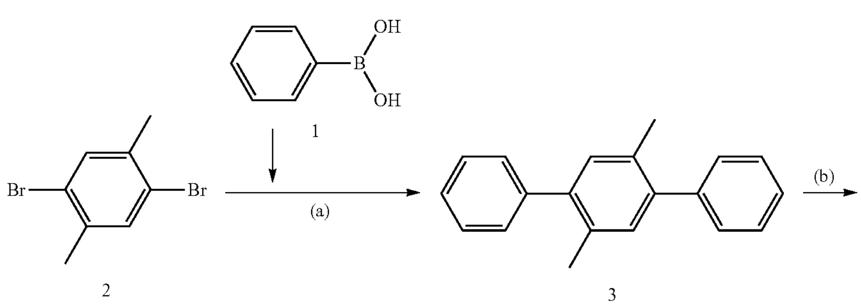

-continued
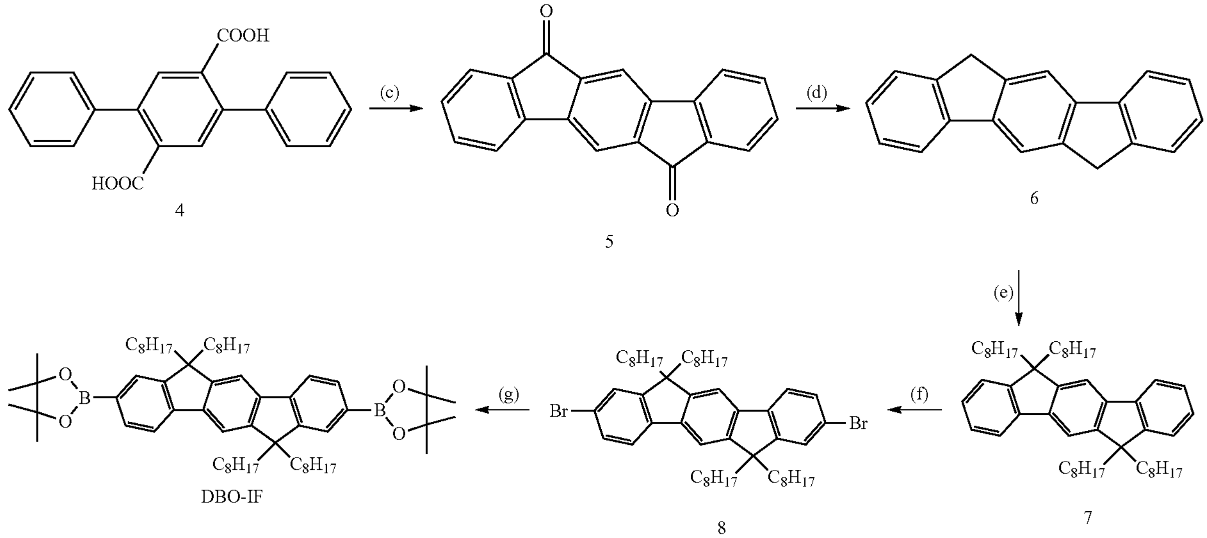
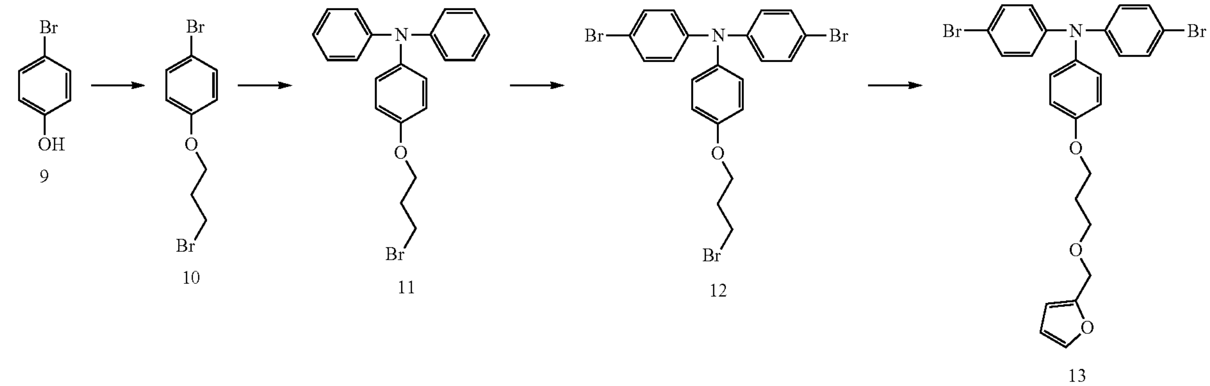
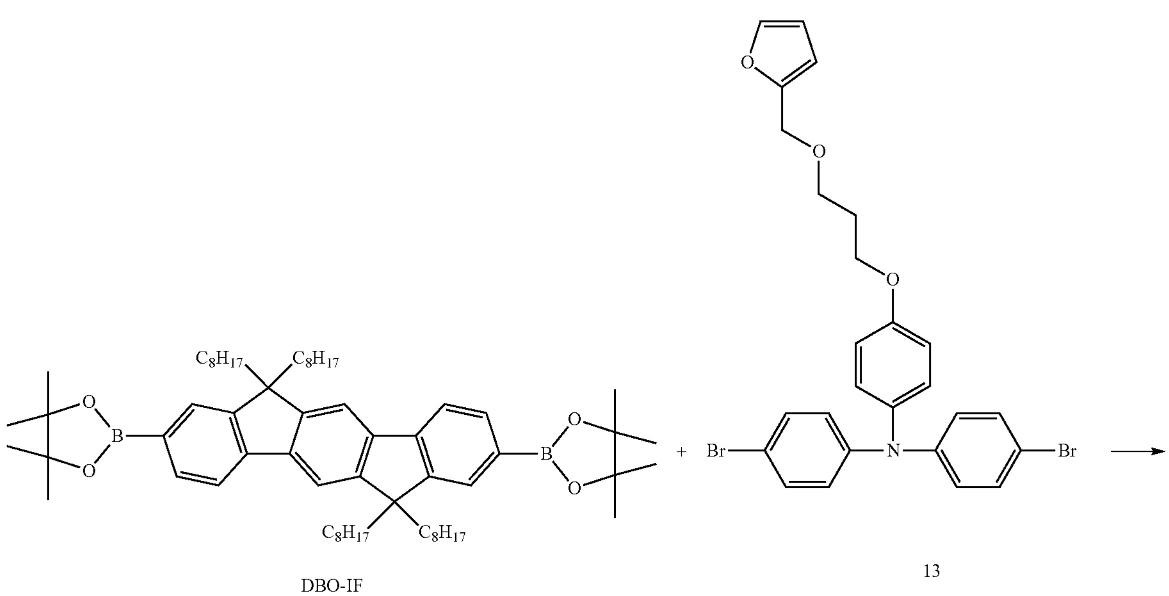

-continued

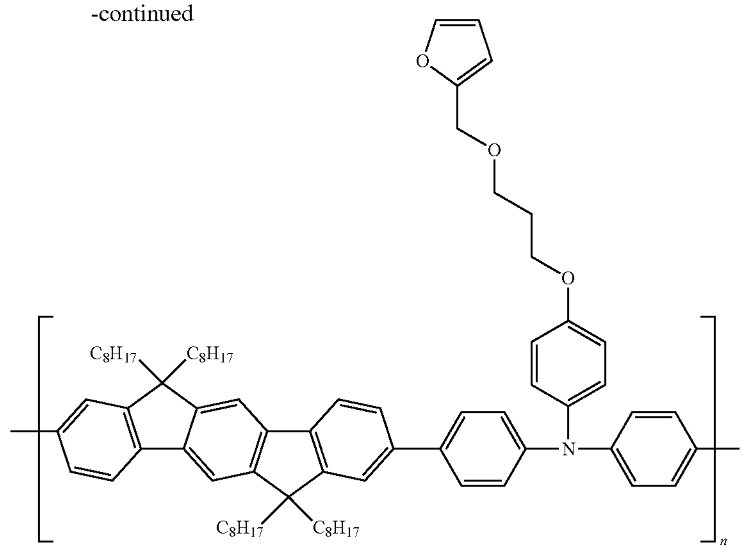

P1

Synthesis of 2,5-Diphenyl-P-Xylene (3)

2,5-dibromo-p-xylene (26.40 g, 0.1 mol) and phenylboronic acid (24.39 g, 0.2 mmol), and toluene (250 ml) were added in a 250 ml three-necked round bottom flask and stirred to dissolve. Water (50 ml) and $Na_2CO_3$ (21.2 g, 0.2 mol) were then added and stirred until all solid was dissolved. Aliquat 336 (0.5 ml) and triphenylphosphine tetrapalladium catalyst (o) $(PPh_3)_4Pd$ (75 mg) were added, protected with nitrogen for 10 min and then heated until reflux (92 to 100° C.). After reflux for 20 min, the nitrogen was turned off, the system was sealed and kept in reflux overnight. The reaction solution was extracted with toluene (50 ml×4) after cooling. The organic phase was combined, washed successively with NaCl saturated solution and water, and the solvent is evaporated. After drying, white crystals (22.48 g) were obtained with a theoretical value of 25.84 g and a yield of 87%. M. P. 180-181° C. (lit. 180° C.), $^1$H NMR ($CDCl_3$, 400 MHz, ppm): δ 7.44-7.30 (m, 10H), 7.14 (s, 2H), 2.26 (s, 6H).

Synthesis of 2,5-Diphenylterephthalic Acid (4)

2,5-diphenyl-p-xylene (12.92 g, 0.05 mol) and pyridine (250 ml) were added to a 250 ml three-necked round bottom flask with mechanical stirring to dissolve, water (30 ml) and potassium permanganate ($KMnO_4$) (39.51 g, 0.25 mol) were then sequentially added, heated to reflux (about 105 to 110° C.) for 2 h. Thereafter, the reaction solution was cooled, water (60 ml) and potassium permanganate ($KMnO_4$) (15.59 g, 0.1 mol) were added after each 30-min reflux, which was repeated for four times. Then, the reaction solution was cooled and water (60 ml) was added after each 6-hour reflux, which was repeated for four times. After the reaction, the reaction solution was filtered while hot, and the filter cake was washed with boiling water (1000 ml×4). The filtrate was combined. The solvent was distilled off to about 100 ml, and concentrated hydrochloric acid (50 ml) was added. After cooled, filtered, washed with cold water and dried in vacuum, white solid (9.21. g) was obtain with a theoretical value of 15.92 g and a yield of 57.9%. M. P. 281-282° C. (lit. 282° C.), $^1$H NMR (DMSO-$d_6$, 400 MHz, ppm): δ 7.67 (s, 2H), 7.46-7.38 (m, 10H).

Synthesis of 6,12-Indenofluorenedione (5)

Concentrated sulfuric acid (100 ml) was added to a 500 ml three-necked round bottom flask, 2,5-diphenylterephthalic acid (3.18 g, 0.01 mol) was slowly added with stirring. The reaction was performed for 0.5 h at room temperature, fuming sulfuric acid (5 to 10 drops) was then added. After 6-h reaction, the reaction solution was poured into an ice-water mixture while stirring with a glass rod. The mixed solution was suction filtered, washed with a large amount of water and dried. Dark red solid (1.95 g) was obtained with a theoretical value of 2.82 g and a yield of 69%. M. P.>300° C. (lit.>300° C.), $^1$H NMR ($CDCl_3$, 400 MHz, ppm): δ 7.79 (s, 2H), 7.68 (d, J=7.36 Hz, 2H), 7.57-7.51 (m, 4H), 7.37-7.29 (m, 2H).

Synthesis of Indenofluorene (6)

6,22-indenofluorenedione (5.64 g, 0.02 mol) was added to a 500 ml three-necked round bottom flask, and diethylene glycol (300 ml) and hydrazine hydrate (85%, 4 ml) were slowly added with stirring, followed by the addition of ground fine powder of KOH (28.10 g, 0.5 mol). After 10-min nitrogen protection, the reaction solution was heated to reflux (195° C.), reacted for 48 h, cooled and poured into crushed ice/concentrated hydrochloric acid (v: v=8:1) mixed solution while stirred with a glass rod. The mixed solution was suction filtered, washed with water and dried. Earthy yellow gray solid (2.29 g) was obtained with a theoretical value of 5.09 g and a yield of 45%. M. P. 300-301° C. (lit. 300-302° C.), $^1$H NMR (DMSO-$d_6$, 400 MHz, ppm): δ 8.09 (s, 2H), 7.93 (d, J=7.4 Hz, 2H), 7.59 (d, J=7.4 Hz, 2H), 7.39 (t, J=7.4 Hz, 2H), 7.31 (t, J=7.4 Hz, 2H), 3.99 (s, 4H).

Synthesis of 6,6,12,12-Tetraoctylfluorene (7)

A rotor was added to a 250 ml long-necked three-necked round bottom flask, indenofluorene (6) (1.27 g) was added.

A high vacuum piston (paraffin seal) was applied in the middle, and reverse rubber plugs were applied on both sides. The flask was evacuated with an oil pump while heating with a fan. Anhydrous THF (100 ml) was added to the flask through a syringe. N-butyllithium (2.87 M, 6 ml, 17.22 mmol) was added dropwise through a syringe to the flask with stirring at −78° C., and reacted with nitrogen protection for 1 h. The system was warmed to room temperature for reaction for 30 min and then lowered to −78° C. 1-bromooctane (n-$C_8H_{17}Br$, 3.82 g, 20 mmol) was added though a syringe, and the reaction solution was warmed to room temperature after reacting for 1 h at −78° C. and reacted overnight at room teperature. Water (30 ml) was added to the flask to quench the reaction. The reaction solution was extracted with petroleum ether (50 ml×4). The organic phase was combined and dried over anhydrous $Na_2SO_4$. The solvent was evaporated and the reaction solution was purified by column chromatography (100-200 mesh silica gel/petroleum ether). Beige crystals (1.68 g) were obtained by recrystallization from methanol with a theoretical value of 3.52 g and a yield of about 47.7%. $^1$H NMR ($CDCl_3$, 400 MHz, ppm): δ 7.72 (d, J=6.8 Hz, 2H), 7.58 (s, 2H), 7.33-7.24 (m, 6H), 1.99 (t, J=8.0 Hz, 8H), 1.12-0.98 (m, 24H), 0.76-0.59 (m, 20H); $^{13}$C NMR ($CDCl_3$, 100 MHz, ppm): δ 151.08, 149.92, 141.48, 140.50, 126.59, 122.81, 119.30, 113.81, 54.66, 40.67, 31.50, 29.69, 23.67, 22.51, 13.96.

Synthesis of 2,7-Dibromo-6,6,12,12-Tetraoctylfluorene (8)

A rotor, 6,6,12,12-tetraoctylfluorene (7.03 g,10 mmol) and $CCl_4$ (100 ml) were added to a 250 ml three-necked round bottom flask, and stirred to dissolve, and $Al_2O_3$/CuBr (40 g, 0.25 mol) was added. The reaction solution was kept in reflux for 18 h. The reaction solution was filtered and the filtrate was washed with water and dried over anhydrous $Na_2SO_4$. The solvent was evaporated, and the obtained solid was recrystallized from methanol. White crystals (3.73 g) were obtained with a theoretical value of 8.61 g and a yield of about 43.3%. $^1$H NMR ($CDCl_3$, 400 MHz, ppm): δ 7.57 (d, J=8.4 Hz, 2H), 7.52 (s, 2H), 7.45 (s, 2H), 7.44 (d, J=8.4 Hz, 2H), 1.97 (t, J=8.2 Hz, 8H), 1.11-0.96 (m, 24H), 0.75-0.58 (m, 20H); $^{13}$C NMR ($CDCl_3$, 100 MHz, ppm): δ 153.12, 149.68, 140.12, 139.72, 129.69, 125.97, 120.73, 120.63, 113.84, 55.13, 40.60, 31.58, 29.71, 23.76, 22.62, 14.11.

Synthesis of 2,8-Bis(4,4,5,5-Tetramethyl-1,3,2-Dioxaborane-Diyl)-6,6,12,12-Tetraoctylindenofluorene (DBO-IF)

A rotor was added to a 250 ml long-necked three-necked round bottom flask. A high vacuum piston (paraffin seal) was applied in the middle, and reverse rubber plugs were applied on both sides. The flask was evacuated with an oil pump while heating with a fan. 2,8-dibromo-6,6,12,12-tetraoctylindenofluorene (4.31 g, 5 mmol) was dissolved in THF (120 ml) which was added to the flask through a syringe and stirred at −78° C. for 20 min. N-butyllithium (2.87 M, 6 ml, 17.22 mmol) was added dropwise to the flask. The reaction was kept under nitrogen protection for 2 h, then 2-isopropyl-4,4,5,5-tetramethyl-1,3,2-dioxaborane (5 ml) was added through a syringe. The reaction was kept at −78° C. for 2 h, then naturally warmed to room temperature and kept overnight. Water (about 30 ml) was added to the flask to quench the reaction. The reaction solution was extracted with diethyl ether (50 ml×4). The organic phase was combined and dried over anhydrous $Na_2SO_4$. The solvent was evaporated and the reaction solution was purified by column chromatography (100-200 mesh silica gel/petroleum ether: ethyl acetate v:v=9:1). White crystals were obtained (1.18 g) with a theoretical value of 4.78 g and a yield of about 24.7%. $^1$H NMR ($CDCl_3$, 400 MHz, ppm): δ 7.75 (d, J=7.7 Hz, 2H), 7.71 (d, J=7.3 Hz, 2H), 7.70 (s, 2H), 7.59 (s, 2H) 4.19 (t, J=5.3 Hz, 8H), 2.08 (t, J=5.3 Hz, 4H), 2.01 (q, J=6.4 Hz, 8H), 1.07-0.96 (m, 24H), 0.68 (t, J=7.0 Hz, 12H), 0.58 (t, J=6.7 Hz, 8H); $^{13}$C NMR ($CDCl_3$, 100 MHz, ppm): δ 150.49, 150.15, 143.94, 140.83, 132.35, 127.75, 118.59, 114.17, 61.99, 54.58, 40.64, 31.51, 29.71, 27.42, 23.65, 22.52, 13.96.

Synthesis of 1-Bromo-4-(3-Bromopropoxy)Benzene 1,3-dibromopropane (316.4 g, 1.5 mol) and potassium carbonate (41.4 g, 0.3 mol) were added to a round bottom flask with ethanol as solvent, and p-bromophenol (51.9 g, 0.3 mol) was dissolved in ethanol and slowly dropped into the reaction system at reflux temperature. The reaction was kept overnight. After reaction, water was added to quench the reaction which was then extracted with dichloromethane, washed with saline water, and subjected to rotary evaporation to remove dichloromethane. 1,3-dibromopropane was distilled under reduced pressure and recycled. After that, dichloromethane and silica gel powder were added to the reaction solution which was subjected to a silica gel column with petroleum ether as a rinse. Product (60 g) was obtained. Mp 58-59° C.; IR (KBr disk) v: 2958 and 2930 (—CH2), 1489 (—CH2-), 1241 (C—O); 1H NMR (500 MHz, CDCl3): δ 2.36-2.40 (2H, m, J2'-3'=J2'-1'6, H-2'), 3.66-3.69 (2H, t, J3'-2'6, H-3'), 4.13-4.16 (2H, t, J1'-2'6, H-1'), 6.87 (2H, d, J3-2 9, H-3), 7.46 (2H, d, J2-3 9, H-2); 13C NMR (125 MHz, CDCl3): δ 28.3 (C-3'), 30.7 (C-2'), 64.1 (C-1'), 111.6 (C-1), 114.8 (2C, C-3), 130.8 (2C, C-2), 156.3 (C-4); m/z (EI): 296 (M+, 45%), 294 (80), 174 (97), 172 (100), 143 (20), 121 (17), 93 (21), 76 (19), 63 (43). HRMS (EI) found: 291.9095 (79Br, C9H10Br2O requires: 291.9098).

4-(3-Bromopropoxy)-N,N-Diphenylaniline

Compound 1 (13 g, 0.044 mol), diphenylamine (7.45 g, 0.044 mol), sodium tert-butoxide (8.45 g, 0.088 mol), a catalyst of bis(dibenzylideneacetone)palladium (1.27 g, 0.0022 mol) were added to a two-necked flask with anhydrous toluene as a reaction solvent. Nitrogen was purged for 30 min to remove oxygen, and then tri-tert-butylphosphine (13 ml) was added. The progress of the reaction was followed. After reaction, water was added to quench the reaction. The reaction solution was extracted with ethyl acetate. The organic phase was subjected to rotary evaporation to remove solvent. Silica gel powder was added to the reaction solution which was subjected to a silica gel column. Product (13.66 g) was obtained.

4-Bromo-N-(4-Bromophenyl)-N-(4-(3-Bromopropoxy)Phenyl)Aniline

Compound 2 (13.66 g, 0.036 mol) was dissolved in DMF to which NBS (12.73 g, 0.072 mol) was added in an ice bath. The reaction was kept overnight at room temperature. Water was added to quench the reaction which was extracted with dichloromethane and then washed with water. Silica gel powder was added to the reaction solution which was subjected to a silica gel column. Product (11.7 g) was obtained.

4-Bromo-N-(4-Bromophenyl)-N-(4-(3-(Furan-2-yloxy)Propoxy)Phenyl)Aniline

Furfuralcohol (4.6 g, 0.0468 mol) was added to a two-necked flask, anhydrous DMF was added as a reaction solvent. Air was replaced with nitrogen for three times. Sodium hydride (1.87 g, 0.0468 mol) was added under nitrogen atmosphere. and reacted for one hour. Compound 3 (5.06 g, 0.0094 mol) was added and reacted for 30 min, then heated to 50° C. and reacted overnight. Water was added to terminate the reaction. The reaction solution was extracted with dichloromethane, wash with saline water. The organic solvent was removed by rotary evaporation. Silica gel powder was added to the reaction solution which was subjected to a silica gel column. Product (1 g) was obtained.

Synthesis of Polymer P1

To a 25 mL two-necked round bottom flask, monomer of 4-bromo-N-(4-bromophenyl)-N-(4-(3-(furan-2-yloxy)propoxy)phenyl)aniline (13) (195 mg, 0.5 mmol), monomer of 2,8-bis(4,4,5,5-tetramethyl-1,3,2-dioxaborane-diyl)-6,6,12,12-tetraoctylindenofluorene (418 mg, 0.5 mmol), $Pd(PPh_3)_4$ (10 mg), degassed toluene (10 mL), degassed tetrahydrofuran (4 mL), and aqueous solution of tetraethylammonium hydroxide (2 mL, mass fraction of 20%) were added and uniformly stirred. Argon was passed for 15 minutes. The reaction was performed under argon protection at 110° C. for 24 hours, bromobenzene (50 µL) was added and kept in reflux for 2 hours, and then phenylboronic acid (20 mg) was added and kept in reflux for 2 hours. After cooled to room temperature, the reaction solution was added dropwise to methanol to precipitate. The obtained flocculent precipitate was filtered, vacuum dried, and redissolved in tetrahydrofuran (about 30 mL). The obtained tetrahydrofuran solution was filtered through a polytetrafluoroethylene (PTFE) filter head having a pore size of 0.45 µm, concentrated under reduced pressure, and then added dropwise to methanol for precipitation. After drying in vacuo, pale yellow solid (372 g) was obtained. GPC (tetrahydrofuran, polystyrene standard sample) Mn=21 000 g $mol^{-1}$, PDI=1.8.

Example 2: Synthesis of Polymer P2 C Conjugated Diene Functional Group D

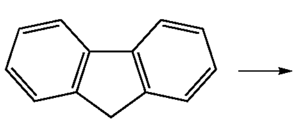

14

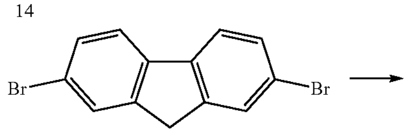

15

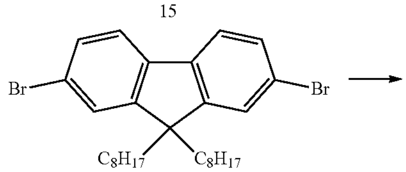

16

-continued

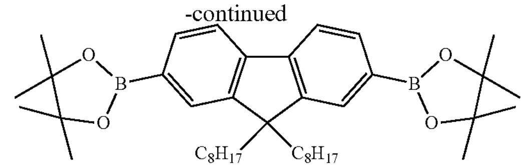

17

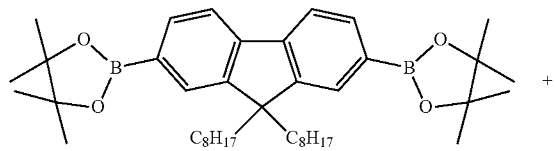

17

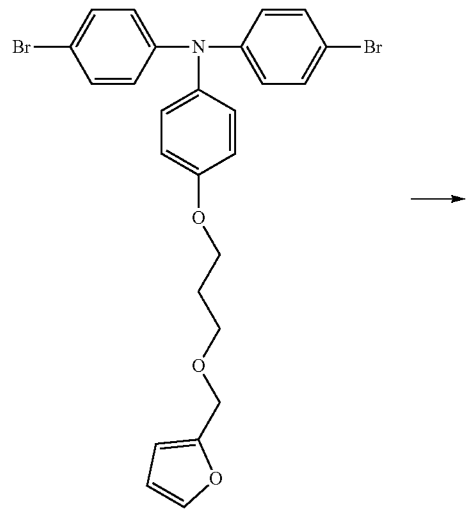

13

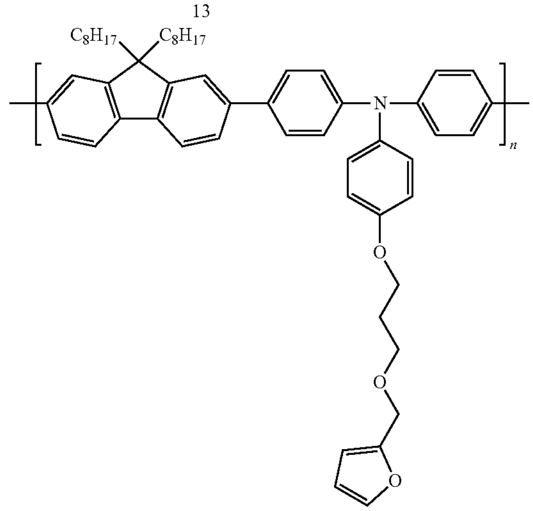

P2

Synthesis of 2,7-Dibromofluorene (15)

Fluorene (14) (100 g, 602 mmol) and iron powder (0.8 g, 1.4 mmol) were added to a 1 liter three-necked round bottom flask. Chloroform (500 mL) was added to dissolve them completely and cooled to 0 to 5° C. in an ice-water bath. A mixture of liquid bromine (69 mL, 1337 mmol) and chloroform (100 mL) was slowly added dropwise. After 1-hour dropping in dark, the reaction solution was reacted at room temperature for 10 hours, and a large amount of white solid was precipitated. The reaction was monitored by a thin layer chromatography. After the reaction, a saturated aqueous solution of sodium hydrogen sulfite was added to remove excess unreacted liquid bromine. A large amount of white solid was precipitated in the reaction mixture and filtered. The filtrate was washed with water for three times. The oil layer was separated and concentrated. The directly filtered solid and the concentrated solid was combined to give a crude product. The crude product was washed for three times with a saturated aqueous solution of sodium hydrogen sulfate, dried, purified by recrystallization from chloroform. White crystals (178 g) were obtained with a yield of 90%.

$^1$H NMR (300 MHz, $CDCl_3$, TMS) δ (ppm): 7.54 (d, 2H), 7.46 (d, 2H), 7.29 (d, 2H), 3.88 (m, 2H); 13C NMR (75 MHz, $CDCl_3$, TMS) δ (ppm): 152.92, 144.50, 134.90, 128.91, 121.30, 119.54, 76.55. Elemental analysis result: $C_{13}H_8Br_2$, theoretical calculation value: C, 48.15%, H, 2.47%; experimental test value: C, 48.21%; H, 2.65%.

Synthesis of 2,7-Dibromo-9,9-Dioctylfluorene (16)

Raw material of 2,7-dibromofluorene (15) (13.0 g, 40 mmol) was added to a 500 mL three-necked round bottom flask, dimethyl sulfoxide (150 mL) was added and stirred at room temperature. Aqueous solution of sodium hydroxide (20 mL, 50%) and tetrabutylammonium bromide (0.5 g, 0.15 mmol) were added and reacted at room temperature under argon protection for 1 hour. 1-bromooctane (17.9 g, 100 mmol) was then added and the reaction was continued for 12 hours. The reaction solution was poured into ice water, extracted with dichloromethane, and the oil layer was washed with water and a saturated aqueous solution of sodium chloride, and concentrated. The concentrate was separated by a silica gel column (200-300 mesh). White solid (17.5 g) was obtained after rinsing with petroleum ether, recrystallization from ethanol and dried in vacuo, with a yield of 80%.

2,7-Bis(4,4,5,5-Tetramethyl-1,3,2-Dioxaborolan-2-yl)-9,9'-Dioctylfluorene (17)

2,7-dibromo-9,9'-dioctylfluorene (16) (14.4 g, 20 mmol) and tetrahydrofuran (130 mL) were added in a 250 mL three-necked flask. A solution of n-butyllithium/n-hexane (2.4 M, 18.4 mL, 44 mmol) was added dropwise at −78° C. under argon protection, and was reacted at a constant temperature of −78° C. for 2 hours. Thereafter, 2-isopropoxy-4,4,5,5-tetramethyl-1,3,2-dioxaborolane (11.16 g, 60 mmol) was added once to the reaction solution at −78° C. The reaction was performed at a constant temperature for 1.5 hours, and then the reaction solution was gradually warmed to room temperature and reacted overnight. After the reaction, the reaction solution was poured into ice water and extracted with dichloromethane. The oil layer was washed with water and a saturated aqueous solution of sodium chloride and concentrated to obtain a crude product. The crude product was recrystallized from n-hexane. After drying, white solid (10.4 g) was obtained with a yield of 64%.

Synthesis of Polymer P2 Containing Conjugated Diene Functional Group D

To a 25 mL two-necked round bottom flask, monomer of 4-bromo-N-(4-bromophenyl)-N-(4-(3-(furan-2-yloxy)propoxy)phenyl)aniline (13) (195 mg, 0.5 mmol), monomer of 2,8-bis(4,4,5,5-tetramethyl-1,3,2-dioxaborane-diyl)-9,9-dioctylfluorene (418 mg, 0.5 mmol), $Pd(PPh_3)_4$ (10 mg), degassed toluene (10 mL), degassed tetrahydrofuran (4 mL), and aqueous solution of tetraethylammonium hydroxide (2 mL, mass fraction of 20%) were added and uniformly stirred. Argon was passed for 15 minutes. The reaction was performed under argon protection at 110° C. for 24 hours, and bromobenzene (50 μL) was added and kept in reflux for 2 hours, and then phenylboronic acid (20 mg) was added and kept in reflux for 2 hours. After cooled to room temperature, the reaction solution was added dropwise to methanol to precipitate. The obtained flocculent precipitate was filtered, vacuum dried, and redissolved in tetrahydrofuran (about 30 mL). The obtained tetrahydrofuran solution was filtered through a polytetrafluoroethylene (PTFE) filter head having a pore size of 0.45 μm, concentrated under reduced pressure, and then added dropwise to methanol to precipate. After drying in vacuo, pale yellow solid (292 mg) was obtained with a yield of 74%. GPC (tetrahydrofuran, polystyrene standard sample) Mn=18 000 g $mol^{-1}$, PDI=2.1.

Example 3: Synthesis of Polymer P3 Containing Dienophile Functional Group A

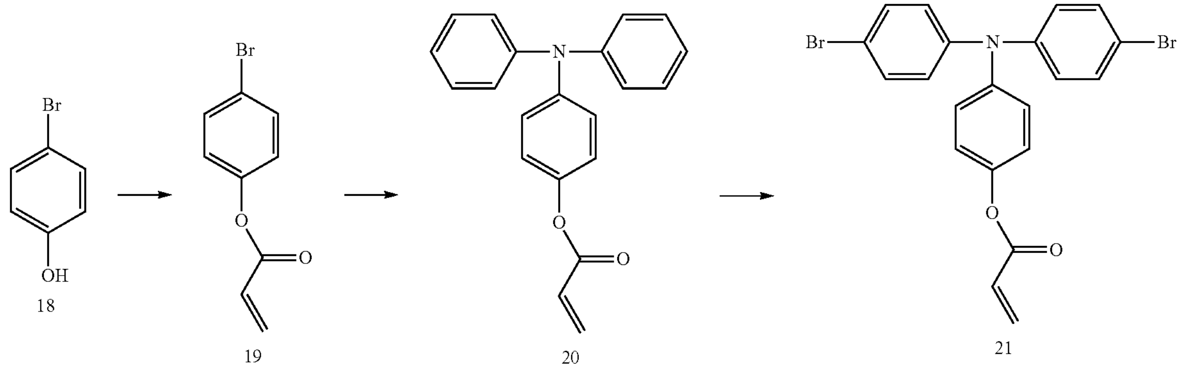

18 19 20 21

-continued

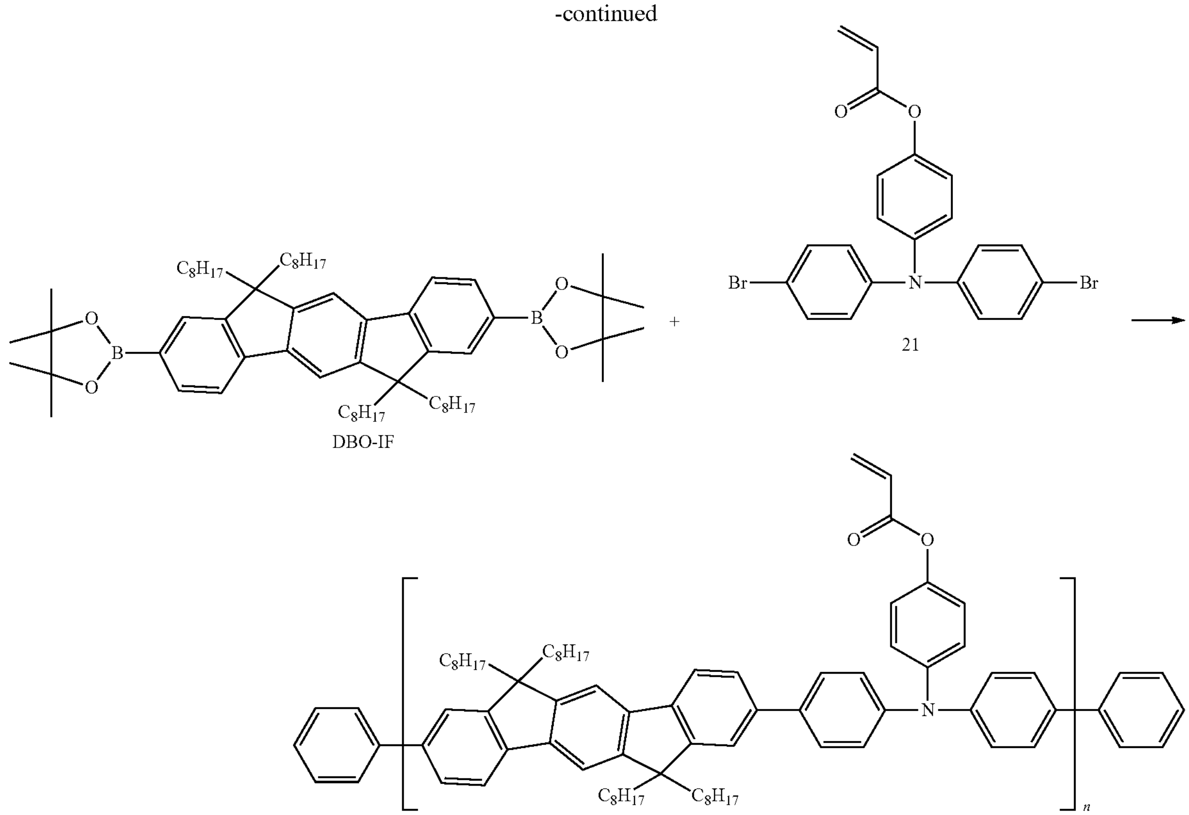

P3

Synthesis of 4-Bromophenyl Acrylate (19)

Sodium hydride (60%, 3.68 g, 91.6 mol) was added to a solution of p-bromobenzyl alcohol (16.3 g, 87.3 mol) in tetrahydrofuran in ice bath and reacted for 30 min. Acryloyl chloride (8.3 g, 91.6 mol) was then added. The reaction was continued for 30 min with stirring. Water was then added to terminate the reaction, and the organic solvent was removed by rotary evaporation. The residue was extracted with ethyl acetate, and then washed with saturated saline water. Silica gel powder was added to the reaction solution which was subjected to a silica gel column. Ethyl acetate:petroleum ether at a ratio of 80:20 was used as a rinse. An oily product (16 g) was obtained with a yield of 95%. $^{1}$H-NMR ($CDCl_3$) δ: 6.03 (1H, dd, J=10.5, 1.1 Hz), 6.31 (1H, dd, J=17.3, 10.5 Hz), 6.61 (1H, dd, J=17.3, 1.1 Hz), 7.03 (2H, d, J=9.1 Hz), 7.50 (2H, d, J=9.1 Hz).

Synthesis of 4-(Diphenylamino)Phenyl Acrylate (20)

Comound 19 (14.27 g, 21 mmol), diphenylamine (10 g, 59.21 mmol), palladium acetate (0.148 g, 1.12 mmol), dppf (2.3 g, 2.81 mmol), potassium tert-butoxide (8.13 g, 84.6 mmol) were added to a two-necked flask. Air was replaced with nitrogen for 3 times. Toluene was added as the reaction solvent and the reaction solution was kept in reflux at 90° C. overnight. Water was then added to terminate the reaction. Organic phase was then subjected to rotary evaporation and dichloromethane was added. Silica gel powder was added to the reaction solution which was then subjected to a silica gel column, and rinsed with petroleum ether as a rinse. An oily product (10 g) was obtained with a yield of 67%.

Synthesis of 4-(Bis(4-Bromophenyl)Amino)Acrylic Acid Phenyl Ester (21)

Compound 3 (10 g, 26.1 mmol) was dissolved in a solvent of DMF to which NBS (10.23 g, 52.2 mmol) was slowly added in an ice bath. The reaction was kept overnight. Water was then added to terminate the reaction and the reaction solution was extracted with dichloromethane. The organic phase was then washed with water. Silica gel powder was added to the reaction solution which was then subjected to a silica gel column, and rinsed with petroleum ether as a rinse. An oily product (9 g) was obtained with a yield of 80%.

Synthesis of Polymer P3 Containing Dienophile Functional Group A

To a 25 mL two-necked round bottom flask, monomer of 4-(bis(4-bromophenyl)amino)acrylic acid phenyl ester (21) (237 mg, 0.5 mmol), monomer of 2,8-bis(4,4,5,5-tetramethyl-1,3,2-dioxaborane-diyl)-6,6,12,12-tetraoctylindenofluorene (418 mg, 0.5 mmol), $Pd(PPh_3)_4$ (10 mg), degassed toluene (10 mL), degassed tetrahydrofuran (4 mL), and aqueous solution of tetraethylammonium hydroxide (2 mL, mass fraction of 20%) were added and uniformly stirred. Argon was passed for 15 minutes. The reaction was performed under argon protection at 110° C. for 24 hours, bromobenzene (50 μL) was added and kept in reflux for 2 hours, and then phenylboronic acid (20 mg) was added and kept in reflux for 2 hours. After cooled to room temperature, the reaction solution was added dropwise to methanol to precipitate. The obtained flocculent precipitate was filtered, vacuum dried, and redissolved in tetrahydrofuran (about 30 mL). The obtained tetrahydrofuran solution was filtered through a polytetrafluoroethylene (PTFE) filter head having a pore size of 0.45 μm, concentrated under reduced pressure, and then added dropwise to methanol to precipate. After drying in vacuo, pale yellow solid (362 mg) was obtained with a yield of 79%. GPC (tetrahydrofuran, polystyrene standard sample) Mn=118 000 g $mol^{-1}$, PDI=2.2.

Example 4: Synthesis of Polymer P4 Containing Dienophile Functional Group A

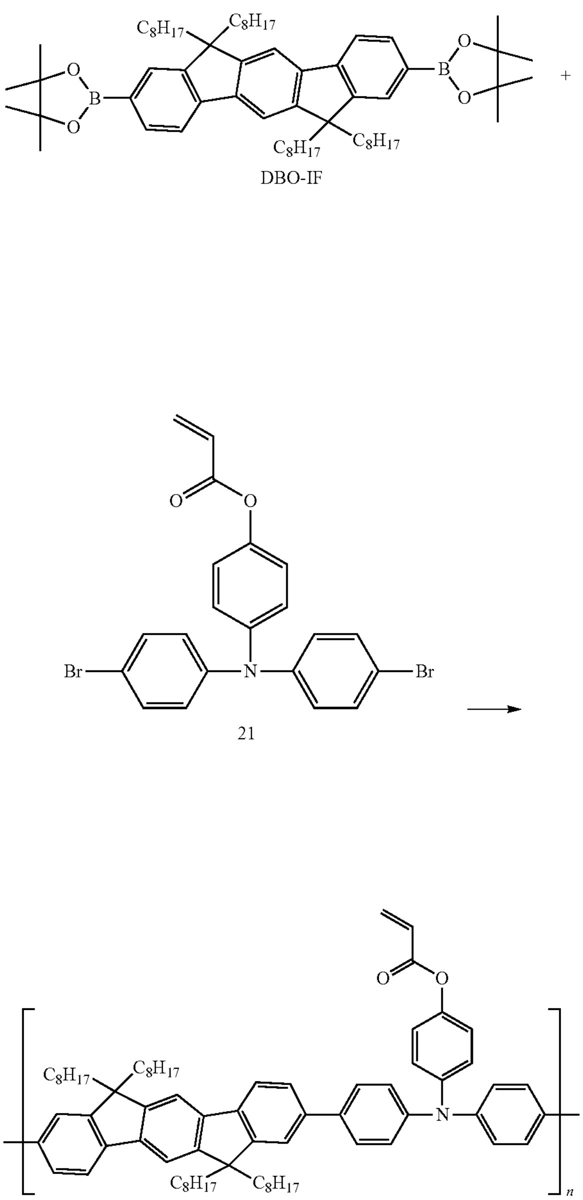

DBO-IF

21

P4

Synthesis of Polymer P4 Containing Dienophile Functional Group A

To a 25 mL two-necked round bottom flask, monomer of 4-(bis(4-bromophenyl)amino)acrylic acid phenyl ester (21) (237 mg, 0.5 mmol), monomer of 2,8-bis(4,4,5,5-tetramethyl-1,3,2-dioxaborane-diyl)-9,9-dioctylfluorene (418 mg, 0.5 mmol), $Pd(PPh_3)_4$ (10 mg), degassed toluene (10 mL), degassed tetrahydrofuran (4 mL), and aqueous solution of tetraethylammonium hydroxide (2 mL, mass fraction of 20%) were added and uniformly stirred. Argon was passed for 15 minutes. The reaction was performed under argon protection at 110° C. for 24 hours, bromobenzene (50 μL) was added and kept in reflux for 2 hours, and then phenylboronic acid (20 mg) was added and kept in reflux for 2 hours. After cooled to room temperature, the reaction solution was added dropwise to methanol to precipitate. The obtained flocculent precipitate was filtered, vacuum dried, and redissolved in tetrahydrofuran (about 30 mL). The obtained tetrahydrofuran solution was filtered through a polytetrafluoroethylene (PTFE) filter head having a pore size of 0.45 μm, concentrated under reduced pressure, and then added dropwise to methanol for precipitation. After drying in vacuo, pale yellow solid (278 mg) was obtained with a yield of 69%. GPC (tetrahydrofuran, polystyrene standard sample) Mn=118 000 g $mol^{-1}$, PDI=2.8.

Example 5: Preparation and Characterization of OLED Devices

Scheme 1: A mixture including the polymers containing the conjugated diene functional groups D and the polymers containing the dienophile functional groups A (P1: P3, P1: P4, P2: P3, P2: P4, wherein the molar ratio of conjugated diene functional group D:dienophile functional group A was 1:1) synthesized in Examples 1 to 4 was used as a hole transporting material in the application of solution processed OLED (ITO anode/hole transporting layer/light-emitting layer/electron transporting layer/aluminum cathode).

Other materials are as follows:

H1

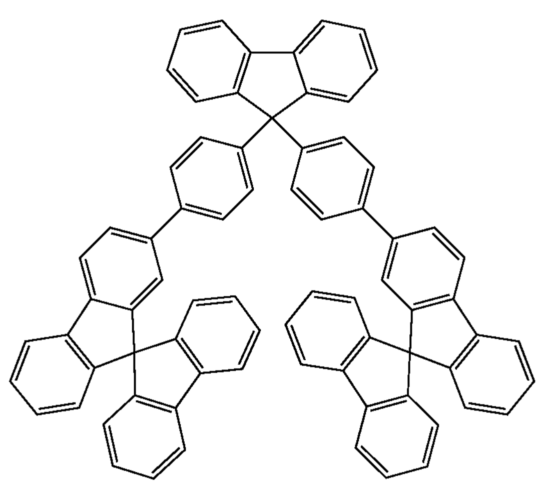

-continued

H2

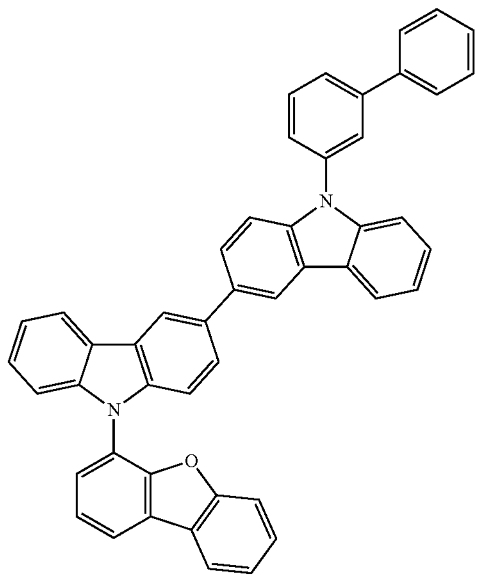

E1

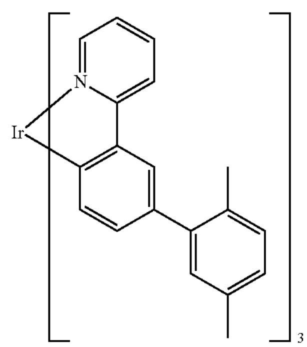

wherein H1 is a co-host material and synthesis of which is referred to the Chinese Patent NO. CN201510889328.8; H2 is a co-host material and synthesis of which is referred to the Patent NO. WO201034125A1; E1 is a phosphorescent guest, and synthesis of which is referred to the Patent NO. CN102668152;

The preparation steps of the OLED devices were as follows:

1) Cleaning of an ITO transparent electrode (anode) glass substrate: the substrate was subjected to ultrasonic treatment with an aqueous solution of 5% Decon90 cleaning solution for 30 minutes, followed by ultrasonic cleaning with deionized water for several times, then subjected to ultrasonic cleaning with isopropanol and nitrogen drying. The substrate was treated under oxygen plasma for 5 minutes to clean the ITO surface and to improve the work function of the ITO electrode.

2) Preparation of an HIL and an HTL: PEDOT:PSS (Clevios™ PEDOT:PSS A14083) was spin-coated on the oxygen plasma-treated glass substrate to obtain an 80-nm film which was annealed in air at 150° C. for 20 minutes; a mixture including the polymer containing conjugated diene functional groups D and the polymer containing dienophile functional groups A (P1:P3, P1:P4, P2:P3, P2:P4, wherein the molar ratio of conjugated diene functional group D:dienophile functional group A was 1:1) synthesized in Examples 1 to 4 was dissolved in a tolune solution at a concentration of 5 mg/ml which was spin-coated on the PEDOT:PSS film with a thickness of 20 nm. The film was heated on a hot plate at 100° C. for reacting for 40 min to allow the conjugated diene functional groups D and the dienophile functional groups A to undergo a Diels-Alder reaction and crosslink to form a three-dimensional network polymer film. Thereafter, the polymer film constructed based on the Diels-Alder reaction was rinsed with toluene and was measured to have a thickness of 18 to 19 nm, indicating that the crosslinking reaction is effective, and the curing of the crosslinkable polymer constructed based on the Diels-Alder reaction is relatively complete.

3) Preparation of a light-emitting layer: H1, H2, E1 were dissolved in toluene at a weight ratio of 40:40:20, and the concentration of the solution is 20 mg/mL. This solution was spin-coated in a nitrogen glove box to obtain a 60-nm film and was then annealed at 120° C. for 10 minutes.

4) Preparation of a cathode: the spin-coated device was placed in a vacuum evaporation chamber, and 2-nm barium and 100-nm aluminum were sequentially deposited to yield a light-emitting device.

5) The device was encapsulated in a nitrogen glove box using UV-curable resin and a glass cover.

Current-voltage (I-V) property, luminous intensity and external quantum efficiency of the OLED devices were measured by a Keithley 236 current and voltage-measurement system and a calibrated silicon photodiode.

| | Efficiency (cd/A) @1000 nits | Color |
|---|---|---|
| OLED-1 | 31.6 | Green |
| OLED-2 | 36.5 | Green |
| OLED-3 | 33.1 | Green |
| OLED-4 | 38.9 | Green |

Scheme 2: A blender of the polymers containing the conjugated diene functional groups D synthesized in Examples 1 to 2 doped with small molecular crosslinking agents containing dienophiles was used as a hole transporting material in the application of O/PLEDs (ITO anode/hole transporting layer/light-emitting layer/electron transporting layer/aluminum cathode).

A mixture of the polymers containing the conjugated diene functional groups D synthesized in Examples 1 to 2 doped with small molecular crosslinking agents containing the dienophiles (the proportion of doped crosslinking agent can be adjusted) was dissolved in toluene, and the concentration of the solution is 5 mg/mL which was spin-coated on the PEDOT:PSS film with a thickness of 20 nm. The film was heated on a hot plate at 100° C. for reacting for 0 to 40 min to allow the conjugated diene functional groups D of the polymers and the dienophile functional groups A of the doped crosslinking agents to undergo a Diels-Alder reaction and crosslink to form a three-dimensional network polymer film. Thereafter, the crosslinkable polymer film constructed based on the Diels-Alder reaction was rinsed with toluene and was measured to have a thickness of 18 to 19 nm, indicating that the crosslinking reaction is effective, and the curing of the crosslinkable polymer constructed based on the Diels-Alder reaction is relatively complete.

The chemical mechanism of the small molecular crosslinking agent containing the dienophile functional groups A is shown in the following figures, but is not limited to the following compounds:

Scheme 3: A blender of the polymers containing the dienophile functional groups A synthesized in Examples 3 to 4 doped with small molecular crosslinking agents containing conjugated dienes was used as a hole transporting material in the applicaton of O/PLEDs (ITO anode/hole transporting layer/light-emitting layer/electron transporting layer/aluminum cathode).

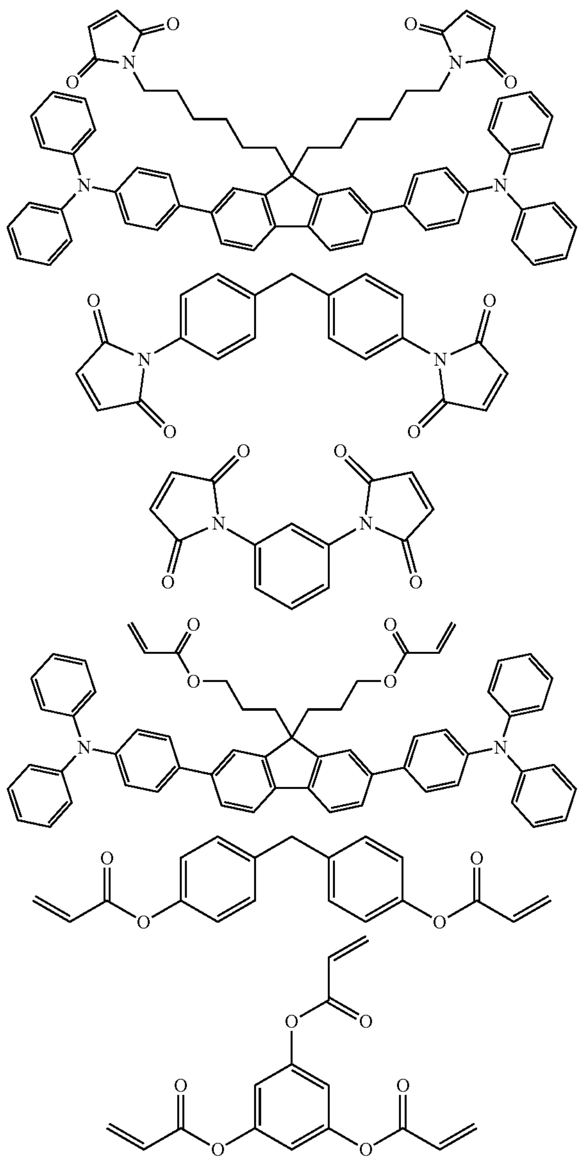

A mixture of the polymers containing the dienophile functional groups A synthesized in Examples 1 to 4 doped with small molecular crosslinking agents containing the conjugated dienes (the proportion of doped crosslinking agent can be adjusted) was dissolved in toluene, and the concentration of the solution is 5 mg/mL which was spin-coated on the PEDOT:PSS film with a thickness of 20 nm. The film was heated on a hot plate at 100° C. for reacting for 0 to 40 min to allow the conjugated dienophile functional groups A of the polymers and the dienophile functional groups A of the doped crosslinking agents to undergo a Diels-Alder reaction and crosslink to form a three-dimensional network polymer film. Thereafter, the crosslinkable polymer film constructed based on the Diels-Alder reaction was rinsed with toluene and was measured to have a thickness of 18 to 19 nm, indicating that the crosslinking reaction is effective, and the curing of the crosslinkable polymer constructed based on the Diels-Alder reaction is relatively complete.

The chemical mechanism of the small molecular cross-linking agent containing the dienophile functional group A is shown in the following figures, but is not limited to the following compounds:

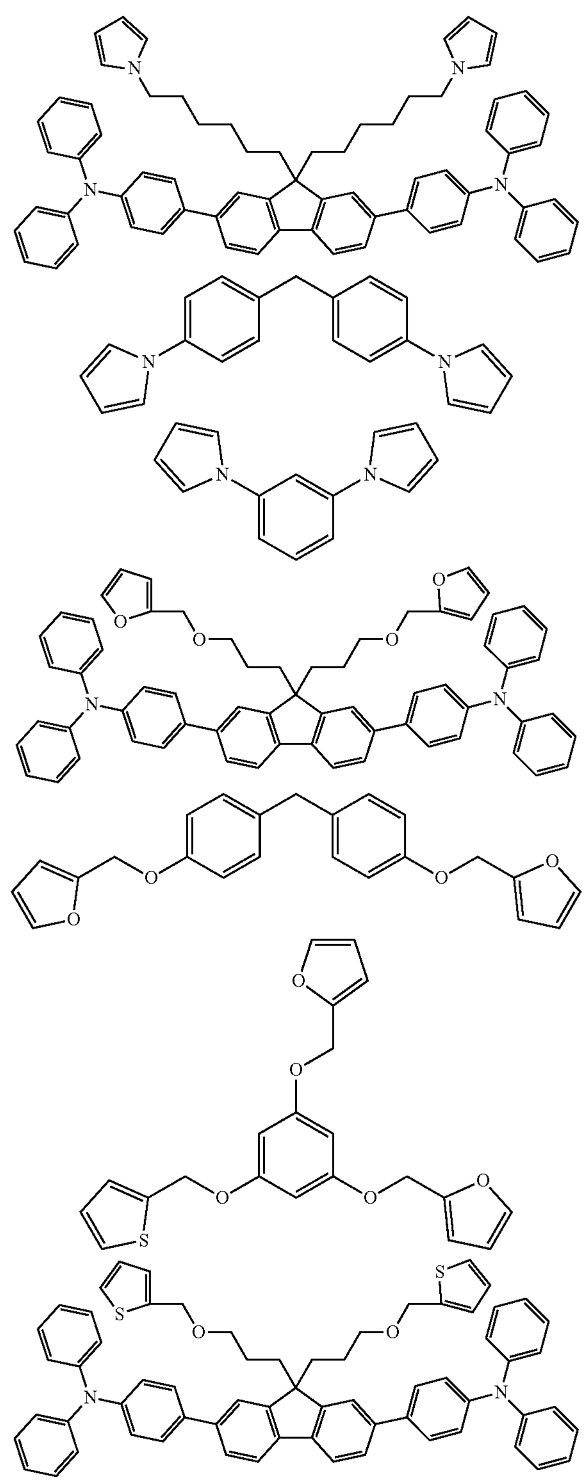

-continued

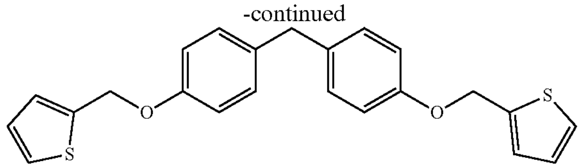

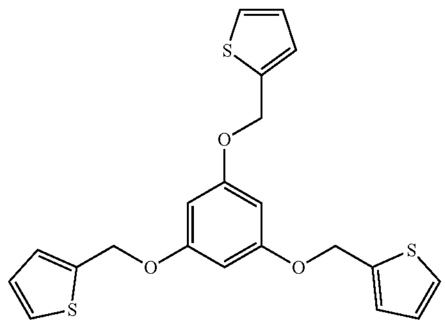

Example 6: Crosslinking and Solvent Resistance Test

A blender of the polymer containing the conjugated diene functional groups D synthesized in Example 2 doped with the small molecular crosslinking agent containing the dienophile functional groups A (the chemical structure is as shown above, the proportion of the doped crosslinking agent is 5%, or 10%) was formed into a film on a quartz plate and heated to allow the conjugated diene functional groups D of the polymer P2 and the dienophile functional groups A of the small molecular crosslinking agent to undergo the Diels-Alder reaction and crosslink to form an insoluble and infusible interpenetrating network polymer film.

A mixture of the polymer P2 containing the conjugated diene functional groups D synthesized in Example 2 doped with small molecular crosslinking agent containing the dienophile functional groups A (the chemical structure is shown above, the proportion of the doped crosslinking agent is 5%, or 10%) was dissolved in toluene, and the concentration of the solution is 5 mg/mL which was spin-coated on a quartz plate with a thickness of 20 nm. The film was heated on a hot plate at 100° C. for reacting for 1 to 10 min to allow the conjugated diene functional groups D of the polymer P2 and the dienophile functional groups A of the small molecular crosslinking agent to undergo the Diels-Alder reaction. The crosslinked polymer film was then rinsed with toluene. The degree of change in absorbance before and after elution of the toluene solvent was tested, which was used to determine the solvent resistance property of the crosslinking of the polymer film. The more the absorbance decreases, the poorer the solvent resistance of the polymer is. On the contrary, the decrease of the absorbance of the polymer is relatively small after elution with toluene, indicating that the solvent resistance of the polymer is relatively good.

It should be understood that, the application of the present disclosure is not limited to the above-described examples, and those skilled in the art can make modifications and changes in accordance with the above description, all of which are within the scope of the appended claims.

What is claimed is:

1. A mixture that can undergo a Diels-Alder reaction, comprising a polymer (I) and a polymer (II), wherein the polymer (I) and the polymer (II) have structures as follows:

Polymer (I)

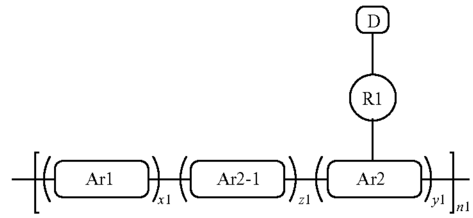

Polymer (II)

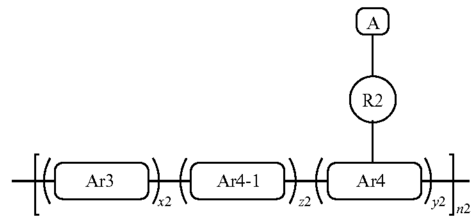

wherein:

x1, y1, x2, y2, z1, and z2 are molar percentages; $x1>0$, $x2>0$, $y1>0$, $y2>0$, $z1\geq 0$, $z2\geq 0$; $x1+y1+z1=1$, $x2+y2+z2=1$;

Ar1, Ar2-1, Ar3, and Ar4-1 are each independently selected from an aryl group containing 5 to 40 ring atoms and a heteroaryl group containing 5 to 40 ring atoms;

Ar2 or Ar4 each independently has a structure as shown in Chemical Formula (1):

Chemical Formula (1)

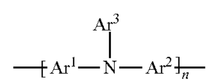

$Ar^1$, $Ar^2$ and $Ar^3$ are each independently a substituted or unsubstituted aryl or heteroaryl;

n is 1, 2, 3, 4, or 5;

R1 and R2 are each independently a linking group;

D is a conjugated diene functional group, A is a dienophile functional group;

n1 is greater than 0, and n2 is greater than 0.

2. The mixture that can undergo the Diels-Alder reaction according to claim 1, wherein the polymer (I) has a structure represented by (III) and the polymer (II) has a structure represented by (IV):

Polymer (III)

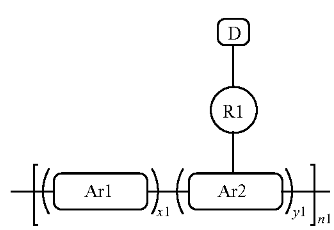

-continued

Polymer (IV)

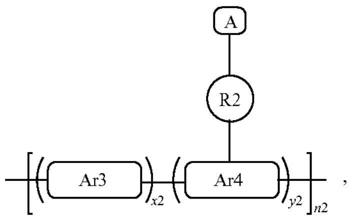

wherein x1+y1=1, x2+y2=1.

3. The mixture that can undergo the Diels-Alder reaction according to claim 1, wherein the aryl group is selected from the group consisting of benzene, biphenyl, triphenyl, benzo, fluorene, indenofluorene, and derivatives thereof;

the heteroaryl group is selected from the group consisting of triphenylamine, dibenzothiophene, dibenzofuran, dibenzoselenophen, furan, thiophene, benzofuran, benzothiophene, benzoselenophene, carbazole, indolocarbazole, indolopyridine, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, benzoxazole, bisbenzoxazole, isoxazole, benzothiazole, quinoline, isoquinoline, cinnoline, quinazoline, quinoxaline, naphthalene, phthalein, pteridine, xanthene, acridine, phenazine, phenothiazine, phenoxazine, benzofuropyridine, furodipyridine, benzothienopyridine, thienodipyridine, benzoselenophenopyridine, selenophenodipyridine, and derivatives thereof.

4. The mixture that can undergo the Diels-Alder reaction according to claim 1, wherein R1 and R2 are each independently selected from the group consisting of an alkyl group containing 1 to 30 C atoms, an alkoxy group containing 1 to 30 C atoms, benzene, biphenyl, triphenyl, benzo, thiophene, anthracene, naphthalene, benzodithiophene, aryl amine, triphenylamine, naphthylamine, thiophene, carbazole, dibenzothiophene, dithienocyclopentadiene, dithienothiol, dibenzoselenophene, furan, thiophene, benzofuran, benzothiophene, benzoselenophene, carbazole, and furan.

5. The mixture that can undergo the Diels-Alder reaction according to claim 1, wherein D is selected from the group consisting of the following groups:

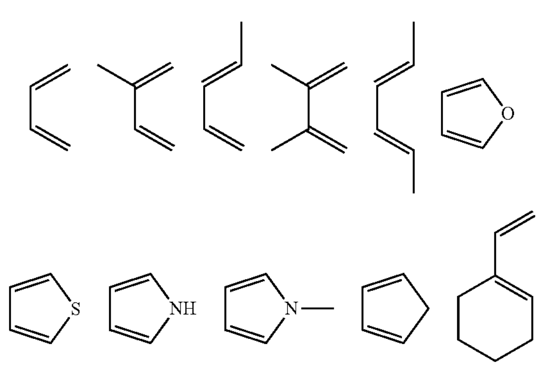

-continued

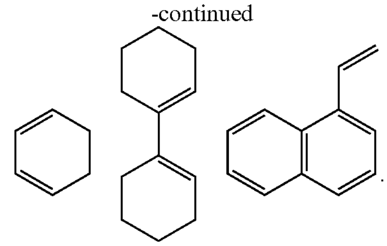

6. The mixture that can undergo the Diels-Alder reaction according to claim 1, wherein D is substituted by a substituent selected from the group consisting of deuterium, alkyl, alkoxy, amino, alkenyl, alkynyl, aralkyl, heteroalkyl, aryl and heteroaryl.

7. The mixture that can undergo the Diels-Alder reaction according to claim 1, wherein A is selected from the group consisting of the following structural groups:

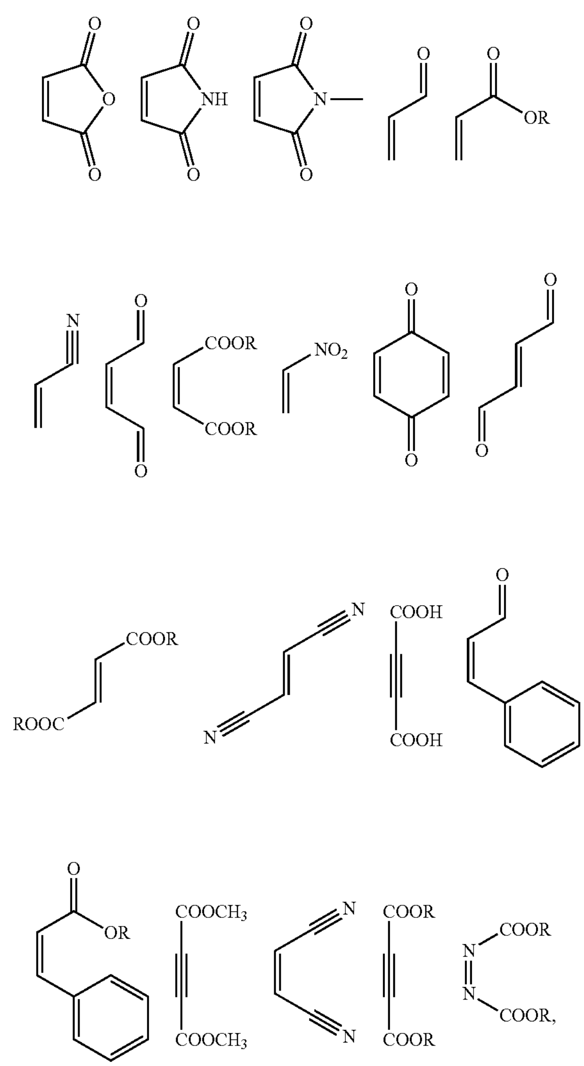

and R is a substituent.

8. The mixture that can undergo the Diels-Alder reaction according to claim 2, wherein the polymer (I) has a structure represented by (III-1), the polymer (II) has a structure represented by (IV-1):

Polymer (III-1)

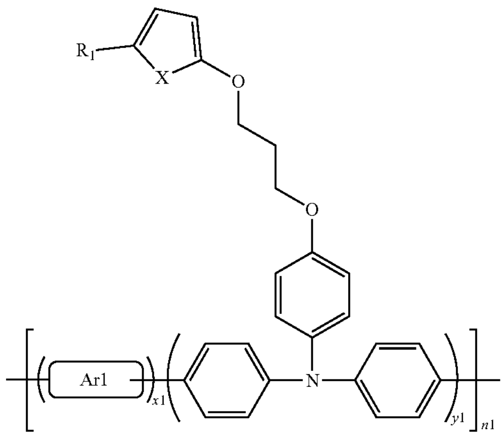

Polymer (IV-1)

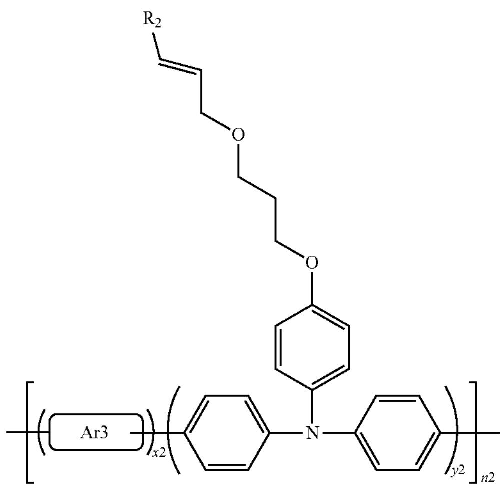

wherein X is $CH_2$, S, O or N—$CH_3$;

$R_1$ is hydrogen, deuterium, methyl or phenyl;

$R_2$ is —COOH, —CHO, —CN, —$NO_2$ or

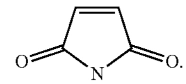

9. A mixture comprising the mixture that can undergo a Diels-Alder reaction according to claim 1, and an organic solvent or an organic functional material selected from the group consisting of a hole injection material, a hole transporting material, an electron transporting material, an electron injection material, an electron blocking material, a hole blocking material, an emitter, and a host material.

10. An organic electronic device comprising the mixture that can undergo a Diels-Alder reaction according to claim 1.

11. The organic electronic device according to claim 10, wherein the organic electronic device is selected from the group consisting of an organic light-emitting diode, an organic photovoltaic, an organic light-emitting cell, an organic field effect transistor, an organic light-emitting field effect transistor, an organic laser, an organic spintronic device, a quantum dot light-emitting diode, a perovskite cell, an organic sensor, and an organic plasmon emitting diode.

12. The mixture that can undergo the Diels-Alder reaction according to claim 1, wherein R1-D and R2-A are selected from the following structural groups:

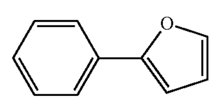 [SMILES: c1ccc(-c2ccco2)cc1]

1

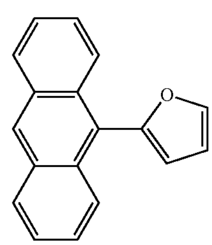 [SMILES: c1coc(-c2c3ccccc3cc3ccccc23)c1]

2

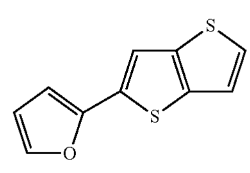 [SMILES: c1coc(-c2cc3sccc3s2)c1]

3

-continued
4
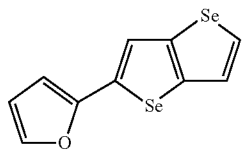 [SMILES: c1coc(-c2cc3[se]ccc3[se]2)c1]
5
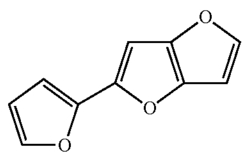 [SMILES: c1coc(-c2cc3occc3o2)c1]
6
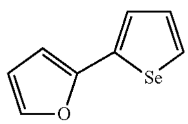
7
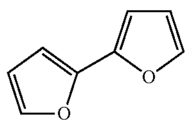
8
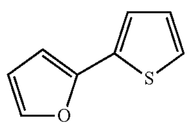
9
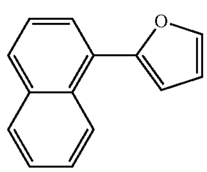
10
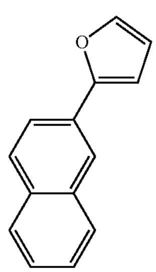 [SMILES: c1coc(-c2ccc3ccccc3c2)c1]
11
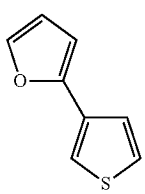
12
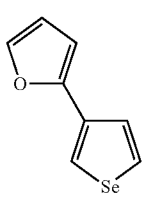

-continued
13
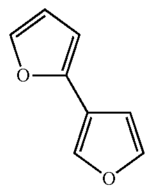
14
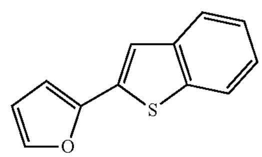
15
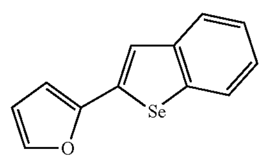
16
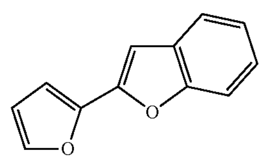
17
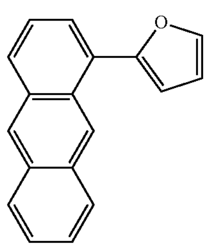 [SMILES: c1coc(-c2cccc3cc4ccccc4cc23)c1]
18
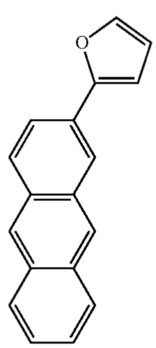 [SMILES: c1coc(-c2ccc3cc4ccccc4cc3c2)c1]
19
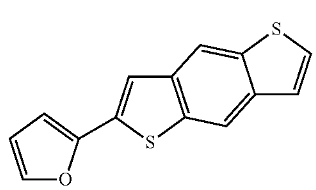 [SMILES: c1coc(-c2cc3cc4sccc4cc3s2)c1]

-continued
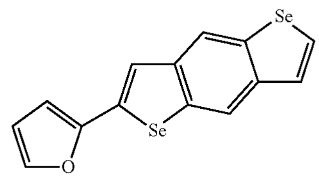 [SMILES: c1coc(-c2cc3cc4[se]ccc4cc3[se]2)c1]
20
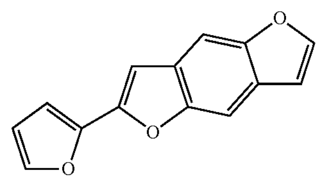 [SMILES: c1coc(-c2cc3cc4occc4cc3o2)c1]
21
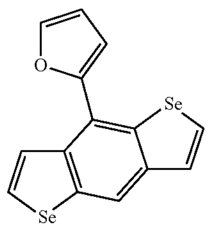 [SMILES: c1coc(-c2c3cc[se]c3cc3cc[se]c23)c1]
22
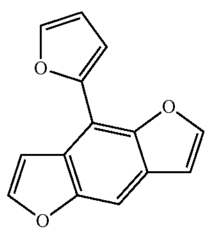 [SMILES: c1coc(-c2c3ccoc3cc3ccoc23)c1]
23
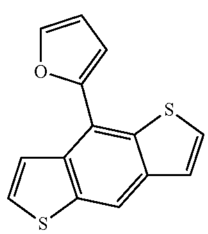 [SMILES: c1coc(-c2c3ccsc3cc3ccsc23)c1]
24
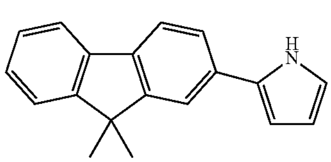 [SMILES: CC1(C)c2ccccc2-c2ccc(-c3ccc[nH]3)cc21]
25
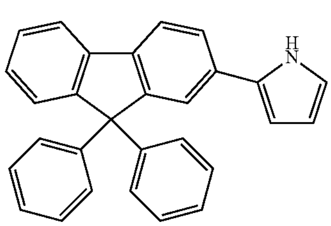
26

-continued
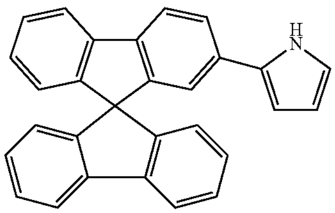 [SMILES: c1c[nH]c(-c2ccc3c(c2)C2(c4ccccc4-c4ccccc42)c2ccccc2-3)c1]
27
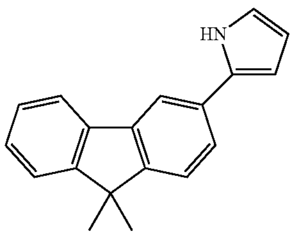 [SMILES: CC1(C)c2ccccc2-c2cc(-c3ccc[nH]3)ccc21]
28
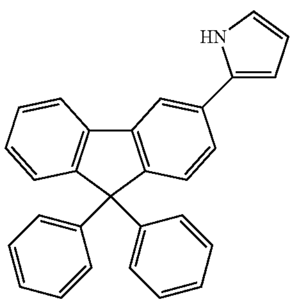 [SMILES: c1ccc(C2(c3ccccc3)c3ccccc3-c3cc(-c4ccc[nH]4)ccc32)cc1]
29
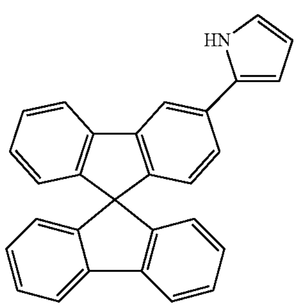 [SMILES: c1c[nH]c(-c2ccc3c(c2)-c2ccccc2C32c3ccccc3-c3ccccc32)c1]
30
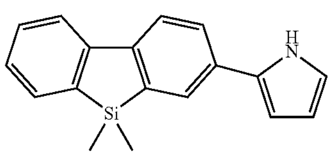
31
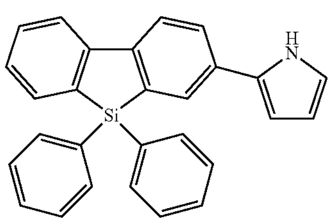 [SMILES: c1ccc([Si]2(c3ccccc3)c3ccccc3-c3ccc(-c4ccc[nH]4)cc32)cc1]
32

-continued
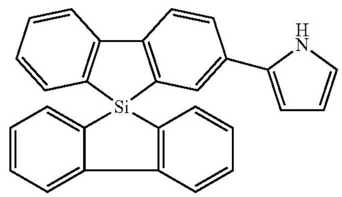 [SMILES: c1c[nH]c(-c2ccc3c(c2)[Si]2(c4ccccc4-c4ccccc42)c2ccccc2-3)c1]
33
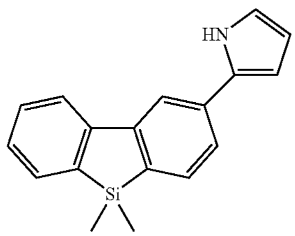
34
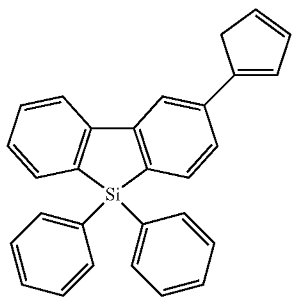 [SMILES: C1=CCC(c2ccc3c(c2)-c2ccccc2[Si]3(c2ccccc2)c2ccccc2)=C1]
35
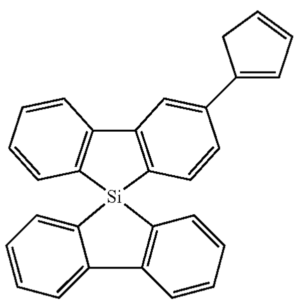
36
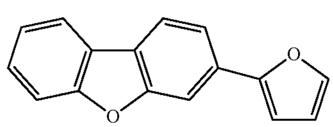 [SMILES: c1coc(-c2ccc3c(c2)oc2ccccc23)c1]
37
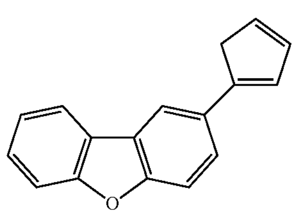 [SMILES: C1=CCC(c2ccc3oc4ccccc4c3c2)=C1]
38
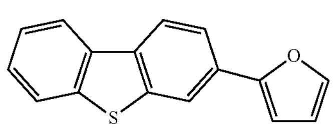 [SMILES: c1coc(-c2ccc3c(c2)sc2ccccc23)c1]
39

-continued
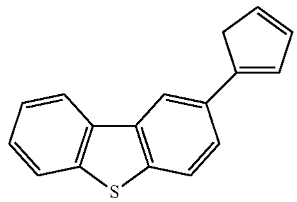 [SMILES: C1=CCC(c2ccc3sc4ccccc4c3c2)=C1]
40
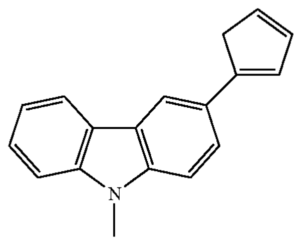 [SMILES: Cn1c2ccccc2c2cc(C3=CC=CC3)ccc21]
41
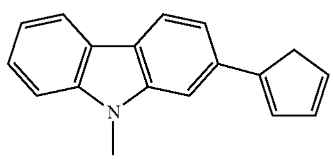 [SMILES: Cn1c2ccccc2c2ccc(C3=CC=CC3)cc21]
42
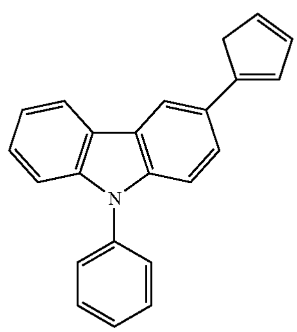 [SMILES: C1=CCC(c2ccc3c(c2)c2ccccc2n3-c2ccccc2)=C1]
43
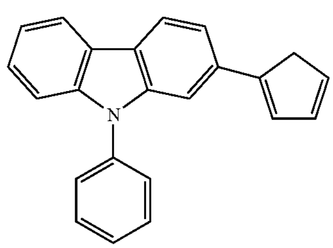 [SMILES: C1=CCC(c2ccc3c4ccccc4n(-c4ccccc4)c3c2)=C1]
44
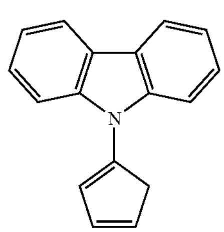 [SMILES: C1=CCC(n2c3ccccc3c3ccccc32)=C1]
45

-continued
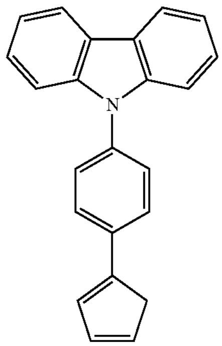 [SMILES: C1=CCC(c2ccc(-n3c4ccccc4c4ccccc43)cc2)=C1]
46
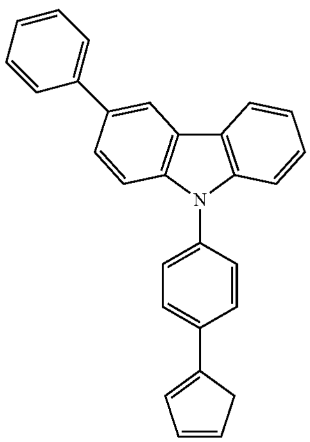 [SMILES: C1=CCC(c2ccc(-n3c4ccccc4c4cc(-c5ccccc5)ccc43)cc2)=C1]
47
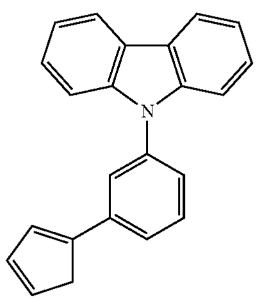 [SMILES: C1=CCC(c2cccc(-n3c4ccccc4c4ccccc43)c2)=C1]
48
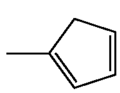
49
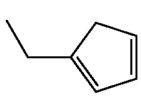
50
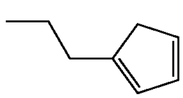
51
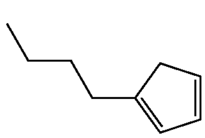
52

-continued
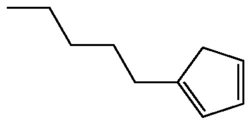
53
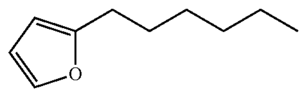
54
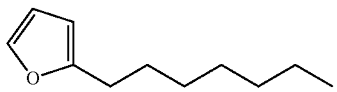
55
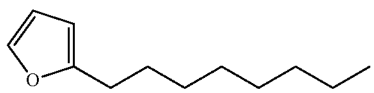
56
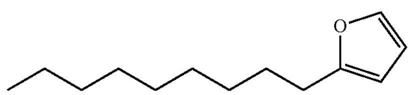
57
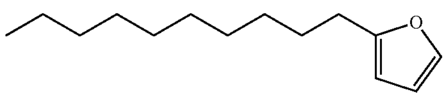
57
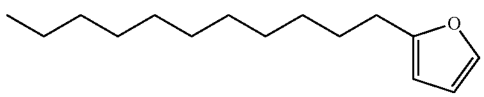 [SMILES: CCCCCCCCCCCc1ccco1]
58
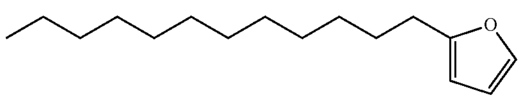 [SMILES: CCCCCCCCCCCCc1ccco1]
59
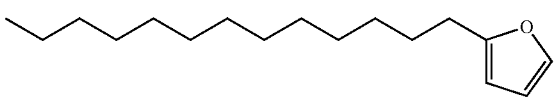 [SMILES: CCCCCCCCCCCCCc1ccco1]
60
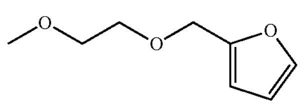
61
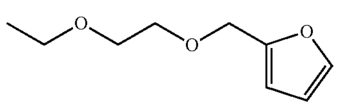
62
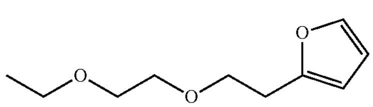
63
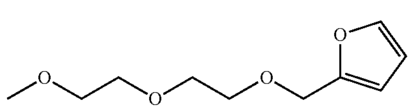
64

-continued
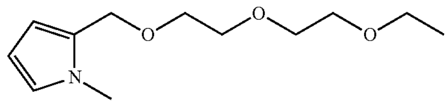 [SMILES: CCOCCOCCOCc1cccn1C]
65
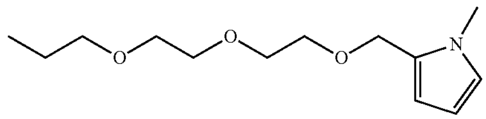 [SMILES: CCCOCCOCCOCc1cccn1C]
66
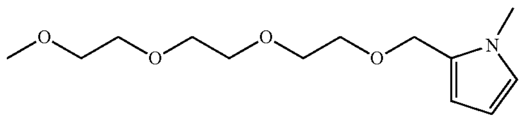 [SMILES: COCCOCCOCCOCc1cccn1C]
67
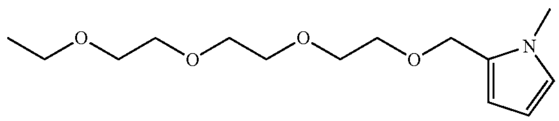 [SMILES: CCOCCOCCOCCOCc1cccn1C]
68
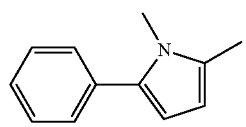
69
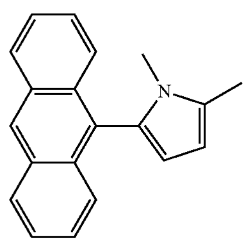 [SMILES: Cc1ccc(-c2c3ccccc3cc3ccccc23)n1C]
70
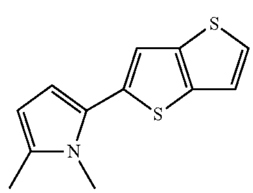
71
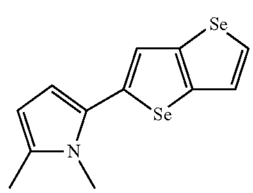
72
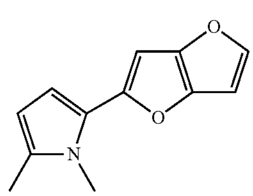
73

-continued
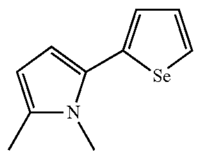
74
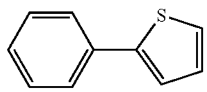 [SMILES: c1ccc(-c2cccs2)cc1]
75
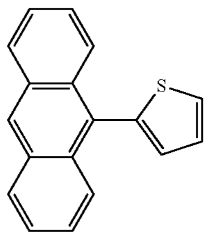
76
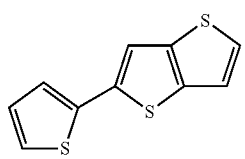 [SMILES: c1csc(-c2cc3sccc3s2)c1]
77
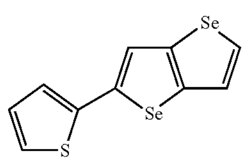
78
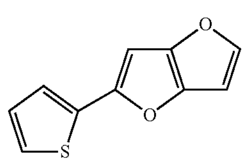
79
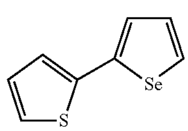
80
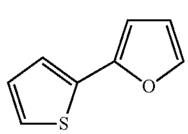
81
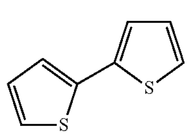
82

-continued
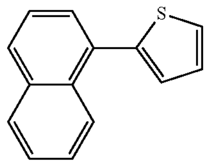
83
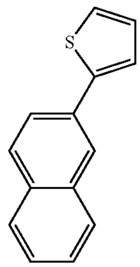 [SMILES: c1csc(-c2ccc3ccccc3c2)c1]
84
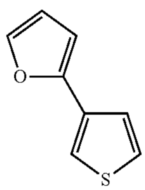
85
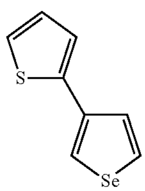
86
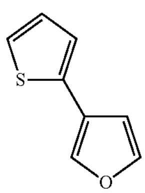
87
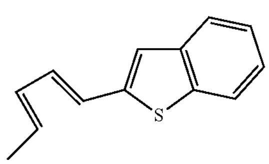
88
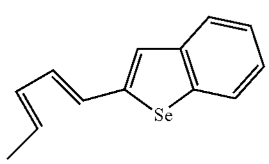
89
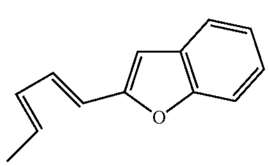
90

-continued
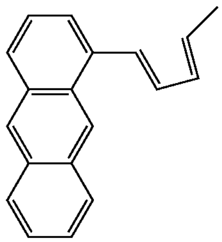 [SMILES: C/C=C/C=C/c1cccc2cc3ccccc3cc12]
91
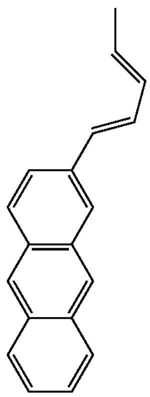 [SMILES: C/C=C/C=C/c1ccc2cc3ccccc3cc2c1]
92
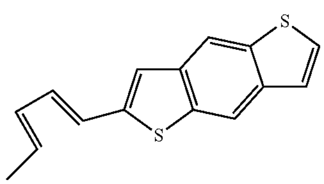 [SMILES: C/C=C/C=C/c1cc2cc3sccc3cc2s1]
93
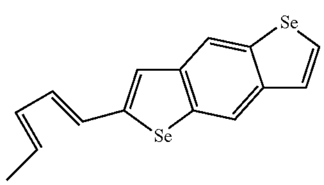 [SMILES: C/C=C/C=C/c1cc2cc3[se]ccc3cc2[se]1]
94
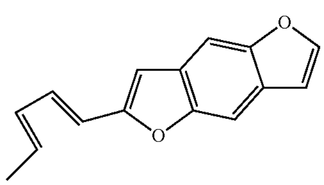 [SMILES: C/C=C/C=C/c1cc2cc3occc3cc2o1]
95
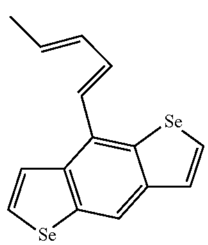
96

-continued
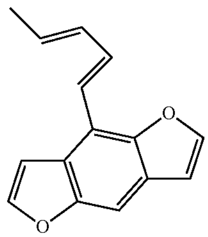 [SMILES: C/C=C/C=C/c1c2ccoc2cc2ccoc12]
97
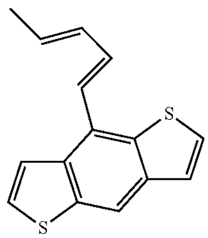
98
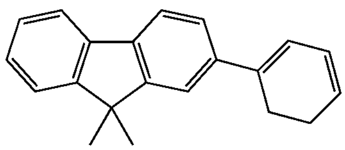 [SMILES: CC1(C)c2ccccc2-c2ccc(C3=CC=CCC3)cc21]
99
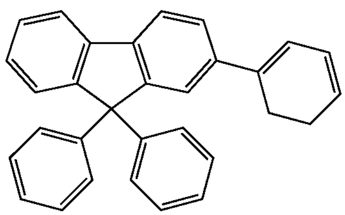 [SMILES: C1=CCCC(c2ccc3c(c2)C(c2ccccc2)(c2ccccc2)c2ccccc2-3)=C1]
100
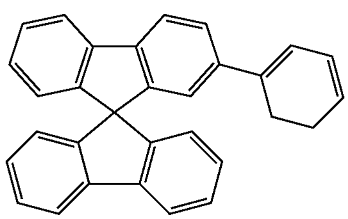 [SMILES: C1=CCCC(c2ccc3c(c2)C2(c4ccccc4-c4ccccc42)c2ccccc2-3)=C1]
101
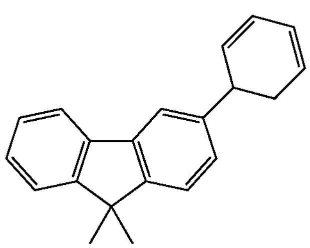 [SMILES: CC1(C)c2ccccc2-c2cc(C3C=CC=CC3)ccc21]
102

-continued
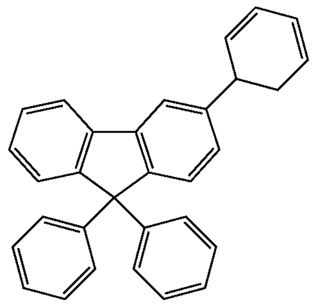 [SMILES: C1=CCC(c2ccc3c(c2)-c2ccccc2C3(c2ccccc2)c2ccccc2)C=C1]
103
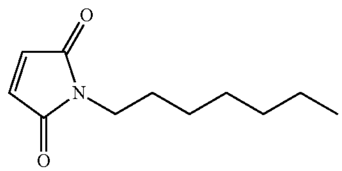
104
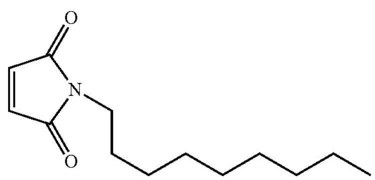 [SMILES: CCCCCCCCCN1C(=O)C=CC1=O]
105
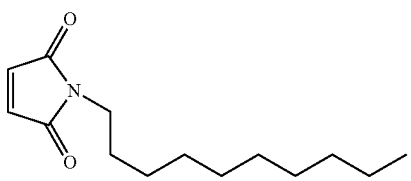 [SMILES: CCCCCCCCCCN1C(=O)C=CC1=O]
106
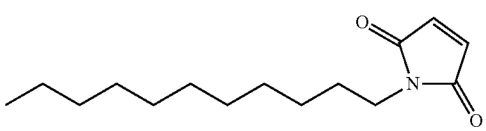 [SMILES: CCCCCCCCCCCN1C(=O)C=CC1=O]
107
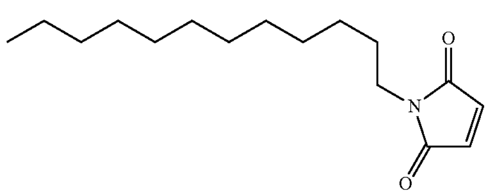 [SMILES: CCCCCCCCCCCCN1C(=O)C=CC1=O]
108
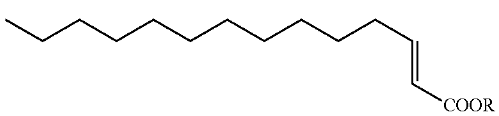
109
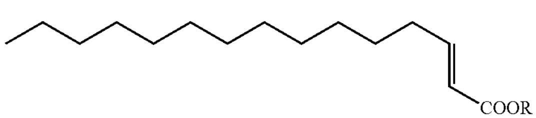
110
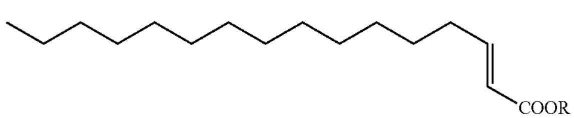
111

-continued
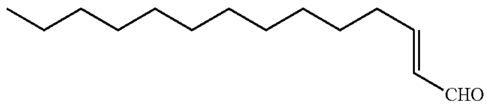
112
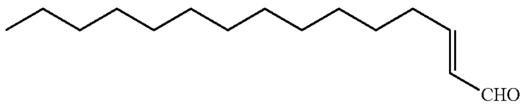 [SMILES: CCCCCCCCCCCC/C=C/C=O]
113
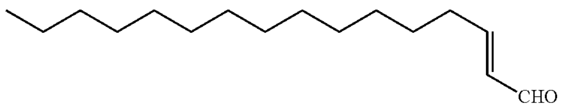 [SMILES: CCCCCCCCCCCCC/C=C/C=O]
114
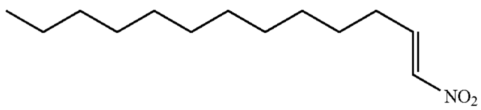 [SMILES: CCCCCCCCCCC/C=C/[N+](=O)[O-]]
115
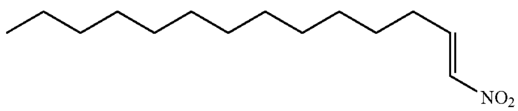 [SMILES: CCCCCCCCCCCC/C=C/[N+](=O)[O-]]
116
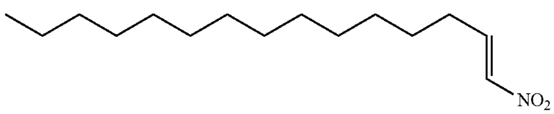 [SMILES: CCCCCCCCCCCCC/C=C/[N+](=O)[O-]]
117
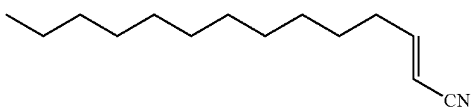
118
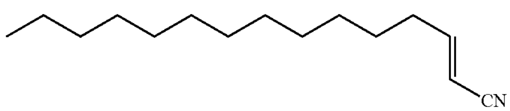 [SMILES: CCCCCCCCCCCC/C=C/C#N]
118
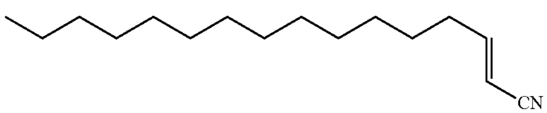 [SMILES: CCCCCCCCCCCCC/C=C/C#N]
119
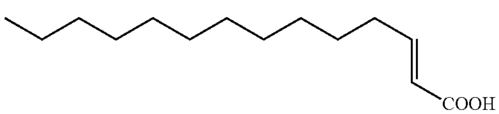
120
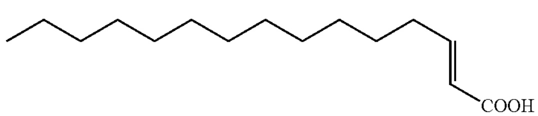 [SMILES: CCCCCCCCCCCC/C=C/C(=O)O]
121
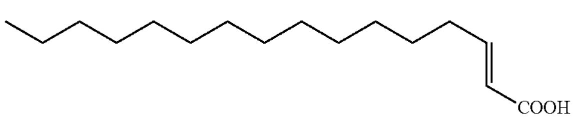 [SMILES: CCCCCCCCCCCCC/C=C/C(=O)O]
122
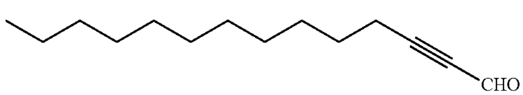
123

-continued

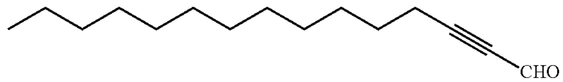 [SMILES: CCCCCCCCCCCCC#CC=O]
124

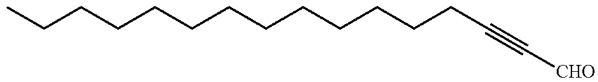 [SMILES: CCCCCCCCCCCCCC#CC=O]
125

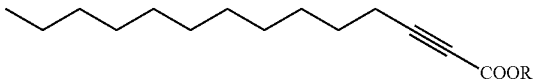
126

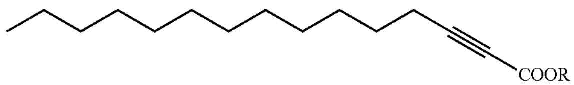
127

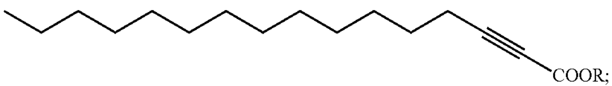
128

;

wherein R is a substituent.

13. The mixture that can undergo the Diels-Alder reaction according to claim 1, wherein Ar1 or Ar3 are each independently selected from the group consisting of benzene, biphenyl, triphenyl, benzo fluorene, indenofluorene, carbazole indolecarbazole, dibenzosilole, benzofuran, benzothiophene, benzoselenophene, and derivatives thereof.

14. The mixture that can undergo the Diels-Alder reaction according to claim 1, wherein Ar1 or Ar3 are each independently selected from the group consisting of fluorene, or indenofluorene and derivatives thereof.

15. The mixture that can undergo the Diels-Alder reaction according to claim 7, wherein the substituent is selected from the group consisting of hydrogen, deuterium, alkyl, alkoxy, amino, alkenyl, alkynyl, aralkyl, heteroalkyl, aryl and heteroaryl.

16. The mixture that can undergo the Diels-Alder reaction according to claim 12, wherein the substituent is selected from the group consisting of hydrogen, deuterium, alkyl, alkoxy, amino, alkenyl, alkynyl, aralkyl, heteroalkyl, aryl and heteroaryl.

* * * * *